US008436343B2

(12) United States Patent
Nishimura et al.

(10) Patent No.: US 8,436,343 B2
(45) Date of Patent: May 7, 2013

(54) ORGANIC EL DEVICE

(75) Inventors: Kazuki Nishimura, Sodegaura (JP); Toshihiro Iwakuma, Sodegaura (JP); Masahiro Kawamura, Sodegaura (JP); Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 233 days.

(21) Appl. No.: 12/668,035

(22) PCT Filed: Jul. 4, 2008

(86) PCT No.: PCT/JP2008/062134

§ 371 (c)(1), (2), (4) Date: Jan. 7, 2010

(87) PCT Pub. No.: WO2009/008346

PCT Pub. Date: Jan. 15, 2009

(65) Prior Publication Data

US 2011/0309337 A1 Dec. 22, 2011

(30) Foreign Application Priority Data

Jul. 7, 2007 (JP) ................................ 2007-179111

(51) Int. Cl.
*H01L 35/24* (2006.01)

(52) U.S. Cl.
USPC .................................... 257/40; 257/E51.022

(58) Field of Classification Search .................... 257/40, 257/E51.022
See application file for complete search history.

(56) References Cited

U.S. PATENT DOCUMENTS

2002/0182441 A1 12/2002 Lamansky et al.
2004/0209116 A1* 10/2004 Ren et al. ...................... 428/690
2005/0077817 A1 4/2005 Yamazaki et al.
2006/0125380 A1* 6/2006 Nagara et al. ................ 313/504
2006/0145603 A1* 7/2006 Taniguchi et al. ............ 313/506
2006/0158104 A1* 7/2006 Iijima et al. .................. 313/504
2006/0175958 A1* 8/2006 Gerhard et al. .............. 313/504

(Continued)

FOREIGN PATENT DOCUMENTS

EP 1 670 083 A2 6/2006
EP 1 670 083 A3 6/2006

(Continued)

OTHER PUBLICATIONS

U.S. Appl. No. 12/667,939, filed Jan. 6, 2010, Nishimura, et al.

(Continued)

*Primary Examiner* — Wael Fahmy
*Assistant Examiner* — Sarah Salerno
(74) *Attorney, Agent, or Firm* — Oblon, Spivak, McClelland, Maier & Neustadt, L.L.P.

(57) ABSTRACT

An organic EL device includes: an anode (3); a cathode (4); and an organic thin-film layer (5) provided between the anode (3) and the cathode (4). The organic thin-film layer (5) includes: a fluorescent-emitting layer (51) containing a fluorescent host and a blue fluorescent dopant; a red phosphorescent-emitting layer (52) containing a red phosphorescent host and a red phosphorescent dopant; and a green phosphorescent-emitting layer (53) containing a green phosphorescent host and a green phosphorescent dopant. The red phosphorescent dopant emits light mainly by receiving transfer of triplet energy from the fluorescent host. The green phosphorescent dopant emits light mainly by recombination of charges within the green phosphorescent-emitting layer.

7 Claims, 2 Drawing Sheets

U.S. PATENT DOCUMENTS

| | | | | |
|---|---|---|---|---|
| 2006/0232194 | A1 | 10/2006 | Tung et al. | |
| 2006/0273714 | A1 | 12/2006 | Forrest et al. | |
| 2006/0279203 | A1* | 12/2006 | Forrest et al. | 313/504 |
| 2007/0138947 | A1 | 6/2007 | Popovic et al. | |

FOREIGN PATENT DOCUMENTS

| | | | |
|---|---|---|---|
| EP | 2 147 472 | A0 | 1/2010 |
| EP | 2 147 473 | A0 | 1/2010 |
| JP | 9 241629 | | 9/1997 |
| JP | 2001 250690 | | 9/2001 |
| JP | 2003 257670 | | 9/2003 |
| JP | 2003 317946 | | 11/2003 |
| JP | 2004 506305 | | 2/2004 |
| JP | 2004 221045 | | 8/2004 |
| JP | 2005 19413 | | 1/2005 |
| JP | 2005 123205 | | 5/2005 |
| JP | 2005 235787 | | 9/2005 |
| JP | 2006 120689 | | 5/2006 |
| JP | 2006 120821 | | 5/2006 |
| JP | 2006 172762 | | 6/2006 |
| JP | 2006 190759 | | 7/2006 |
| JP | 2007 019070 | | 1/2007 |
| JP | 2007 27620 | | 2/2007 |
| JP | 2007 59310 | | 3/2007 |
| JP | 2007 73814 | | 3/2007 |
| JP | 2007 509502 | | 4/2007 |
| JP | 2007 173827 | | 7/2007 |
| WO | 2004 016575 | | 2/2004 |
| WO | 2004 018588 | | 3/2004 |
| WO | 2004 060026 | | 7/2004 |
| WO | 2005 079118 | | 8/2005 |
| WO | 2005 117500 | | 12/2005 |
| WO | 2006 038020 | | 4/2006 |
| WO | 2006 062078 | | 6/2006 |
| WO | 2007 029426 | | 3/2007 |
| WO | 2007 029806 | | 3/2007 |
| WO | 2007 032162 | | 3/2007 |

OTHER PUBLICATIONS

U.S. Appl. No. 12/667,893, filed Jan. 6, 2010, Nishimura, et al.
U.S. Appl. No. 12/668,110, filed Jan. 7, 2010, Nishimura, et al.
U.S. Appl. No. 12/668,111, filed Jan. 7, 2010, Nishimura, et al.
Sun, Yiru et al., "Management of singlet and triplet excitons for efficient white organic light-emitting devices", Nature, vol. 440, p. 908-912, Apr. 13, 2006.
Extended European Search Report issued Mar. 5, 2012, in Patent Application No. 08790865.3.

* cited by examiner

ORGANIC EL DEVICE

TECHNICAL FIELD

The present invention relates to an organic EL device. In particular, the invention relates to an organic EL device including a fluorescent-emitting layer and a phosphorescent-emitting layer.

BACKGROUND ART

To date, organic EL devices including a plurality of emitting layers each of which emits light of a different wavelength are known. Such organic EL devices are also known to provide mixed-color light in which the lights emitted by the emitting layers are mixed together. One of such organic EL devices includes a layered red-emitting layer, green-emitting layer and blue-emitting layer, and provides white light in which emissions from the emitting layers are mixed together.

Excited states of organic compounds encompass a singlet state and a triplet state. Emission from the singlet state is called as fluorescence while emission from the triplet state is called as phosphorescence. Typically, the singlet state and the triplet state occur in a ratio of 1:3.

Conventional organic EL devices have mainly used fluorescent emitting materials for emission of fluorescence. In such an organic EL device that utilizes the fluorescent emission, only the singlet (i.e., 25% of the excitation generated in an emitting layer) contributes to the emission while the triplet (i.e., the remaining 75%) is deactivated without emitting.

In order to enhance the luminous efficiency of organic EL devices, developments are being made on phosphorescent emitting materials for emitting phosphorescence, i.e., emission from the triplet (e.g., Patent Document 1). For instance, reports have been made on red-emitting phosphorescent materials and green-emitting phosphorescent materials. It should be noted that no practically-applicable blue-emitting phosphorescent material has been obtained.

With application of the above phosphorescent materials, organic EL devices for mixed-color emission are capable of enhancing luminous efficiency.

For instance, a known organic EL device provides white emission with use of a blue-emitting fluorescent materials and a red-to-green-emitting phosphorescent materials. According to such a known device, enhancement of quantum efficiency in the red to green emission contributes to enhancement of the luminous efficiency of the entire organic EL device.

However, even in such an organic EL device for mixed-color emission, while emission is obtained from the triplet in the red to green emitting layers, the triplet in the blue emitting layer has been deactivated without contributing to emission.

In view of the above, proposals have been made on an organic EL device in which the triplet of the blue emitting layer is diffused in the red and green emitting layers so that red and green phosphorescence is obtained therefrom (e.g., Patent Documents 2 and 3, Non-Patent Document 1). According to such an organic EL device, the energy of the triplet in the blue emitting layer, which have been typically to be deactivated without contributing to emission, can be utilized for obtaining red and green phosphorescence. Thus, the luminous efficiency of the entire organic EL device can be enhanced.

The organic EL device disclosed in Non-Patent Document 1 includes a blue fluorescent-emitting layer, blocking layer, red phosphorescent-emitting layer, green phosphorescent-emitting layer, blocking layer and blue fluorescent-emitting layer in this order. According to this document, blue fluorescence is obtainable from the singlet in the blue fluorescent-emitting layers, and the triplet in the blue fluorescent-emitting layers is diffused in the red and green phosphorescent-emitting layers via the blocking layers. Then, the triplet in the red and green phosphorescent-emitting layers is generated, from which red and green phosphorescence is obtainable. According to the report, the blue fluorescence and the red and green phosphorescence are mixed together, thereby providing white emission as a whole.

Patent Document 1: US2002/182441
Patent Document 2: WO2006/038020
Patent Document 3: WO2004/060026
Non-Patent Document 1: nature vol 440 p. 908

DISCLOSURE OF THE INVENTION

Problems to be Solved by the Invention

According to such a typical organic EL device as disclosed in Non-Patent Document 1, the triplet in the blue fluorescent-emitting layer is diffused in the red and green phosphorescent-emitting layers. Accordingly, the host of the blue fluorescent-emitting layer is required to be made of a material having a large triplet energy gap. As such a host material, CBP (4,4'-bis(N-carbazolyl)biphenyl) is exemplarily usable.

However, CBP has not only a large triplet energy gap but also a much larger singlet energy gap.

In the blue fluorescent-emitting layer, the singlet energy of the host is transferred to the dopant for emission. However, the singlet energy gap of CBP (i.e., the host) is too large for the energy to be efficiently transferred to the dopant. As a consequence, the luminous efficiency is reduced.

Also, in order for the dopant to sufficiently emit light, the device is required to be applied with extra load such as increase of the voltage. Thus, depending on the employed device structure, the emission lifetime may be shortened.

Widely-known examples of the host material for fluorescent-emitting layers are anthracene compounds.

However, although exhibiting a singlet energy gap of a suitable size, such an anthracene compound exhibits too small a triplet energy gap for the energy to be transferred to the phosphorescent-emitting layer.

For use in a device including a combination of a fluorescent-emitting layer and a phosphorescent-emitting layer, no such material has been obtained that exhibits both of a suitable energy gap as the host material of the fluorescent-emitting layer and practical lifetime. Therefore, there has been a demand for realization of practical luminous efficiency and practical emission lifetime in a device including a combination of a fluorescent-emitting layer and a phosphorescent-emitting layer.

An object of the invention is to provide an organic EL device exhibiting practical luminous efficiency and practical emission lifetime while including a fluorescent-emitting layer and a phosphorescent-emitting layer, in which a host material of the fluorescent-emitting layer has a suitable energy gap.

Means for Solving the Problems

An organic EL device according to an aspect of the invention includes: an anode; a cathode; an organic thin-film layer provided between the anode and the cathode, the organic thin-film layer including: a fluorescent-emitting layer containing a fluorescent host and a fluorescent dopant; a red phosphorescent-emitting layer containing a red phosphorescent host and a red phosphorescent dopant; and a green phosphorescent-emitting layer containing a green phosphorescent host and a green phosphorescent dopant, the red phosphorescent dopant emitting light mainly by receiving transfer of triplet energy from the fluorescent host, the green phosphorescent dopant emitting light mainly by recombination of charges within the green phosphorescent-emitting layer.

By employing, in the green phosphorescent-emitting layer, emission mainly generated by recombination of charges, the transfer of the triplet energy from the fluorescent host becomes less important in perspective of emission. Accordingly, there is no need to select a material having a large triplet energy gap (Eg(T)) as the material for the fluorescent host, and thus the selection of the material is widened. Hence, the selection of a material having excellent heat resistance and charge stability can be more possibly made, which contributes to longer lifetime of the device.

The “mainly” in the above description means that a half and more of the emission is generated by the transfer of the triplet energy or by the recombination of charges. The proportion thereof is determinable through the later-described measurement.

According to the aspect of the invention, the singlet energy generated by the recombination of charges in the fluorescent host is transferred to the fluorescent dopant, so that blue fluorescent emission is obtainable. On the other hand, red phosphorescent emission is obtainable by the transfer of the triplet energy from the fluorescent host, and green phosphorescent emission is obtainable by the recombination of charges in the green phosphorescent-emitting layer. Accordingly, the organic EL device as a whole can provide white emission.

In this description, the red phosphorescent dopant and the green phosphorescent dopant encompass not only dopants respectively for emitting red light (580 to 700 nm) and green light (580 to 580 nm) in terms of emission wavelength, but also green phosphorescent dopants of which emission wavelengths (peak wavelength) are shorter than those (peak wavelength) of red phosphorescent dopants.

Exemplary compounds for the phosphorescent host are as follows.

Examples of the carbazole derivative are compounds represented by the following formulae (101) to (105).

[Chemical Formula 1]

(101)

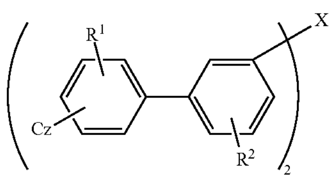

(102)

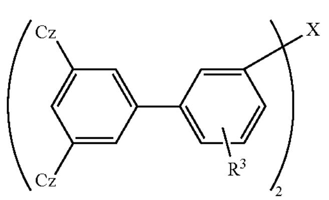

-continued (103)

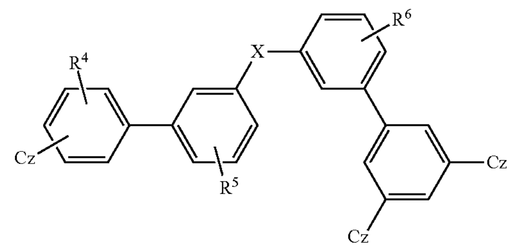

(104)

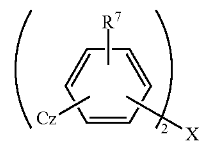

(105)

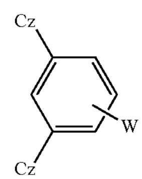

In particular, the compounds represented by the formula (101) or (103) are favorably usable as the phosphorescent host.

The structure of the formula (101) is any one of the following structures.

[Chemical Formula 2]

(101′)

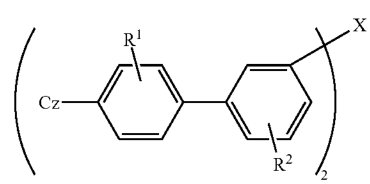

(101″)

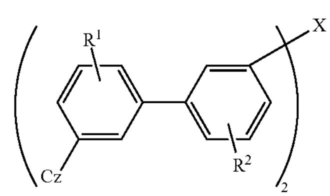

(101‴)

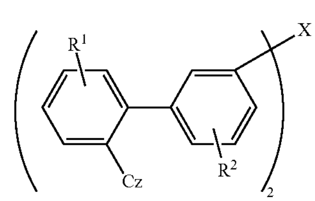

The structure of the formula (103) is any one of the following structures.

[Chemical Formula 3]

(103')

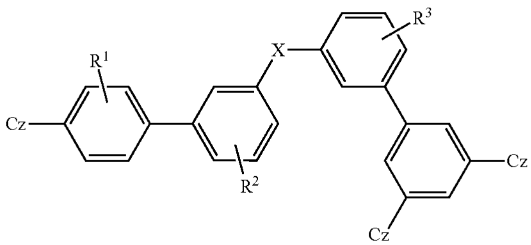

(103")

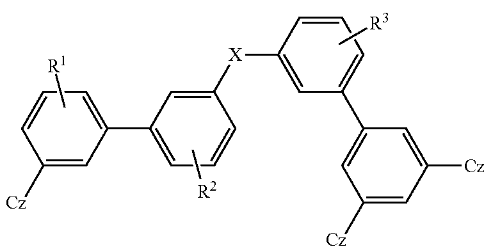

(103''')

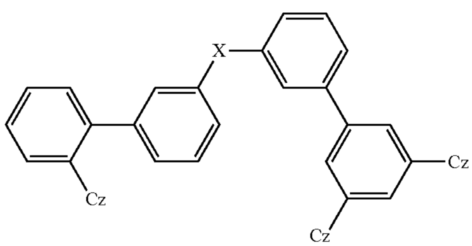

Among the above, materials containing the compounds represented by the general formula (101') or (103') are preferable.

In the formulae (101) to (104), $R^1$ to $R^7$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^1$ to $R^7$ each may be plural. An adjacent set thereof may form a saturated or unsaturated cyclic structure.

Examples of the halogen atom represented by $R^1$ to $R^7$ are fluorine, chlorine, bromine and iodine.

Examples of the substituted or unsubstituted alkyl group represented by $R^1$ to $R^7$ are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethylhexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group and 3,5-tetramethylcyclohexyl group.

Examples of the substituted or unsubstituted heterocyclic group having 3 to 30 carbon atoms represented by $R^1$ to $R^7$ are 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl, 4-pyridinyl, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl, 5-quinoxalinyl, 6-quinoxalinyl, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl, 5-oxadiazolyl, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Among the above, the preferable examples are 2-pyridinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group and 9-carbazolyl group.

The substituted or unsubstituted alkoxy group having 1 to 40 carbon atoms represented by $R^1$ to $R^7$ is a group represented by —OY. Examples of Y are the same as those described with respect to the alkyl group. Preferable examples are also the same.

Examples of the substituted or unsubstituted aryl group having 6 to 40 carbon atoms represented by $R^1$ to $R^7$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among the above, the preferably examples are a phenyl group, 1-naphthyl group, 2-naphthyl group, 9-phenanthryl group, 2-biphenylyl group, 3-biphenylyl group, 4-biphenylyl group, p-tolyl group and 3,4-xylyl group.

The substituted or unsubstituted aryloxy group having 6 to 40 carbon atoms represented by $R^1$ to $R^7$ is a group represented by —OAr. Examples of Ar are the same as those described with respect to the aryl group. Preferable examples are also the same.

Examples of the substituted or unsubstituted aralkyl group having 7 to 40 carbon atoms represented by $R^1$ to $R^7$ are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-(3-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

Among the above, the preferable examples are a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group.

Examples of the substituted or unsubstituted alkenyl group having 2 to 40 carbon atoms represented by $R^1$ to $R^7$ are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-phenylvinyl group and 1,2-diphenylvinyl group are preferable.

The substituted or unsubstituted alkylamino group having 1 to 80 carbon atoms, the substituted or unsubstituted arylamino group having 6 to 80 carbon atoms and the substituted or unsubstituted aralkylamino group having 7 to 80 carbon atoms, which are represented by $R^1$ to $R^7$, are represented by —$NQ^1Q^2$. Examples of $Q^1$ and $Q^2$ each are independently the same as those described with respect to the alkyl group, aryl group and aralkyl group. The preferable examples are also the same.

The substituted or unsubstituted alkylsilyl group having 3 to 10 carbon atoms represented by $R^1$ to $R^7$ are a trimethylsilyl group, triethylsilyl group, t-butyldimethylsilyl group, vinyldimethylsilyl group and propyldimethylsilyl group.

The substituted or unsubstituted arylsilyl group having 6 to 30 carbon atoms represented by $R^1$ to $R^7$ are a triphenylsilyl group, phenyldimethylsilyl group and t-butyldiphenylsilyl group.

Examples of the cyclic structure formed when $R^1$ to $R^7$ are plural are a unsaturated six-membered ring such as benzene ring, saturated or unsaturated five-membered ring and seven-membered ring.

In the formulae (101) to (104), X is a group represented by any one of the following formulae (111) to (116).

[Chemical Formula 4]

(111)

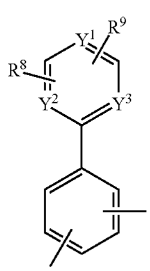

(112)

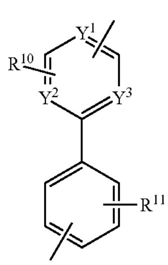

-continued (113)

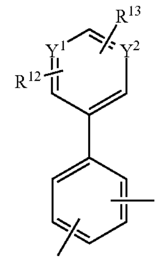

(114)

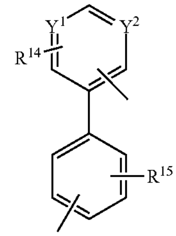

(115)

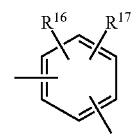

(116)

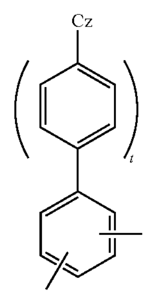

In the formulae (111) to (116), $R^8$ to $R^{17}$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^8$ to $R^{17}$ each may be plural. An adjacent set thereof may form a saturated or unsaturated cyclic structure.

Examples of the groups represented by $R^8$ to $R^{17}$ are the same as the examples described in relation to $R^1$ to $R^7$. The preferable examples are also the same.

In the formulae (111) to (114), $Y^1$ to $Y^3$ each independently represent —CR (R represents a hydrogen atom, group bonded to X in the general formulae (101) to (104) or any one of $R^8$, $R^9$, $R^{10}$, $R^{12}$, $R^{13}$ and $R^{14}$)) or a nitrogen atom. When $Y^1$ to $Y^3$ represent a nitrogen atom, the number thereof is at least 2 within the same ring. Cz is the same as the following.

In the general formula (116), t is an integer of 0 to 1.

The group represented by the general formula (111) preferably has any one of the following structures.

[Chemical Formula 5]

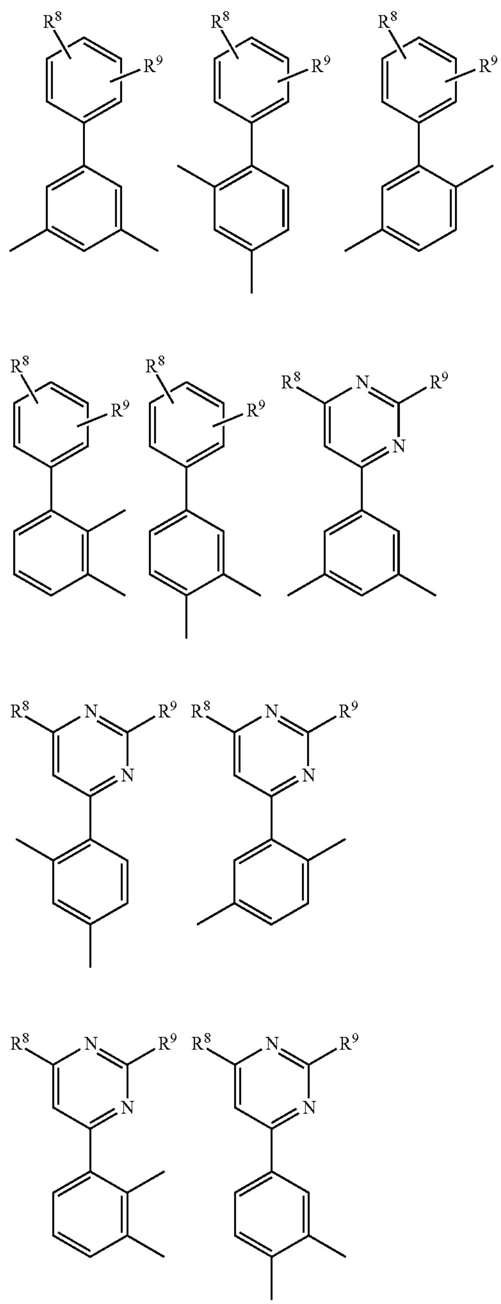

-continued

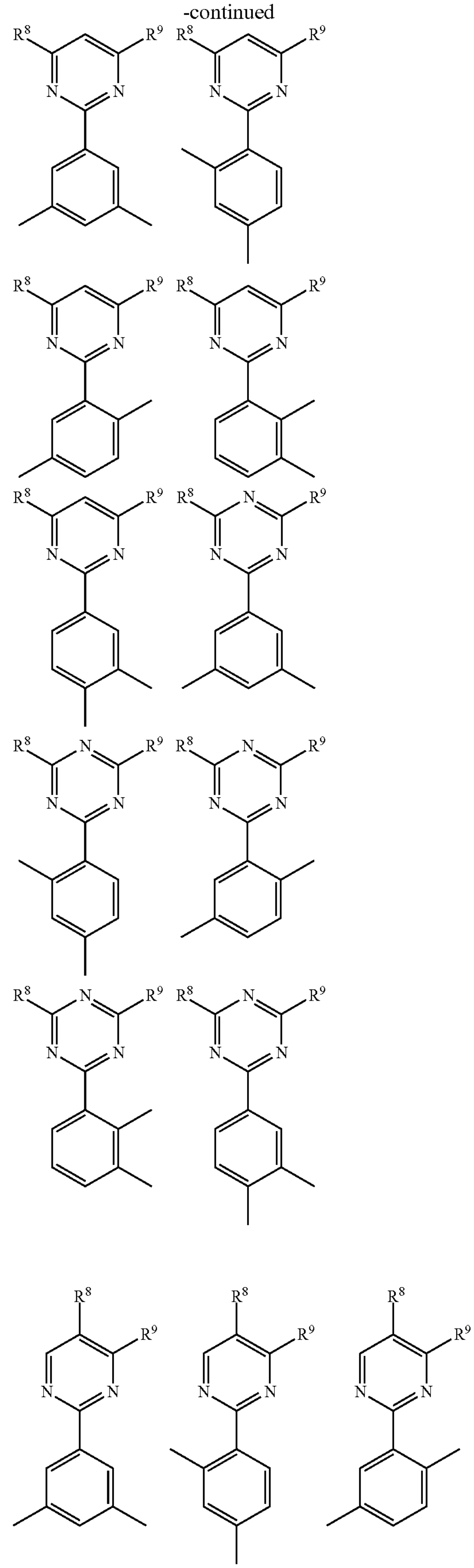

-continued
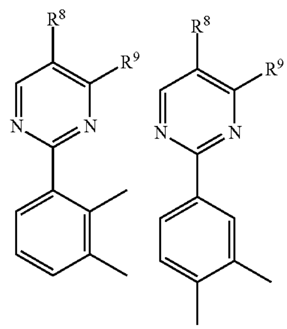
The group represented by the general formula (112) preferably has any one of the following structures.
[Chemical Formula 6]
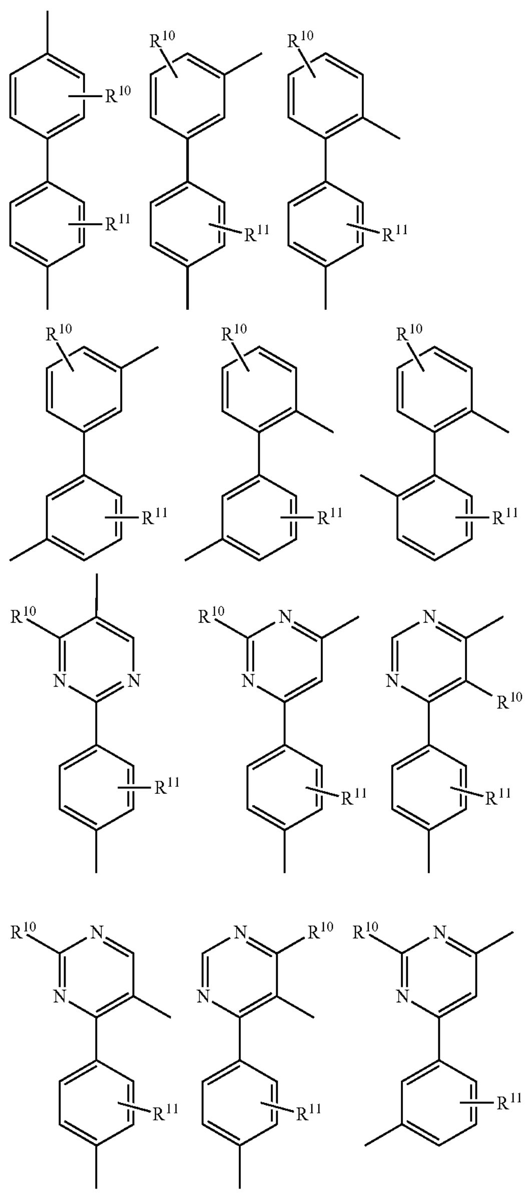
-continued
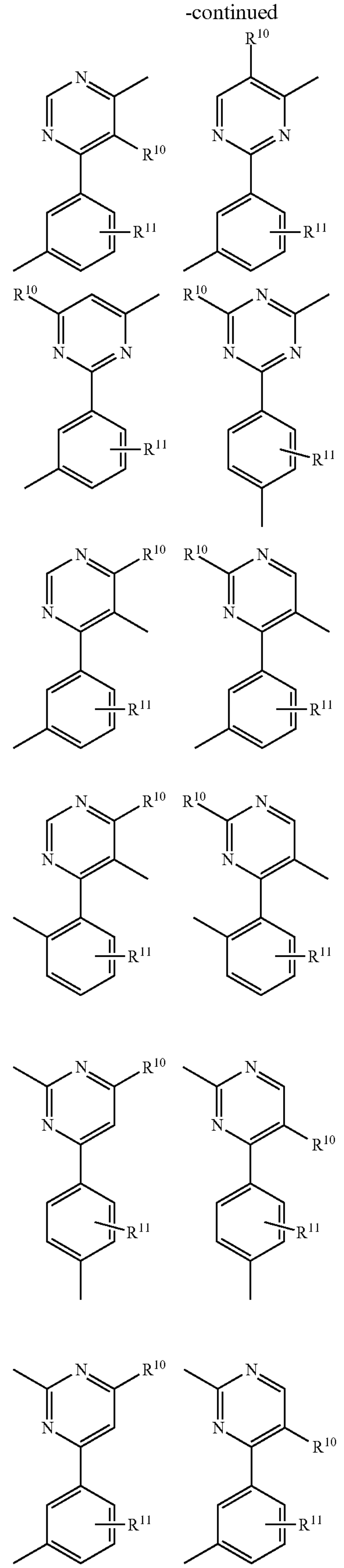

The group represented by the general formula (113) preferably has any one of the following structures.
[Chemical Formula 7]
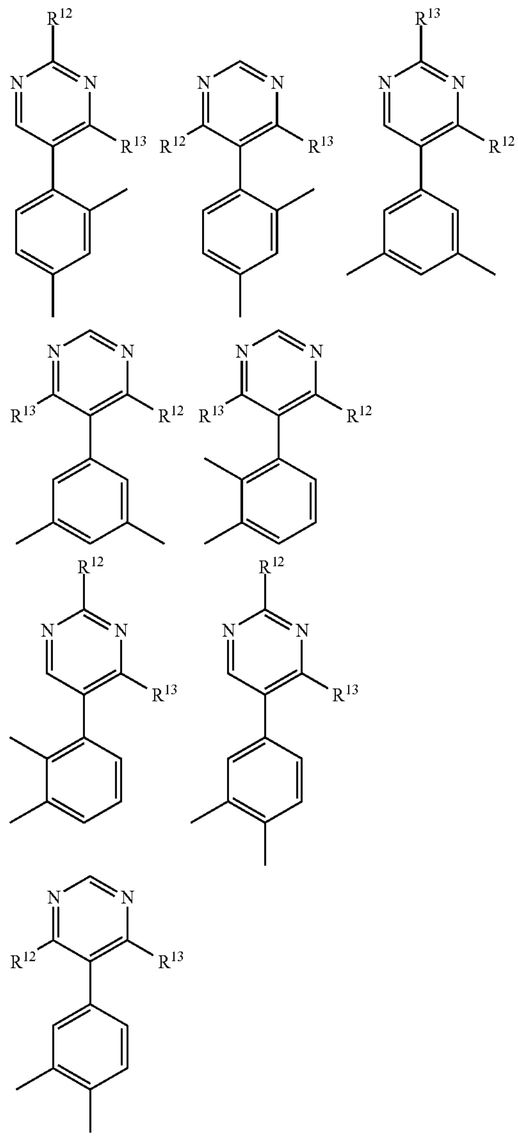
The group represented by the general formula (114) preferably has any one of the following structures.
[Chemical Formula 8]
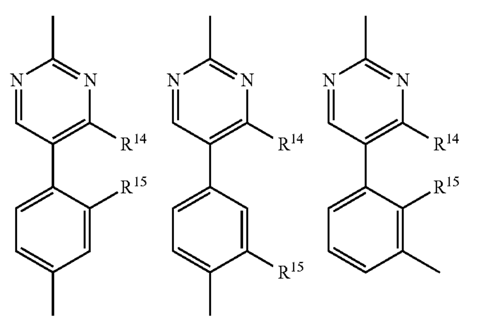
-continued
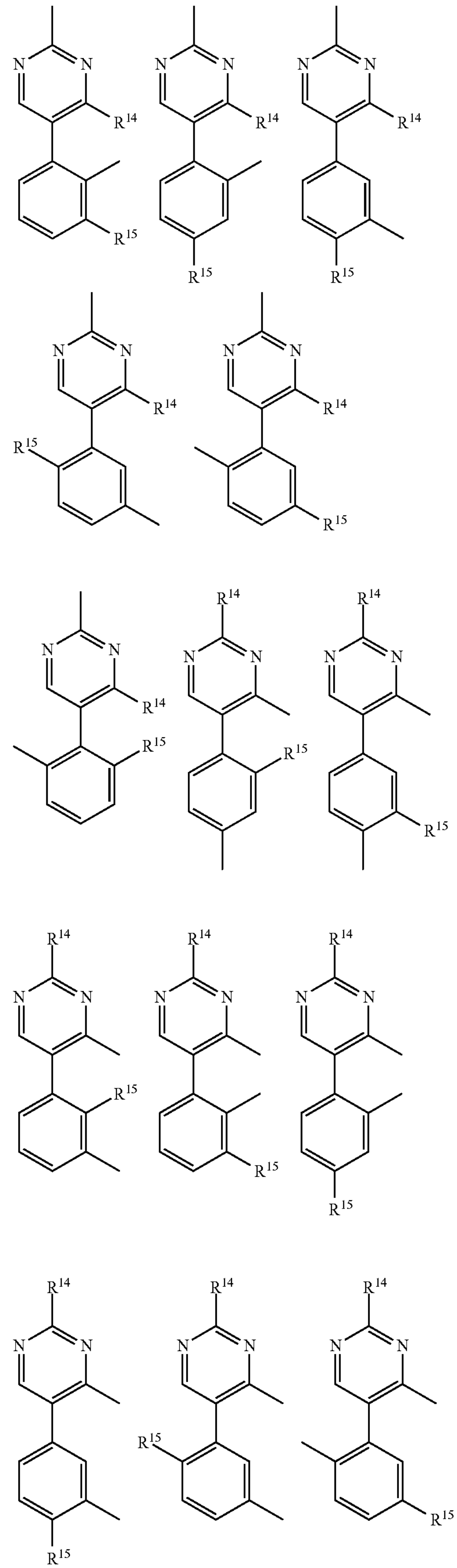

-continued
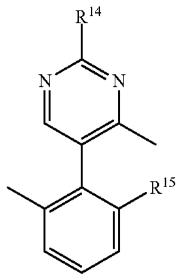
The group represented by the general formula (115) preferably has any one of the following structures.
[Chemical Formula 9]
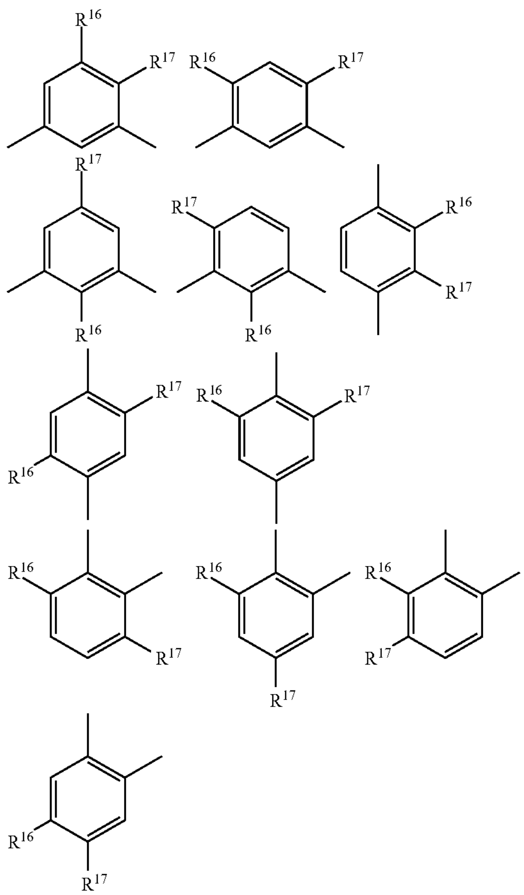
The group represented by the general formula (116) preferably has any one of the following structures.
[Chemical Formula 10]
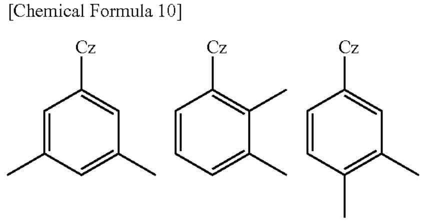
-continued
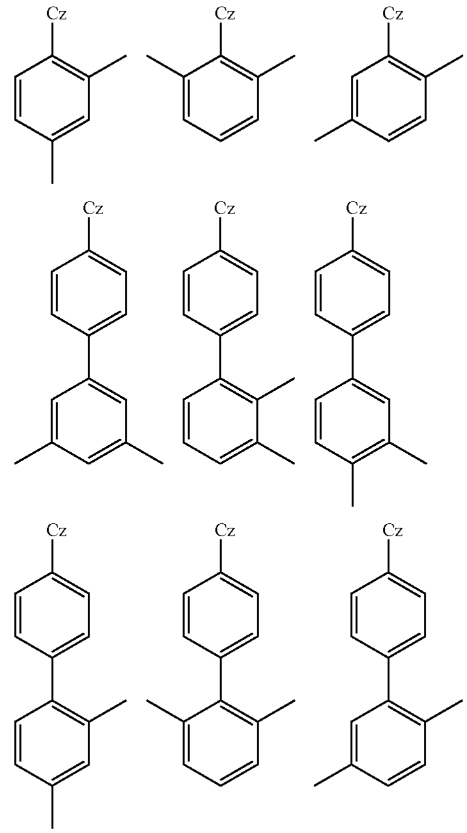
In the formula (105), W is a group represented by any one of the following formulae (121) to (125).
[Chemical Formula 11]
(121)
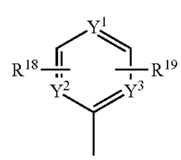
(122)
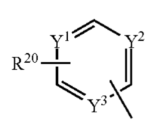
(123)
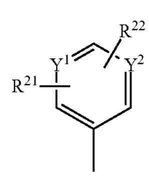
(124)
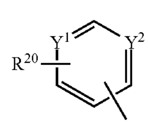

-continued (125)

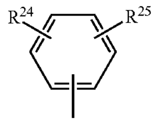

In the formulae (121) to (125), $R^{18}$ to $R^{25}$ represent the same as those represented by $R^8$ to $R^{17}$. $Y^1$ to $Y^3$ are the same as $Y^1$ to $Y^3$ in the formulae (111) to (114).

Examples of the groups represented by $R^{18}$ to $R^{25}$ are the same as the examples described in relation to $R^1$ to $R^7$. The preferable examples are also the same.

In the formulae (101) to (105), Cz is a group represented by either one of the following formulae (131) and (132).

[Chemical Formula 12]

(131)

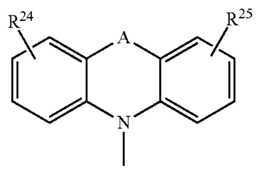

(132)

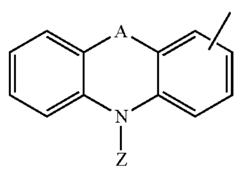

In the formulae (131) and (132), A represents a single bond, —$(CR^{26}R^{27})_n$— (n is an integer of 1 to 3), —$SiR^{28}R^{29}$—, —$NR^{30}$—, —O— or —S—, $R^{26}$ and $R^{27}$, and $R^{28}$ and $R^{29}$ may be bonded together to form a saturated or unsaturated cyclic structure. $R^{24}$ to $R^{30}$ each independently represent a hydrogen atom, halogen atom, substituted or unsubstituted alkyl group having 1 to 40 carbon atoms, substituted or unsubstituted heterocyclic group having 3 to 30 carbon atoms, substituted or unsubstituted alkoxy group having 1 to 40 carbon atoms, substituted or unsubstituted aryl group having 6 to 40 carbon atoms, substituted or unsubstituted aryloxy group having 6 to 40 carbon atoms, substituted or unsubstituted aralkyl group having 7 to 40 carbon atoms, substituted or unsubstituted alkenyl group having 2 to 40 carbon atoms, substituted or unsubstituted alkylamino group having 1 to 80 carbon atoms, substituted or unsubstituted arylamino group having 6 to 80 carbon atoms, substituted or unsubstituted aralkylamino group having 7 to 80 carbon atoms, substituted or unsubstituted alkylsilyl group having 3 to 10 carbon atoms, substituted or unsubstituted arylsilyl group having 6 to 30 carbon atoms or cyano group. $R^{24}$ to $R^{25}$ each may be plural. An adjacent set thereof may form a saturated or unsaturated cyclic structure.

In the formula (132), Z represents a substituted or unsubstituted alkyl group having 1 to 20 carbon atoms, a substituted or unsubstituted aryl group having 6 to 18 carbon atoms, or a substituted or unsubstituted aralkyl group having 7 to 40 carbon atoms.

Examples of the alkyl group having 1 to 20 carbon atoms represented by Z are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group. The preferable examples are a methyl group, ethyl group, propyl group, n-hexyl group and n-heptyl group.

Examples of the aryl group represented by Z are a phenyl group, naphthyl group, tolyl group, biphenyl group and terphenyl group. The preferable examples are a phenyl group, biphenyl group and tolyl group.

Examples of the aralkyl group represented by Z are an α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, benzyl group, p-cyanobenzyl group, m-cyanobenzyl group, o-cyanobenzyl group, 1-phenylethyl group, 2-phenylethyl group, 1-phenylisopropyl group and 2-phenylisopropyl group. Preferable examples are a benzyl group and p-cyanobenzyl group.

Cz preferably has any one of the following structures.

[Chemical Formula 13]

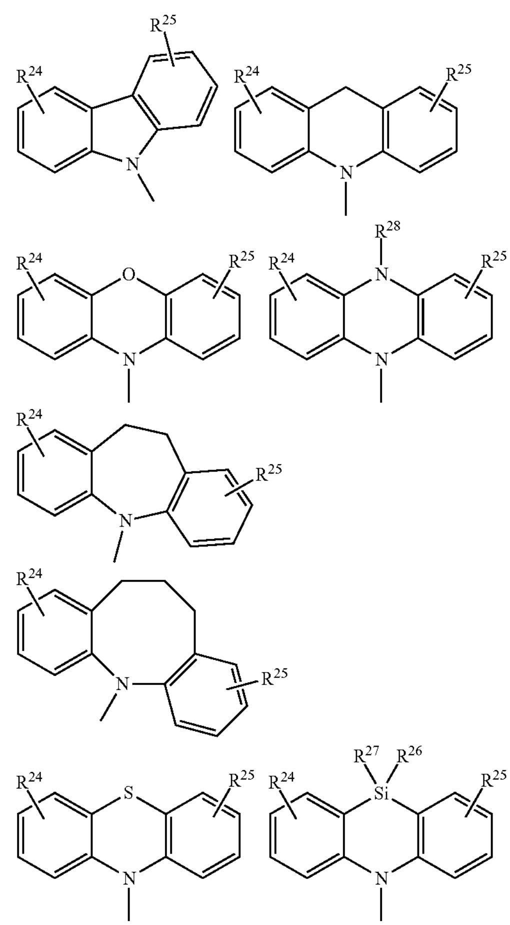

-continued

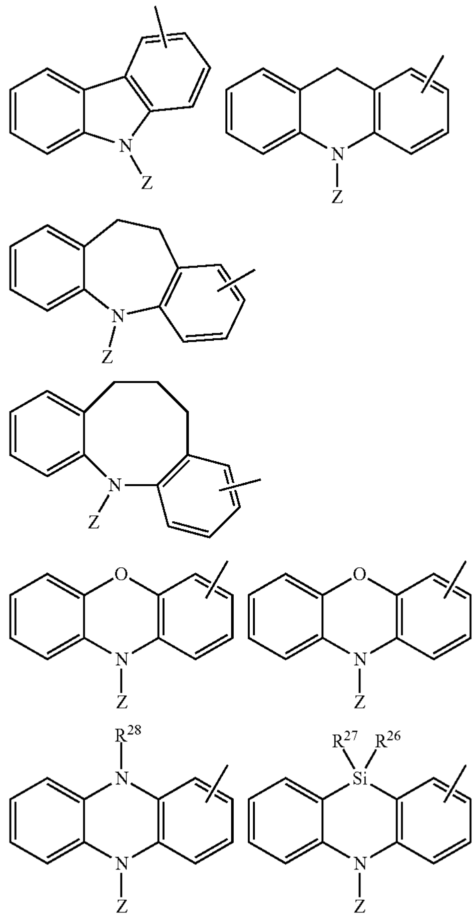

-continued

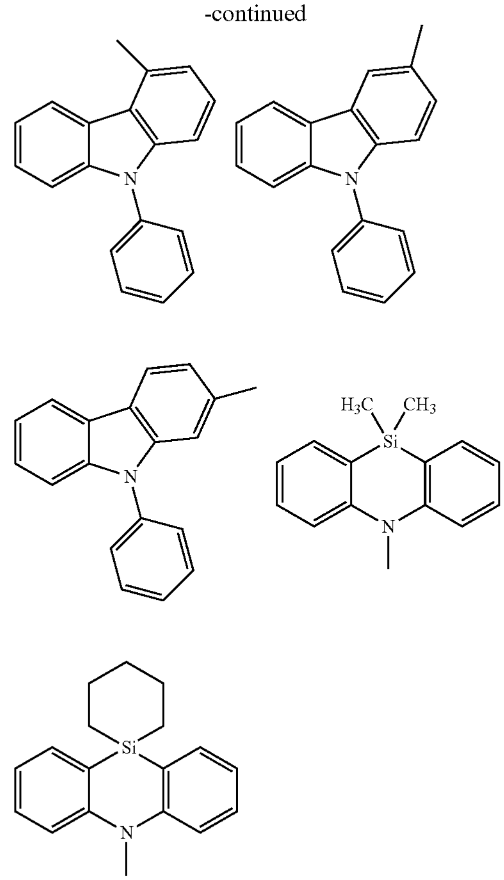

In addition, Cz particularly preferably represents a substituted or unsubstituted carbazolyl group, or substituted or unsubstituted arylcarbazolyl group.

Examples of the substituents for the groups exemplified in the general formulae (101) to (105) are a halogen atom, hydroxyl group, amino group, nitro group, cyano group, alkyl group, alkenyl group, cycloalkyl group, alkoxy group, aromatic hydrocarbon group, aromatic heterocyclic group, aralkyl group, aryloxy group and alkoxycarbonyl group.

Examples of the organic-EL-device material containing the compound represented by any one of the formulae (101) to (105) according to the aspect of the invention will be shown below. However, the invention is not limited to the exemplary compounds shown below.

Cz more preferably has any one of the following structures.

[Chemical Formula 14]

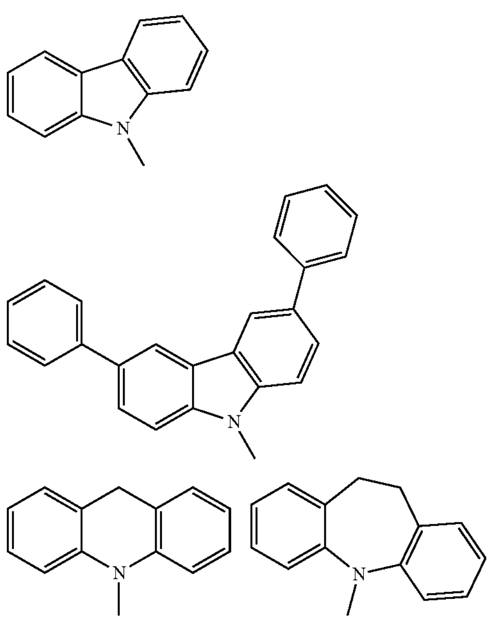

[Chemical Formula 15]

(C1)

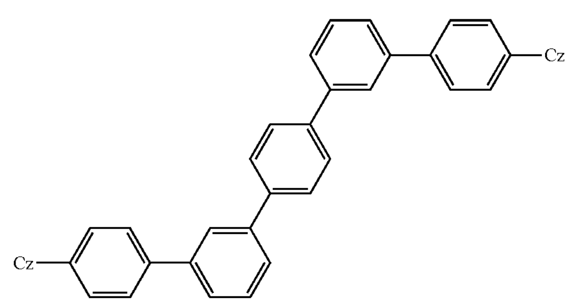

-continued
(C2)
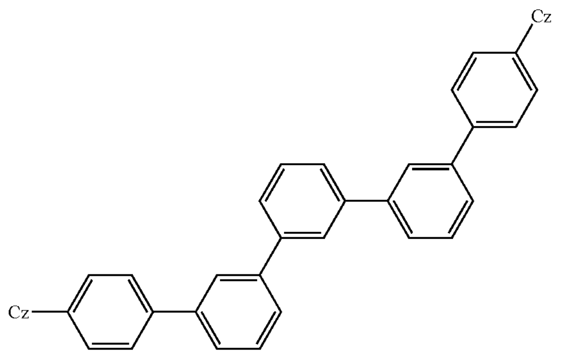
(C3)
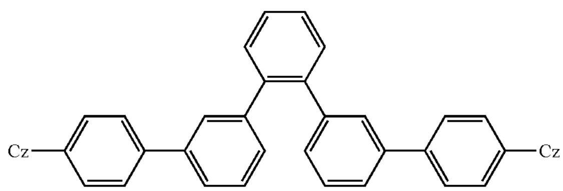
(C4)
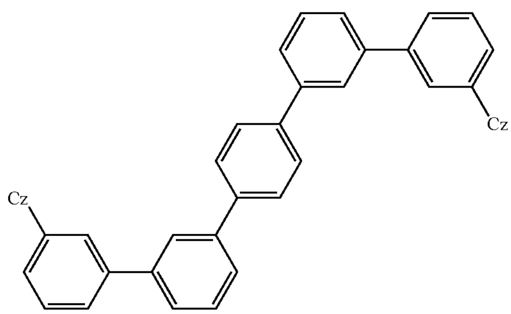
(C5)
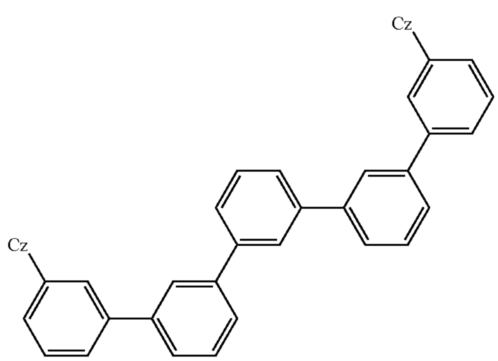
(C6)
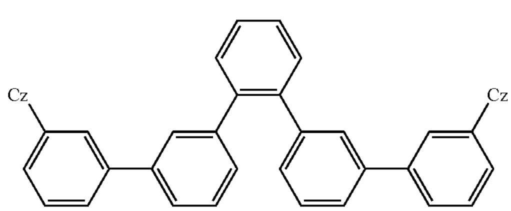
-continued
(C7)
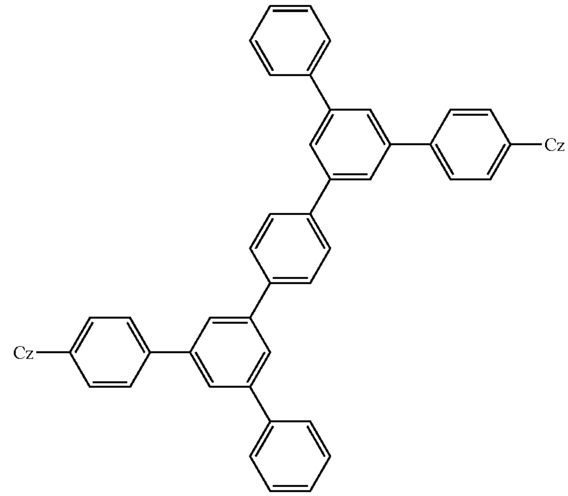
(C8)
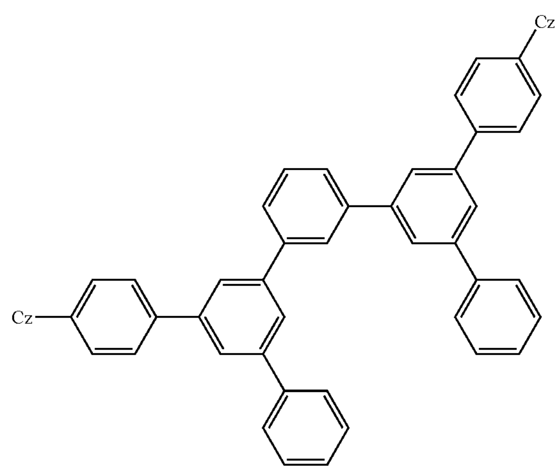
(C9)
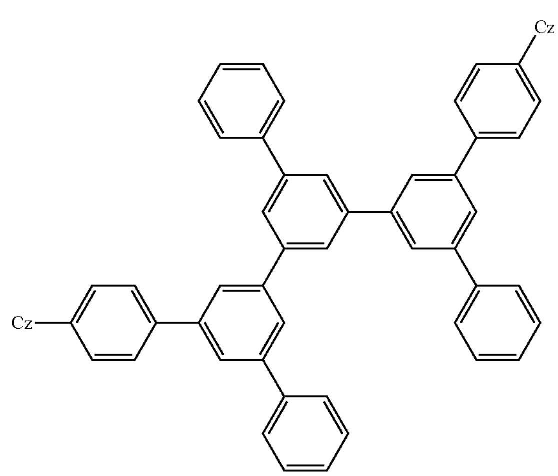

-continued
(C10)
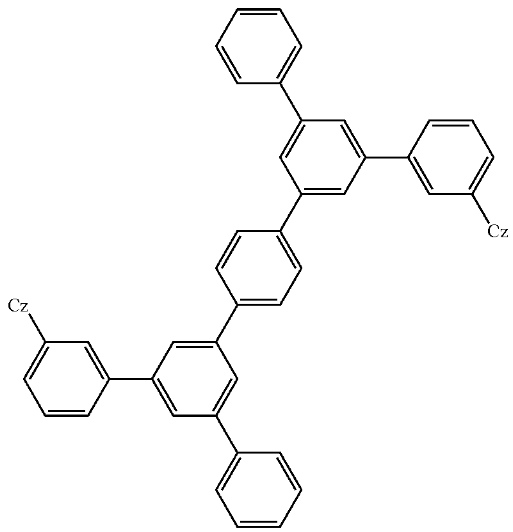
(C11)
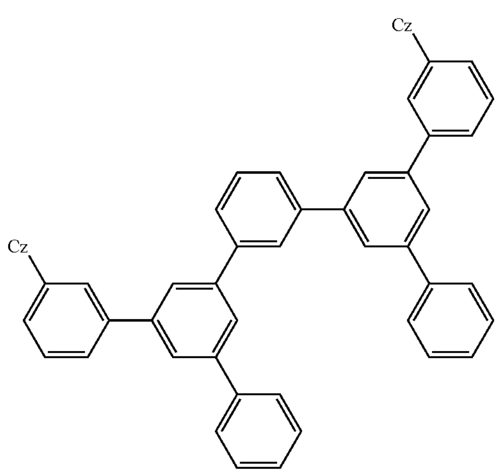
(C12)
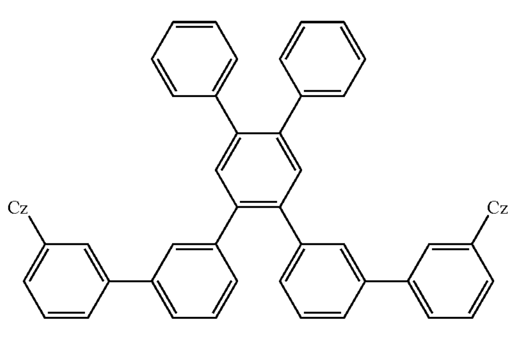
-continued
(C13)
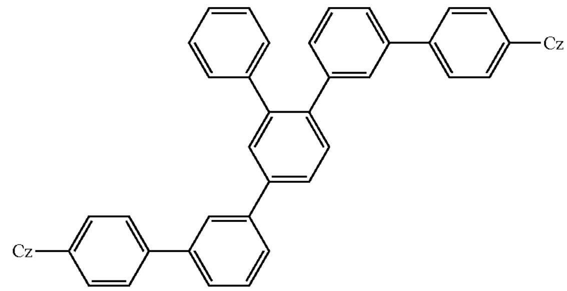
(C14)
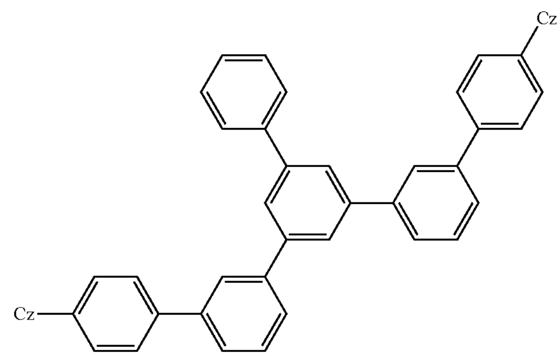
(C15)
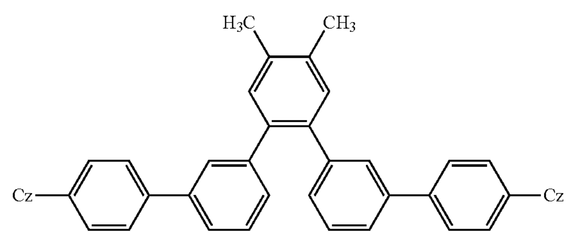
(C16)
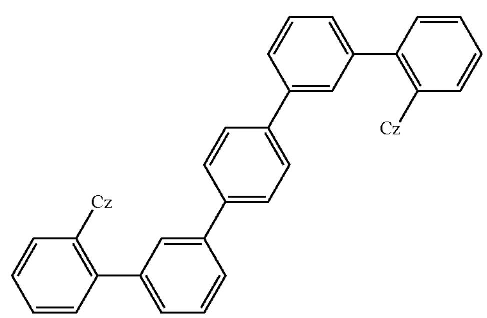
(C17)
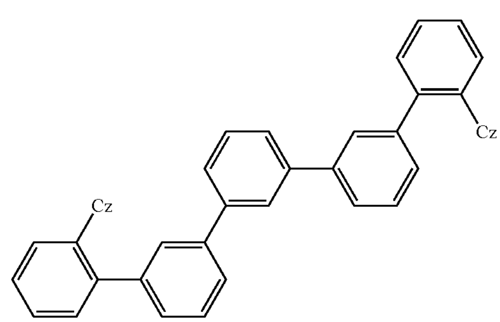

-continued
(C18)
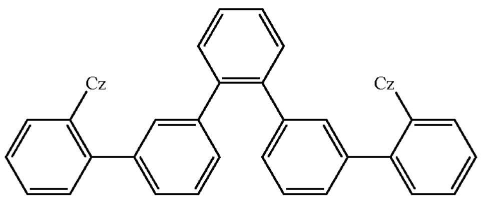
(C19)
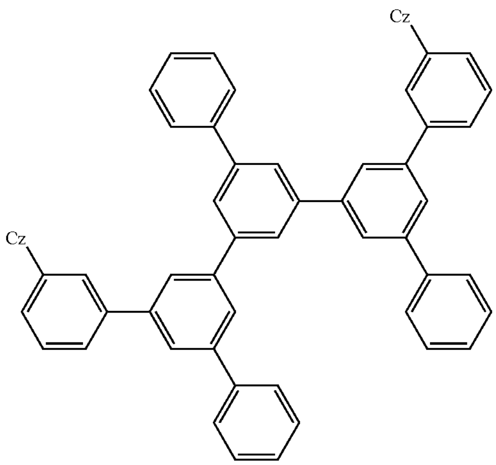
(C20)
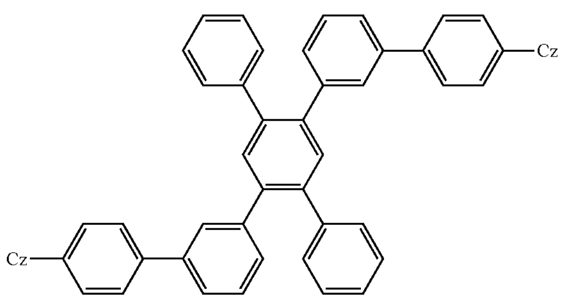
(C21)
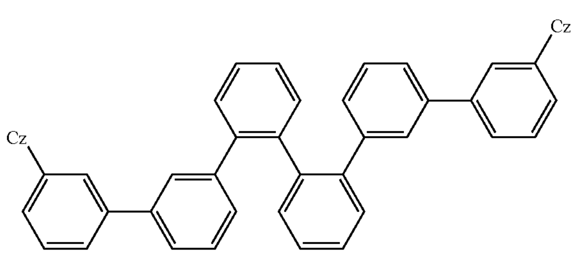
(C22)
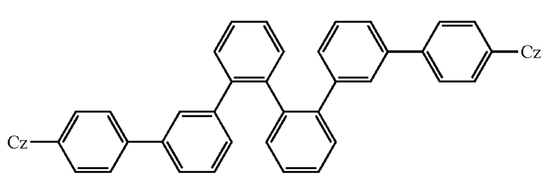
-continued
(C23)
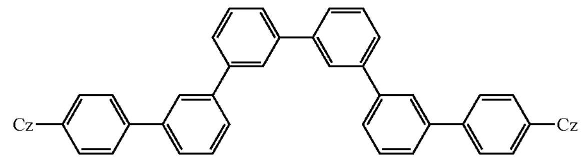
(C24)
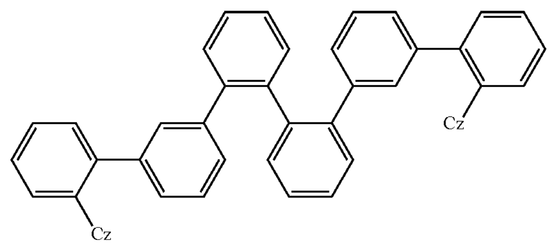
(C25)
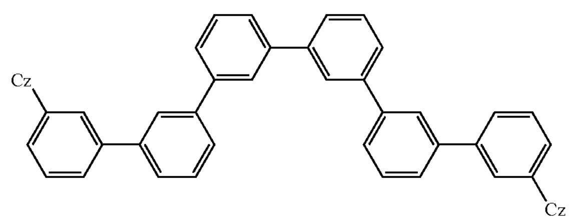
[Chemical Formula 16]
(C26)
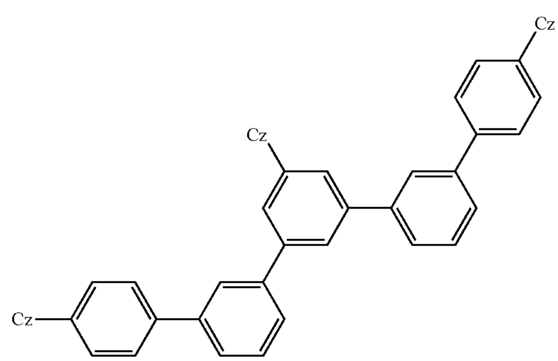
(C27)
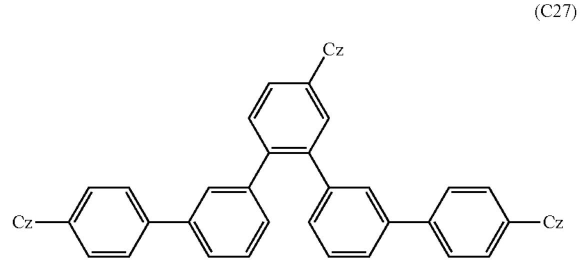

-continued
(C28)
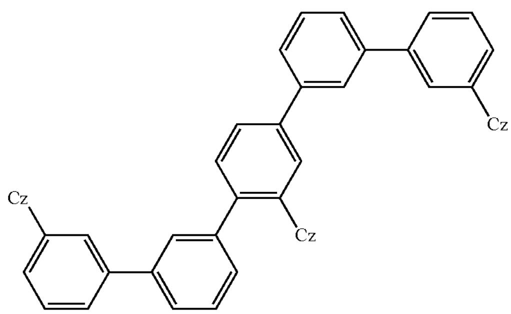
(C29)
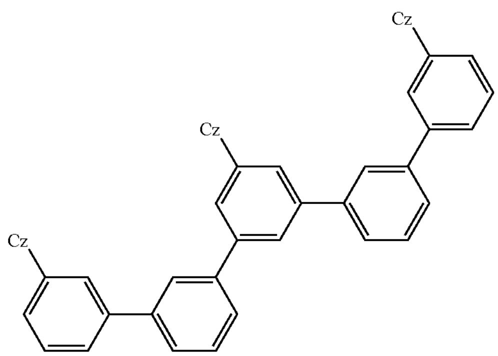
(C30)
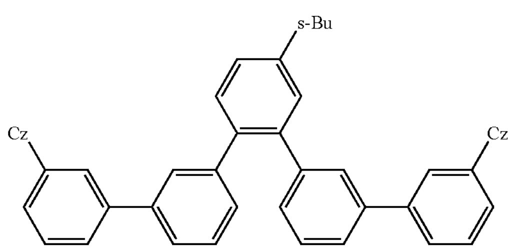
(C31)
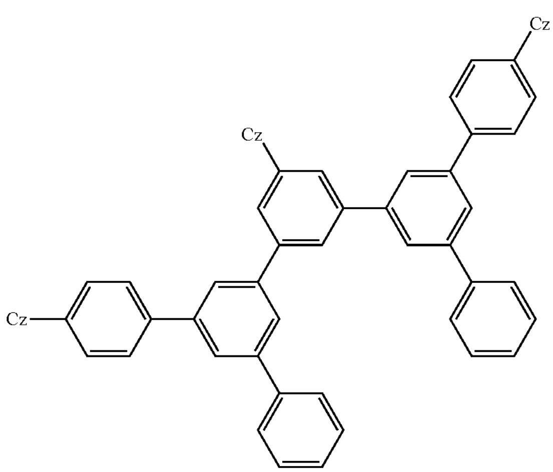
-continued
(C32)
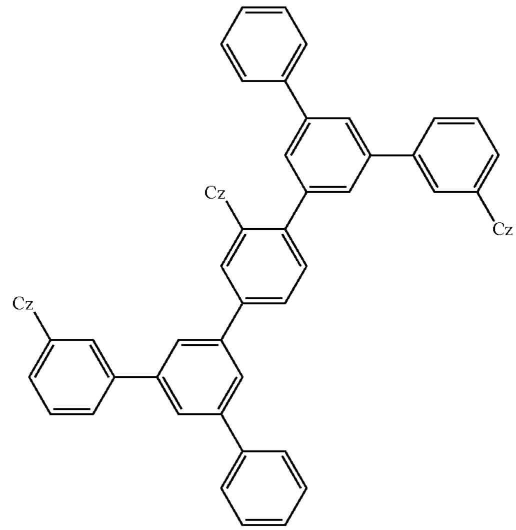
(C33)
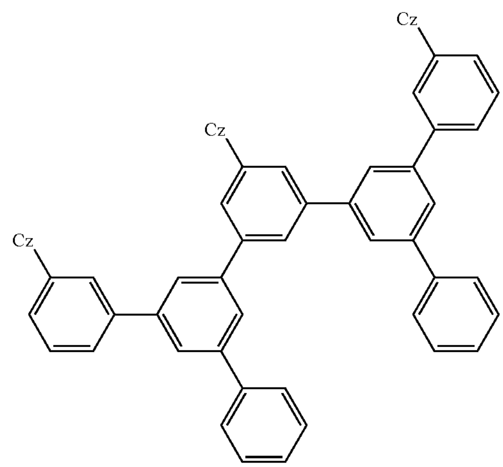
(C34)
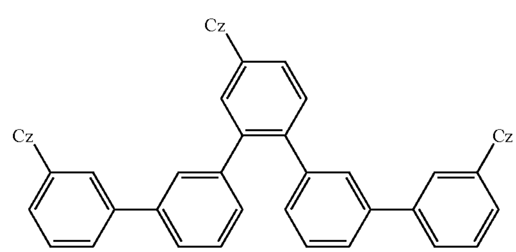
(C35)
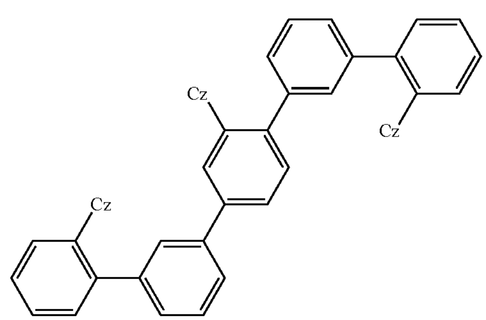

-continued
(C36)
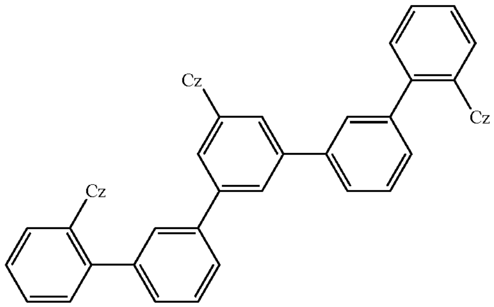
(C37)
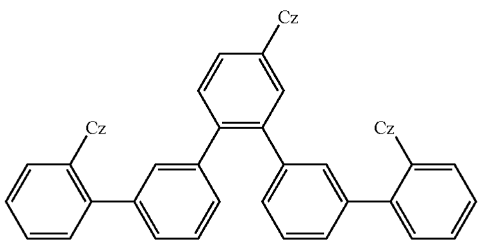
(C38)
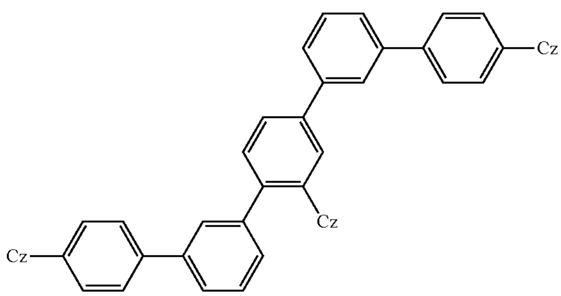
(C39)
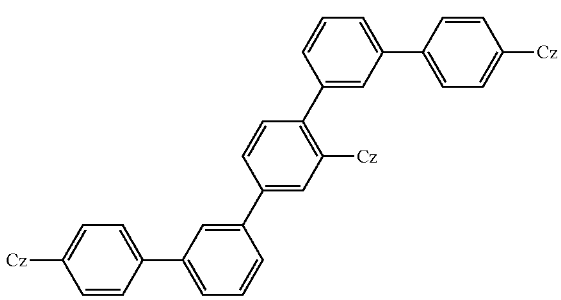
-continued
[Chemical Formula 17]
(C40)
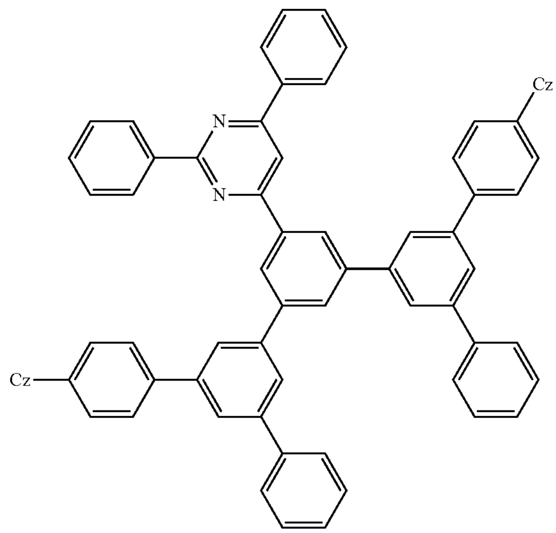
(C41)
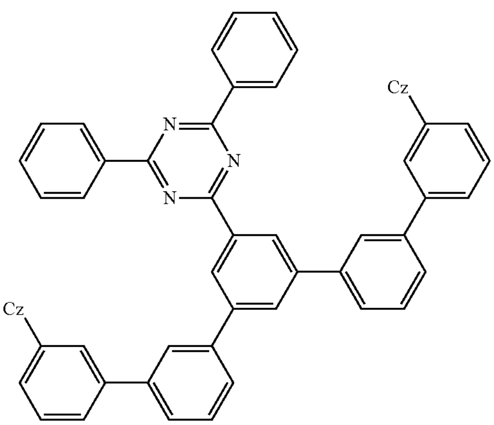
(C42)
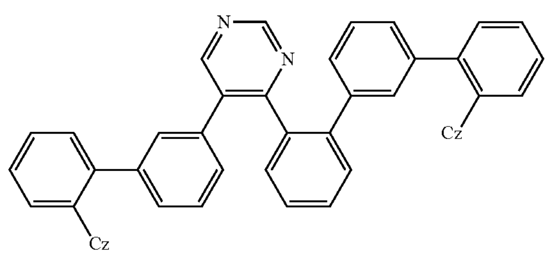

-continued
(C43)
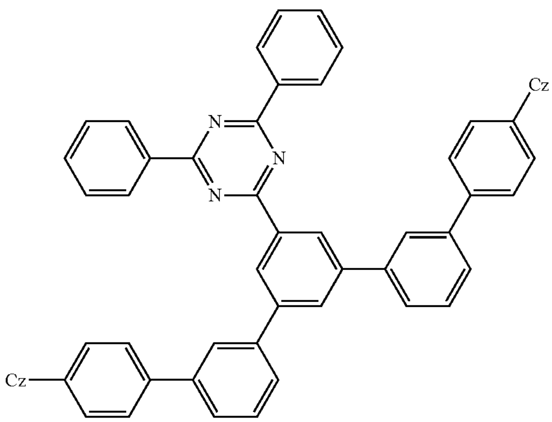
(C44)
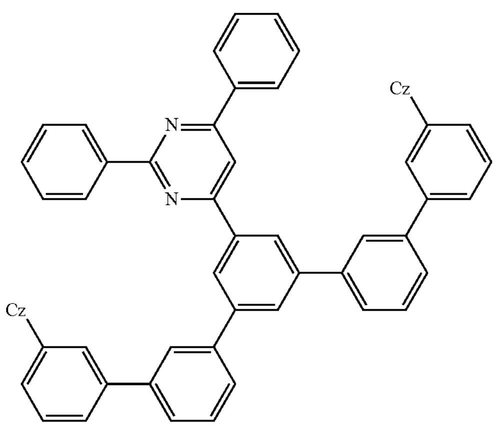
(C45)
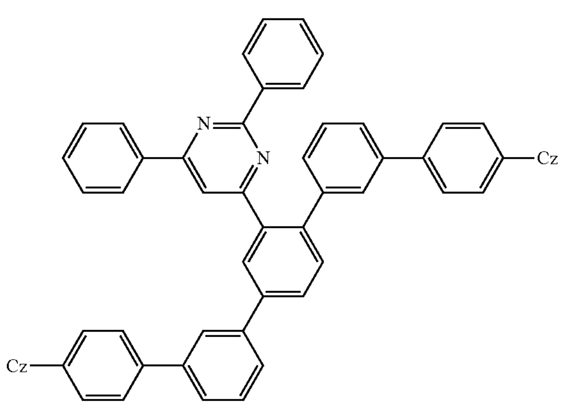
(C46)
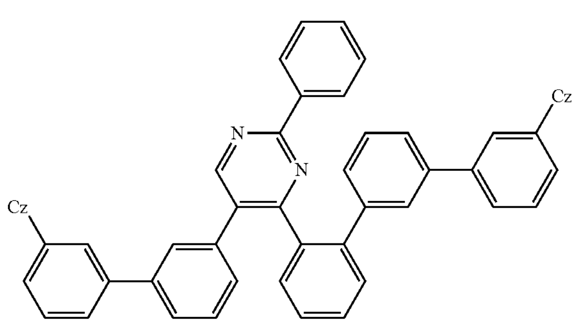
-continued
(C47)
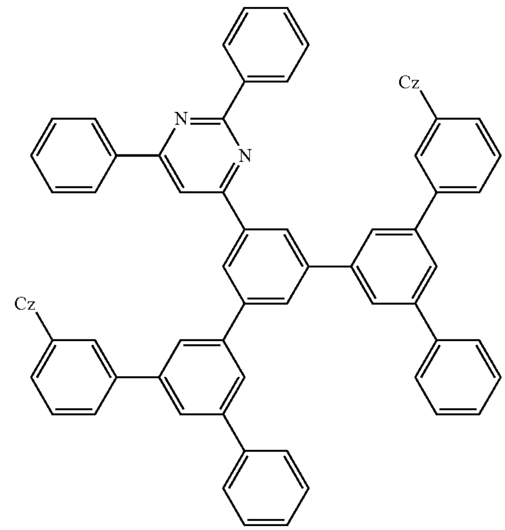
(C48)
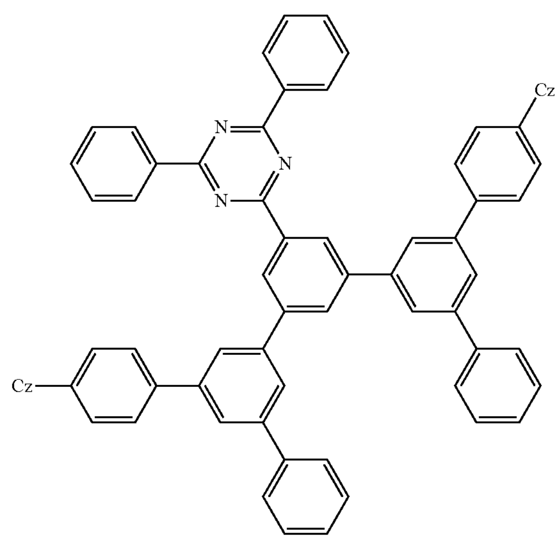
(C49)
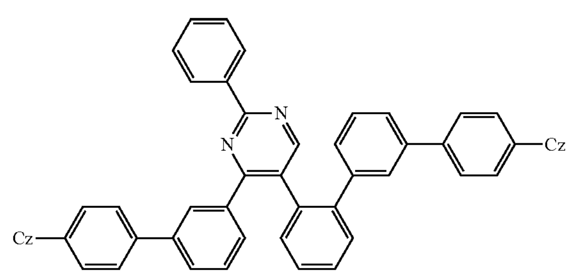

(C50)
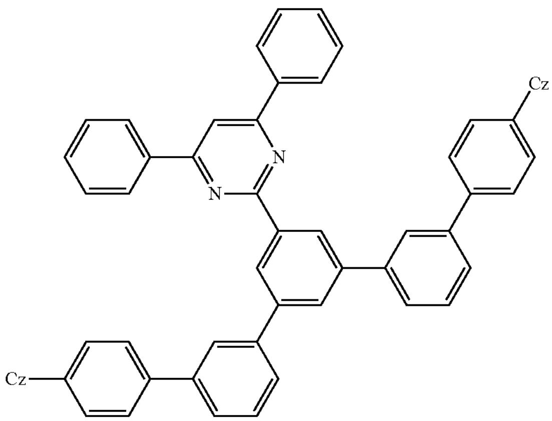
(C51)
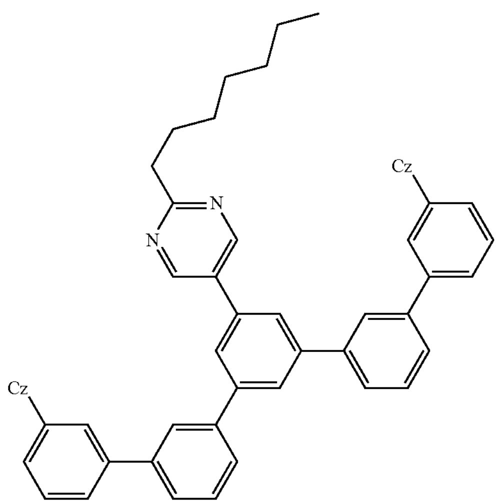
(C52)
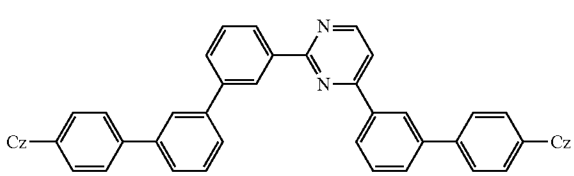
(C53)
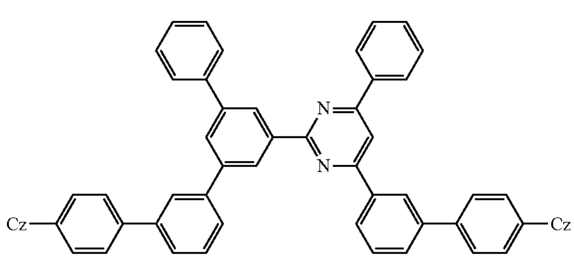
(C54)
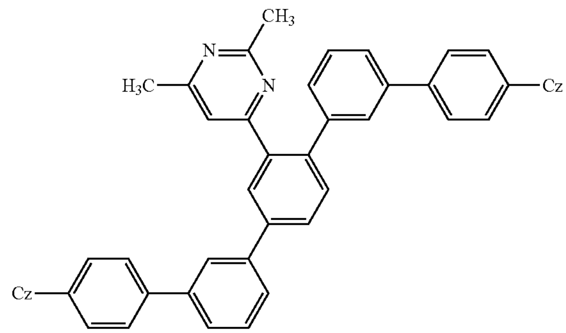
(C55)
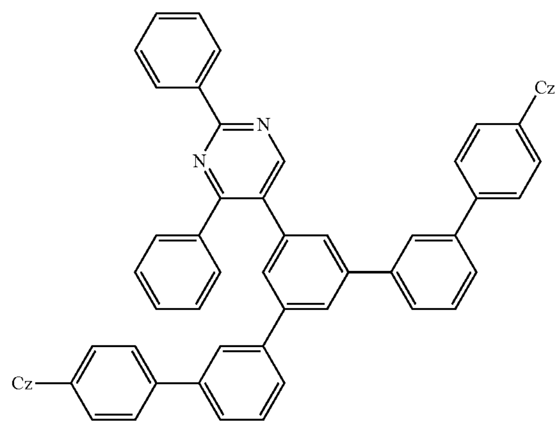
(C56)
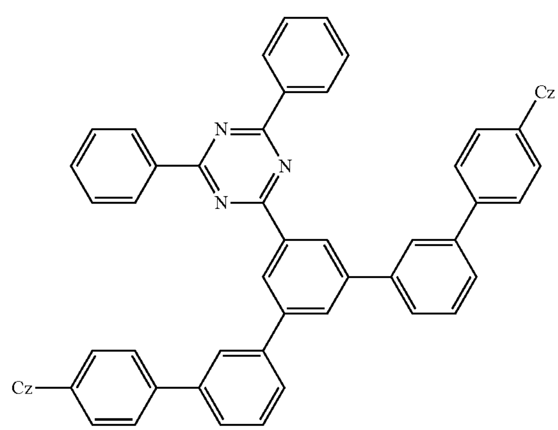

-continued
(C57)
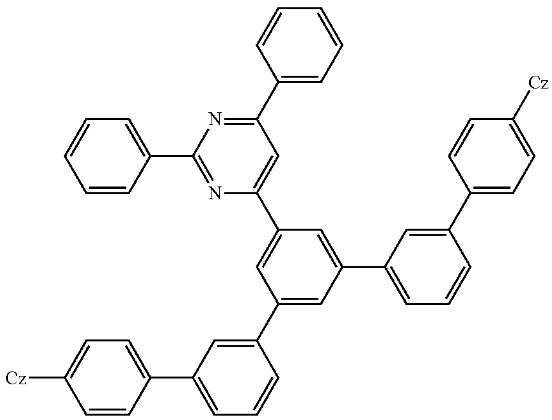
(C58)
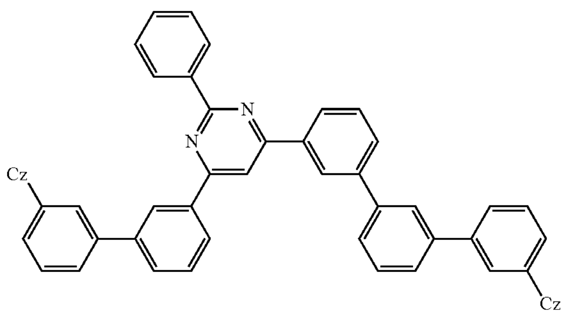
(C59)
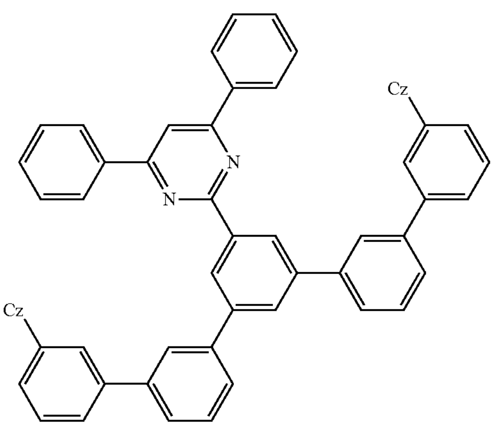
(C60)
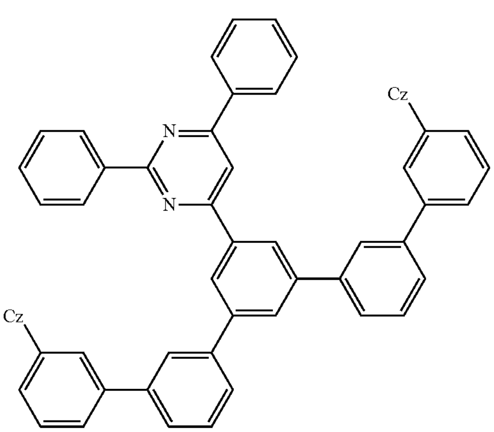
-continued
(C61)
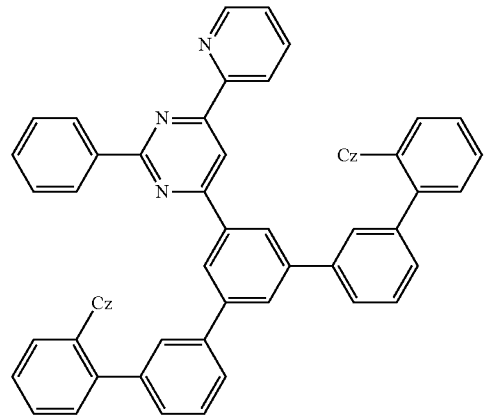
(C62)
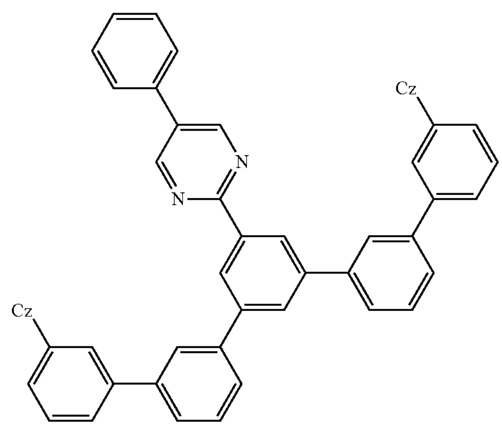
(C63)
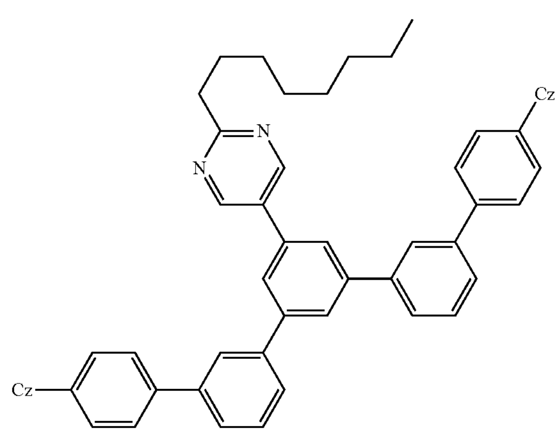

-continued
(C64)
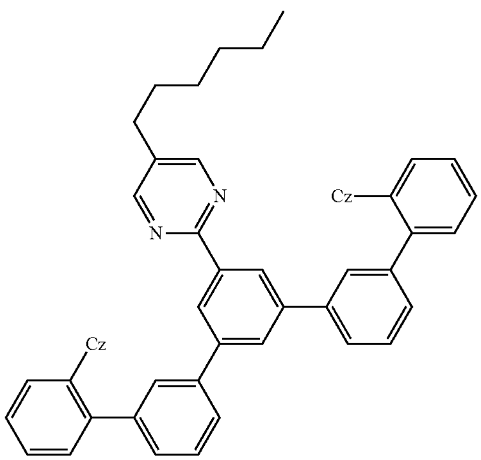
[Chemical Formula 18]
(C65)
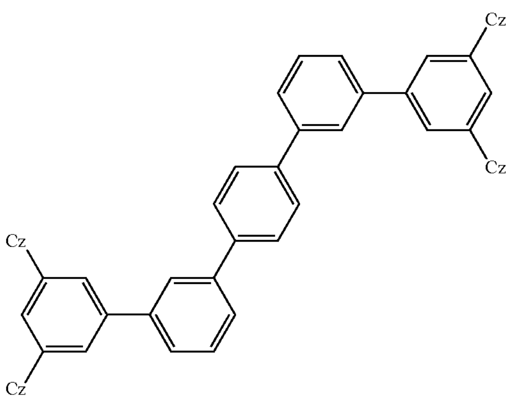
(C66)
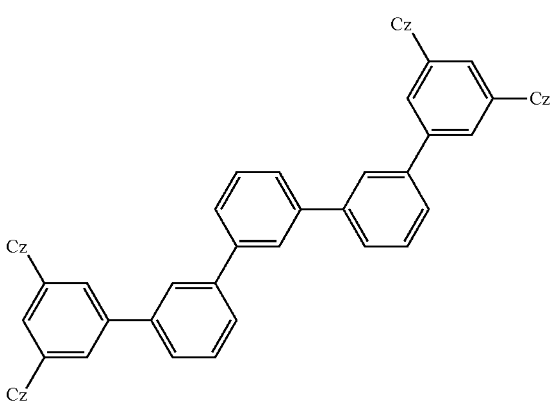
(C67)
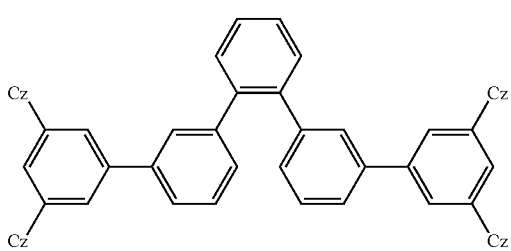
-continued
(C68)
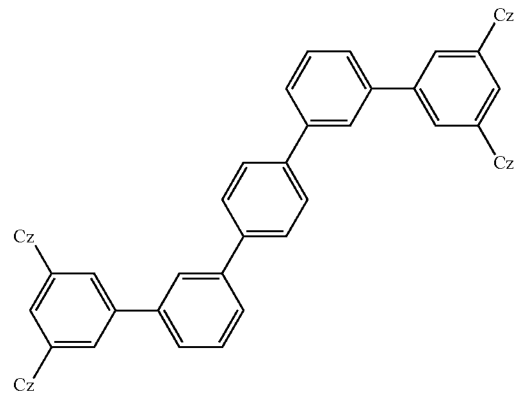
(C69)
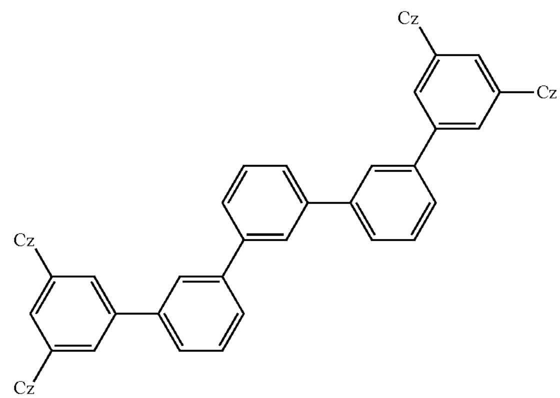
(C70)
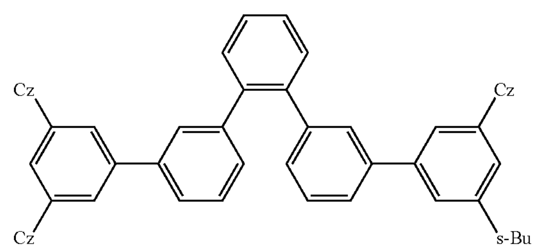
(C71)
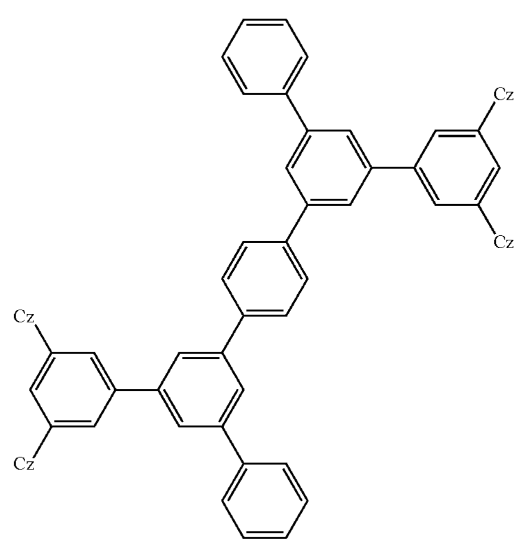

-continued
(C72)
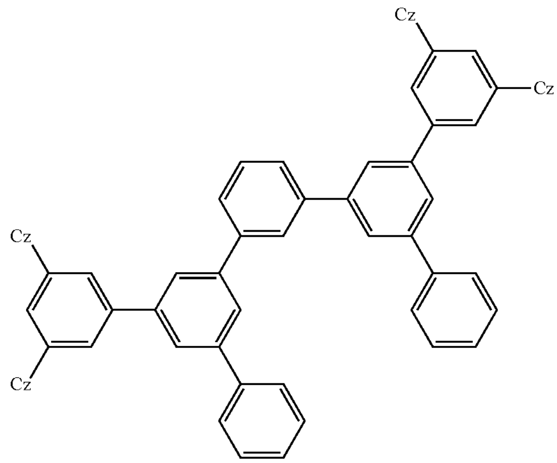
(C73)
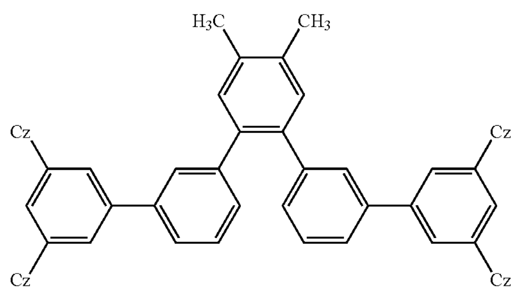
(C74)
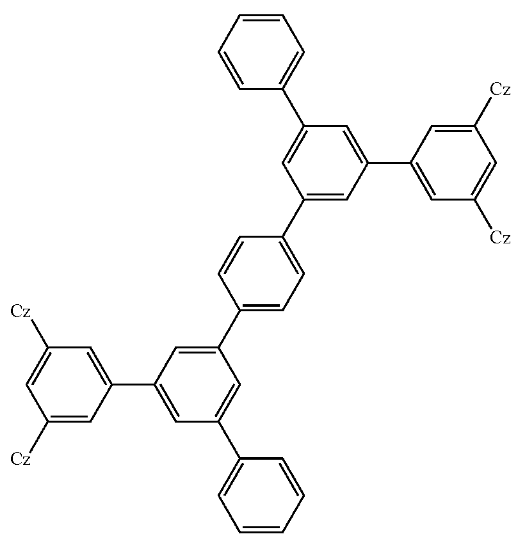
-continued
(C75)
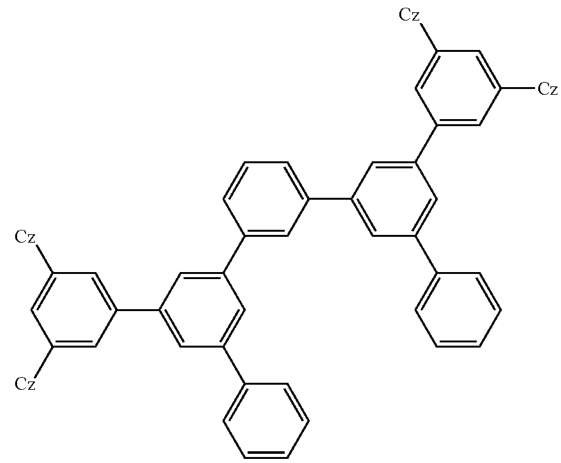
(C76)
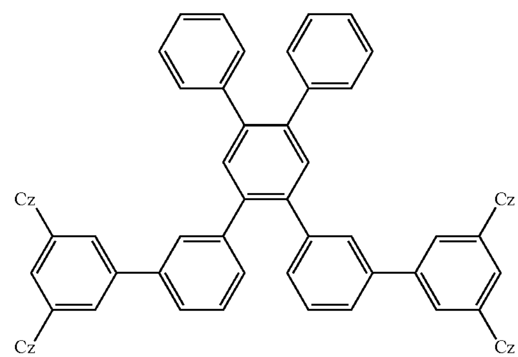
(C77)
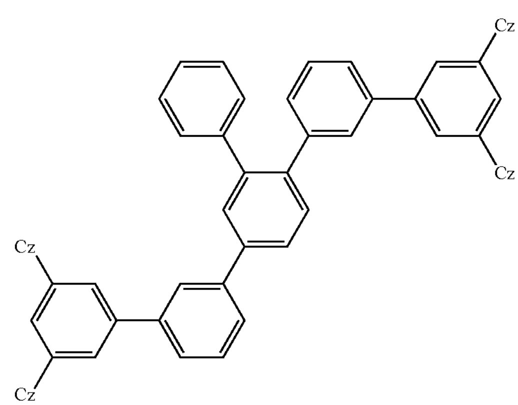

-continued
(C78)
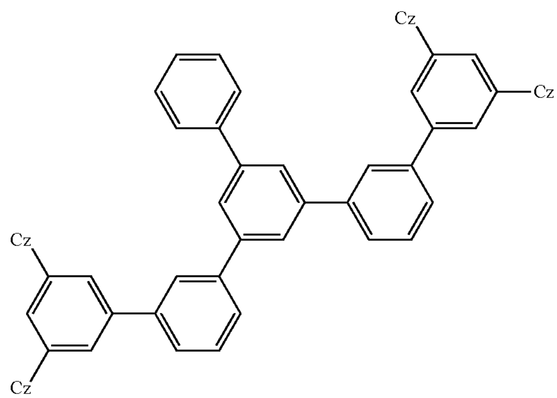
(C79)
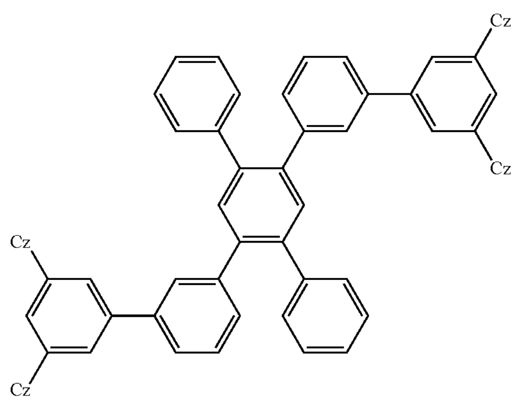
(C80)
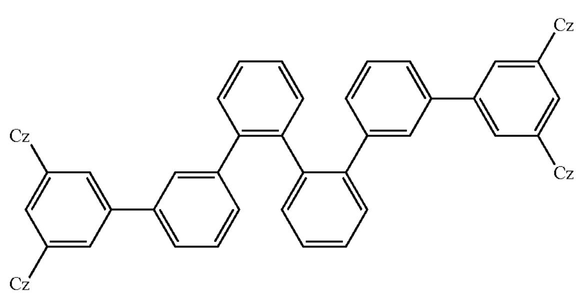
(C81)
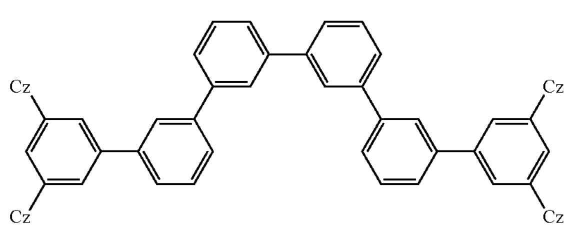
-continued
(C82)
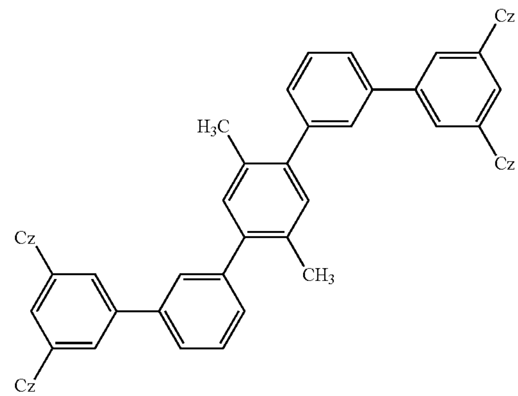
(C83)
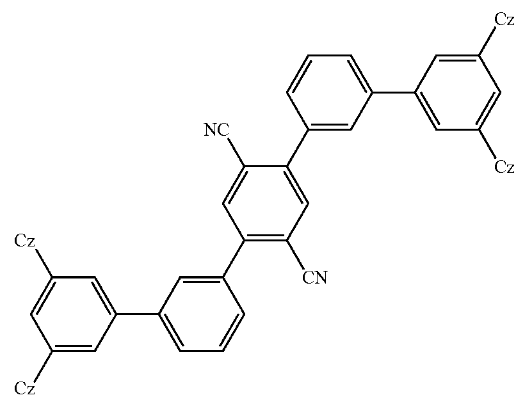
(C84)
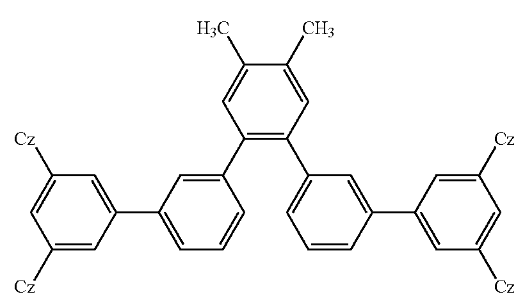

[Chemical Formula 19]
(C85)
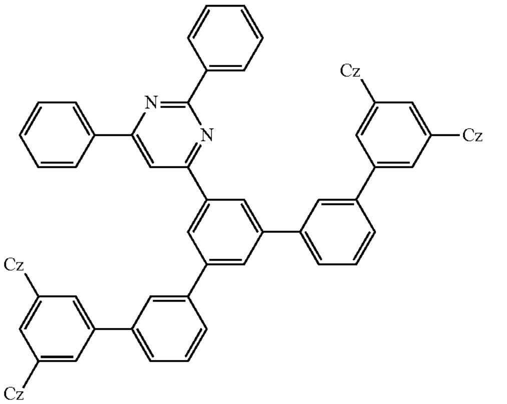
(C86)
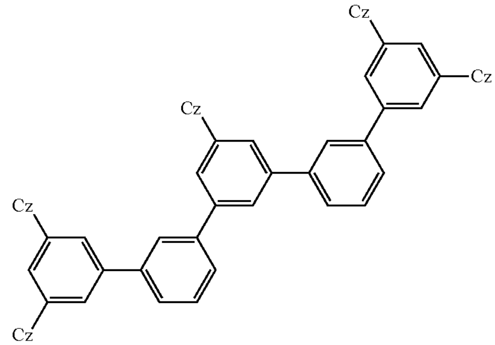
(C87)
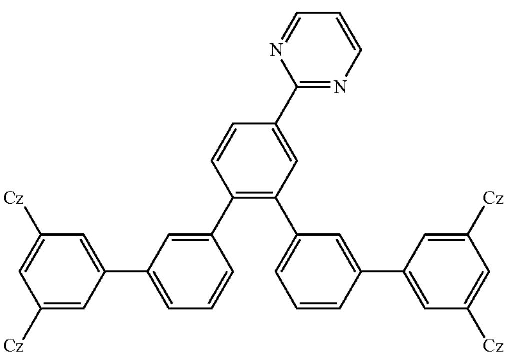
(C88)
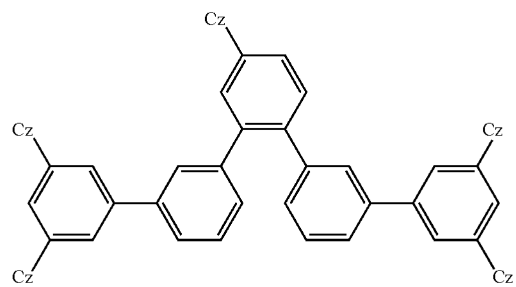
(C89)
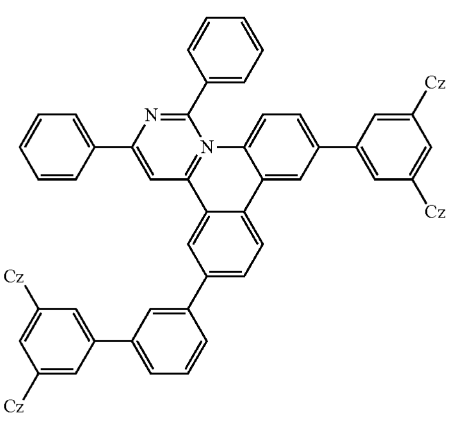
(C90)
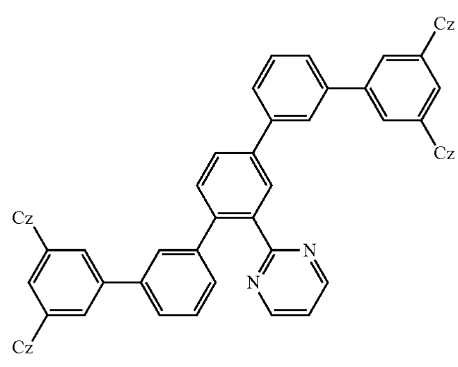

-continued
(C91)
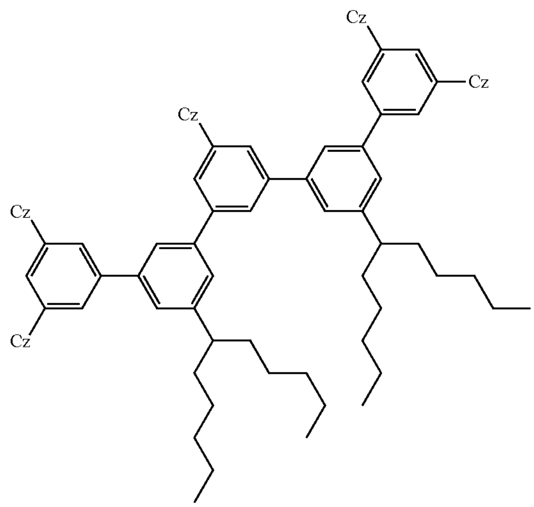
(C92)
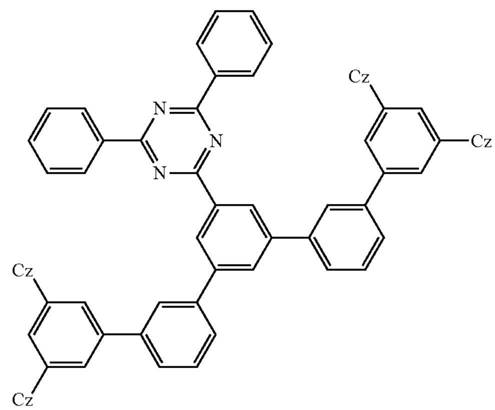
(C93)
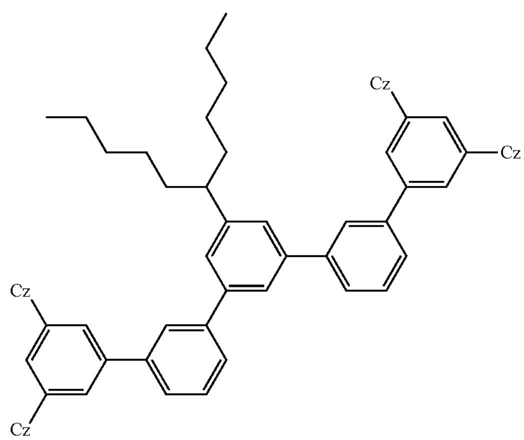
(C94)
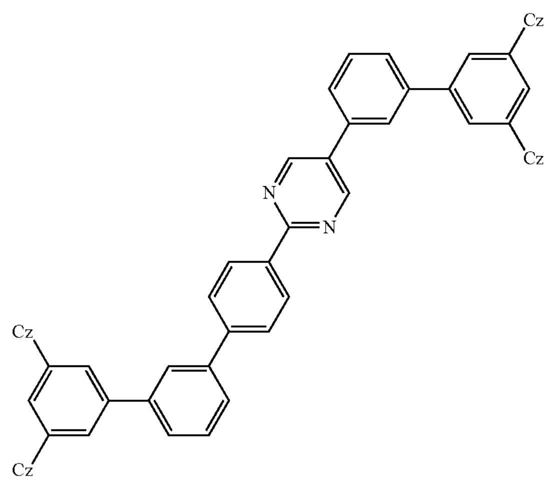
(C95)
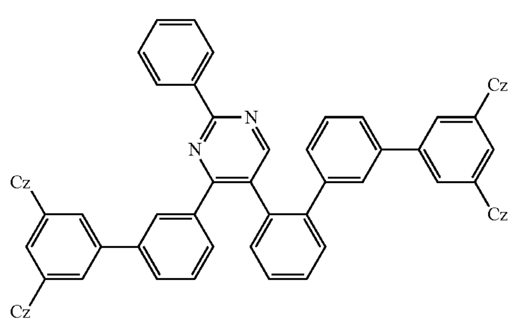
(C96)
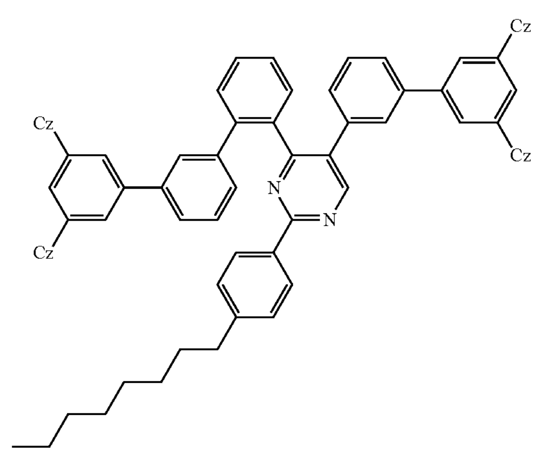

-continued
(C97)
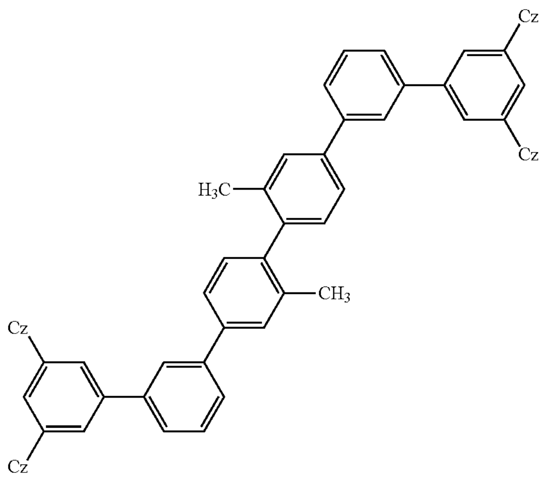
(C98)
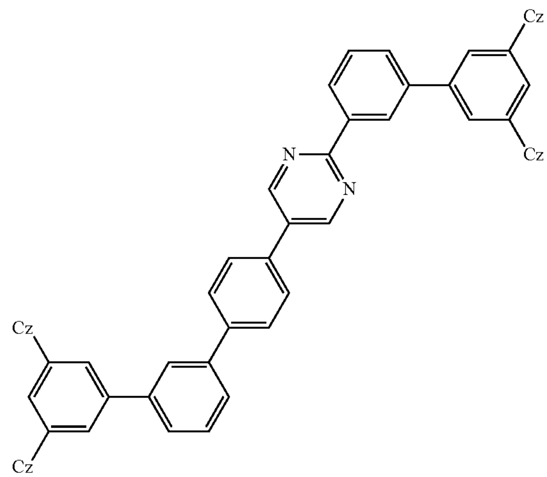
(C99)
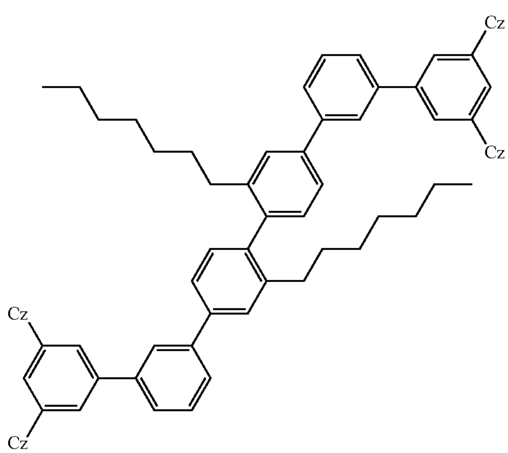
(C100)
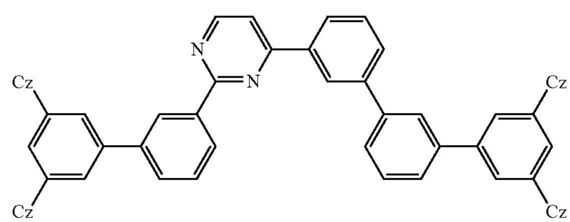
(C101)
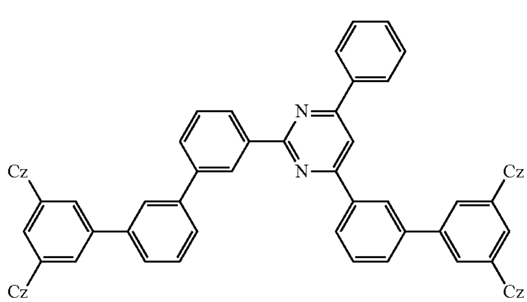
(C102)
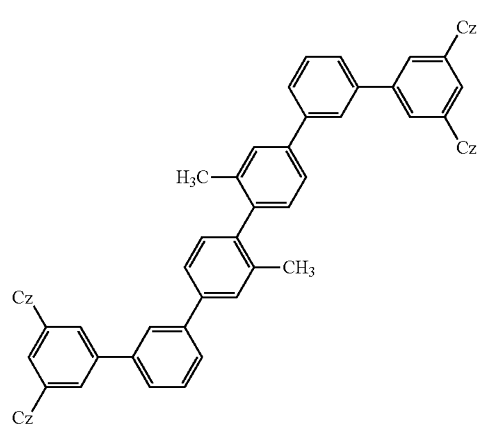

-continued
(C103)
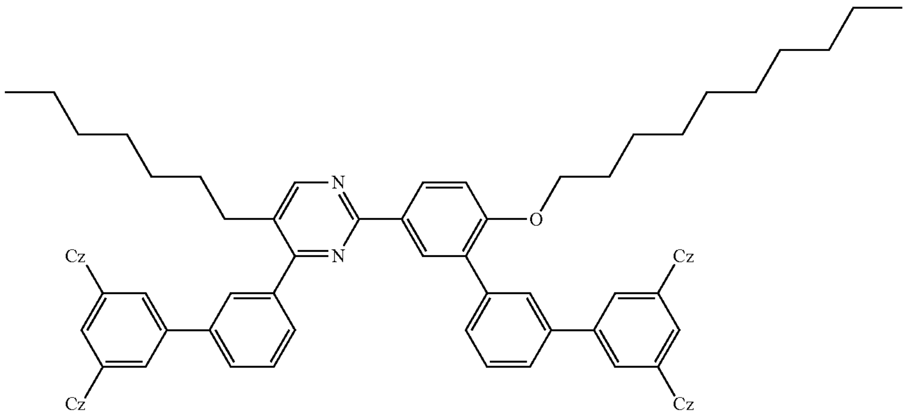
(C104)
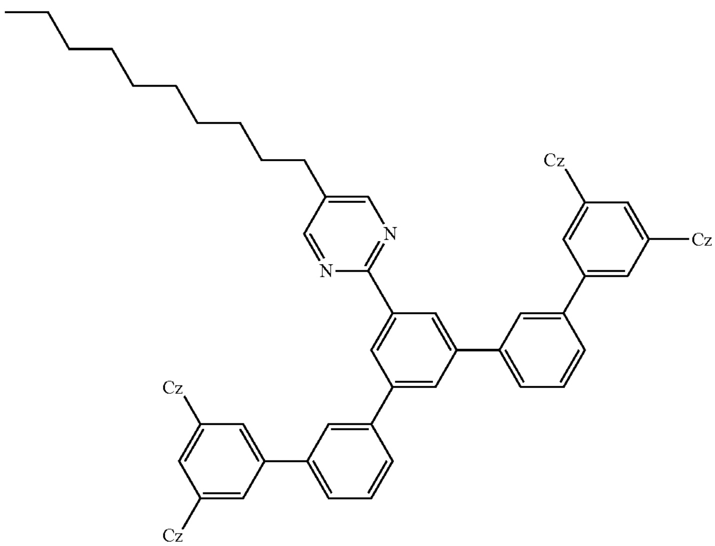
[Chemical Formula 20]
(C105)
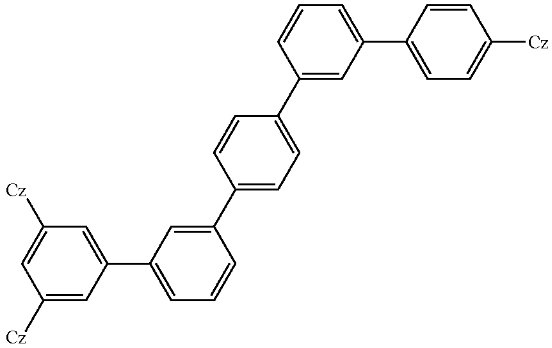
(C106)
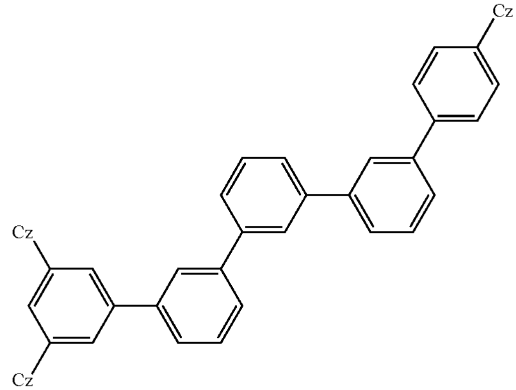

-continued
(C107)
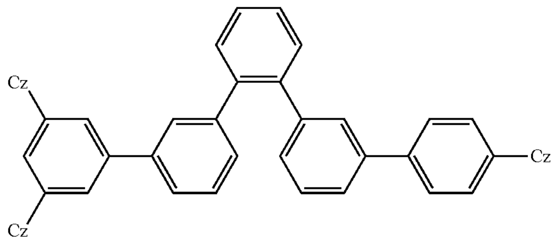
(C108)
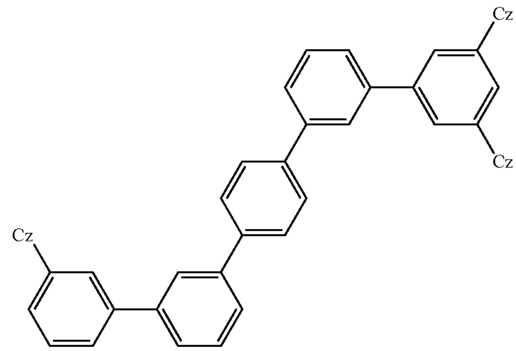
(C109)
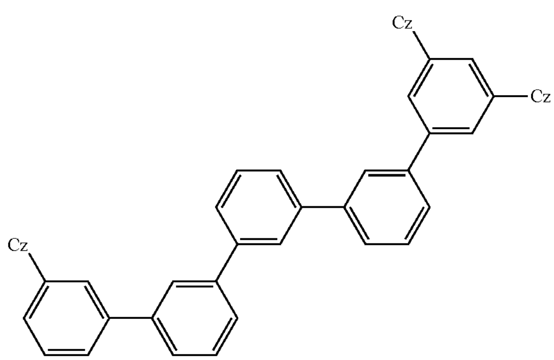
(C110)
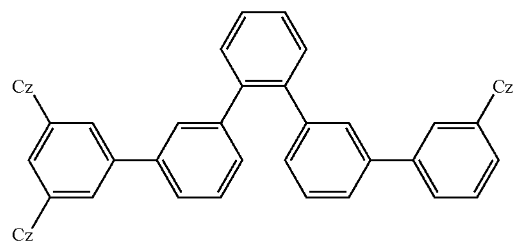
(C111)
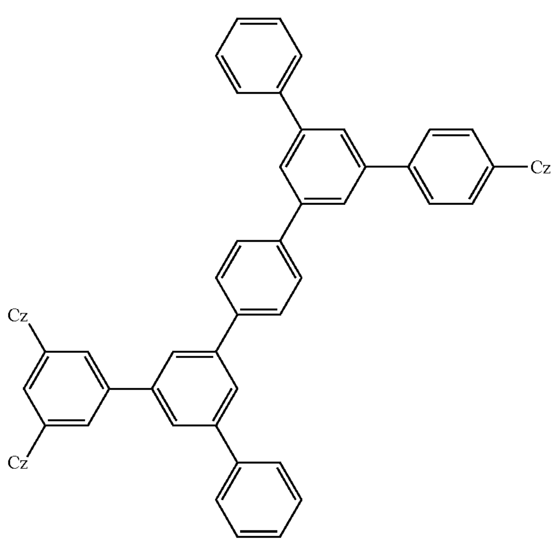
(C112)
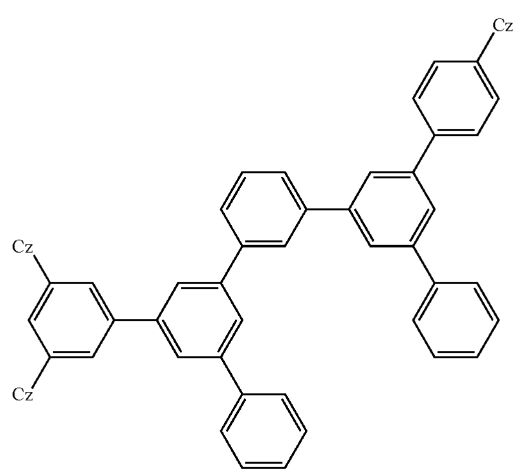

-continued
(C113)
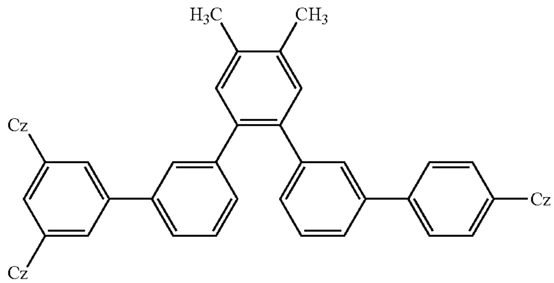
(C114)
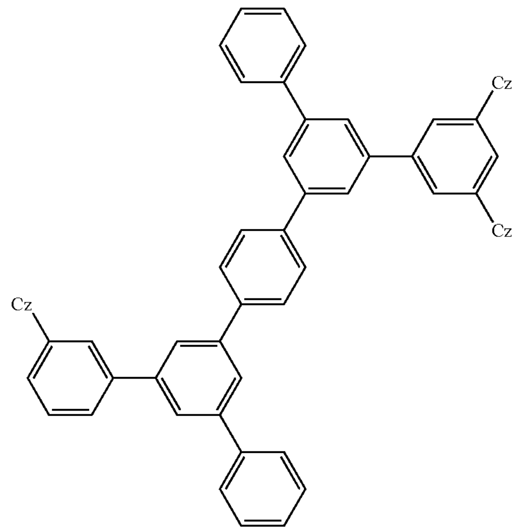
(C115)
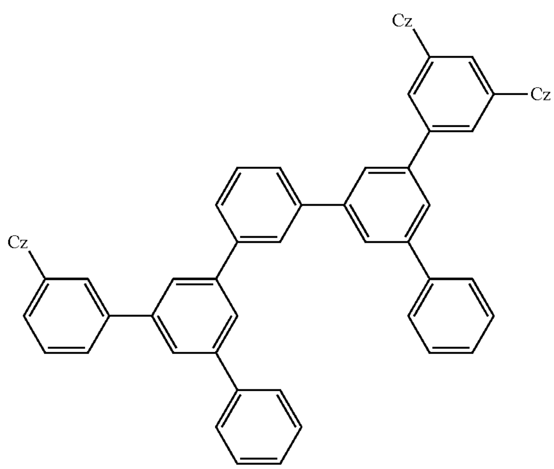
(C116)
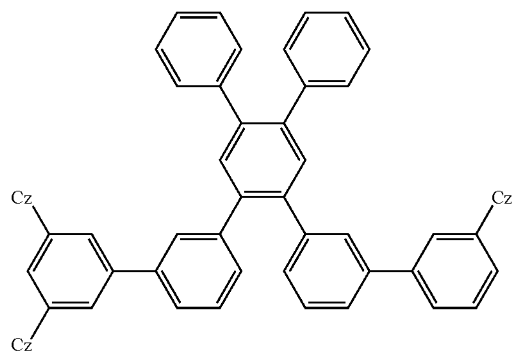
(C117)
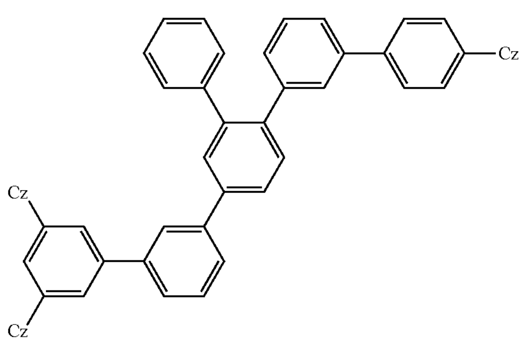
(C118)
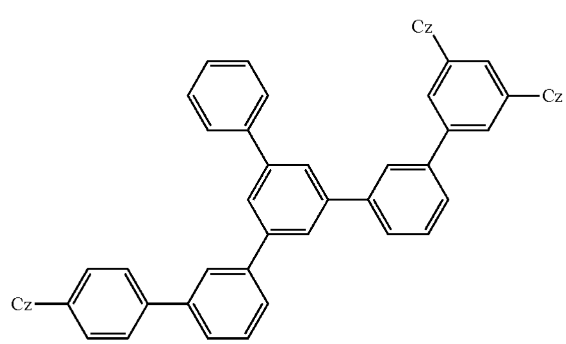

-continued
(C119)
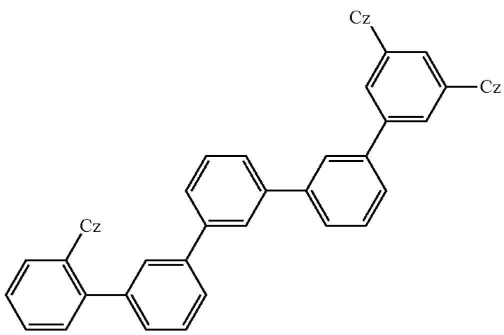
(C120)
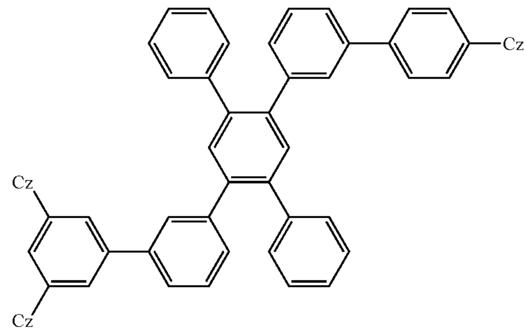
(C121)
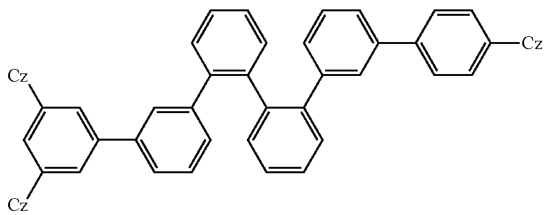
(C122)
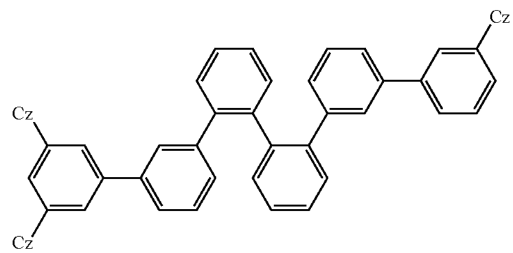
(C123)
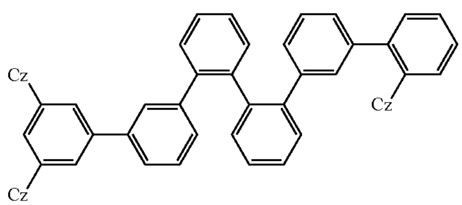
(C124)
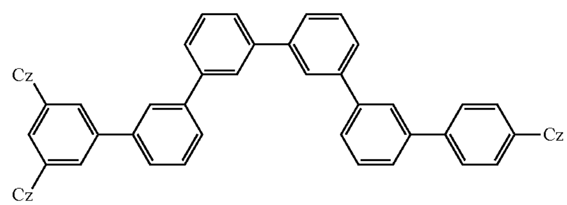
(C125)
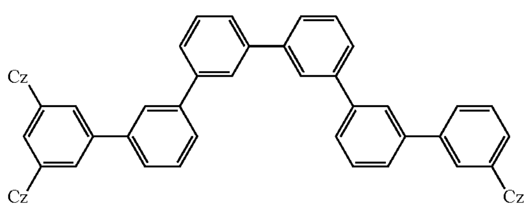
(C126)
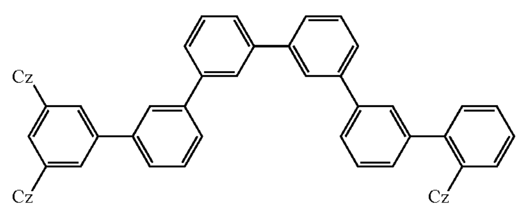
[Chemical Formula 21]
(C127)
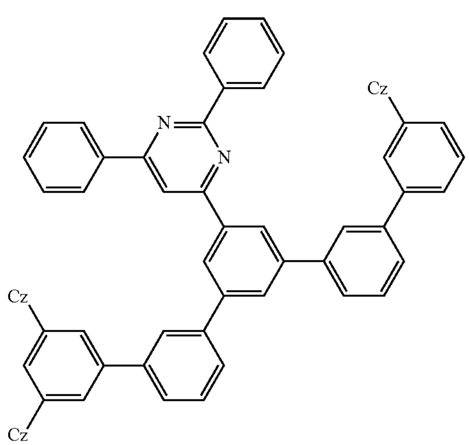
(C128)
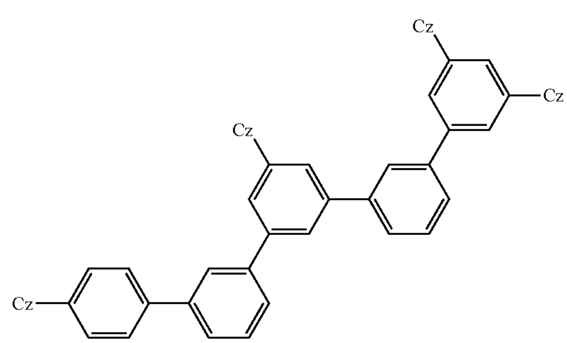

-continued
(C129)
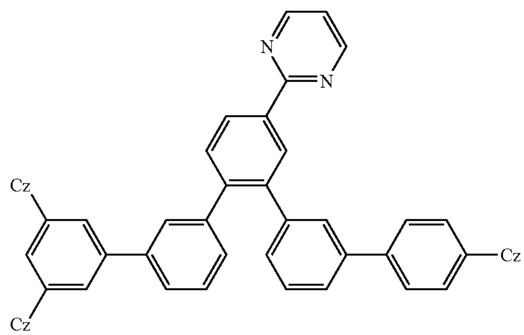
(C130)
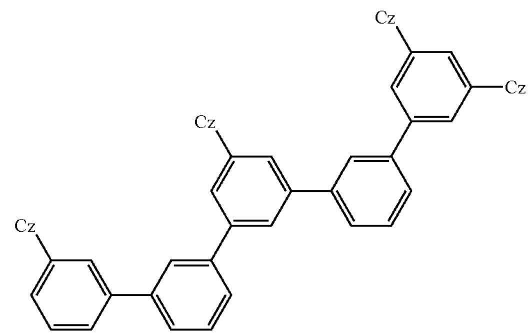
(C131)
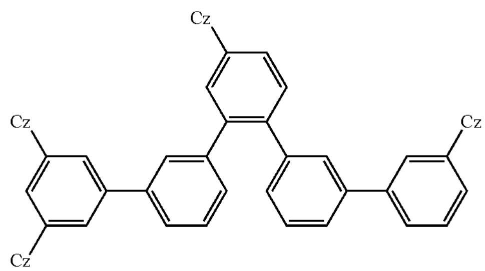
(C132)
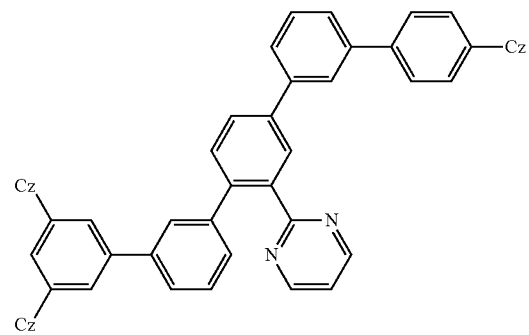
(C133)
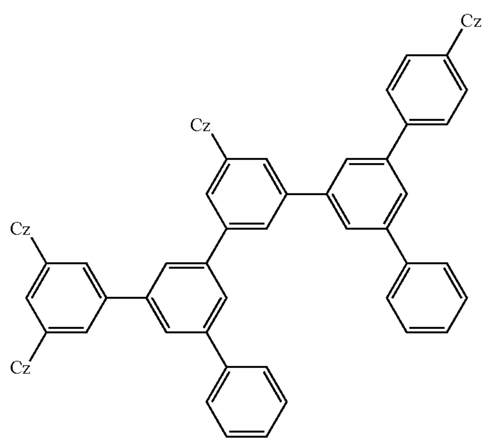
(134)
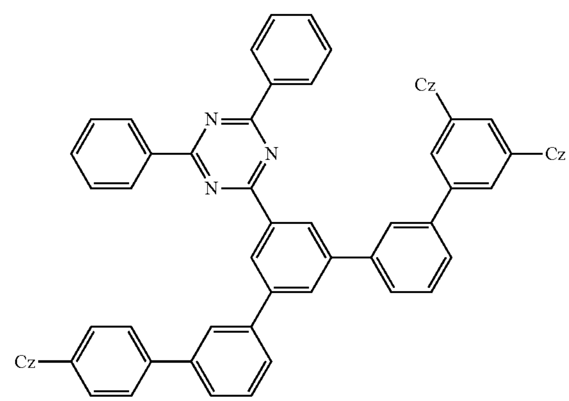
(C135)
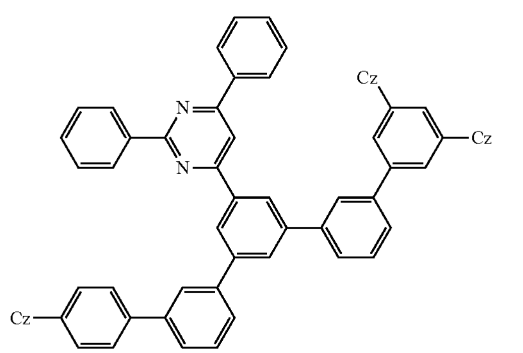
(C136)
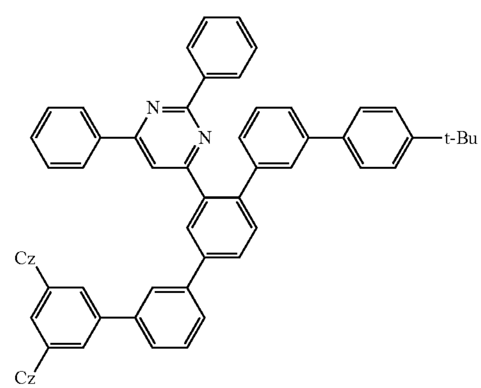

-continued
(C137)
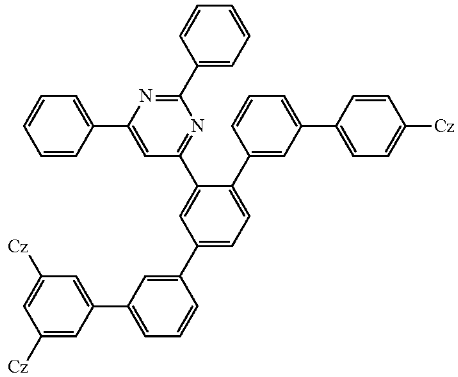
(C138)
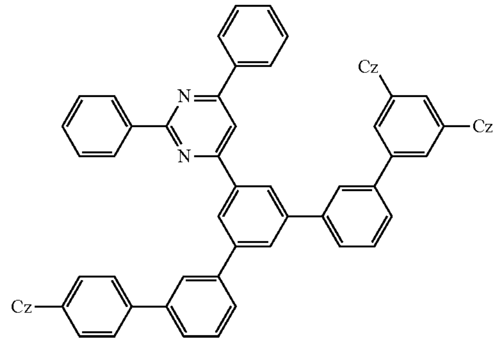
(C139)
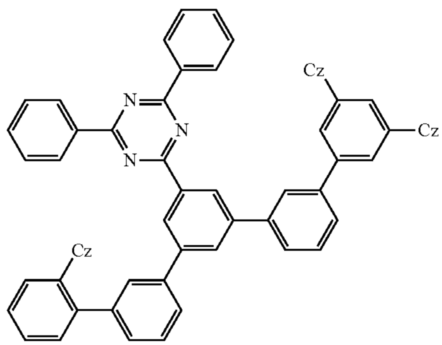
(C140)
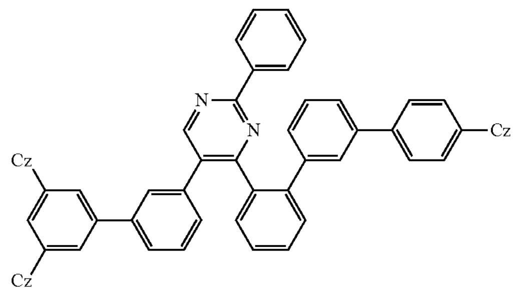
(C141)
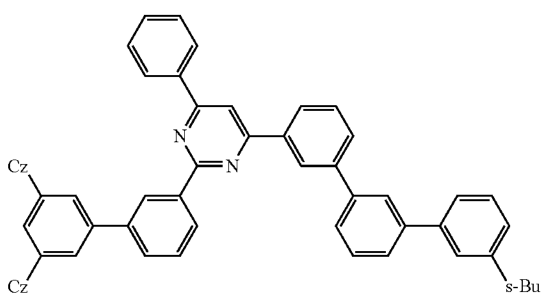
(C142)
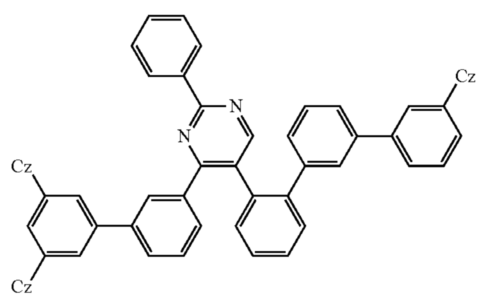
(C143)
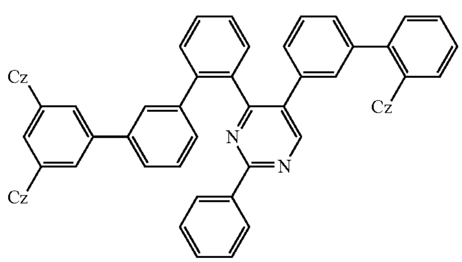
(C144)
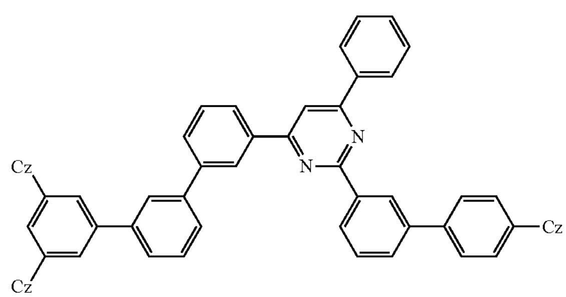

-continued
(C145)
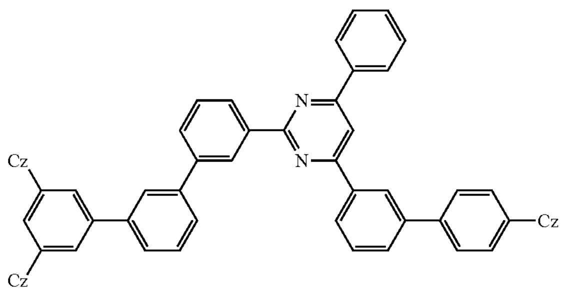
(C146)
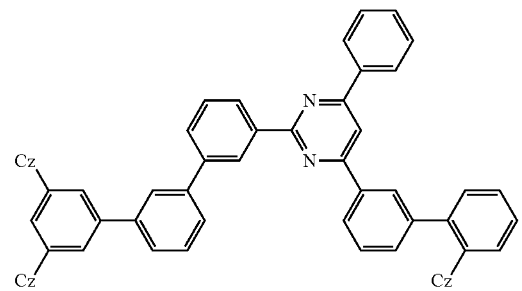
(C147)
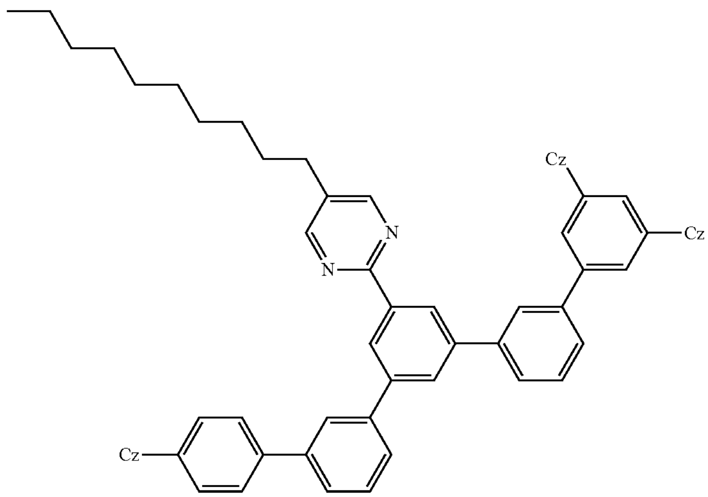
Examples of the host materials usable for the fluorescent host and the red phosphorescent host are carbazole derivatives shown below.
[Chemical Formula 22]
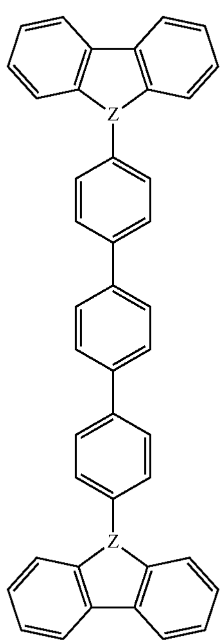
-continued
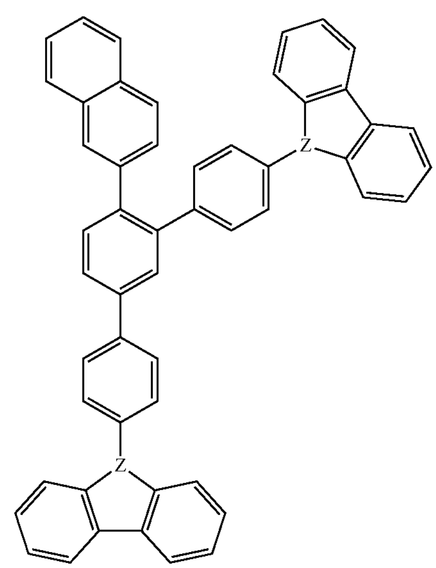

-continued
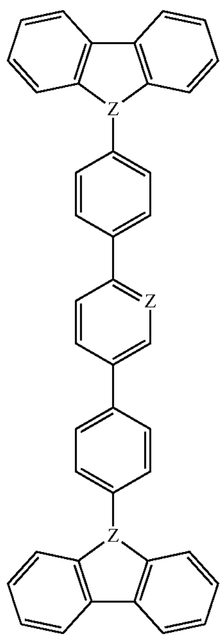
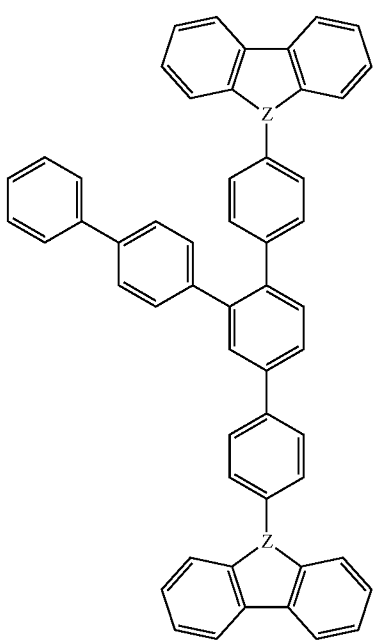
-continued
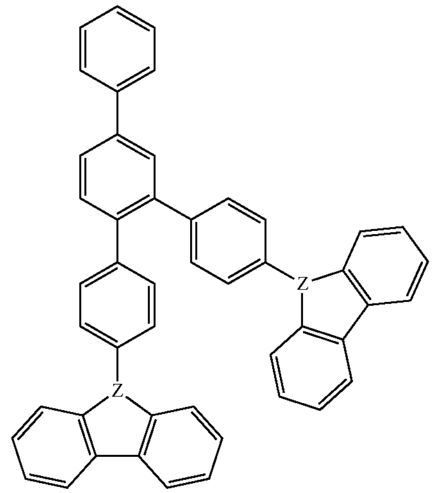
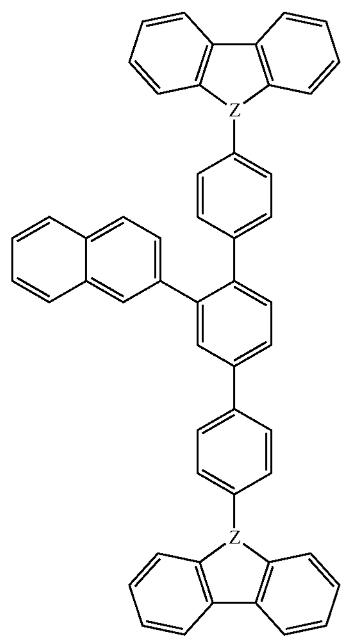
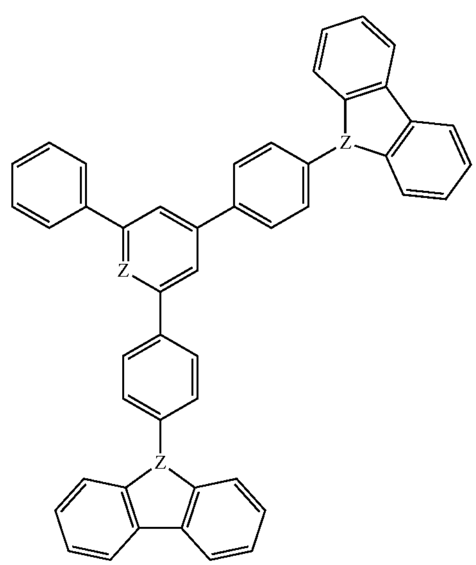

-continued
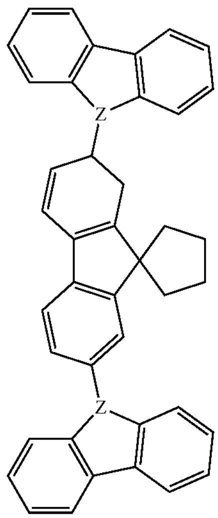
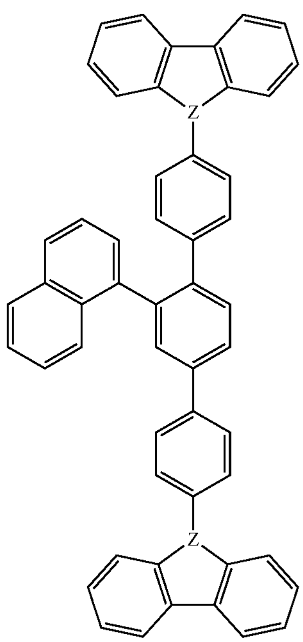
-continued
[Chemical Formula 23]
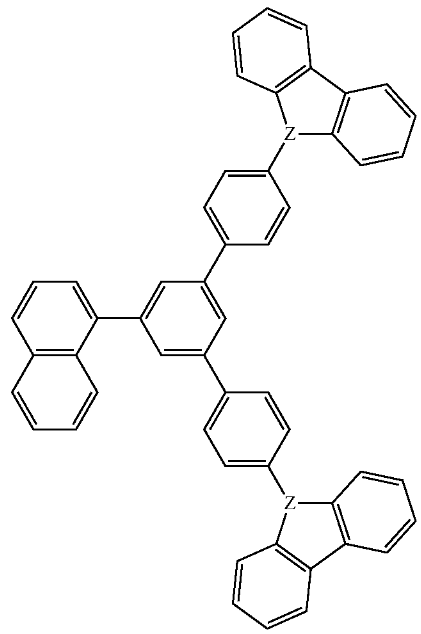
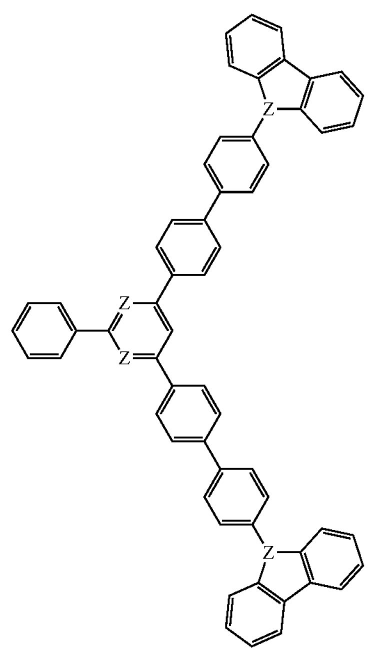

-continued
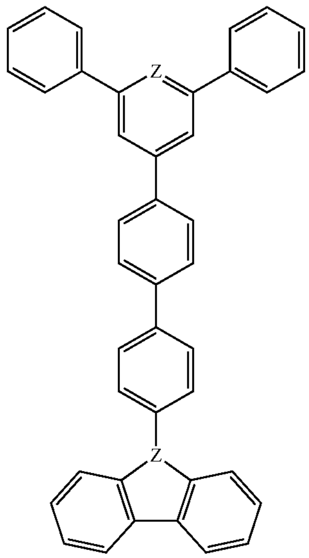
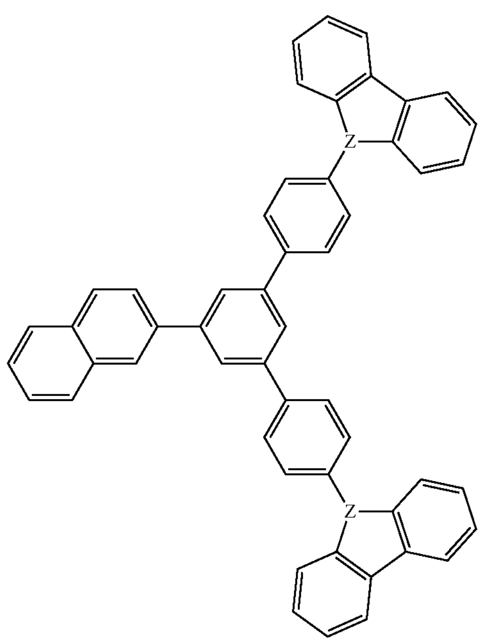
-continued
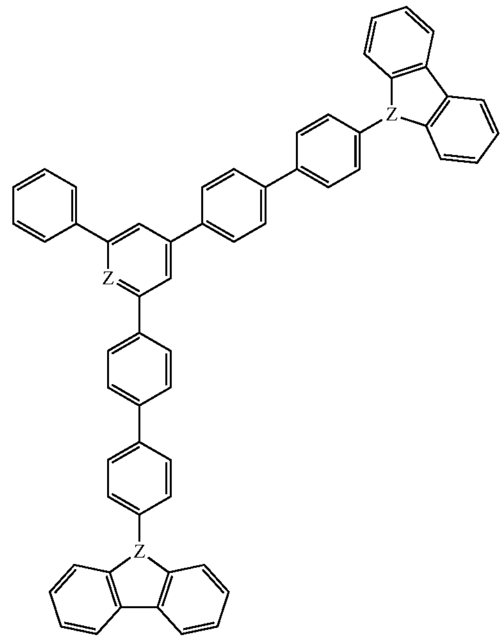
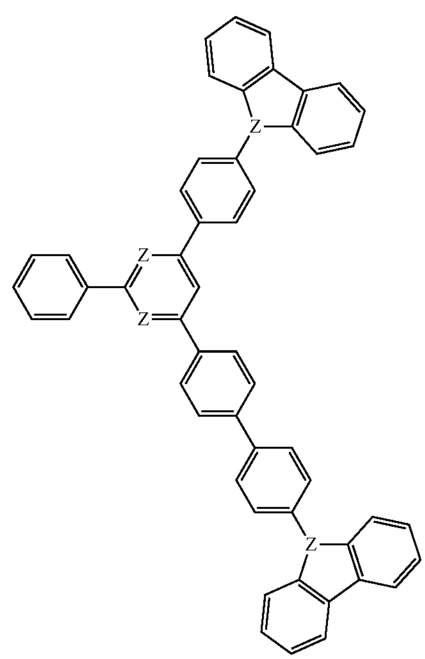

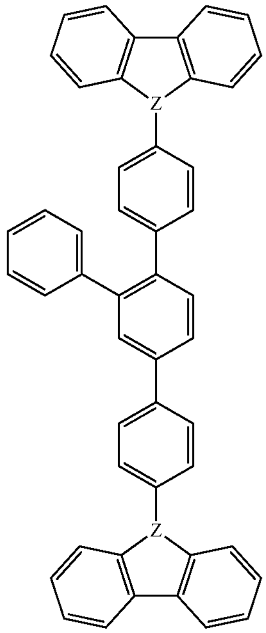
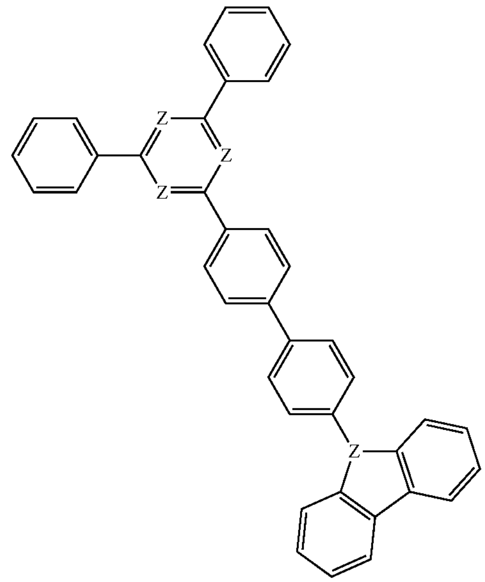
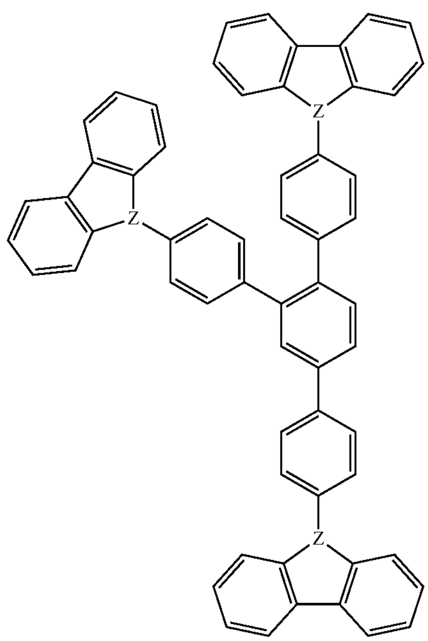
[Chemical Formula 24]
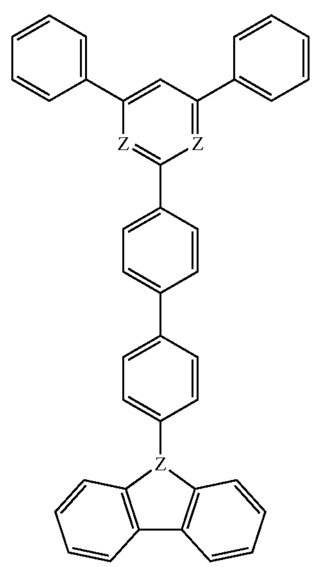

-continued
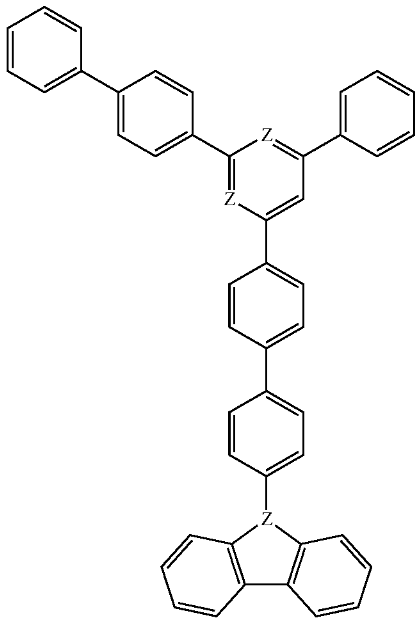
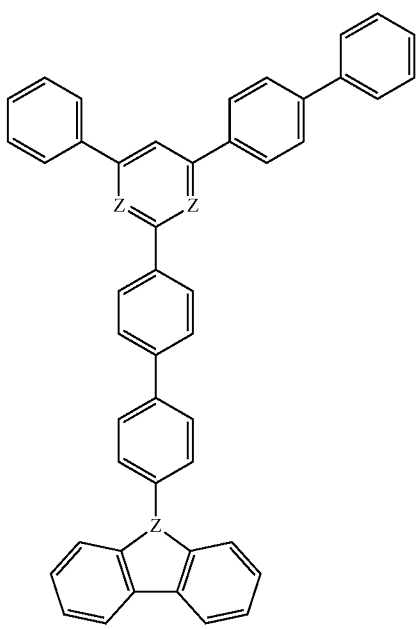
-continued
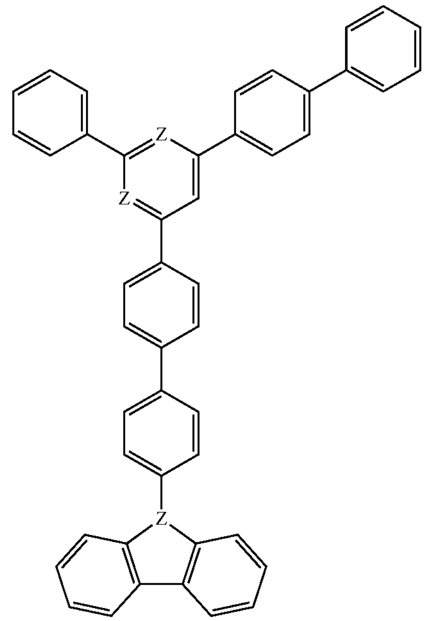
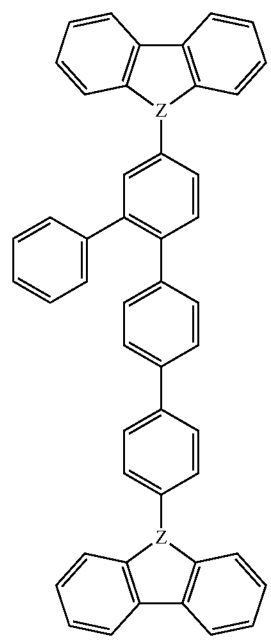

-continued
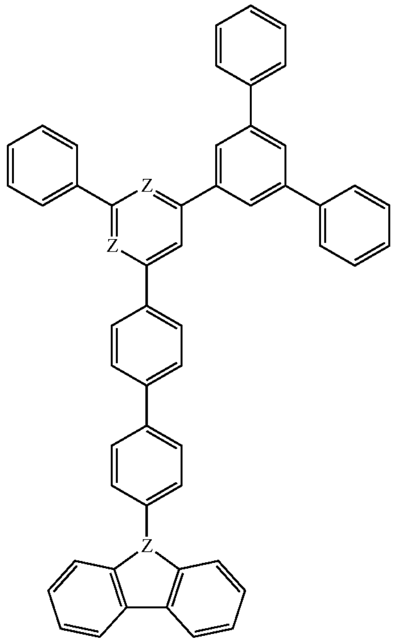
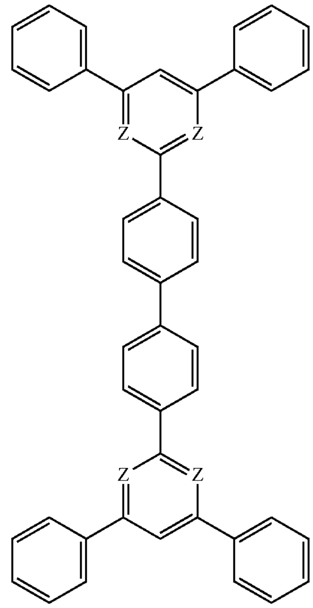
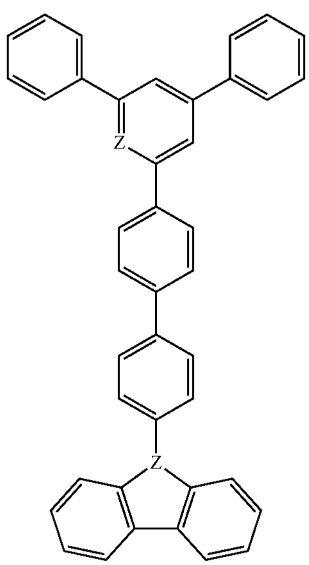
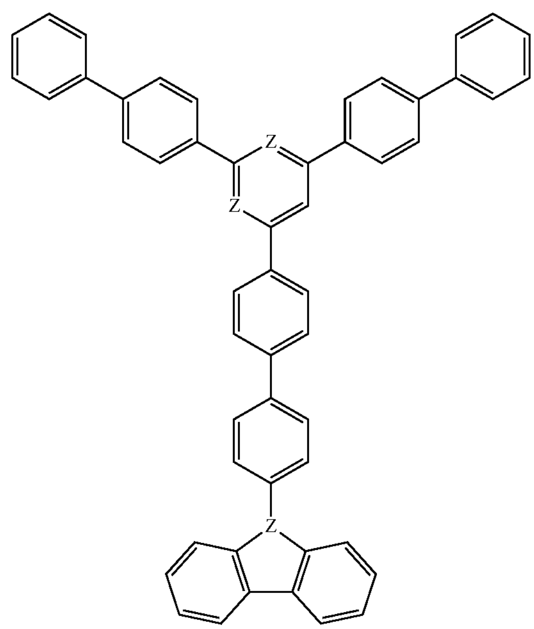

-continued
[Chemical Formula 25]
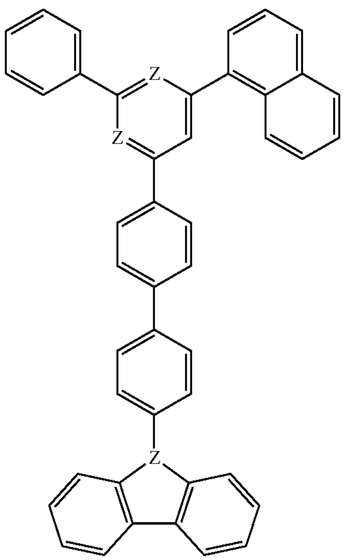
-continued
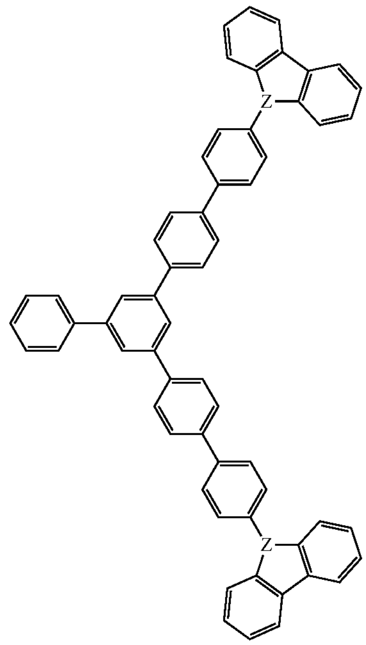
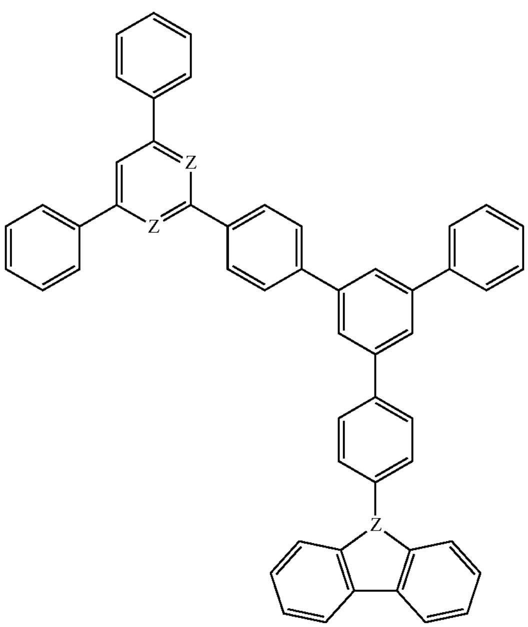
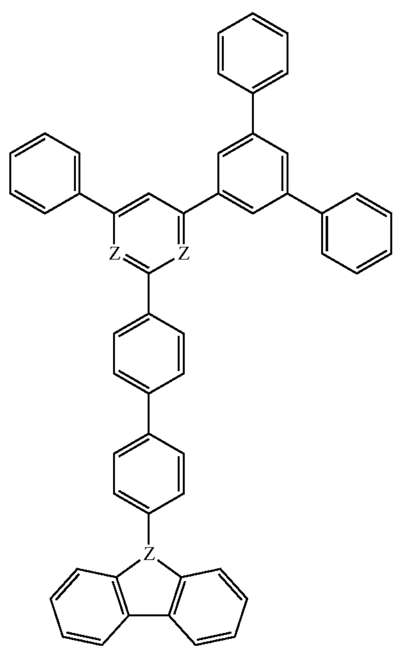

-continued
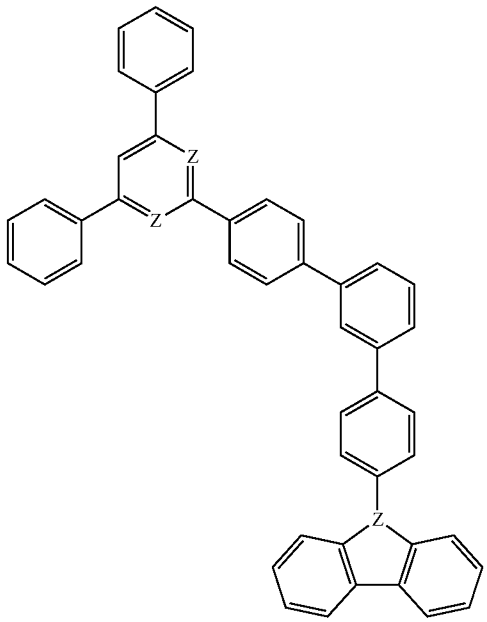
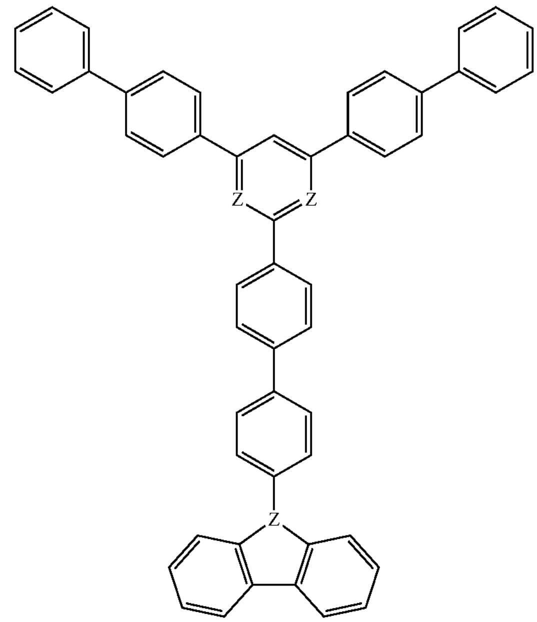
-continued
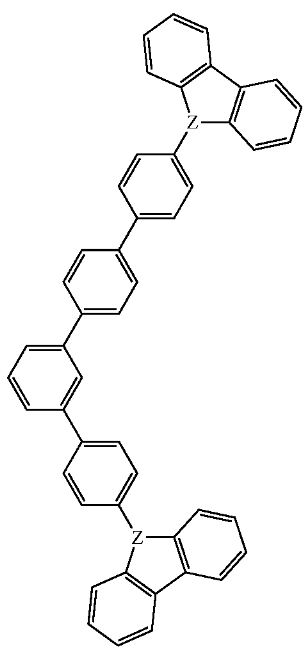
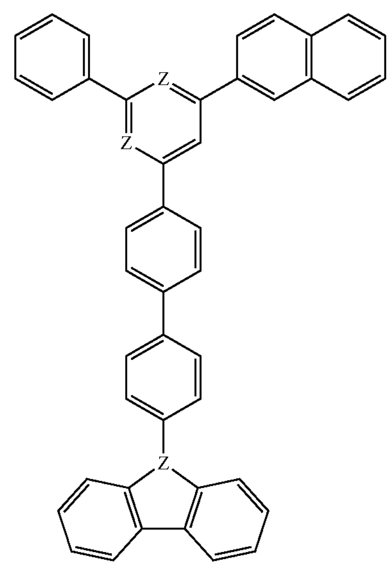

-continued
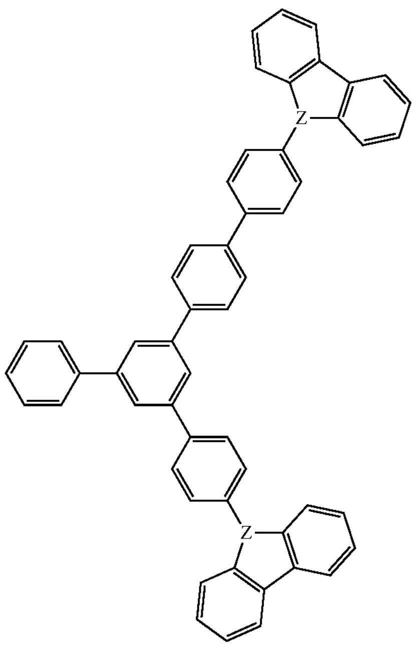
-continued
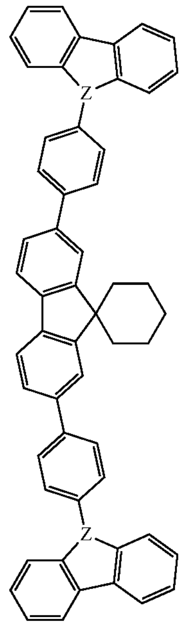
[Chemical Formula 26]
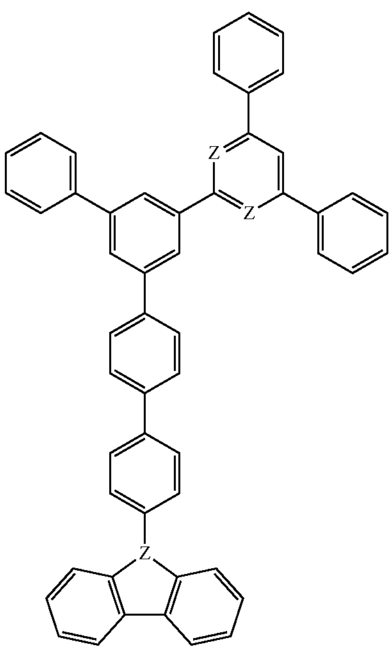
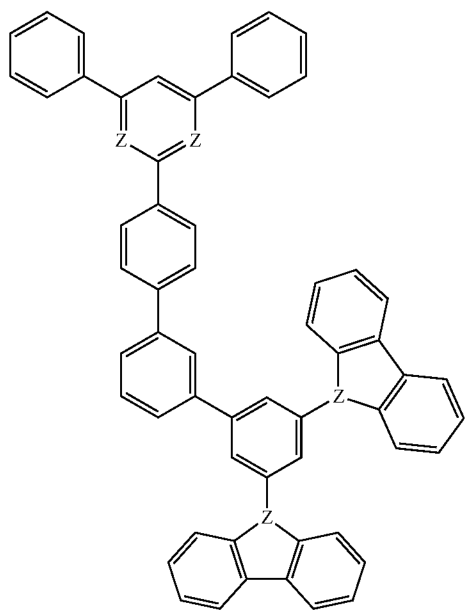

-continued
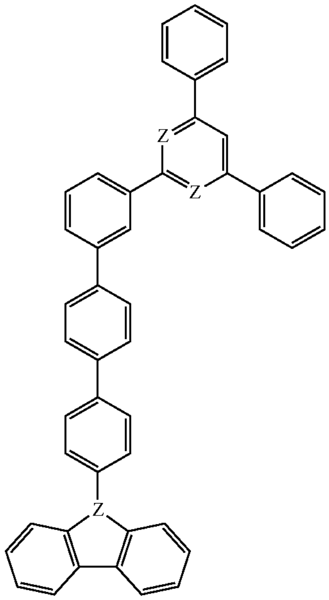
-continued
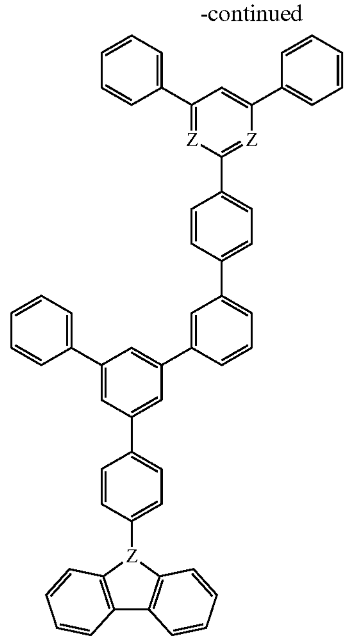
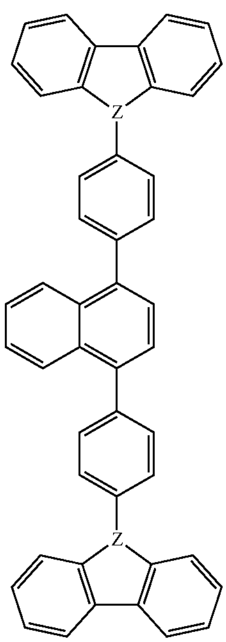
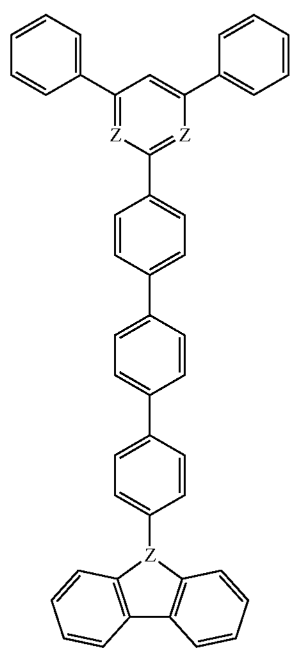

-continued
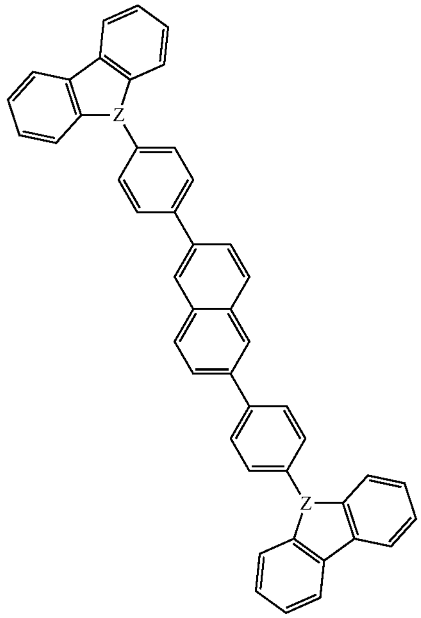
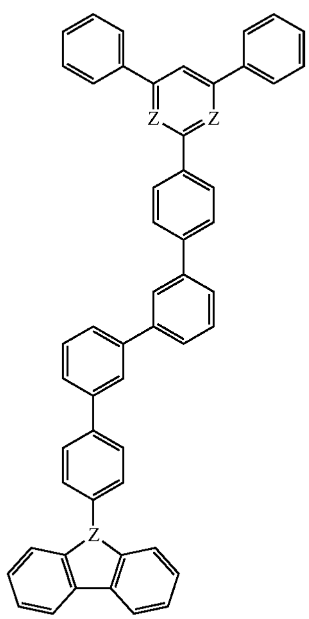
-continued
[Chemical Formula 27]
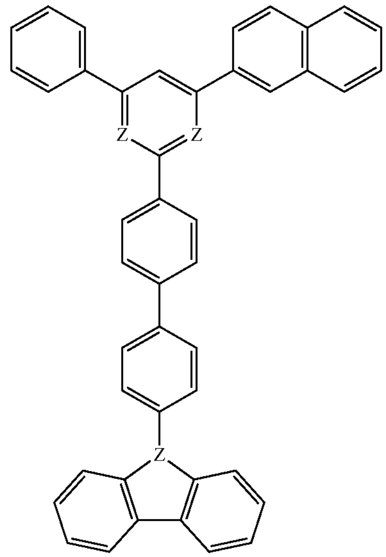
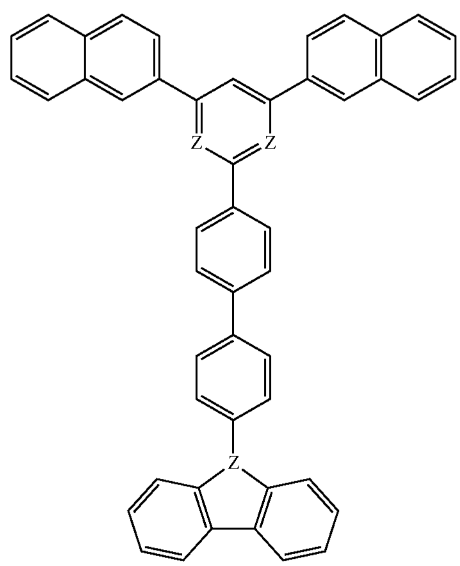

-continued
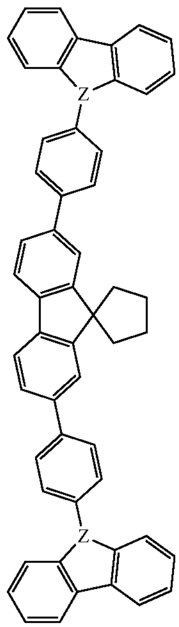
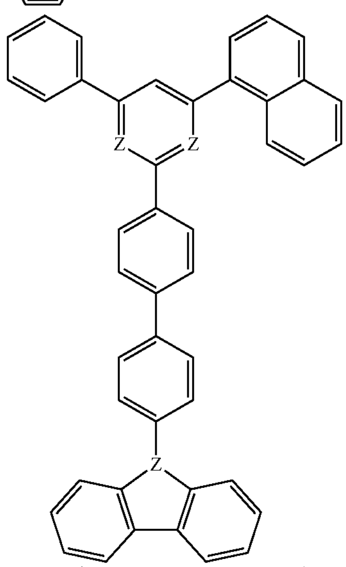
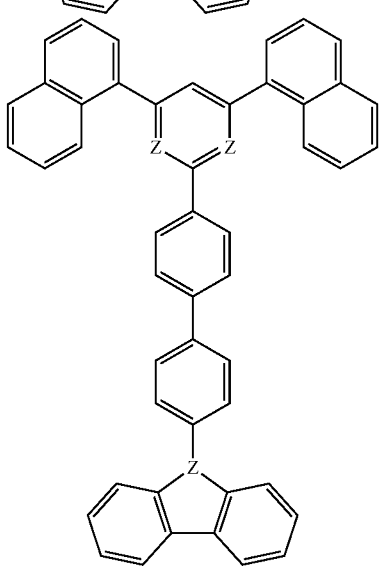
-continued
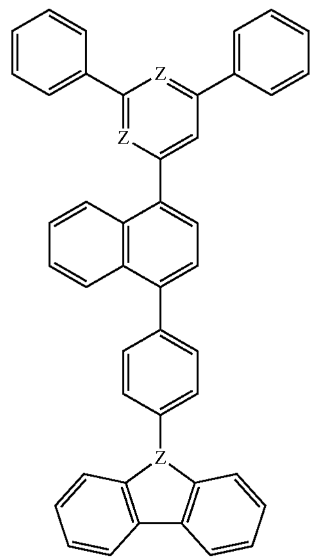
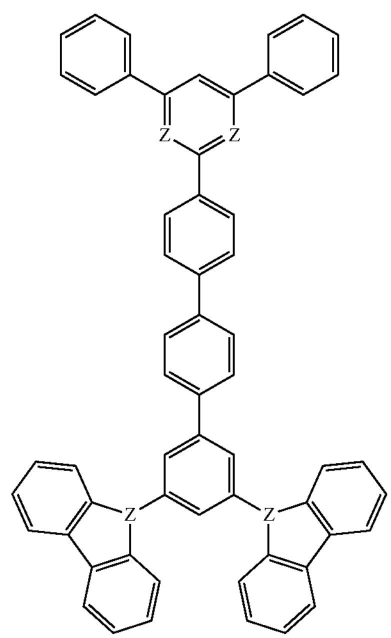

-continued
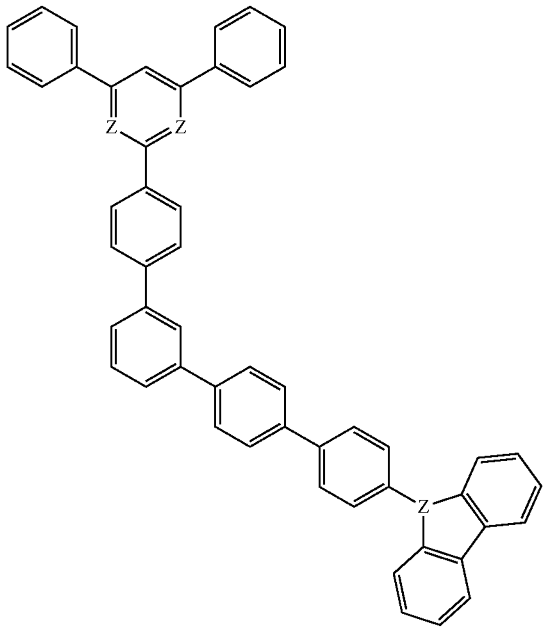
-continued
[Chemical Formula 28]
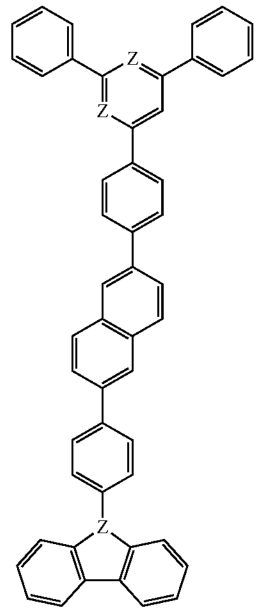
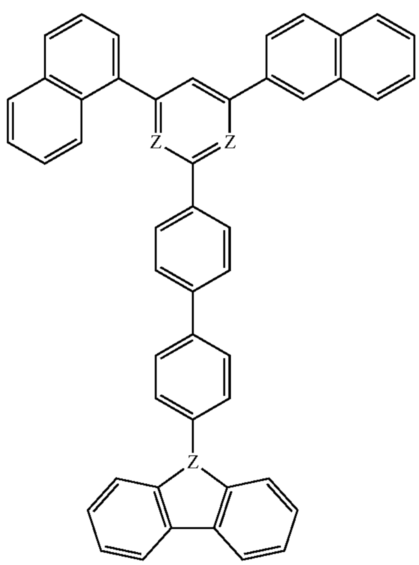
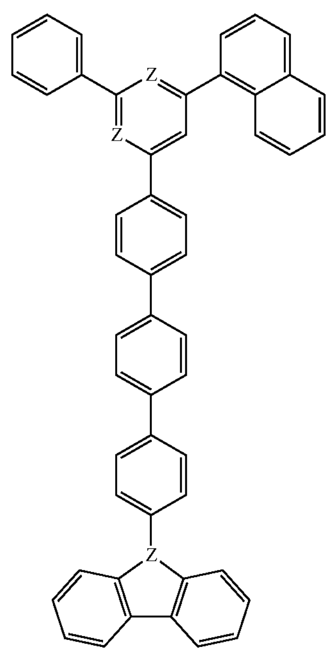

-continued
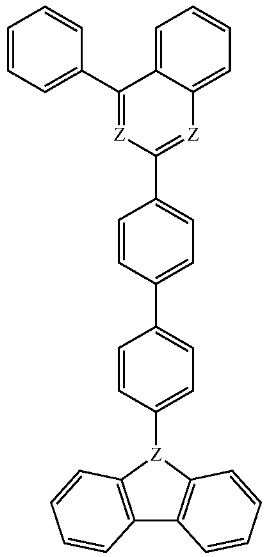
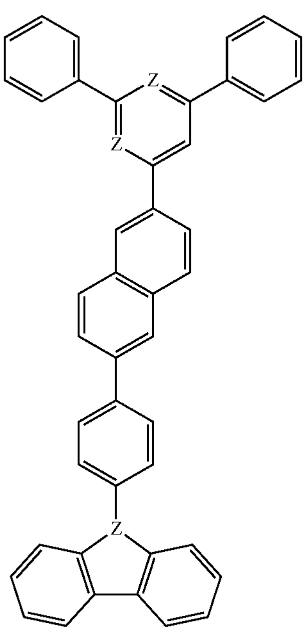
-continued
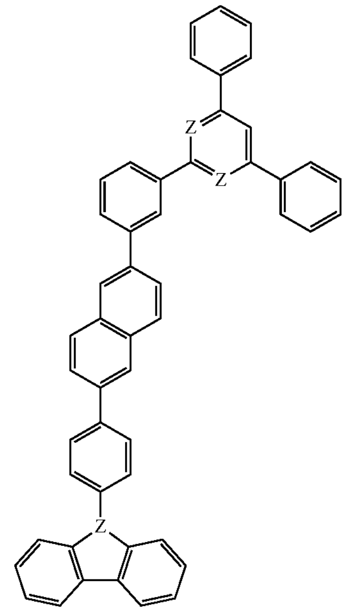
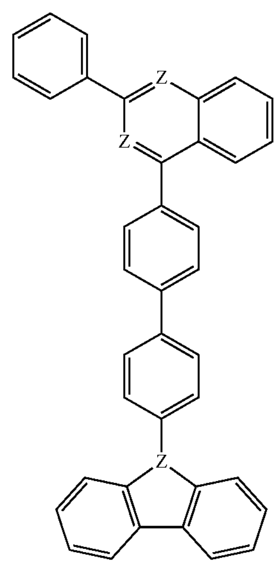

-continued
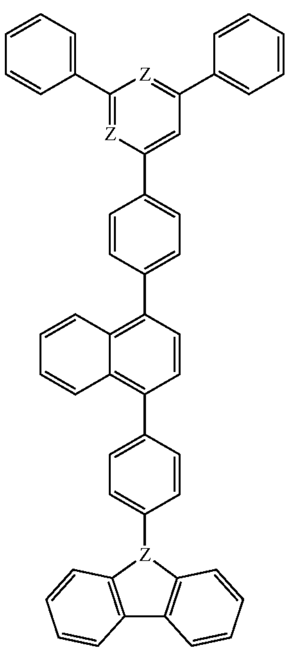
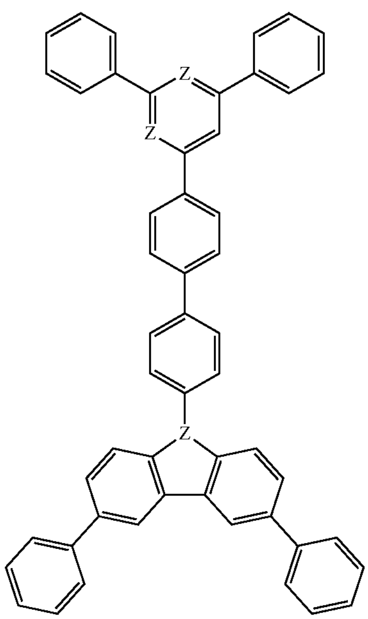
-continued
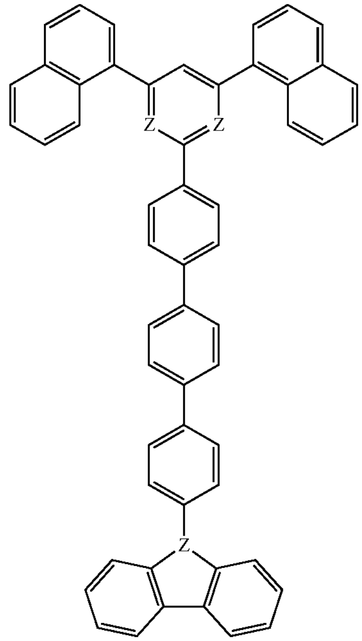
[Chemical Formula 29]
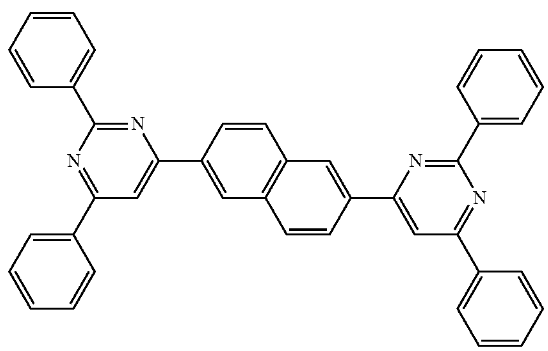
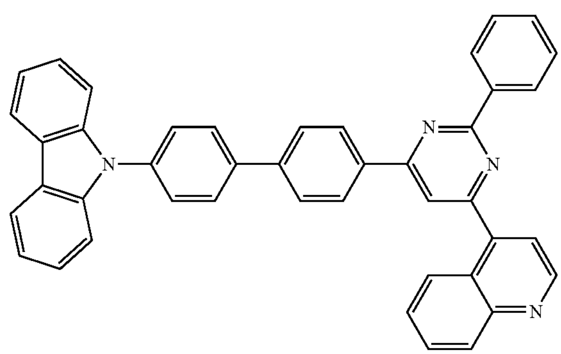
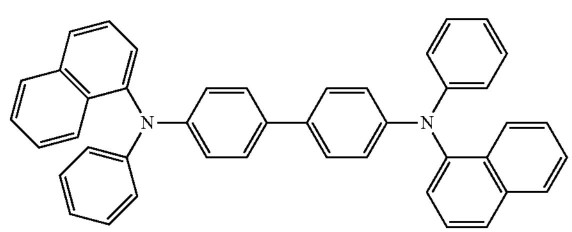

-continued
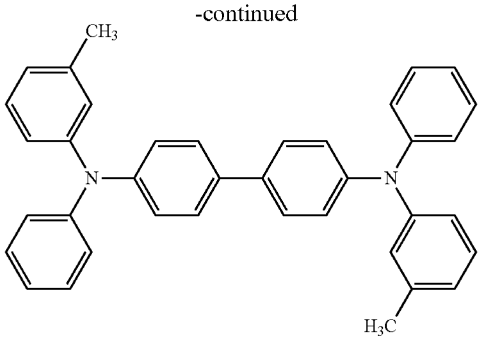
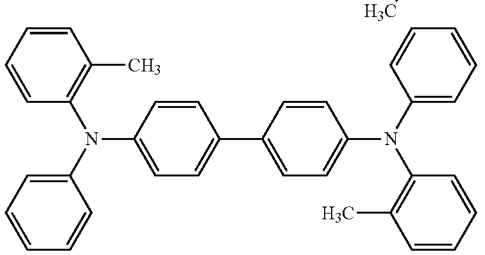
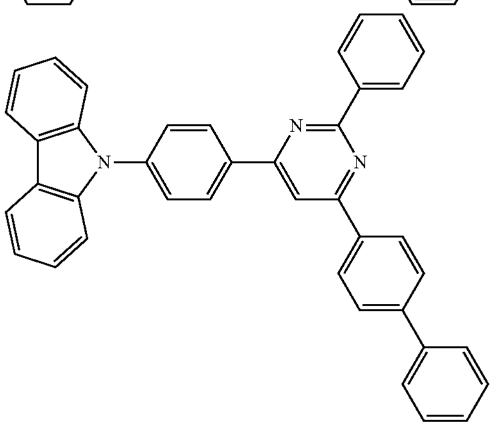
-continued
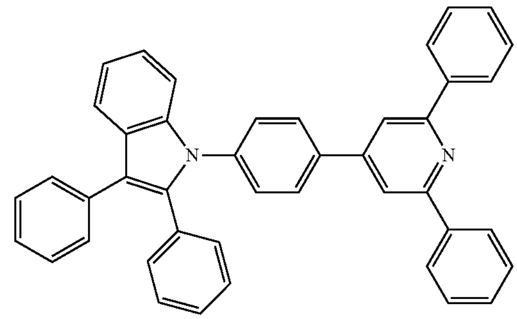
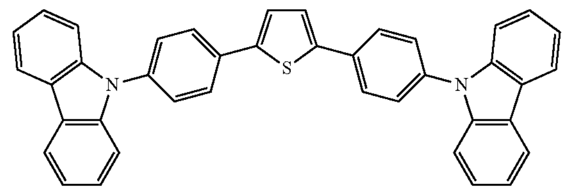
Examples of the host material usable for the green phosphorescent host are shown below. In general, the green phosphorescent host has a larger Eg(T) than the red phosphorescent host.
[Chemical Formula 30]
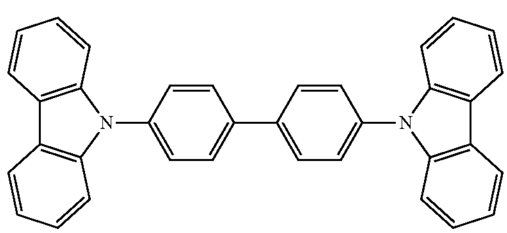
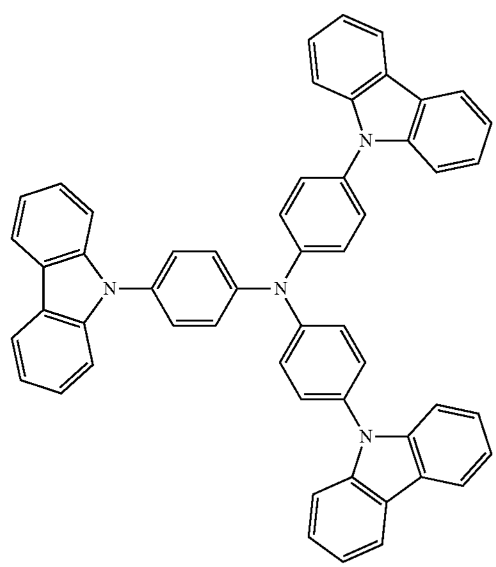

-continued
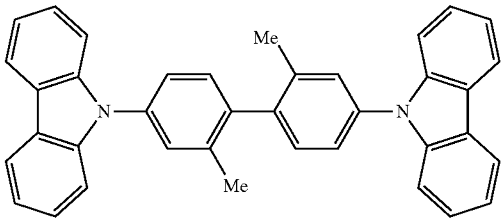
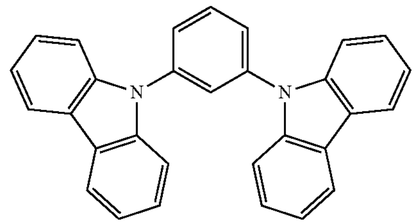
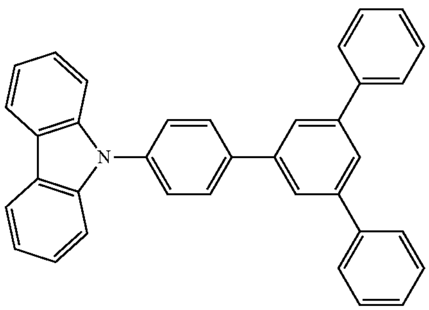
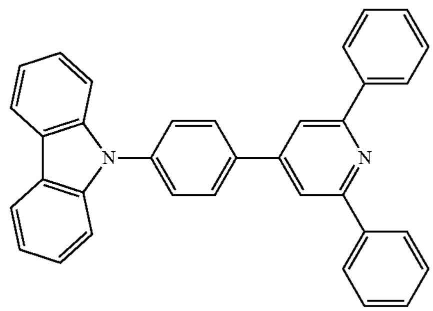
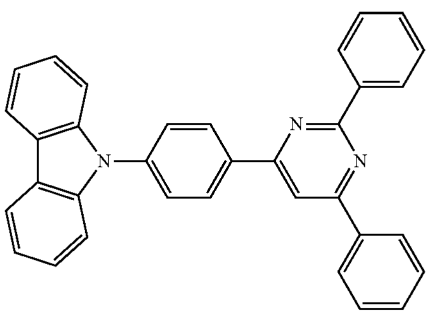
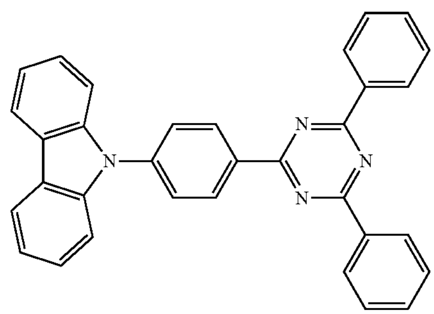
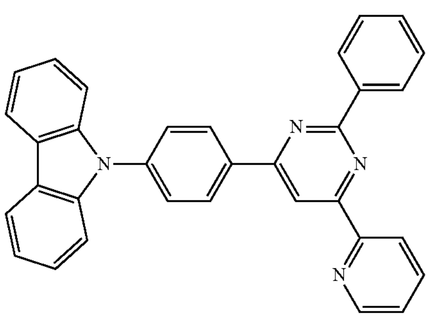
[Chemical Formula 31]
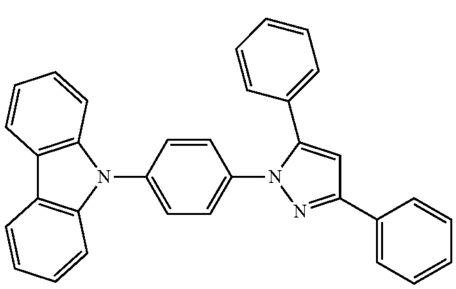
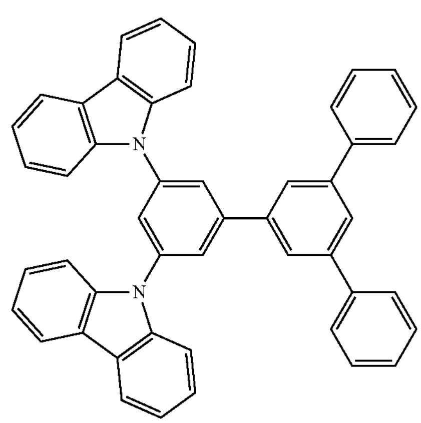

-continued
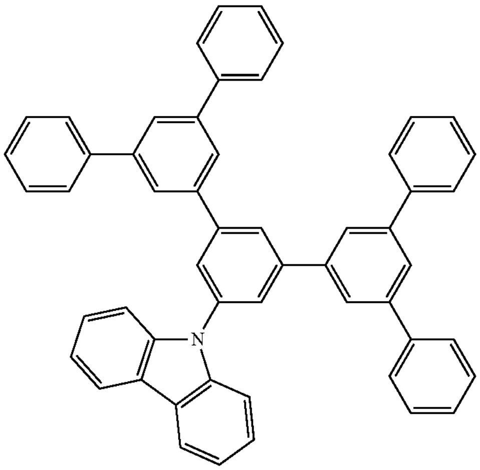
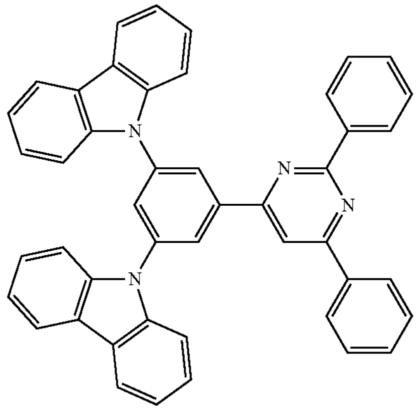
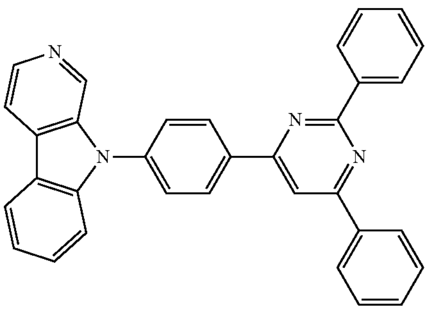
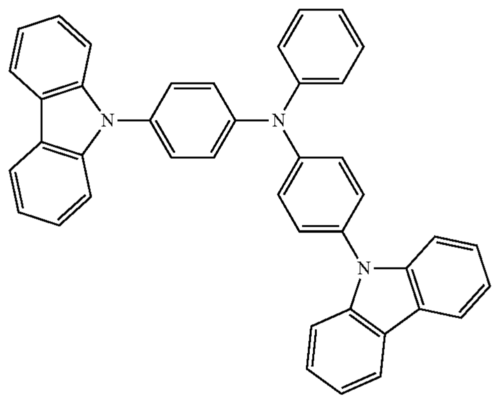
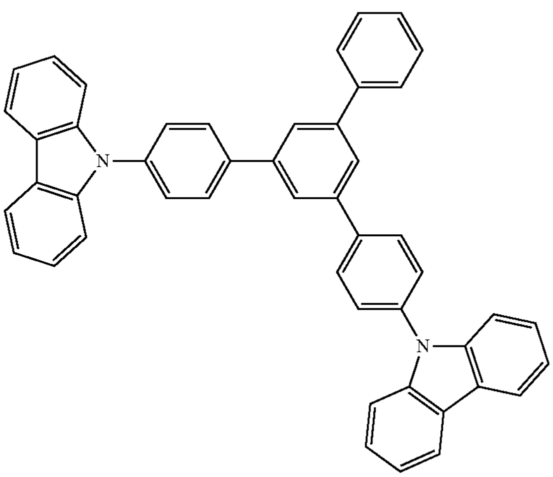
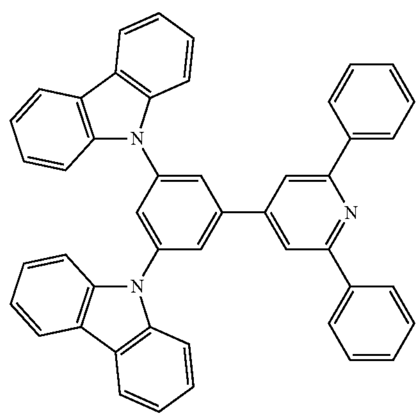
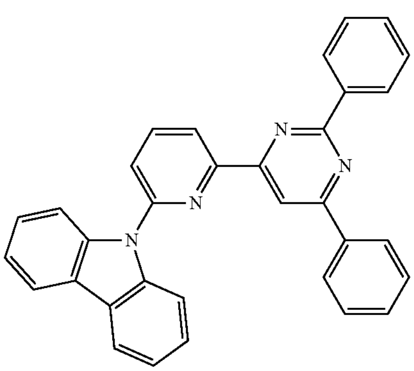

-continued
[Chemical Formula 32]
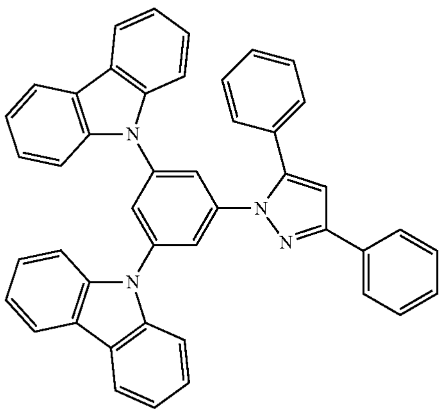
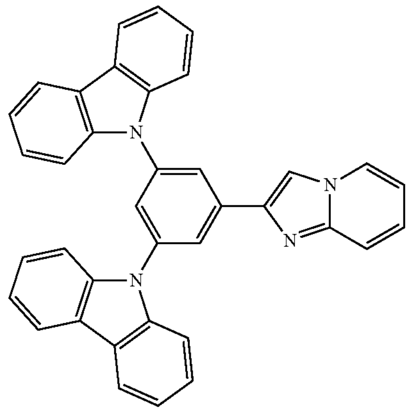
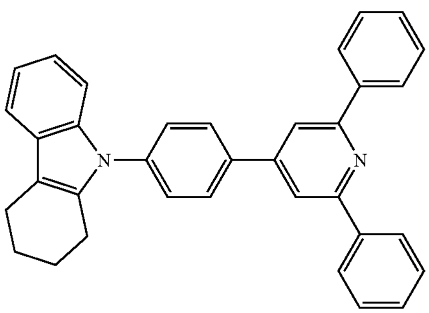
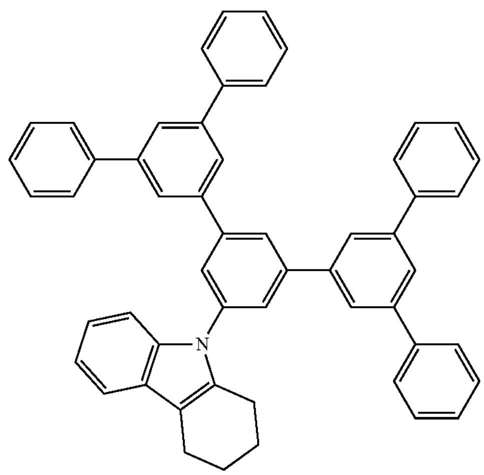
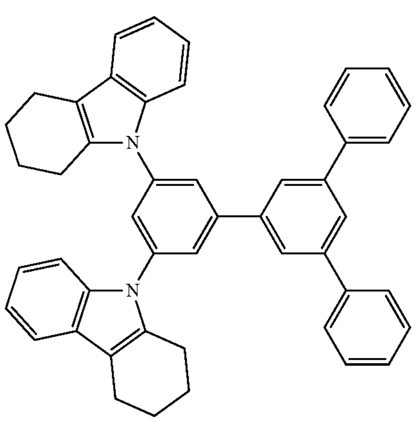
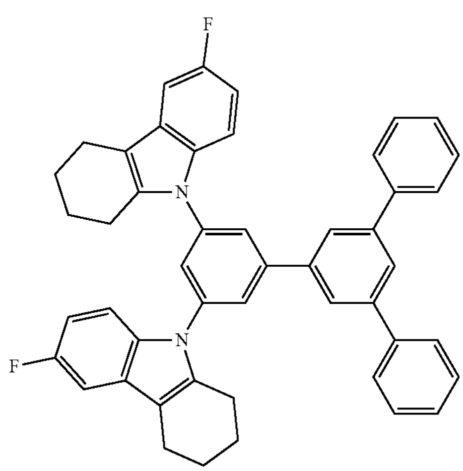

-continued
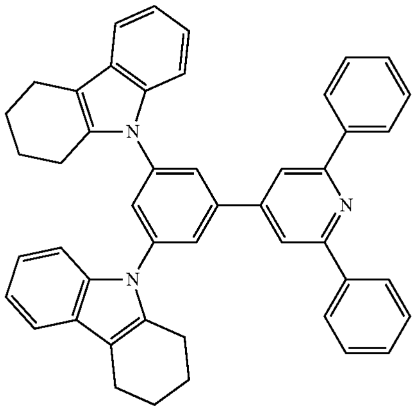
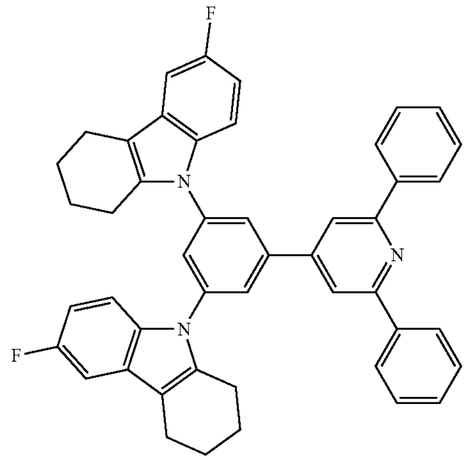
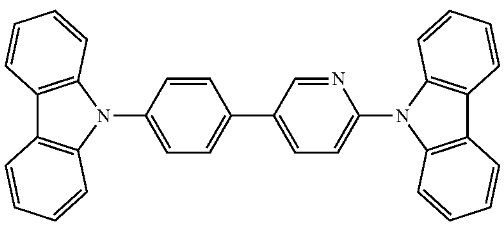
[Chemical Formula 33]
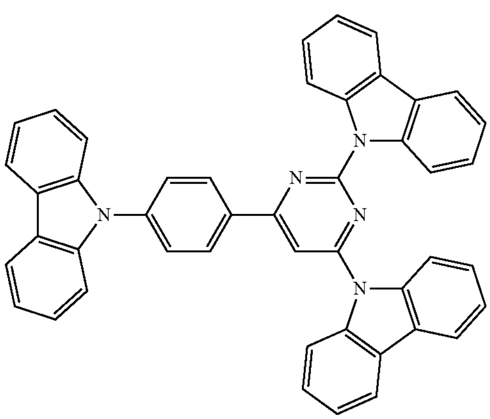
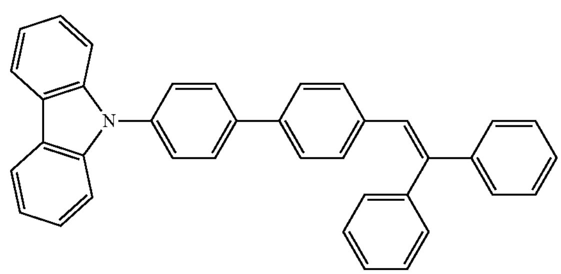
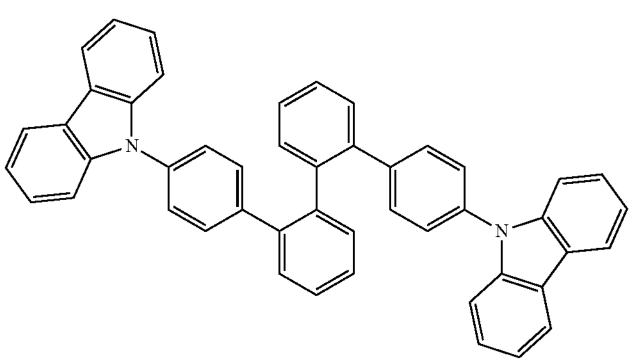

-continued
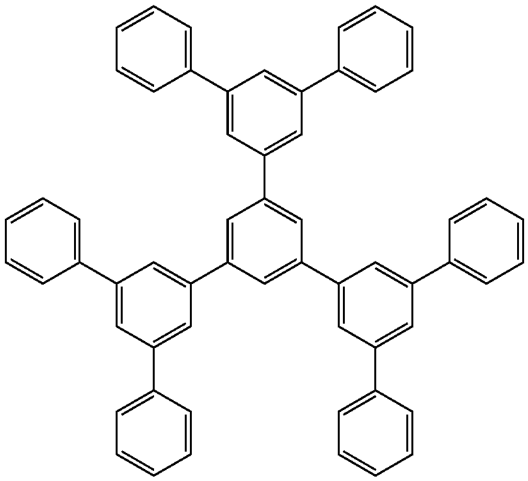
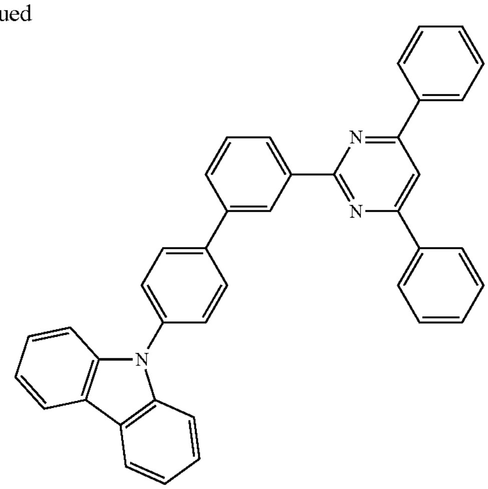
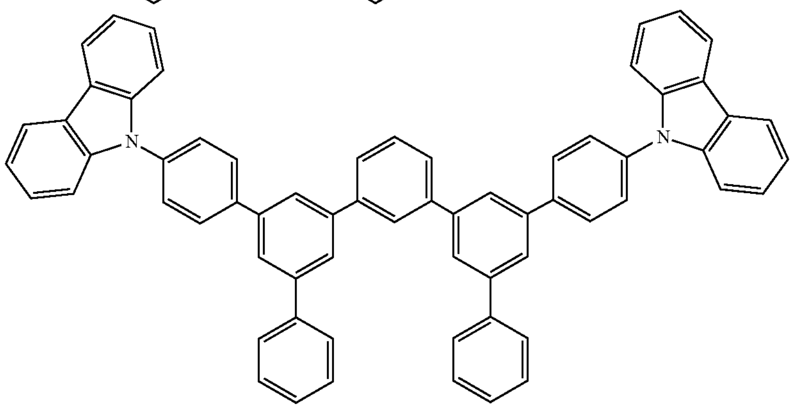
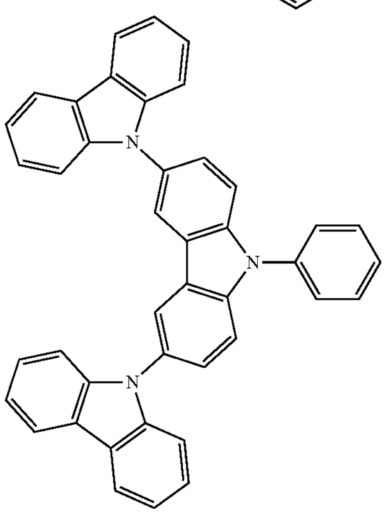
Further examples are fluorene compounds shown below.
[Chemical Formula 34]
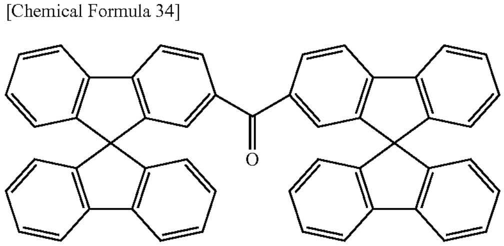
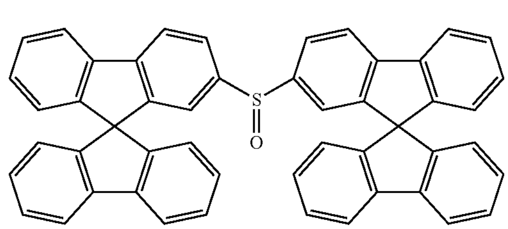

-continued

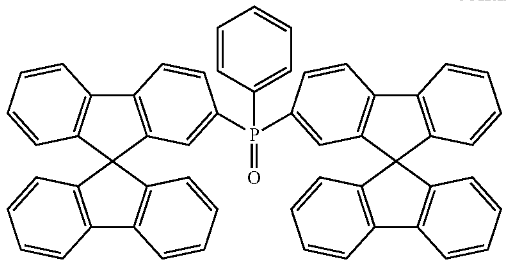

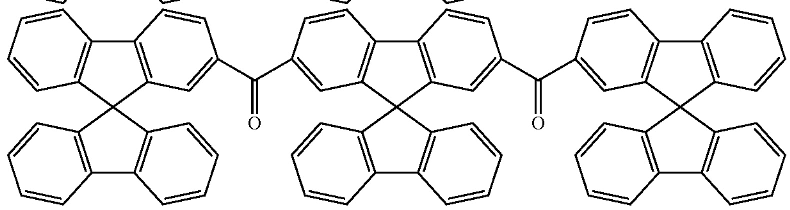

When the red phosphorescent-emitting layer is located closer to the anode than the fluorescent-emitting layer, the red phosphorescent host preferably exhibits large hole mobility. With this arrangement, the injection of holes into the fluorescent-emitting layer (i.e., exciton generating layer) through the red phosphorescent-emitting layer can be facilitated, and a probability of the charge recombination can be increased. At this time, the hole mobility of the red phosphorescent host is preferably $1\times10^{-5}$ $cm^2/Vs$ or more in an electric field intensity of $1.0\times10^4$ to $1.0\times10^6$ V/cm. The hole mobility is more preferably $10^{-4}$ $cm^2/Vs$ or more, much more preferably $10^{-3}$ $cm^2/Vs$ or more.

On the other hand, when the red phosphorescent-emitting layer is located closer to the cathode than the fluorescent-emitting layer, the red phosphorescent host preferably exhibits large electron mobility. With this arrangement, the injection of electrons into the fluorescent-emitting layer (i.e., exciton generating layer) through the red phosphorescent-emitting layer can be facilitated, and a probability of the charge recombination can be increased. At this time, the electron mobility of the red phosphorescent host is preferably $1\times10^{-5}$ $cm^2/Vs$ or more in an electric field intensity of $1.0\times10^4$ to $1.0\times10^6$ V/cm. The electron mobility is more preferably $10^{-4}$ $cm^2/Vs$ or more, much more preferably $10^{-3}$ $cm^2/Vs$ or more.

The fluorescent-emitting layer is preferably thinner than the red phosphorescent-emitting layer.

The fluorescent-emitting layer is preferably thin so that the triplet energy generated in the host of the fluorescent-emitting layer is transferred to the red phosphorescent layer. On the other hand, the red phosphorescent layer is preferably somewhat thick so that the triplet energy diffused from the fluorescent-emitting layer can be received therein.

In this structure, the charges are trapped by the red phosphorescent-emitting layer, and the amount of the charges injected into the fluorescent-emitting layer and green phosphorescent-emitting layer will be reduced. In order to prevent such reduction in charge injection, the red phosphorescent dopant is contained preferably at 10% or less of the red phosphorescent host by mass ratio, more preferably 5% or less.

On the other hand, the charges are also trapped by the green emitting layer. However, since the trapped charges are usable for the green phosphorescent emission, there is no need to prevent the trapping by the green emitting layer. Accordingly, the concentration of the green phosphorescent dopant is not subject to any specific limitation, but is preferably set to be higher than that of the red phosphorescent dopant for balancing the chromaticity. Alternatively, the thickness of the green phosphorescent-emitting layer may be suitably controlled.

The organic thin-film layer may include an intermediate layer between the fluorescent-emitting layer and the red phosphorescent-emitting layer.

The triplet energy gap $Eg_M$ of the intermediate layer, the triplet energy gap $Eg_{FH}$ of the fluorescent host and the triplet energy gap $Eg_{PD\text{-}R}$ of the red phosphorescent dopant preferably satisfy a relationship of $Eg_{PD\text{-}R}<Eg_M\leqq Eg_{FH}$.

Under this condition, the triplet energy of the fluorescent host is transferred to the red phosphorescent dopant via the intermediate layer. However, the triplet energy of the red phosphorescent dopant cannot be transferred to the intermediate layer or to the fluorescent host. Accordingly, the triplet energy, which has been generated in the fluorescent host and transferred to the red phosphorescent dopant, can be prevented from being transferred back to the fluorescent host and deactivated.

The organic thin-film layer may include a plurality of fluorescent-emitting layers, a plurality of red phosphorescent-emitting layers and a plurality of green phosphorescent-emitting layers. The fluorescent-emitting layer may include a plurality of fluorescent dopants. The red phosphorescent-emitting layer and green phosphorescent-emitting layer may include a plurality of red phosphorescent dopants and a plurality of green phosphorescent dopants.

Whether the emission is obtained from excited energy generated by diffusion of triplet or from excited energy generated by charge injection is determinable by measuring, for instance, transient responses after the charges are injected into the device. For example, when the emission is provided as soon as the charges are injected into the device, the emission can be determined to be obtained by way of the charge injection. When the emission is provided after a time-lag subsequent to the injection of the charges into the device, the emission can be determined to be obtained by way of the diffusion of the triplet. Thus, according to the aspect of the invention, it is possible to know about the emission mechanism by measuring the transient responses of the red and green emission.

Preferably in the aspect of the invention, the triplet energy gap $Eg_{FH}$ of the fluorescent host and the triplet energy gap $Eg_{PH\text{-}G}$ of the green phosphorescent host satisfy a relationship of $Eg_{FH}<Eg_{PH-G}$, and the triplet energy gap $Eg_{PH-G}$ of the green phosphorescent host is 2.4 eV or more.

Since the relationship of $Eg_{FH}<Eg_{PH-G}$ is satisfied, the energy is hardly transferred from the fluorescent host to the green phosphorescent host.

The triplet energy of the fluorescent host is presumably transferred to the phosphorescent dopant via the phosphorescent host, because it is difficult to consider that the triplet energy of the fluorescent host is directly transferred to the phosphorescent dopant contained in the fluorescent-emitting layer at a low concentration.

In the organic EL device according to the aspect of the invention, energy is not transferred from the fluorescent host to the green phosphorescent host, and thus the energy is not transferred to the green phosphorescent dopant, either.

Accordingly, the emission of the green phosphorescent-emitting layer is provided by the recombination of the charges within the green phosphorescent-emitting layer, and not by the energy transfer from the fluorescent host. With this arrangement, the red phosphorescent emission is obtainable by the energy transfer from the fluorescent-emitting layer while the green phosphorescent emission is obtainable by the charge recombination separated from the fluorescent-emitting layer.

Preferably in the aspect of the invention, the triplet energy gap $Eg_{FH}$ of the fluorescent host, the triplet energy gap $Eg_{PD-R}$ of the red phosphorescent dopant and the triplet energy gap $Eg_{PD-G}$ of the green phosphorescent dopant satisfy a relationship of $Eg_{PD-R}<Eg_{FH}<Eg_{PD-G}+0.2$ eV.

Since the $Eg_{FH}$ is larger than $Eg_{PD-R}$ and smaller than $Eg_{PD-G}+0.2$ eV, the triplet energy of the fluorescent host is transferable to the red phosphorescent dopant, but is not transferable to the green phosphorescent dopant.

Therefore, in the organic EL device according to the aspect of the invention, only the red phosphorescent emission is obtained by the transfer of the triplet energy from the fluorescent host. In the green phosphorescent-emitting layer, the phosphorescent emission is obtained by the typical recombination of the electrons and holes.

Preferably in the aspect of the invention, the triplet energy gap $Eg_{FH}$ of the fluorescent host, the triplet energy gap $Eg_{PD-R}$ of the red phosphorescent dopant and the triplet energy gap $Eg_{PD-G}$ of the green phosphorescent dopant satisfy a relationship of $Eg_{PD-R}+0.2$ eV$<Eg_{FH}<Eg_{PD-G}+0.2$ eV.

Since $Eg_{FH}$ is larger than $Eg_{PD-R}+0.2$ eV, the triplet energy of the fluorescent host is more reliably transferable to the red phosphorescent dopant.

Further, since $Eg_{FH}$ is smaller than $Eg_{PD-G}+0.2$ eV, the triplet energy of the fluorescent host is prevented from being transferred to the green phosphorescent dopant.

In order to more reliably prevent the transfer of the triplet energy from the fluorescent host to the green phosphorescent dopant, a relationship of $Eg_{FH}<Eg_{PD-G}$ is more preferably satisfied.

Preferably in the aspect of the invention, the fluorescent host contains a host material having a substituted or unsubstituted polycyclic fused aromatic skeleton, the host material having the triplet energy gap of 2.1 eV to 3.0 eV.

By using a polycyclic fused aromatic series for the host material in the above structure, the stability of the molecules can be enhanced, and the device lifetime can be increased.

Conventionally, when the fluorescent emission is solely used, only 25% of the generated excited energy has been usable for the light.

Further, although it has been possible to utilize 100% of the excited energy by using a phosphorescent material, no practical phosphorescent material has been available for obtaining short-wavelength emission.

For use as the host material for the phosphorescent dopant, CBP is representatively known as a material having a large triplet energy gap. However, lifetime of CBP is short.

In this respect, the aspect of the invention can enhance efficiency by use of not only the singlet exciton but the triplet exciton of the excited energy generated in the host of the fluorescent-emitting layer, as compared to a device that uses the fluorescent dopant only.

In addition, by using a polycyclic fused aromatic series, which exhibits higher molecular stability, for the host material of the fluorescent-emitting layer, the device lifetime can be increased.

Accordingly, the aspect of the invention can realize an organic EL device having long lifetime and capable of providing mixed-color emission at high efficiency.

The host material preferably has the triplet energy gap of 2.1 eV to 3.0 eV, more preferably 2.1 eV to 2.7 eV, much more preferably 2.1 eV to 2.5 eV.

The triplet energy gap Eg(T) of the material may be exemplarily defined based on the phosphorescence spectrum. For instance, in the aspect of the invention, the triplet energy gap Eg(T) may be defined as follows.

Specifically, each material is dissolved in an EPA solvent (diethylether: isopentane:ethanol=5:5:2 in volume ratio) at a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to short-wavelength of the obtained phosphorescence spectrum, a wavelength value at an intersection of the tangent line and a base line is converted into energy value, and the converted energy value is defined as the triplet energy gap Eg(T).

For the measurement, for instance, a commercially-available measuring equipment F-4500 (manufactured by Hitachi, Ltd.) may be used.

However, the triplet energy gap does not need to be defined by the above method, but may be defined by any other suitable method as long as such a method is compatible with the invention.

Preferably in the aspect of the invention, the polycyclic fused aromatic skeleton is present in a chemical structure formula as a divalent or multivalent group.

Examples of the substituent for the polycyclic fused aromatic skeleton are halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, and carboxyl group. When the polycyclic fused aromatic skeleton includes a plurality of substituents, two of the substituents may form a ring.

Examples of the halogen atom are fluorine, chlorine, bromine and iodine.

The substituted or unsubstituted amino group is represented by $—NX^1X^2$. $X^1$ and $X^2$ each independently and exemplarily represent a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1 cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group are vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group are cyclopropyl group, cyclobutyl group, cyclopentyl group, cyclohexyl group, and 4-methylcyclohexyl group.

The substituted or unsubstituted alkoxy group is represented by —OY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted aromatic hydrocarbon group are phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted aromatic heterocyclic group are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted aralkyl group are benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The substituted or unsubstituted aryloxy group is represented by —OZ. Examples of Z include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a 2-pyrrolyl group, a 3-pyrrolyl group, a pyrazinyl group, a 2-pyrizinyl group, a 3-pyrizinyl group, a 4-pyrizinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The substituted or unsubstituted alkoxycarbonyl group is represented by —COOY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Preferably in the aspect of the invention, the polycyclic fused aromatic skeleton has a substituent, and the substituent is a substituted or unsubstituted aryl group or a heteroaryl group.

By introducing an aryl group or a heteroaryl group as the substituent, the energy gap can be adjusted and molecular associate can be prevented. Thus, the lifetime can be easily prolonged.

Preferably in the aspect of the invention, the polycyclic fused aromatic skeleton is selected from the group consisting of substituted or unsubstituted naphthalene-diyl, phenanthrene-diyl, chrysene-diyl, fluoranthene-diyl and triphenylene-diyl.

Also preferably in the aspect of the invention, the polycyclic fused aromatic skeleton is substituted by a group containing naphthalene, phenanthrene, chrysene, fluoranthene or triphenylene.

Preferably in the aspect of the invention, the polycyclic fused aromatic skeleton is represented by any one of formulae (1) to (4) as follows.

[Chemical Formula 35]

(1)

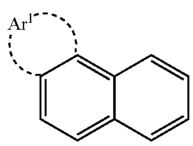

(2)

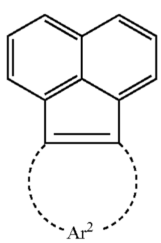

(3)

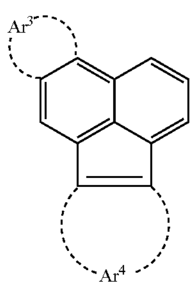

(4)

$Ar^5$—Np—$Ar^6$

In the formulae (1) to (3), $Ar^1$ to $Ar^4$ each represent a substituted or unsubstituted fused cyclic structure having 4 to 10 ring carbon atoms.

In the formula (4), Np represents substituted or unsubstituted naphthalene, and $Ar^5$ and $Ar^6$ each independently represent a substituent formed solely of a substituted or unsubstituted aryl group having 6 to 14 carbon atoms or a substituent formed of a combination of a plurality thereof, However, $Ar^5$ or $Ar^6$ is not anthracene.

Preferably in the aspect of the invention, the polycyclic fused aromatic skeleton is the elementary substance of phenanthrene represented by the following formula (10) or its derivative.

[Chemical Formula 36]

(10)

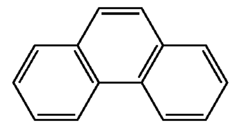

Examples of the substituent for the phenanthrene derivative are an alkyl group, cycloalkyl group, aralkyl group, alkenyl group, cycloalkenyl group, alkynyl group, hydroxyl group, mercapto group, alkoxy group, alkylthio group, arylether group, arylthioether group, aryl group, heterocyclic group, halogen, haloalkane, haloalkene, haloalkyne, cyano group, aldehyde group, carbonyl group, carboxyl group, ester group, amino group, nitro group, silyl group and siloxanyl group.

Examples of the phenanthrene derivative are those represented by the following formulae.

[Chemical Formula 37]

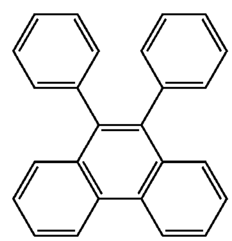

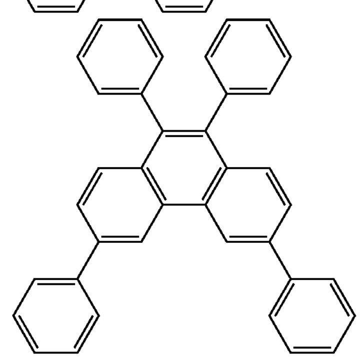

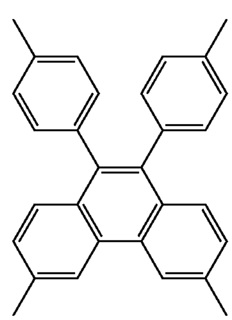

-continued
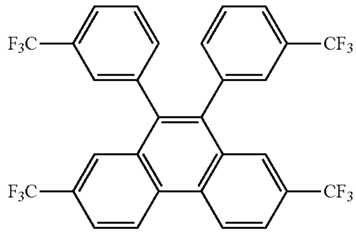
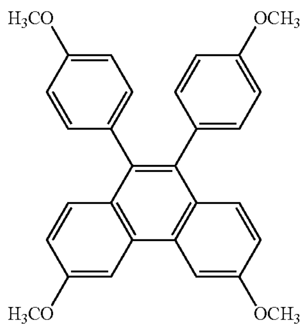
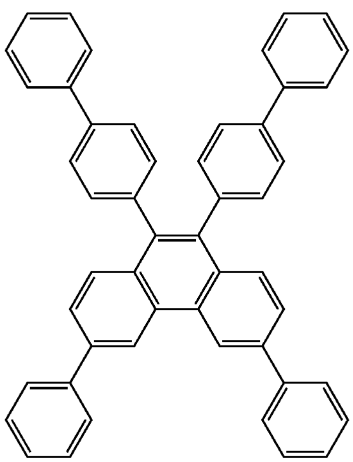
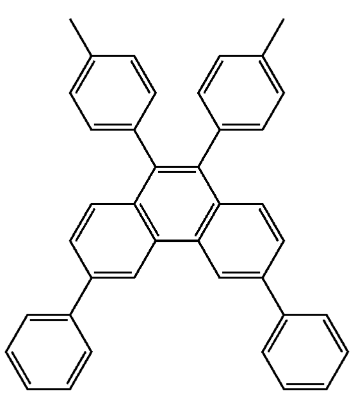
-continued
[Chemical Formula 38]
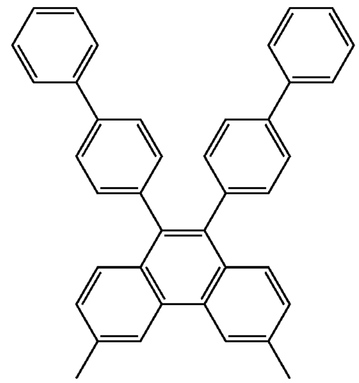
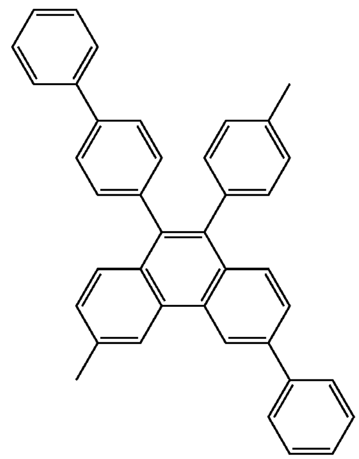
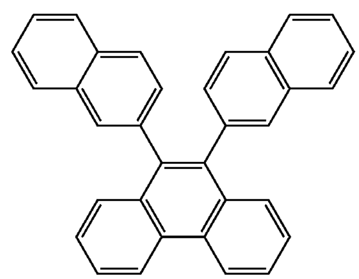
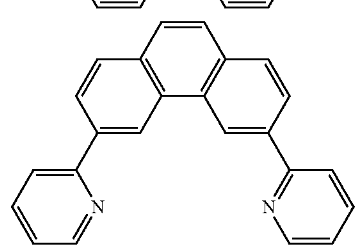
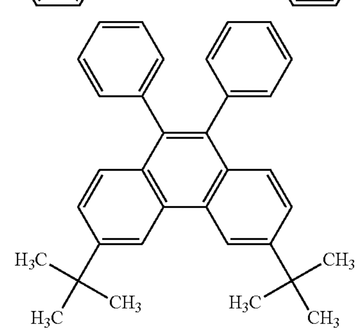

-continued
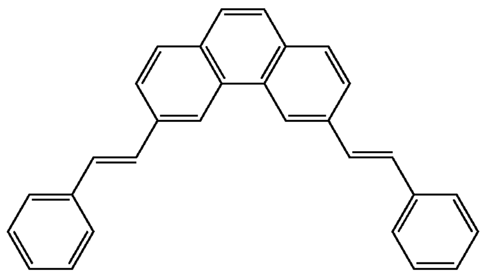
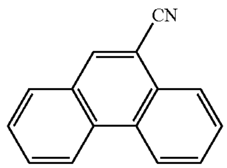
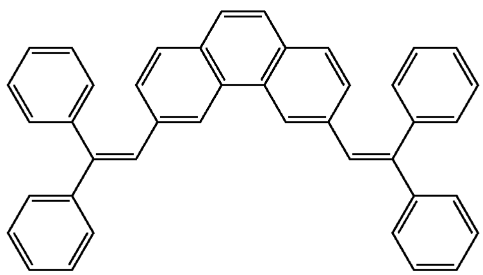
[Chemical Formula 39]
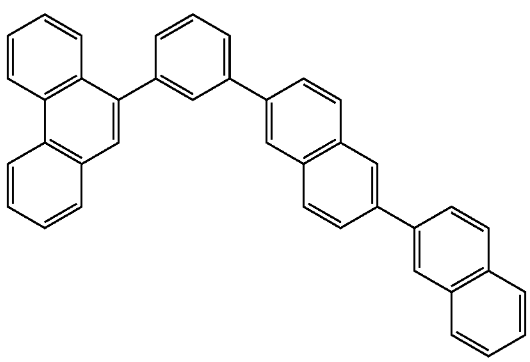
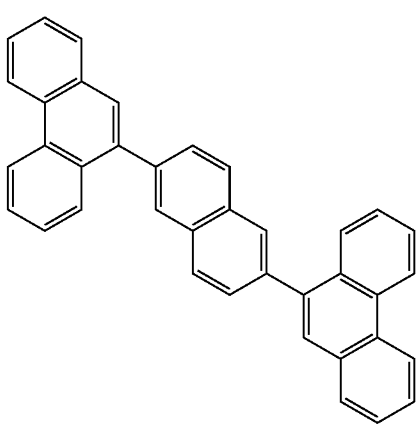
-continued
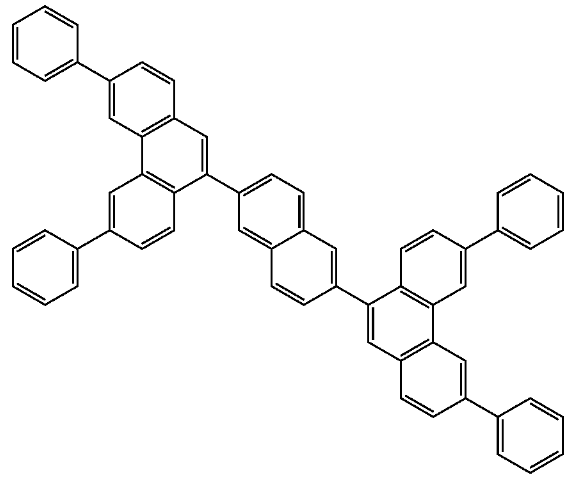
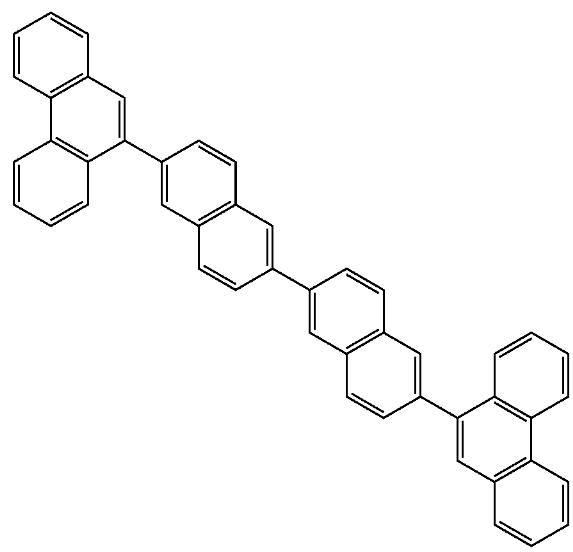
Preferably in the aspect of the invention, the polycyclic fused aromatic skeleton is the elementary substance of chrysene represented by the following formula (11) or its derivative.
[Chemical Formula 40]
(11)
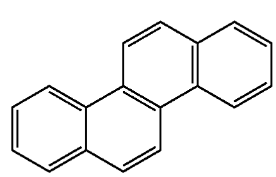

Examples of the chrysene derivative are those represented by the following formulae.
[Chemical Formula 41]
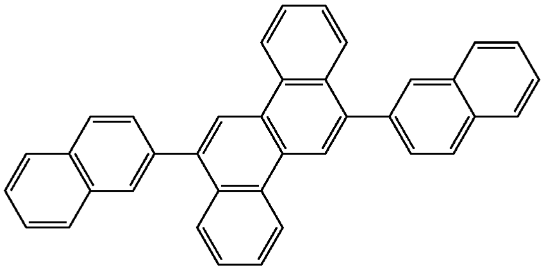
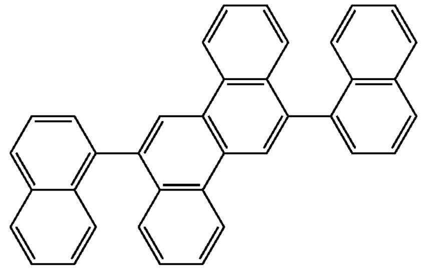
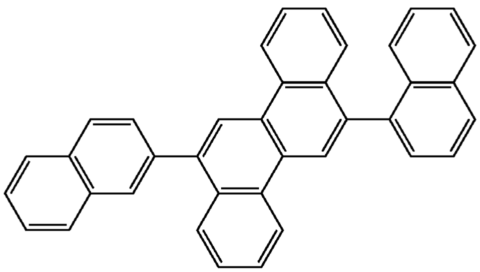
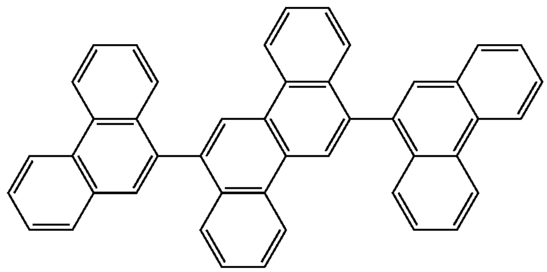
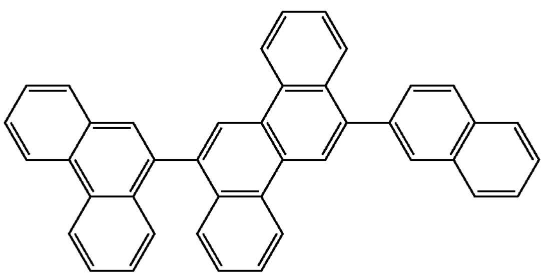
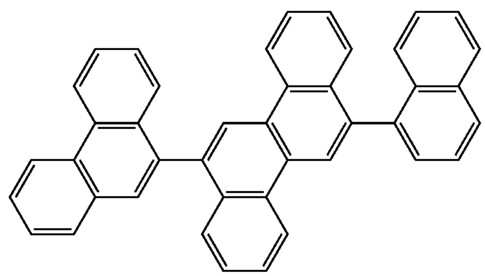
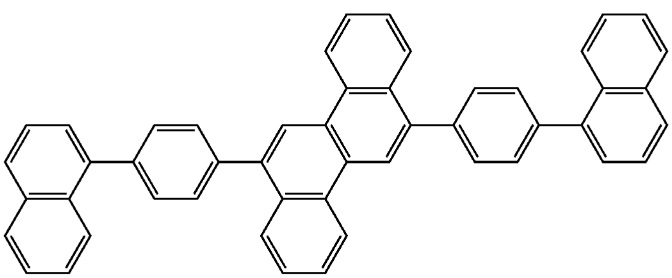
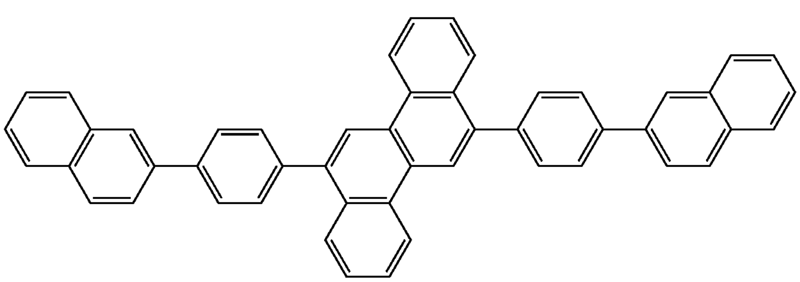

-continued
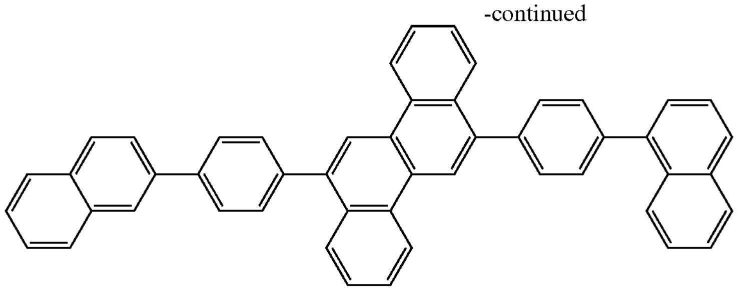
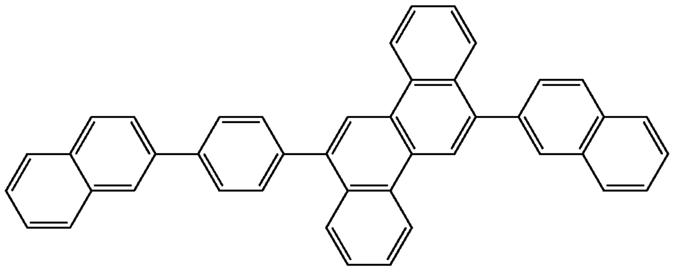
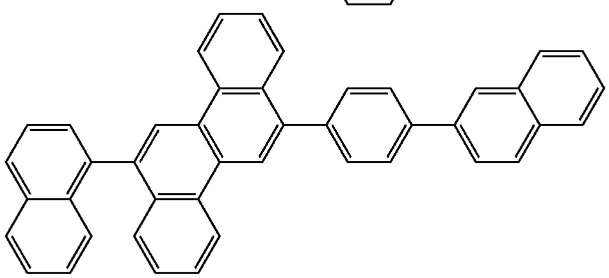
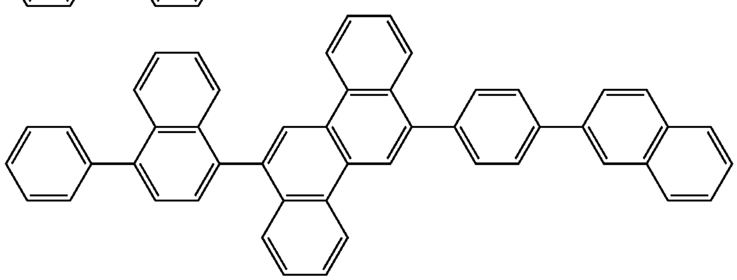
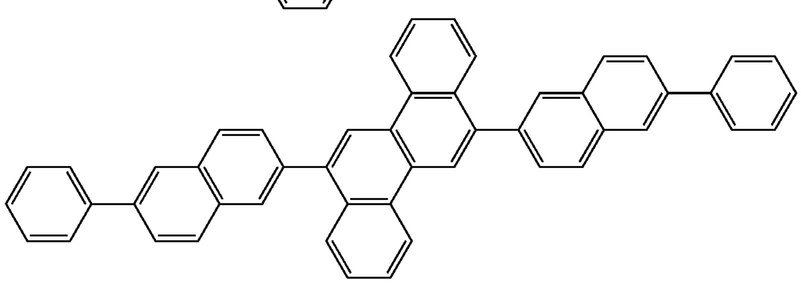
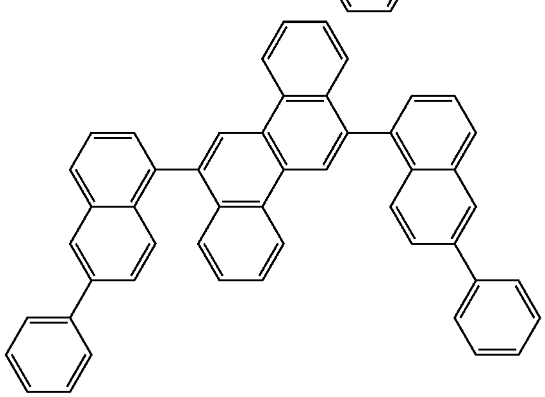

-continued
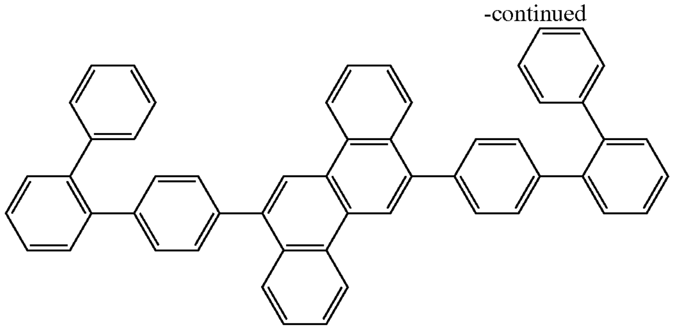
[Chemical Formula 42]
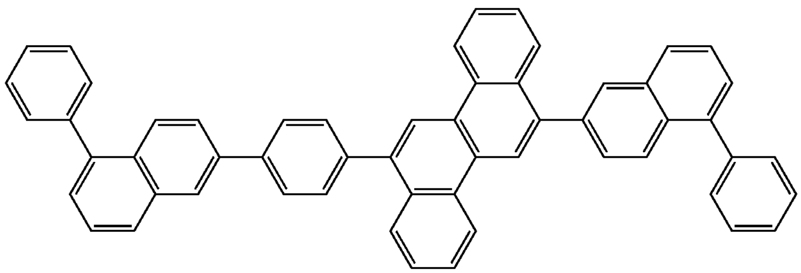
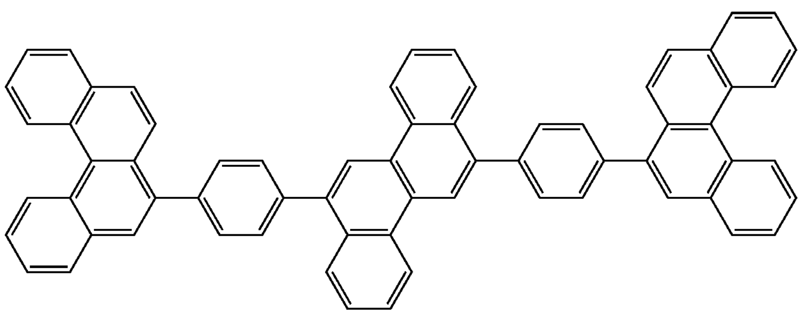
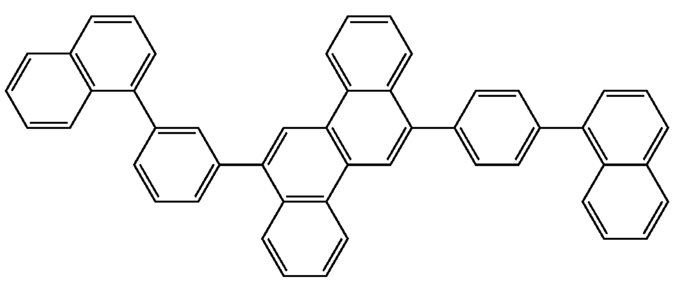
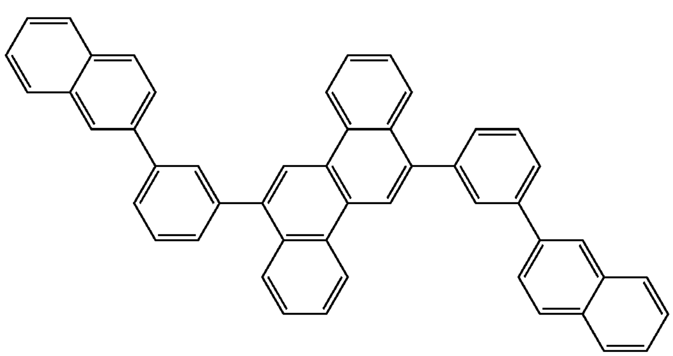

-continued
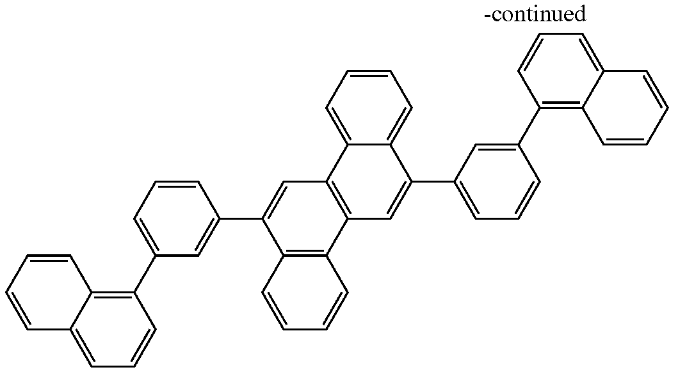
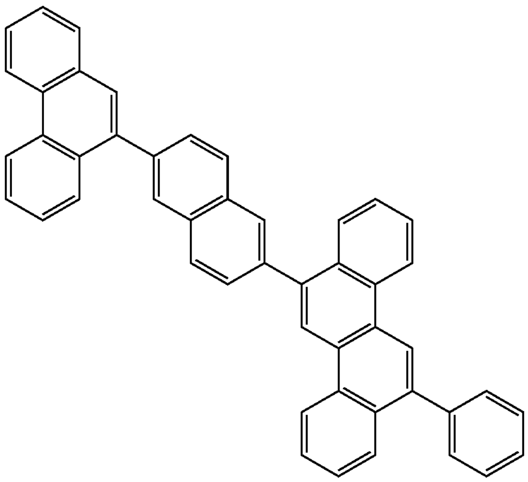
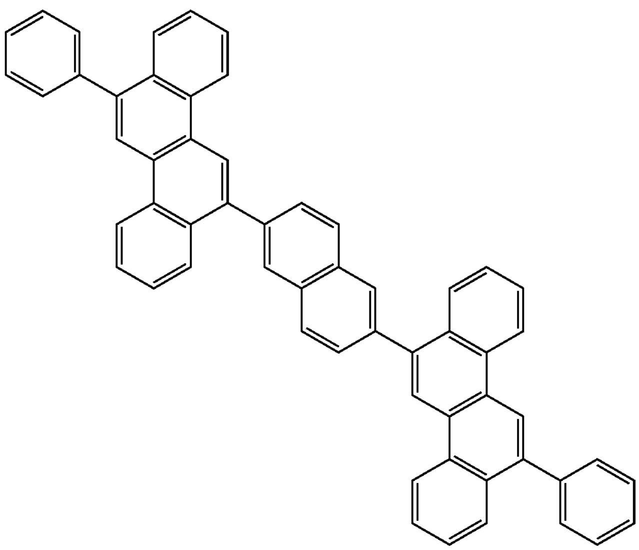
[Chemical Formula 43]
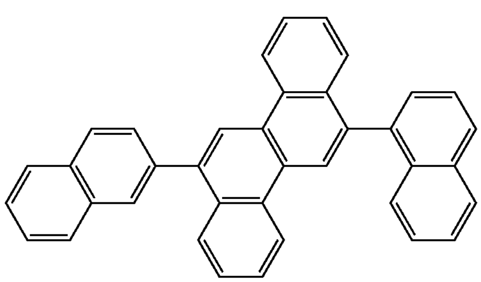
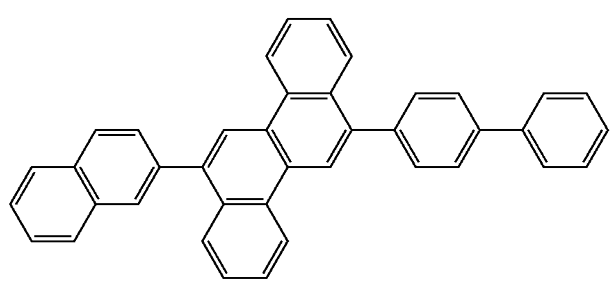

-continued
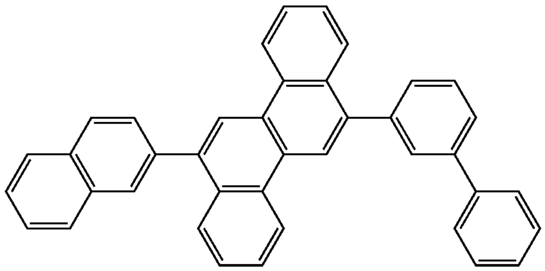
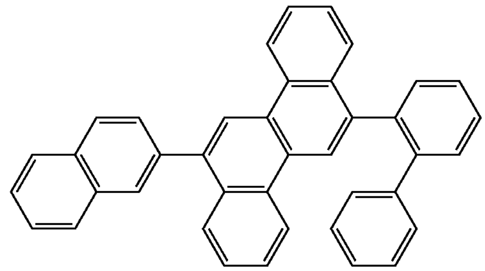
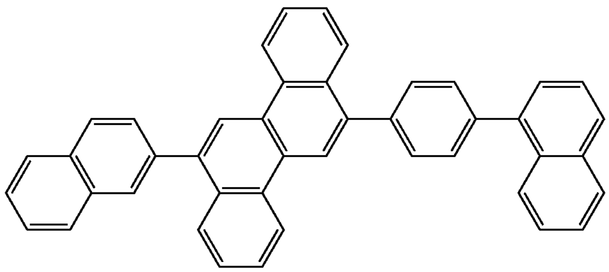
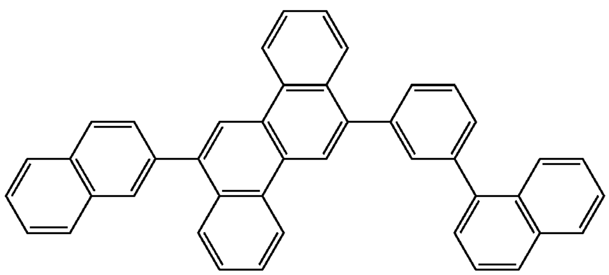
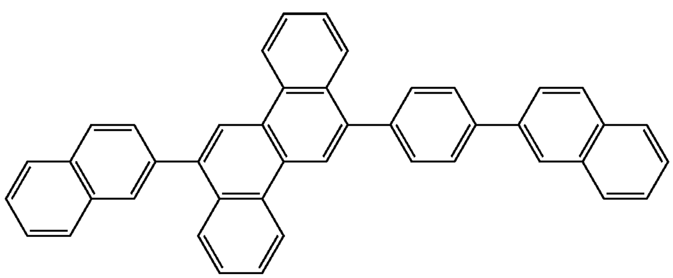
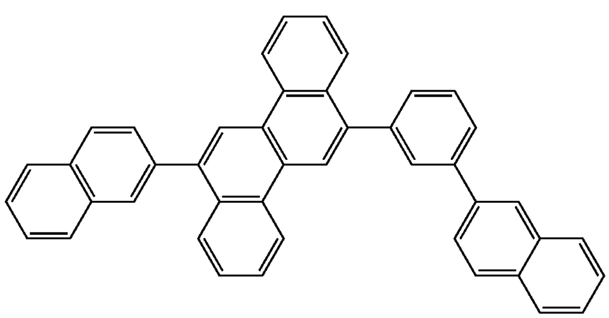
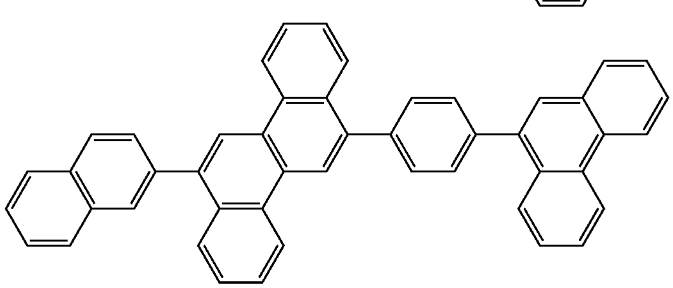

-continued
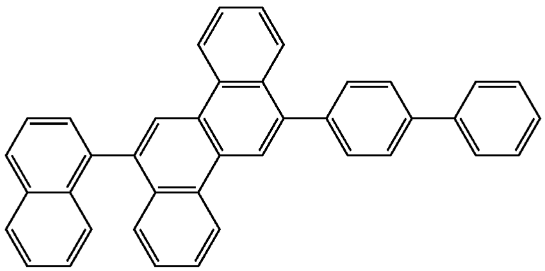
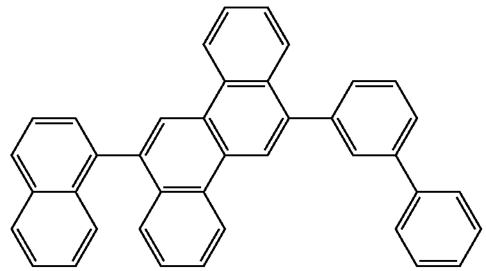
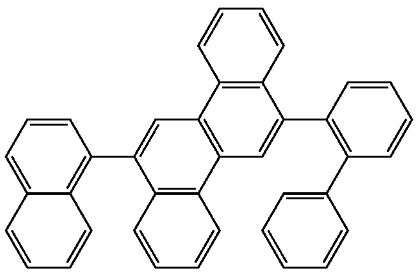
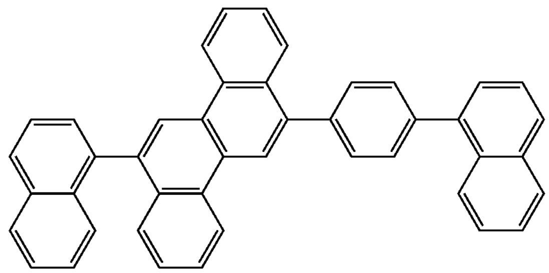
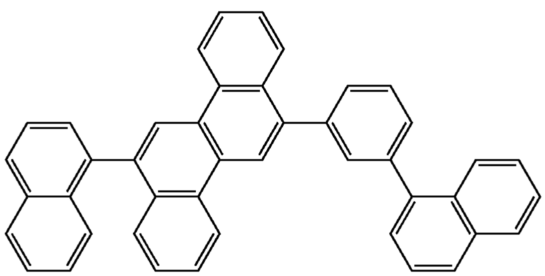
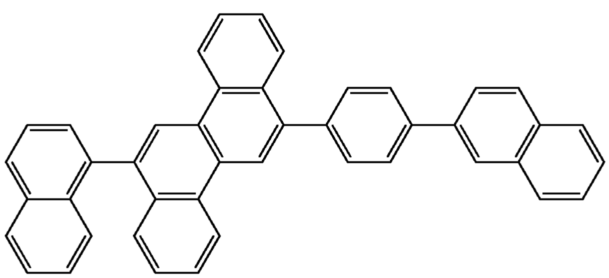
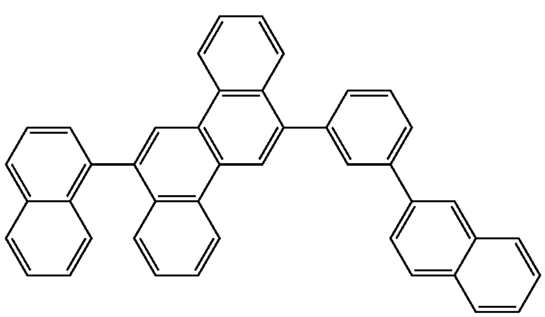
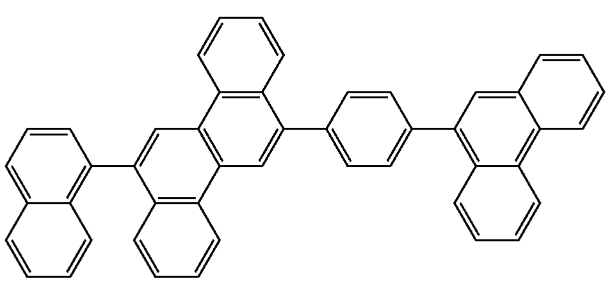

-continued
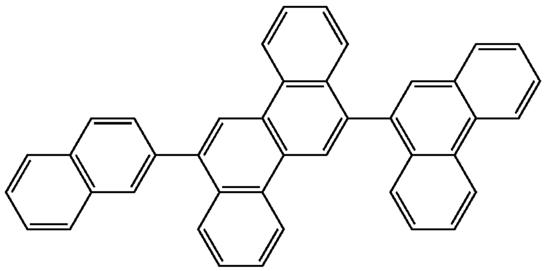
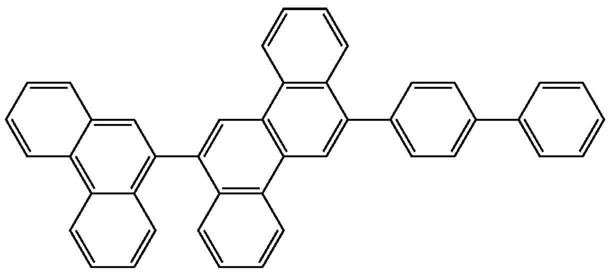
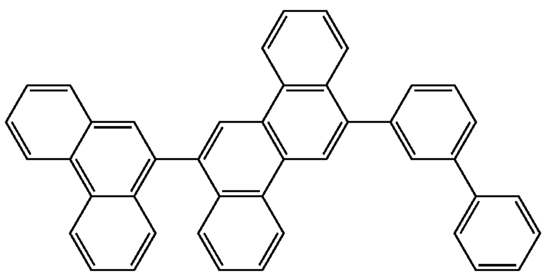
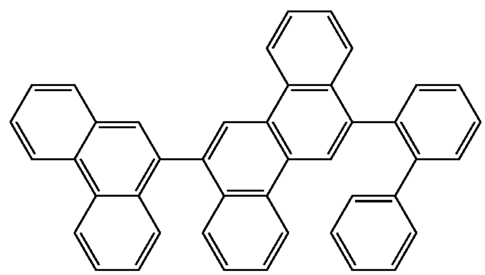
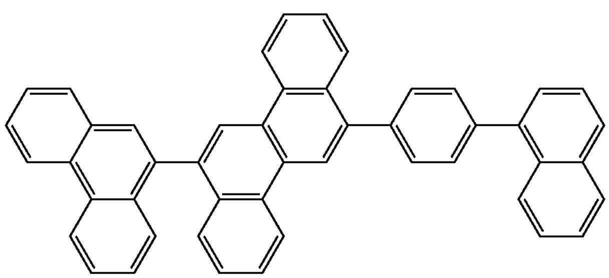
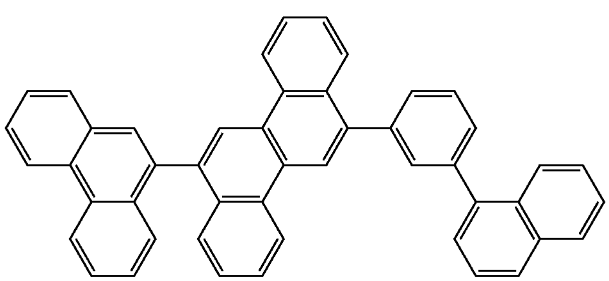
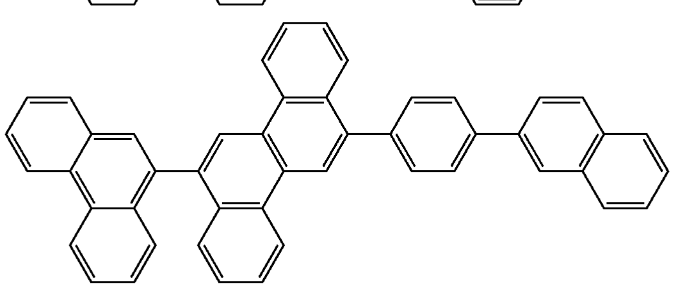

-continued
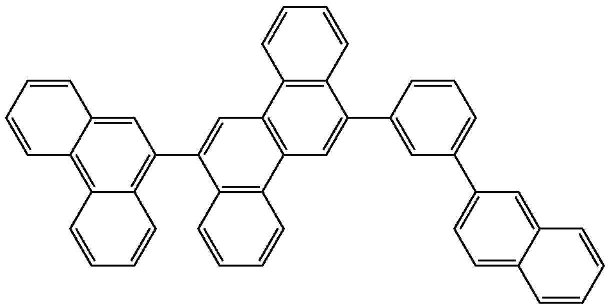
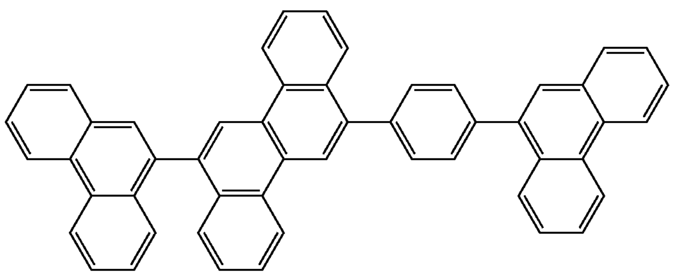
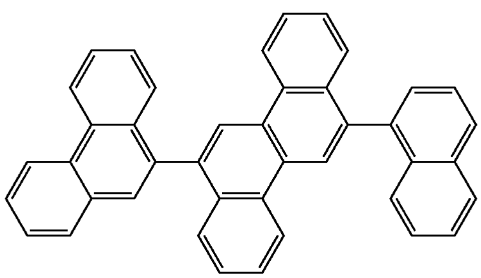
[Chemical Formula 44]
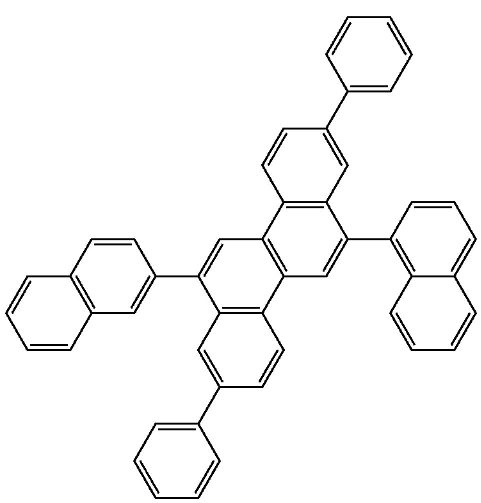

-continued
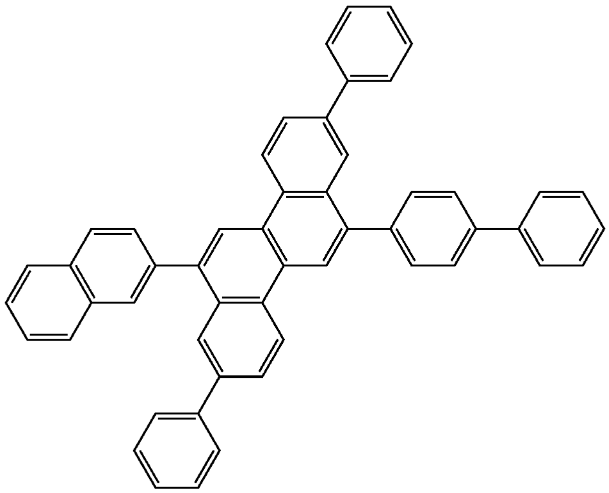
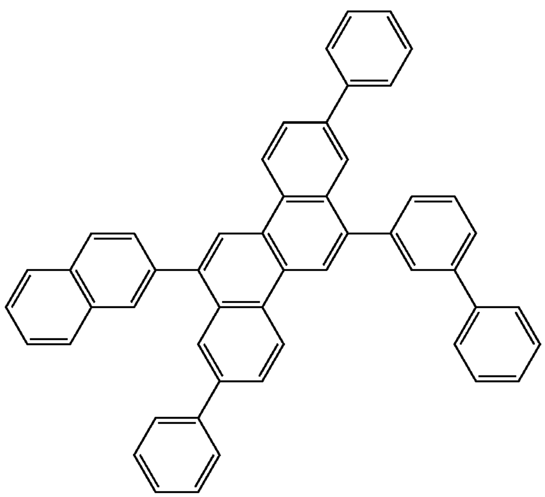
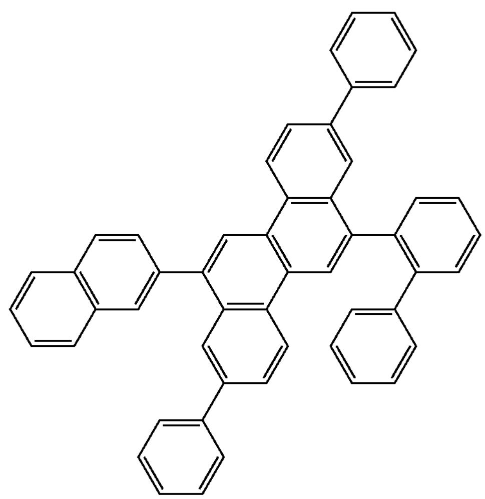
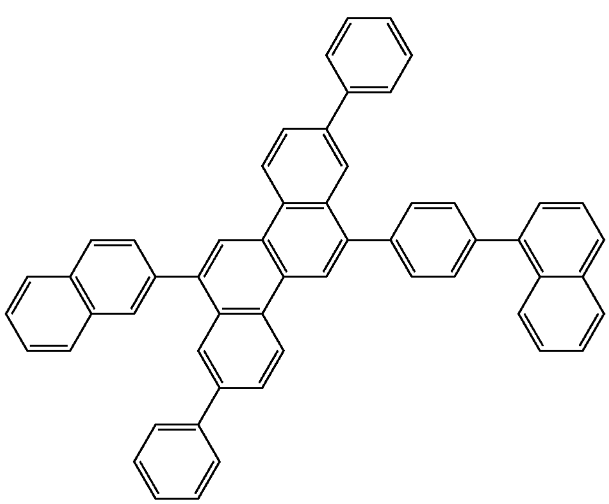

-continued
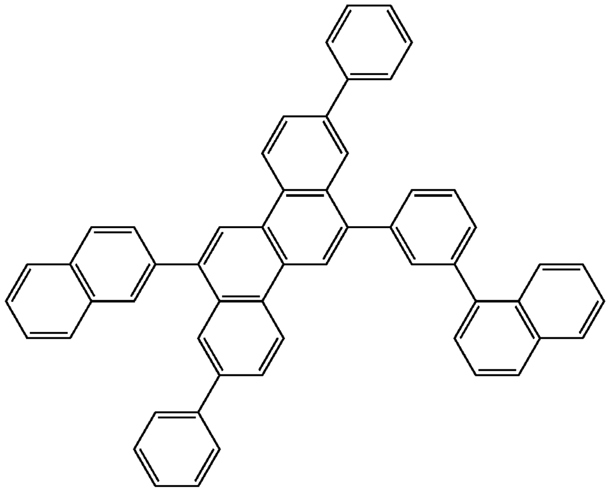
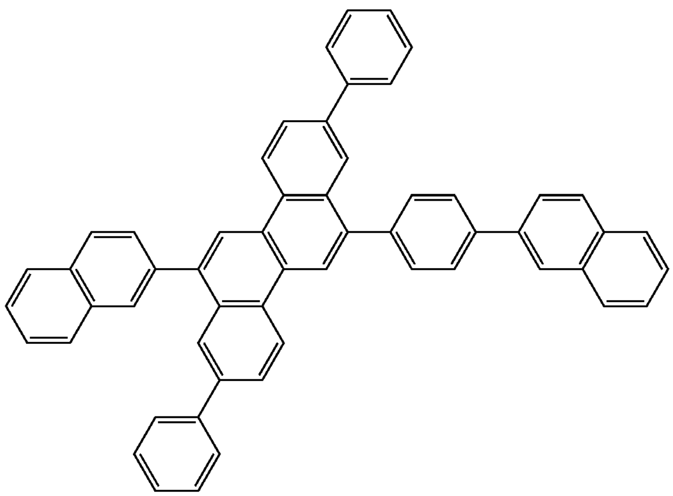
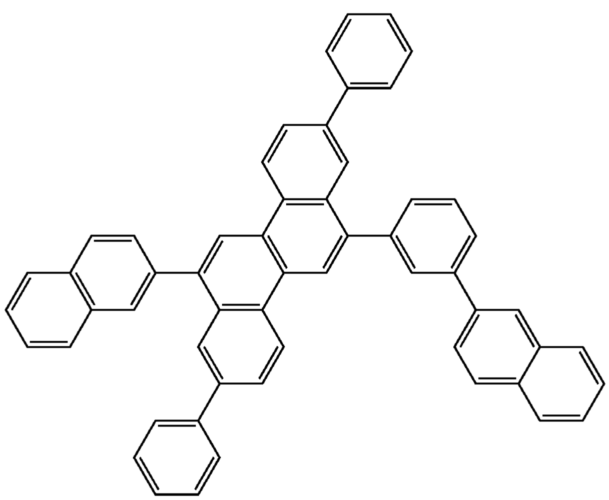

-continued
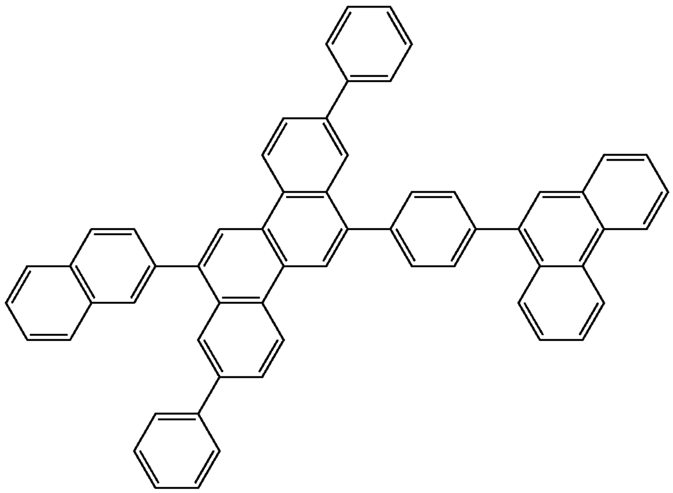
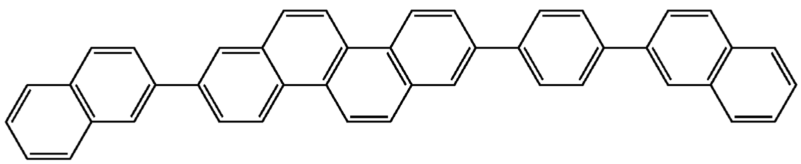
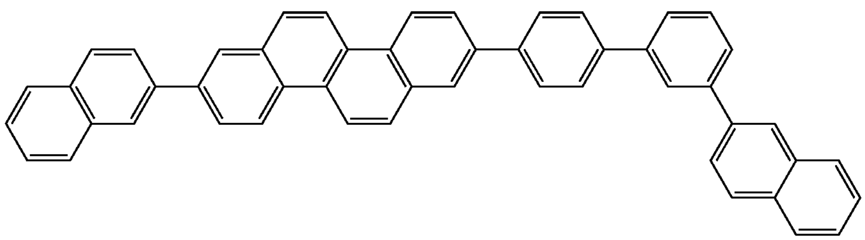
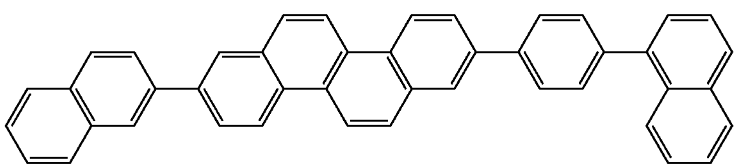
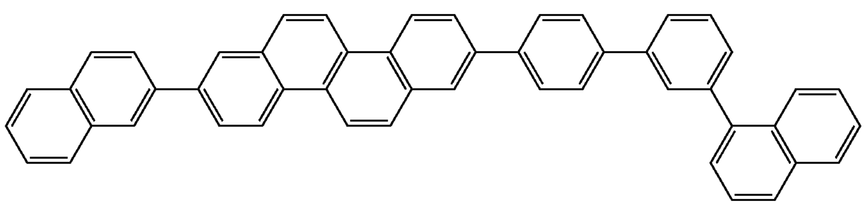
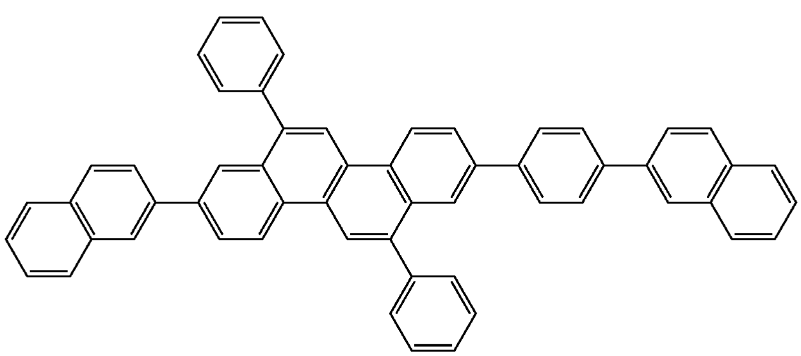

-continued
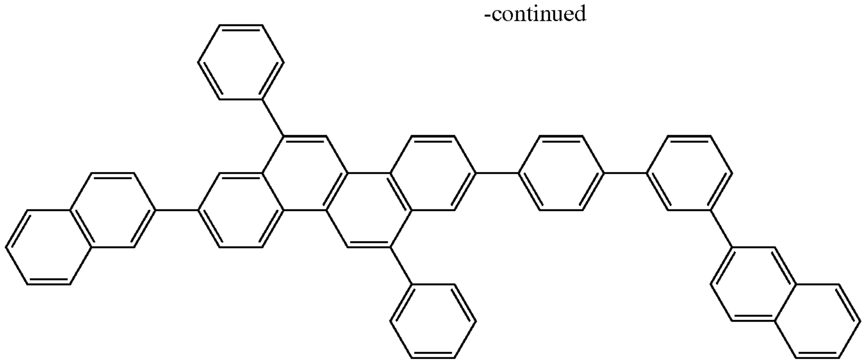
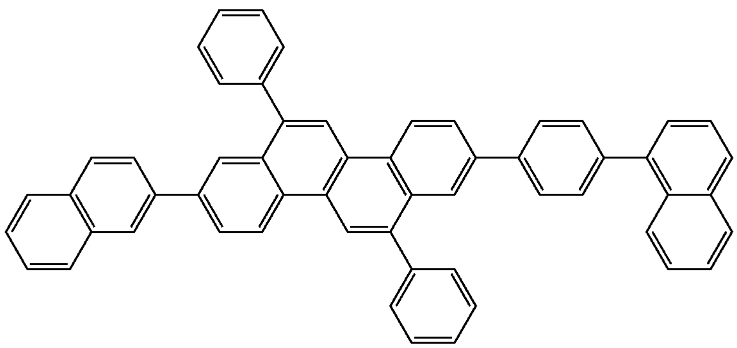
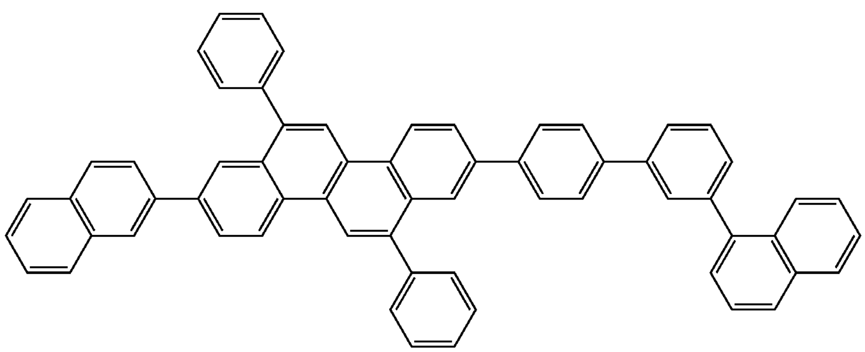 [SMILES: c1ccc(-c2cc3c4ccc(-c5ccc6ccccc6c5)cc4c(-c4ccccc4)cc3c3ccc(-c4ccc(-c5cccc(-c6cccc7ccccc67)c5)cc4)cc23)cc1]
Preferably in the aspect of the invention, the polycyclic fused aromatic skeleton is the elementary substance of a compound represented by the following formula (12) (benzo[c]phenanthrene) or its derivative.
[Chemical Formula 45]
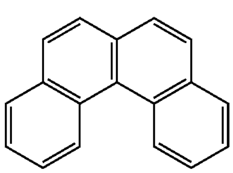
(12)
Examples of the derivative of such a compound are as follows.
[Chemical Formula 46]
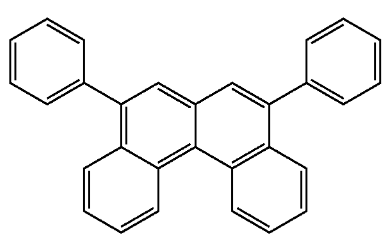

-continued
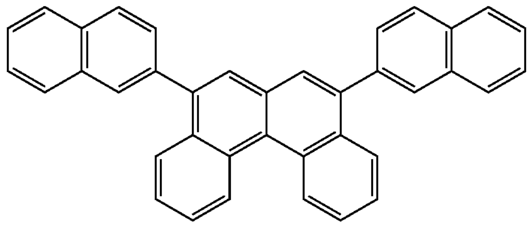
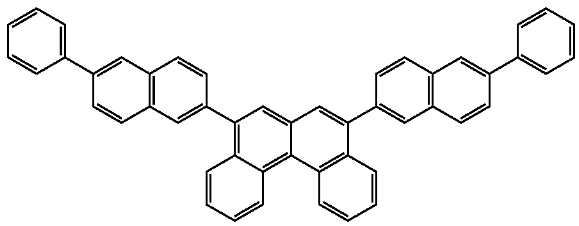
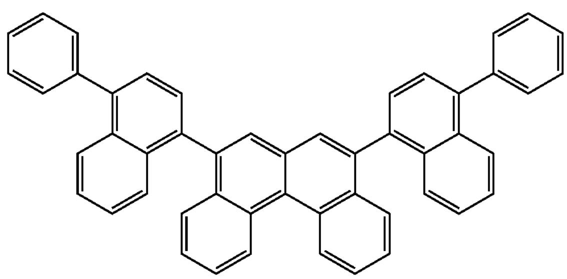
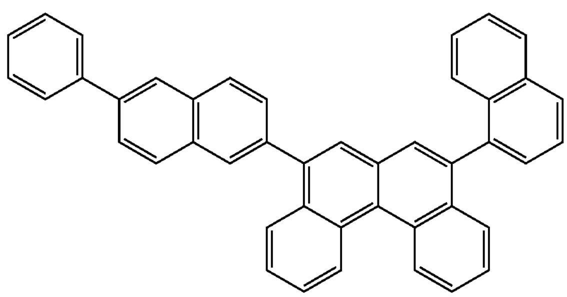
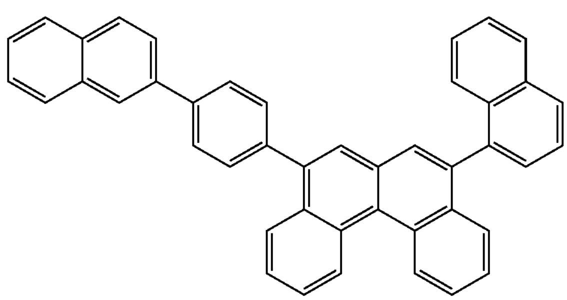
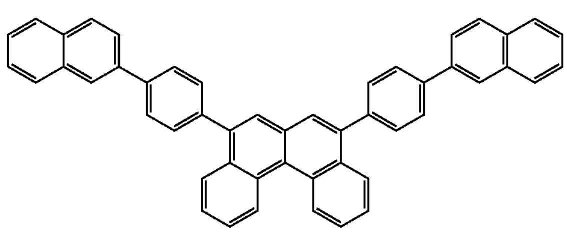
-continued
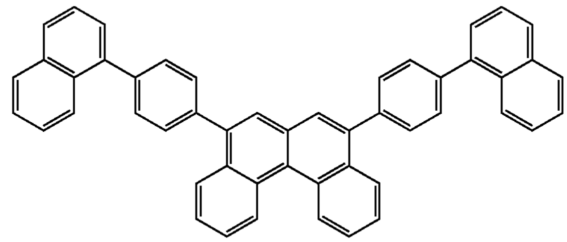
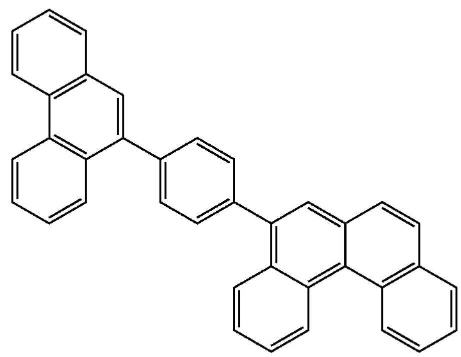
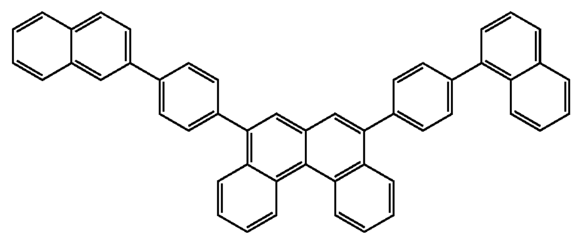
Preferably in the aspect of the invention, the polycyclic fused aromatic skeleton is the elementary substance of a compound represented by the following formula (13) (benzo [c]chrysene) or its derivative.
[Chemical Formula 47]
(13)
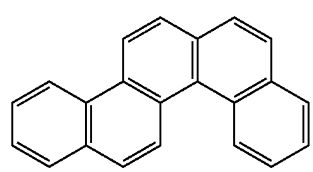
Examples of the derivative of such a compound are as follows.
[Chemical Formula 48]
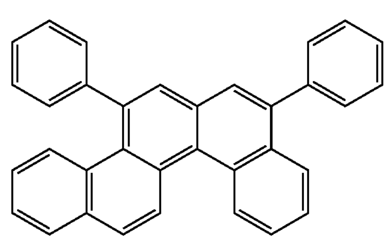

-continued

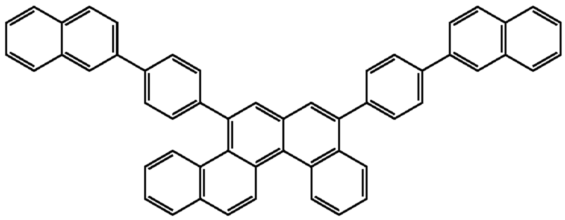

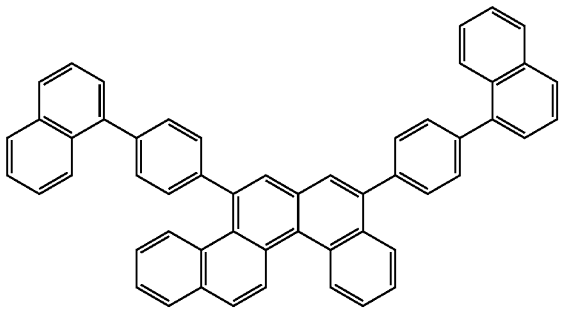

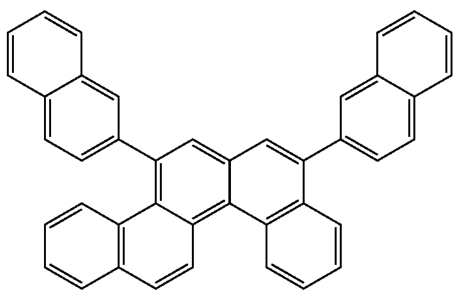

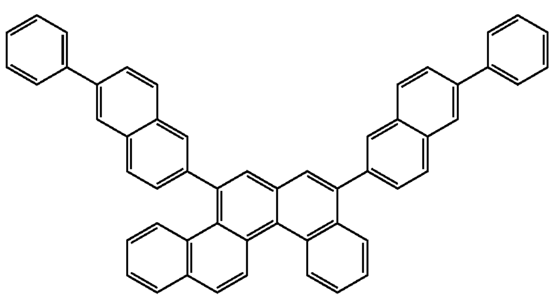

Preferably in the aspect of the invention, the polycyclic fused aromatic skeleton is the elementary substance of a compound represented by the following formula (14) (benzo[c,g]phenanthrene) or its derivative.

[Chemical Formula 49]

(14)

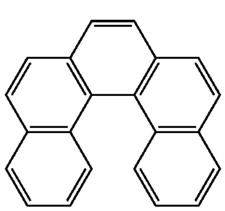

Examples of the derivative of such a compound are as follows.

[Chemical Formula 50]

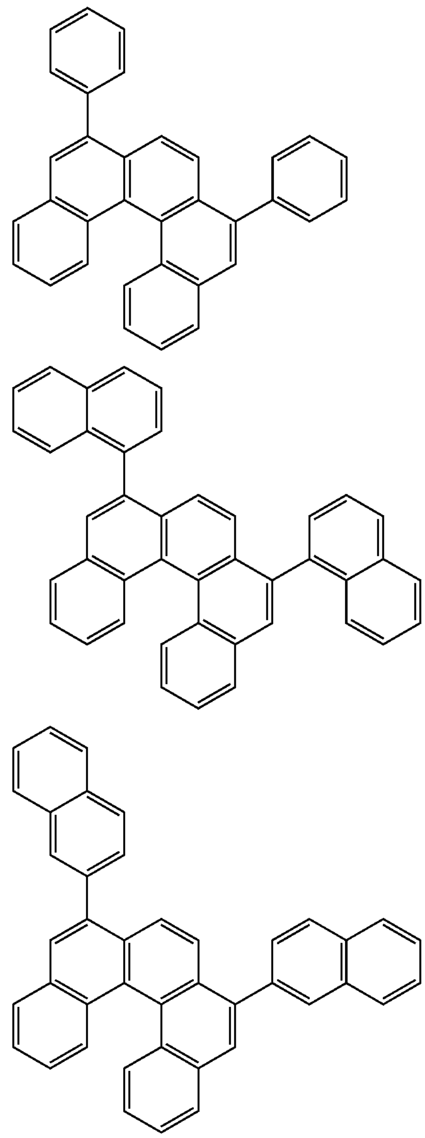

Preferably in the aspect of the invention, the polycyclic fused aromatic skeleton is the elementary substance of fluoranthene represented by the following formula (15) or its derivative.

[Chemical Formula 51]

(15)

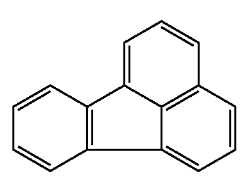

Examples of the fluoranthene derivative are those represented by the following formulae.
[Chemical Formula 52]
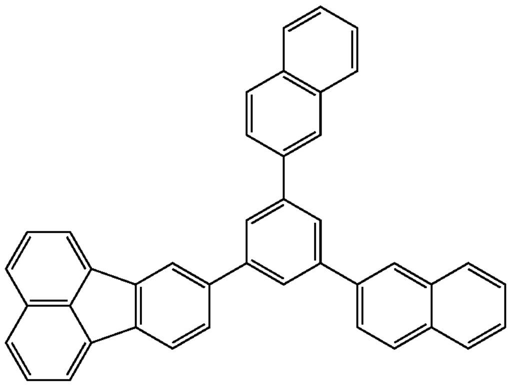
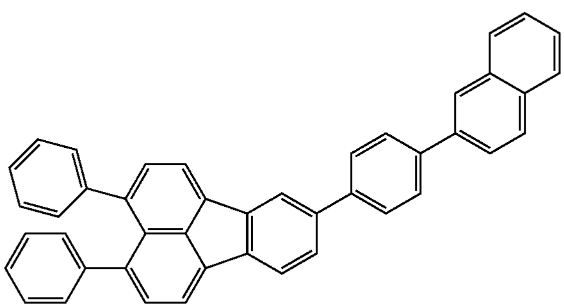
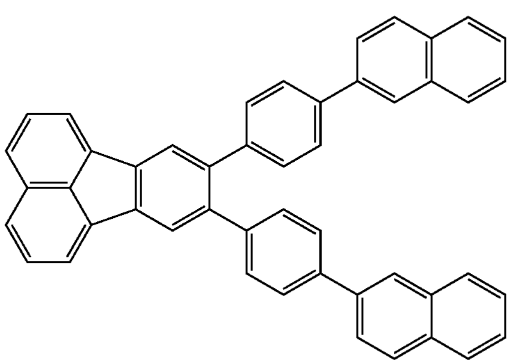
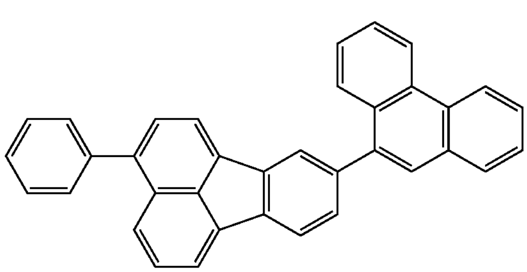
-continued
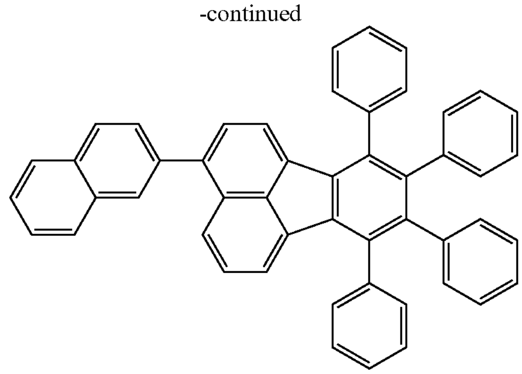
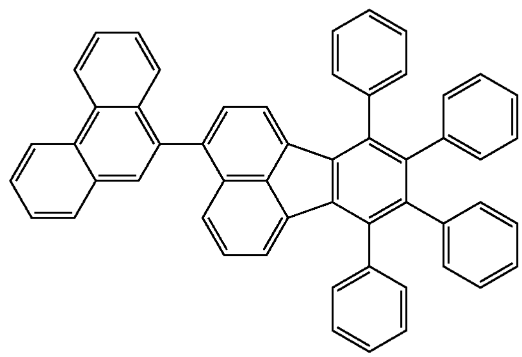
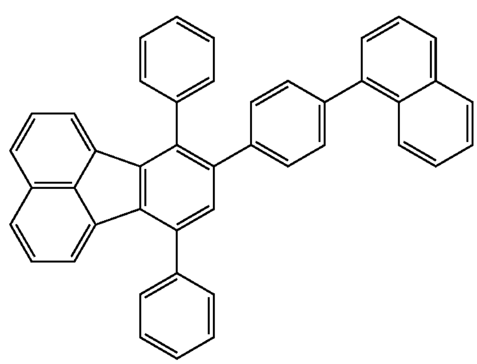
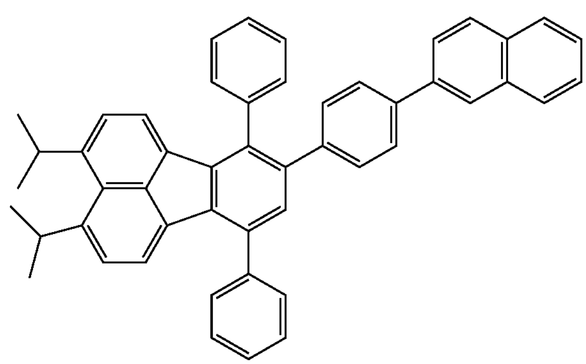

-continued
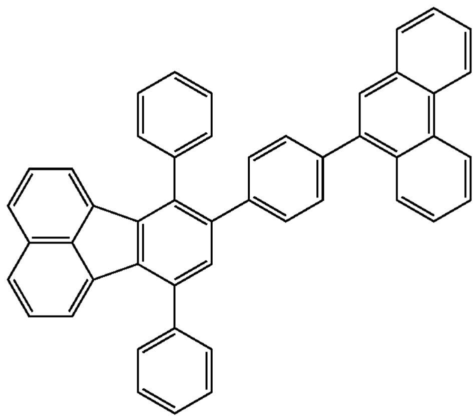
[Chemical Formula 53]
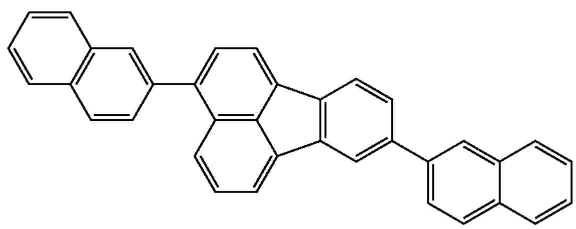
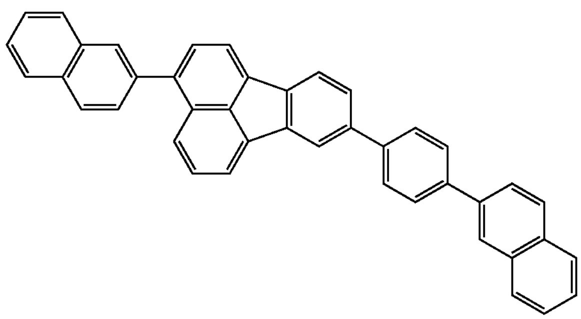
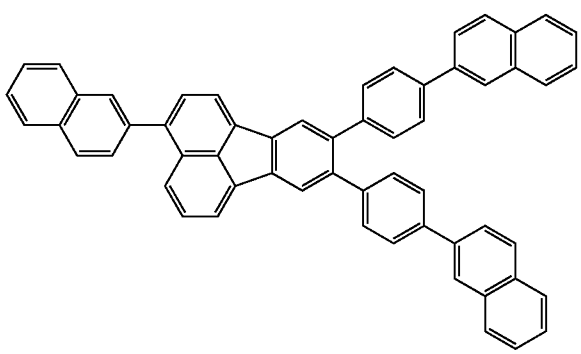
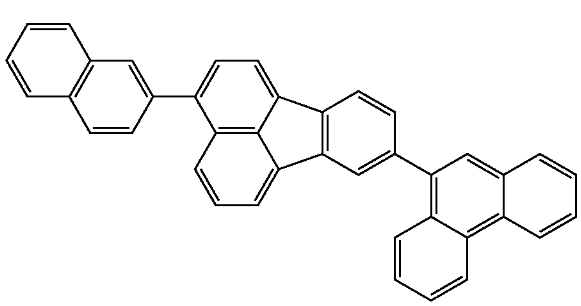
-continued
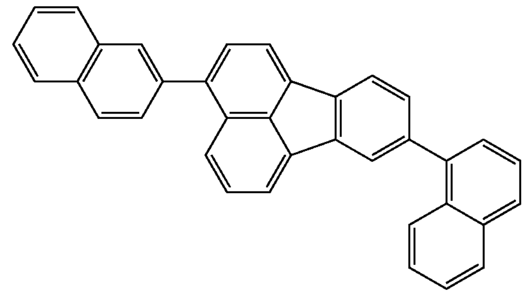
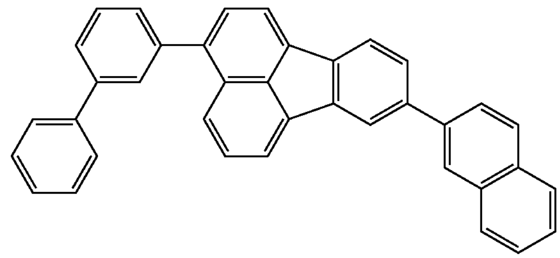
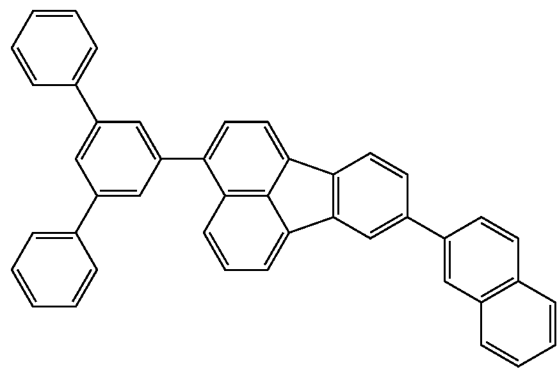
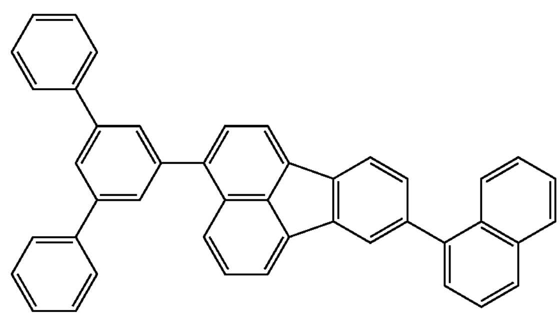
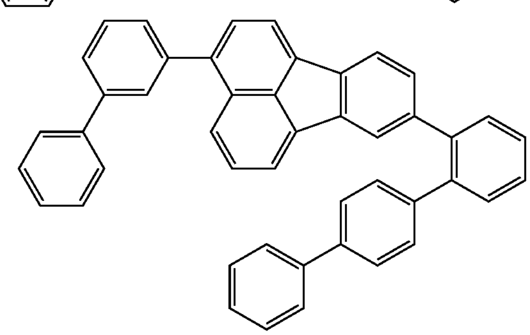
Examples of the substituted or unsubstituted benzofluoranthene are a benzo[b]fluoranthene derivative represented by the following formula (151) and a benzo[k]fluoranthene derivative represented by a formula (152).

[Chemical Formula 54]

(151)

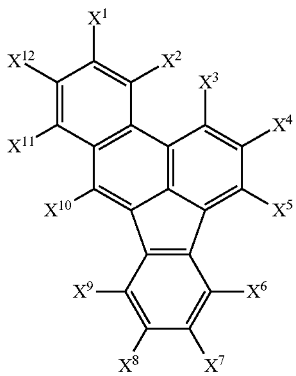

(152)

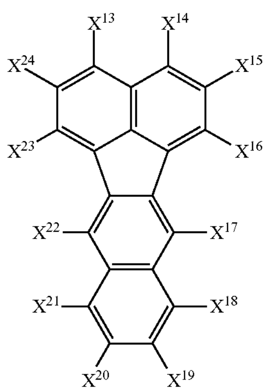

In the formulae (151) and (152), $X^1$ to $X^{24}$ each represent a hydrogen atom, a halogen atom, a linear, branched or cyclic alkyl group, a linear, branched or cyclic alkoxy group, or a substituted or unsubstituted aryl group.

The aryl group represents a carbocyclic aromatic group such as a phenyl group and naphthyl group, or a heterocyclic aromatic group such as a furyl group, thienyl group and pyridyl group.

$X^1$ to $X^{24}$ each preferably represent hydrogen atom, halogen atom (such as fluorine atom, chlorine atom, or bromine atom), linear, branched or cyclic alkyl group having 1 to 16 carbon atoms (such as methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group, or n-hexadecyl group), linear, branched or cyclic alkoxy group having 1 to 16 carbon atoms (such as methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxy group, n-dodecyloxy group, n-tetradecyloxy group, or n-hexadecyloxy group), or substituted or unsubstituted aryl group having 4 to 16 carbon atoms (such as phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octylphenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group, or 4-pyridyl group), more preferably hydrogen atom, fluorine atom, chlorine atom, alkyl group having 1 to 10 carbon atoms, alkoxy group having 1 to 10 carbon atoms or aryl group having 6 to 12 carbon atoms, further more preferably hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the benzo[b]fluoranthene derivative represented by the formula (151) are as follows.

[Chemical Formula 55]

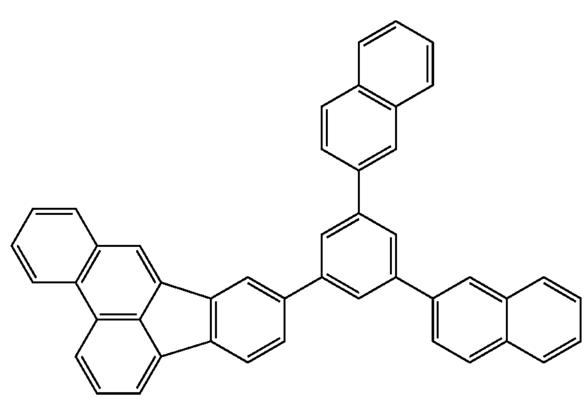

-continued
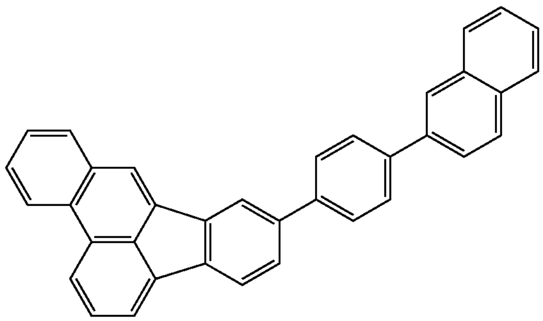
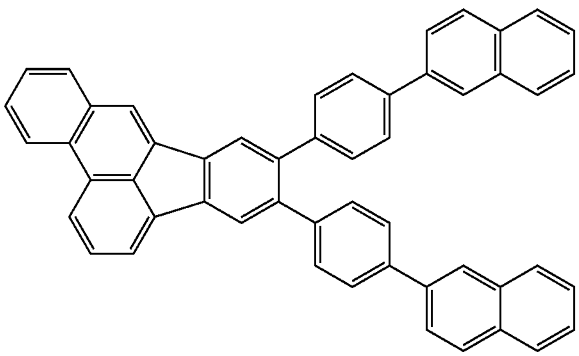
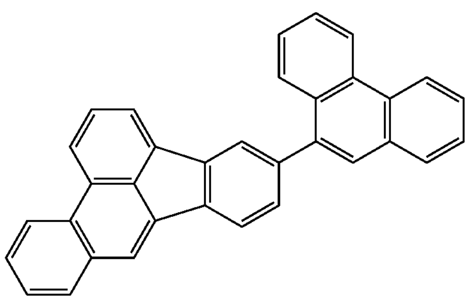
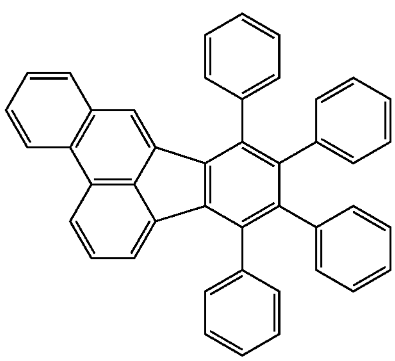
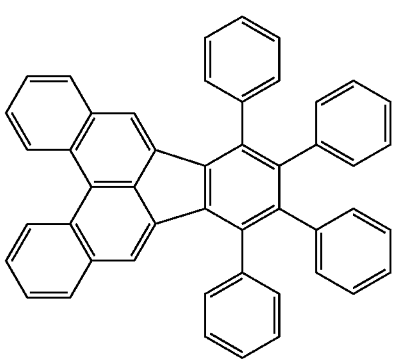
-continued
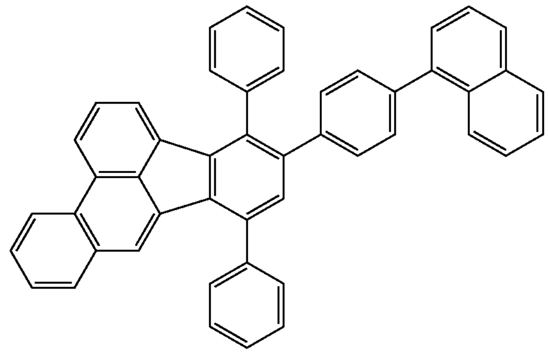
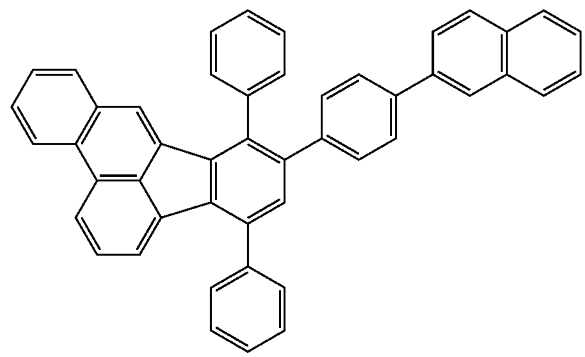
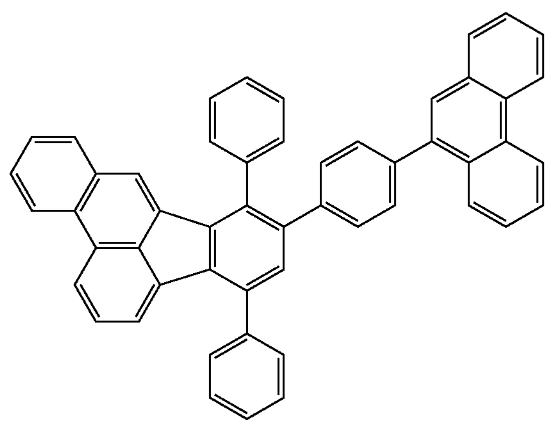
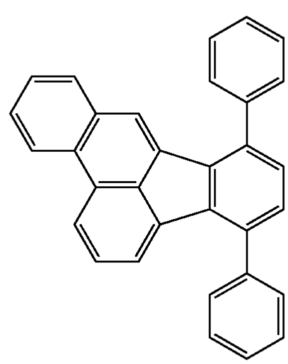 [SMILES: c1ccc(-c2ccc(-c3ccccc3)c3c2-c2cccc4c2c-3cc2ccccc24)cc1]

Examples of the benzo[k]fluoranthene derivative represented by the formula (152) are as follows.

[Chemical Formula 56]

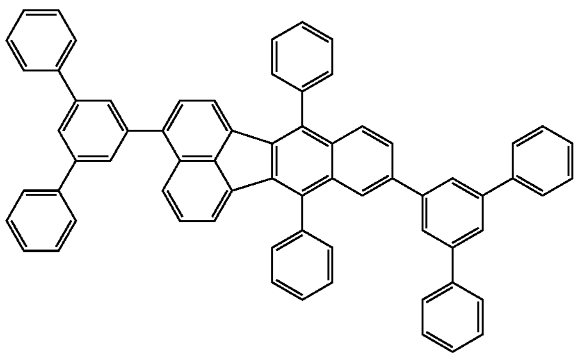

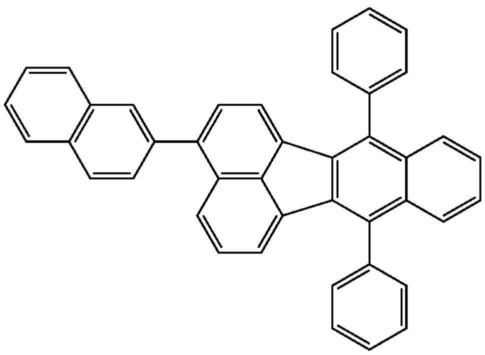

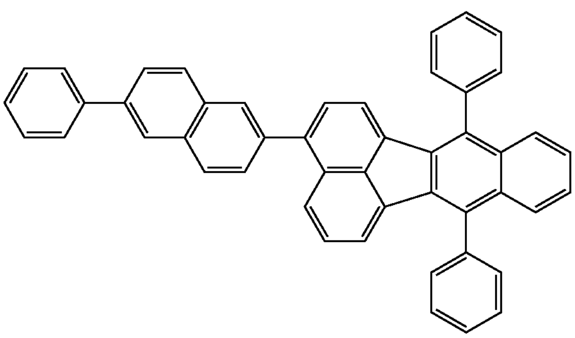

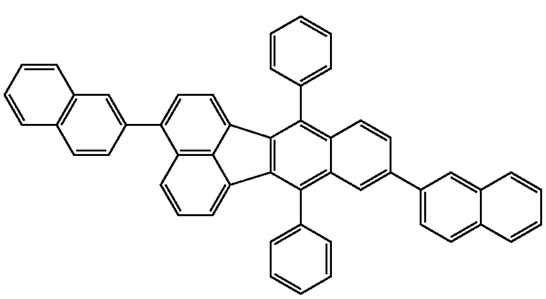

-continued

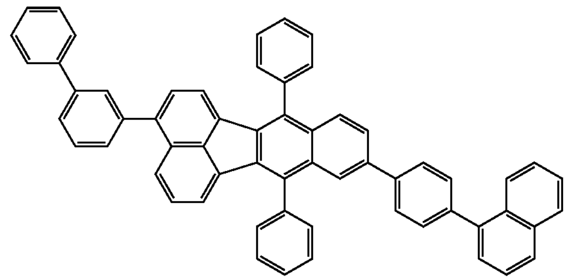

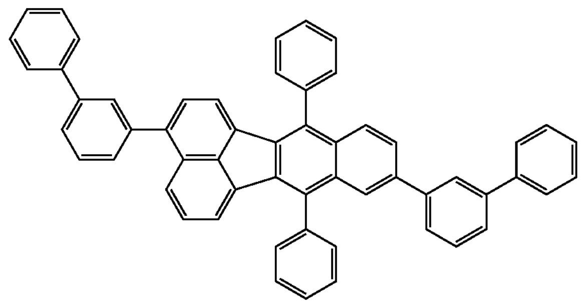

Preferably in the aspect of the invention, the polycyclic fused aromatic skeleton is the elementary substance of triphenylene represented by the following formula (16) or its derivative. Carbon atoms of the skeleton may be partly replaced by nitrogen atom(s).

[Chemical Formula 57]

(16)

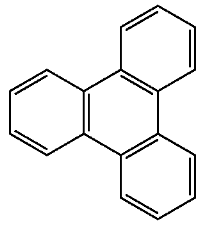

Examples of the triphenylene derivative are those represented by the following formulae.
[Chemical Formula 58]
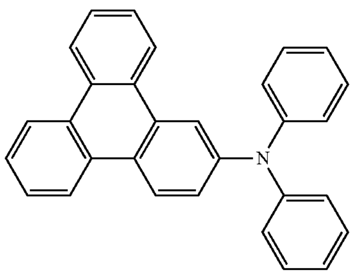
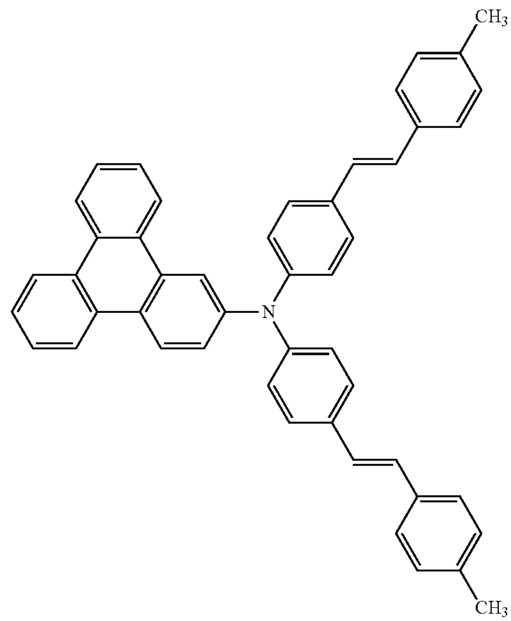
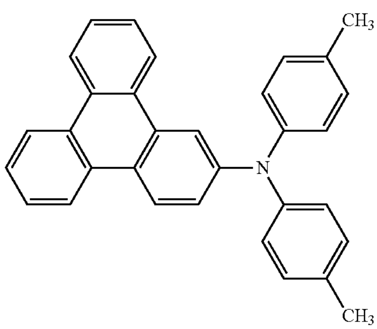
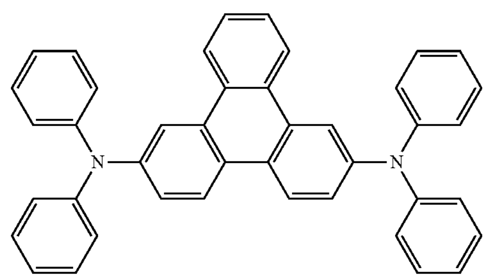
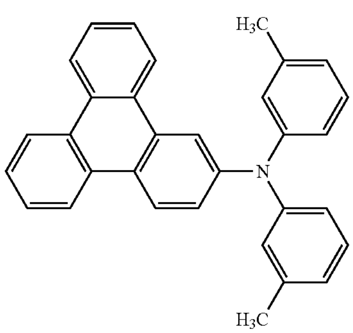
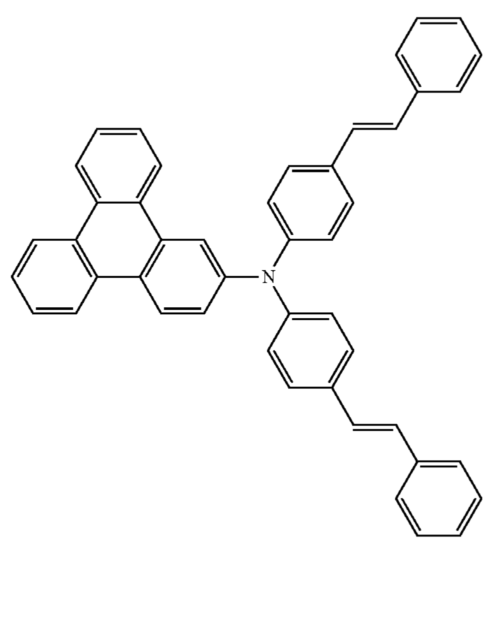

-continued
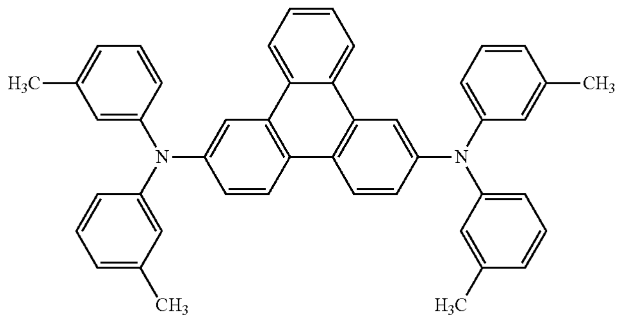
[Chemical Formula 59]
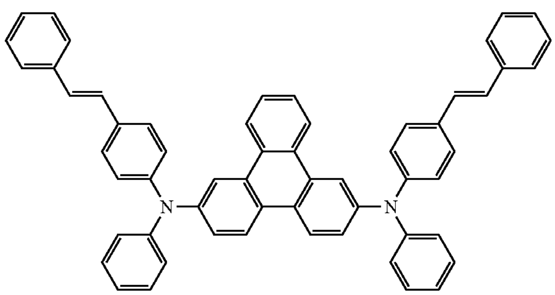
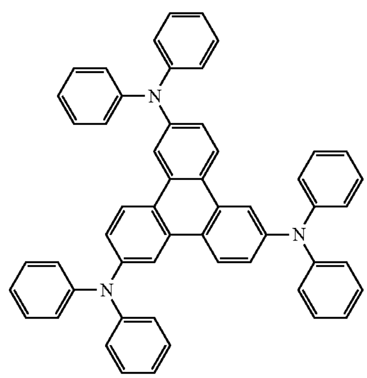
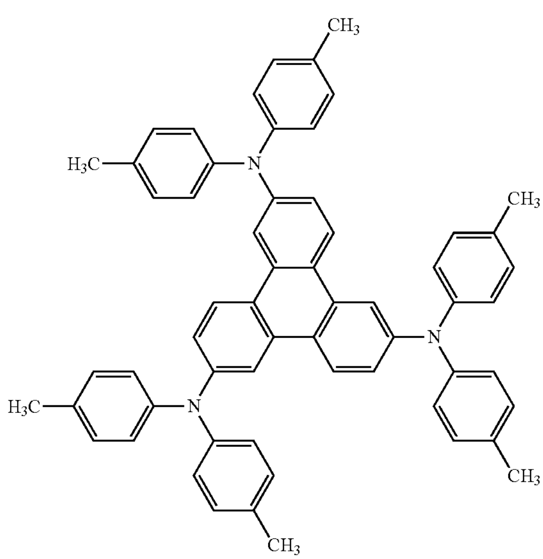
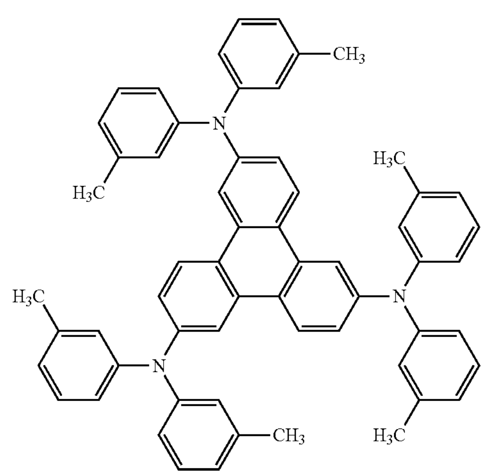

-continued
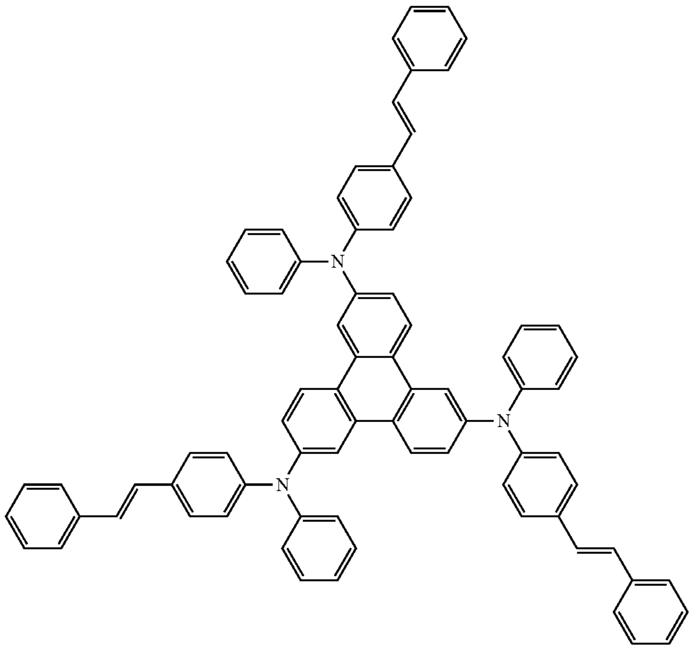
[Chemical Formula 60]
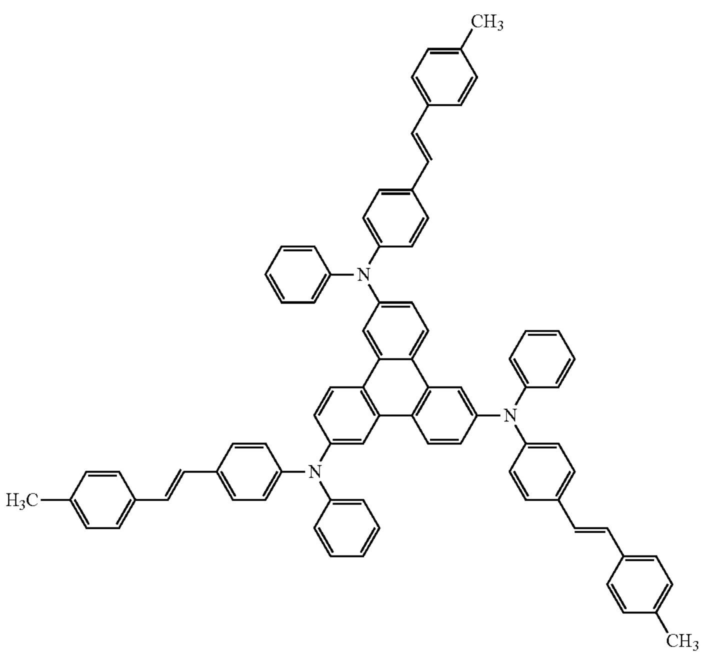

-continued
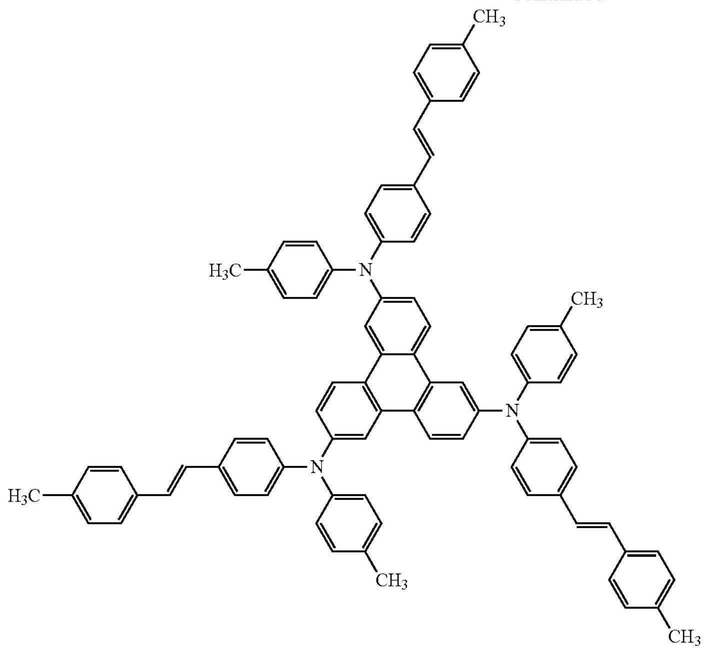
[Chemical Formula 61]
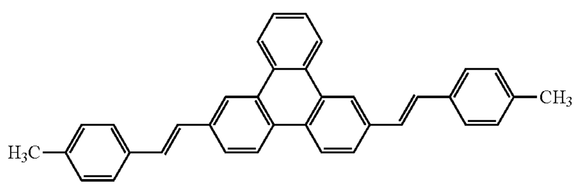
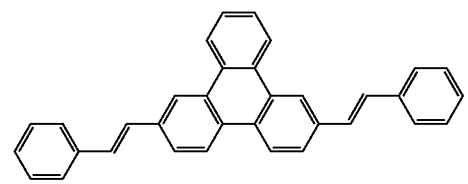
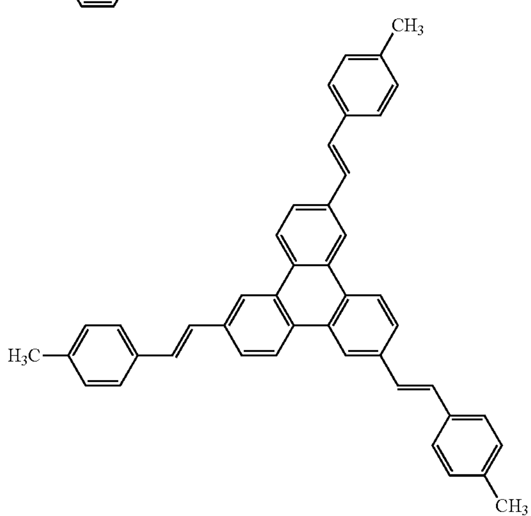
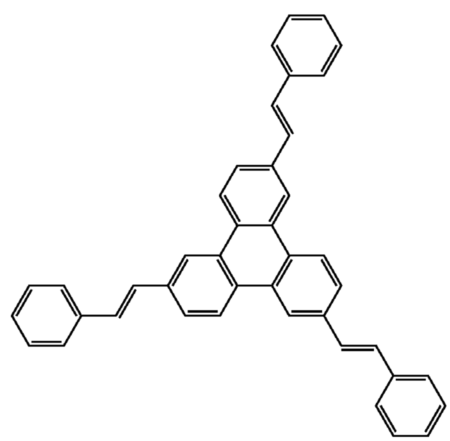
[Chemical Formula 62]
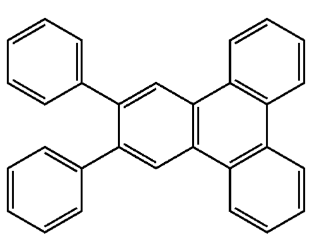
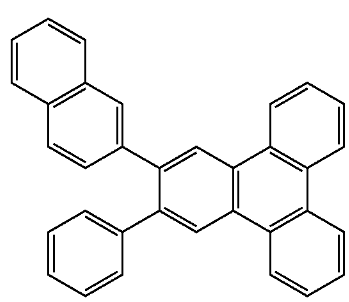

-continued
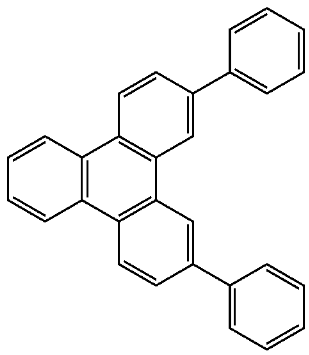
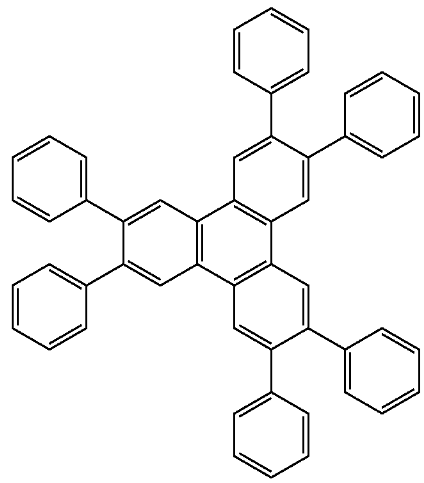
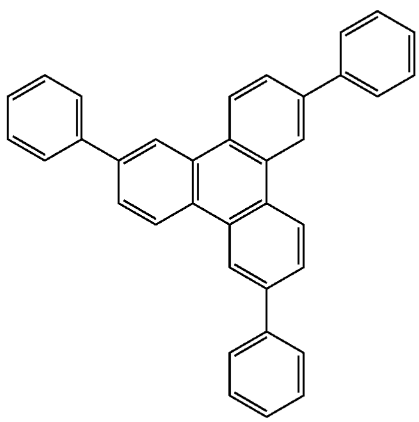
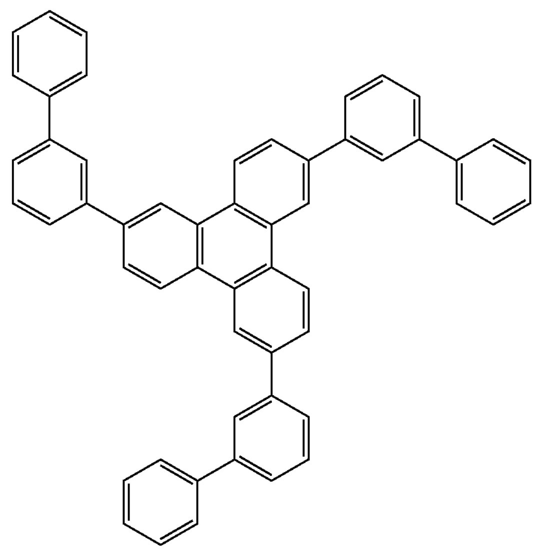
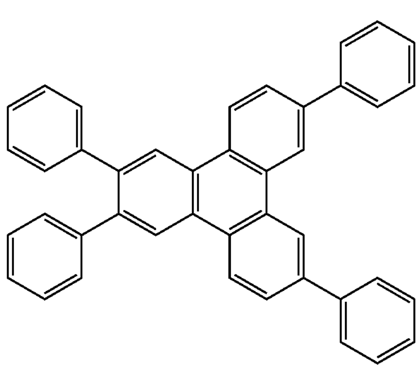 [SMILES: c1ccc(-c2ccc3c(c2)c2cc(-c4ccccc4)ccc2c2cc(-c4ccccc4)c(-c4ccccc4)cc32)cc1]

The polycyclic fused aromatic skeleton may contain a nitrogen atom, examples of which are shown below.

[Chemical Formula 63]

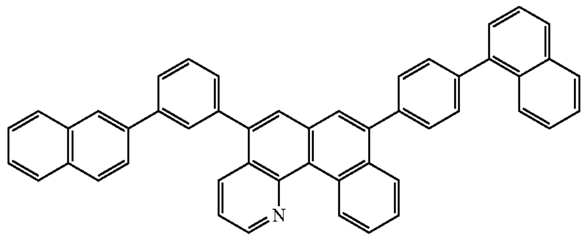

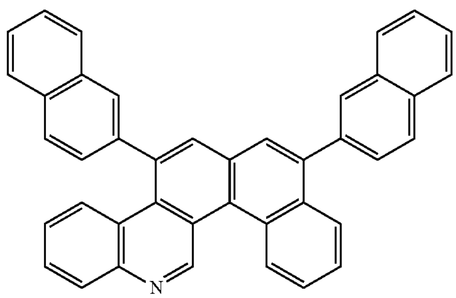

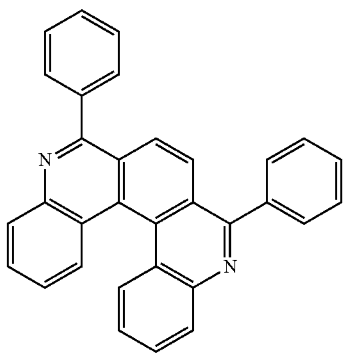

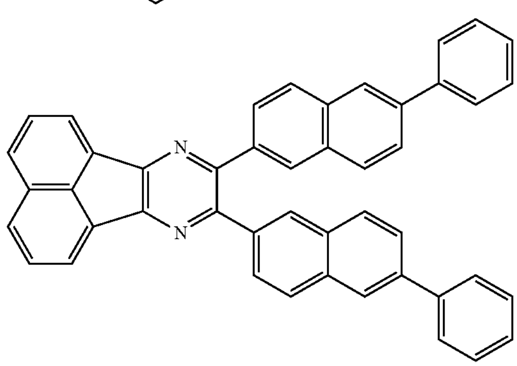

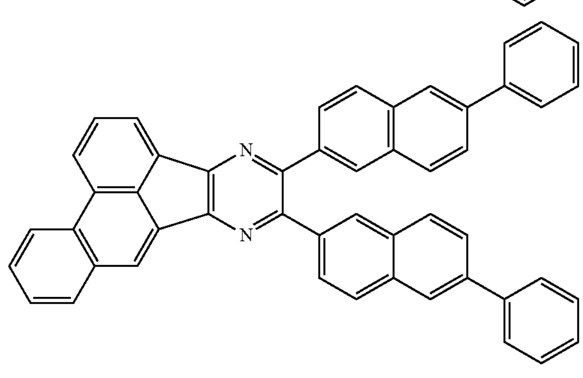

-continued

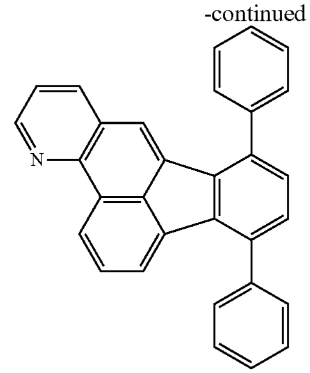

Examples of the compound represented by the formula (4) are compounds represented by the following formulae (41) to (48).

[Chemical Formula 64]

$$\mathrm{Np{-}(Np)_{\mathit{n}}{-}Np} \quad (41)$$

In the formula (41), Np represents a substituted or unsubstituted naphthalene skeleton, and n represents an integer of 0 to 3.

[Chemical Formula 65]

(42)

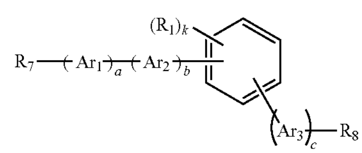

In the formula (42), $Ar_1$ and $Ar_2$ each independently represent a substituted or unsubstituted naphthalene skeleton or a substituted or unsubstituted phenanthrene skeleton. $Ar_3$ represents a substituted or unsubstituted aryl group having 6 to 30 ring carbon atoms.

However, at least one of $Ar_1$, $Ar_2$ and $Ar_3$ is a naphthalene skeleton. $R_1$, $R_7$ and $R_8$ each represent a hydrogen atom or a substituent. a, b and c each represent an integer of 1 to 3.

k represents an integer of 1 to 4. When k is 2 or more, $R_1$ may be mutually the same or different.

[Chemical Formula 66]

(43)

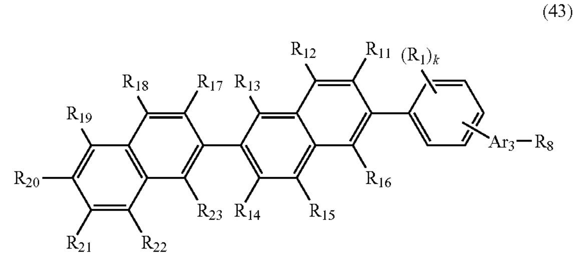

In the formula (43), $Ar_3$ represents an aryl group having 6 to 30 ring carbon atoms or arylene group, and $R_1$, $R_8$, $R_{11}$ to $R_{23}$ each represent a hydrogen atom or a substituent.

k represents an integer of 1 to 4. When k is 2 or more, $R_1$ may be mutually the same or different.

[Chemical Formula 67]

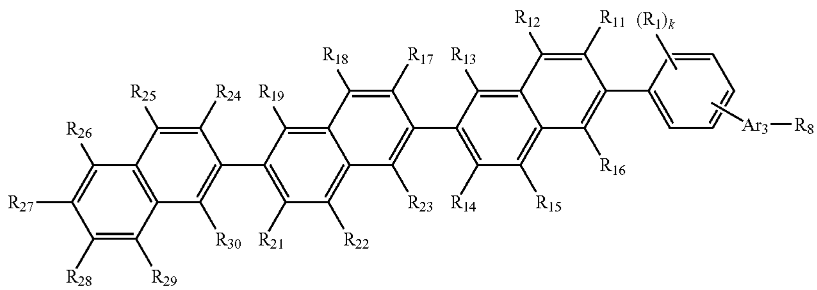

(44)

In the formula (44), $Ar_3$ represents an aryl group having 6 to 30 ring carbon atoms or arylene group, and $R_1$, $R_8$, $R_{11}$ to $R_{19}$ and $R_{21}$ to $R_{30}$ each represent a hydrogen atom or a substituent.

k represents an integer of 1 to 4. When k is 2 or more, $R_1$ may be mutually the same or different.

[Chemical Formula 68]

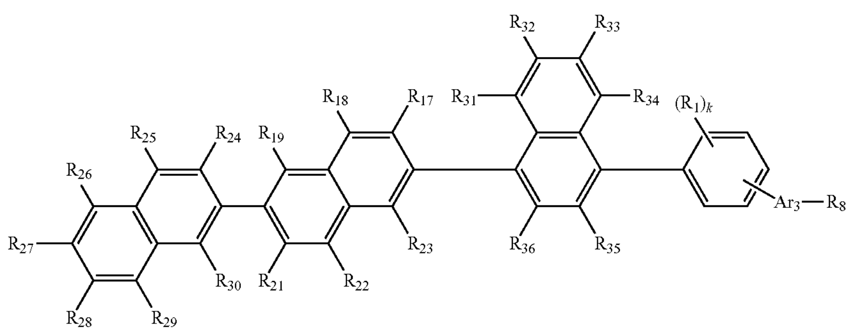

(45)

In the formula (45), $Ar_3$ represents an aryl group having 6 to 30 ring carbon atoms or arylene group, and $R_1$, $R_8$, $R_{17}$ to $R_{19}$ and $R_{21}$ to $R_{36}$ each represent a hydrogen atom or a substituent.

k represents an integer of 1 to 4. When k is 2 or more, $R_1$ may be mutually the same or different.

[Chemical Formula 69]

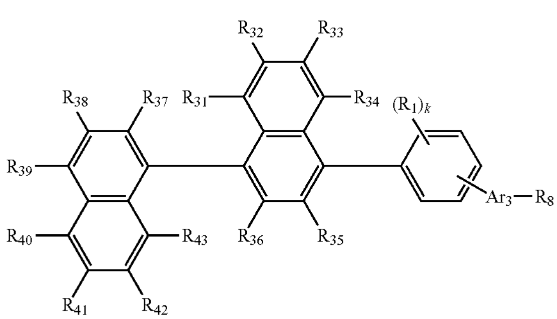

(46)

In the formula (46), $Ar_3$ represents an aryl group having 6 to 30 ring carbon atoms or arylene group, and $R_1$, $R_8$, $R_{31}$ to $R_{43}$ each represent a hydrogen atom or a substituent.

k represents an integer of 1 to 4. When k is 2 or more, $R_1$ may be mutually the same or different.

[Chemical Formula 70]

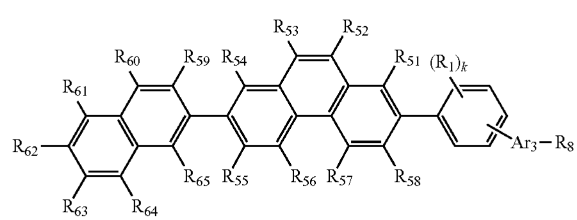

(47)

In the formula (47), $Ar_3$ represents an aryl group having 6 to 30 ring carbon atoms or arylene group, and $R_1$, $R_8$, $R_{51}$ to $R_{65}$ each represent a hydrogen atom or a substituent.

k represents an integer of 1 to 4. When k is 2 or more, $R_1$ may be mutually the same or different.

[Chemical Formula 71]
(48)
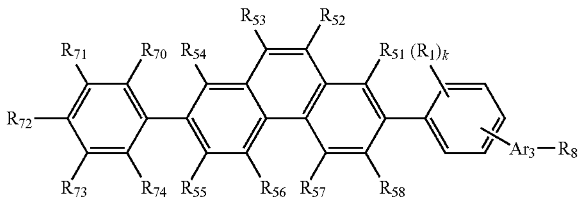
In the formula (48), $Ar_3$ represents an aryl group having 6 to 30 ring carbon atoms or arylene group, and $R_1$, $R_8$, $R_{51}$ to $R_{58}$ and $R_{70}$ to $R_{74}$ each represent a hydrogen atom or a substituent.
k represents an integer of 1 to 4. When k is 2 or more, $R_1$ may be mutually the same or different.
Examples of the compounds are as follows.
[Chemical Formula 72]
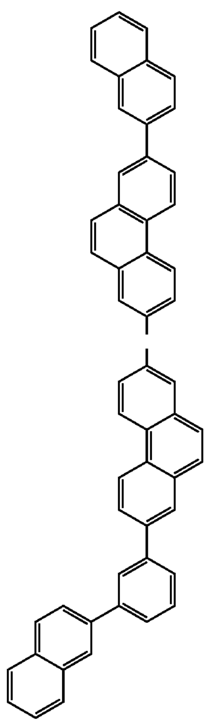
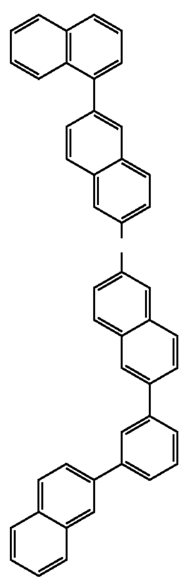
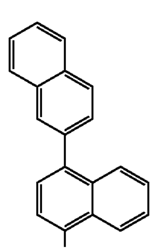
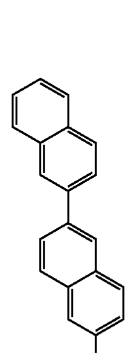
-continued
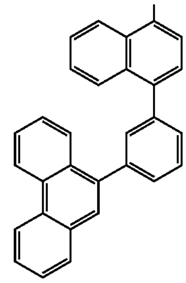
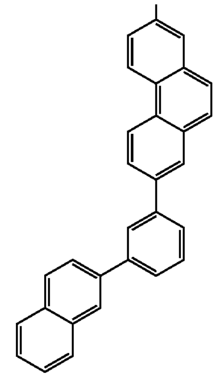
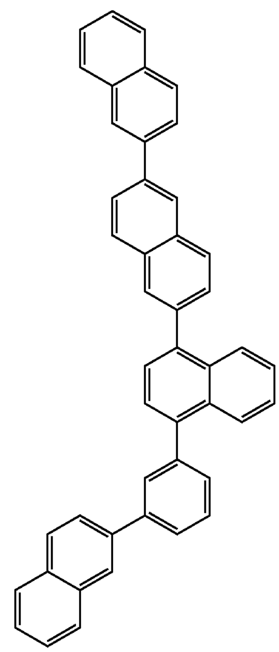
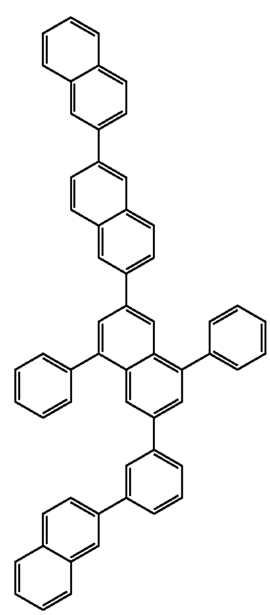

-continued
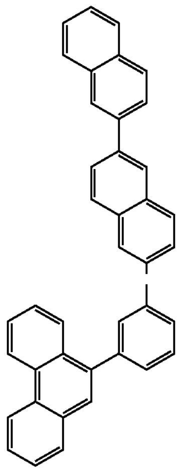
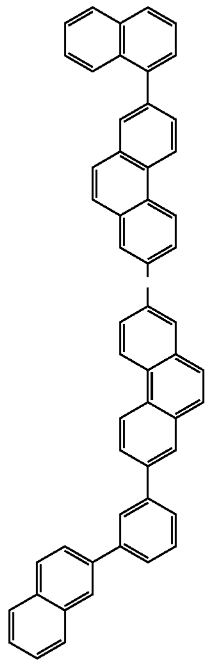
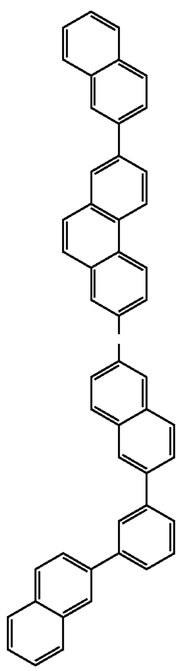
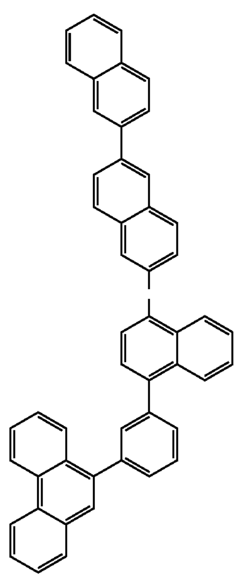
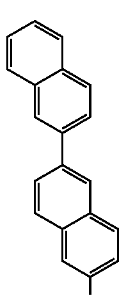
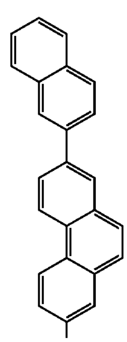
-continued
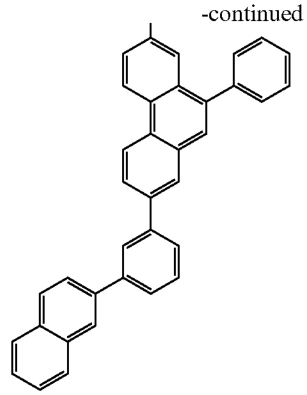
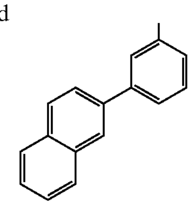
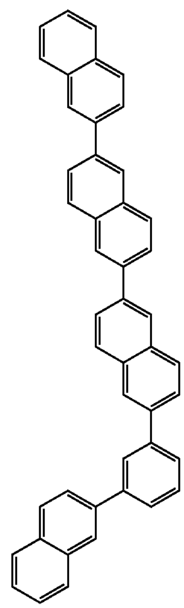
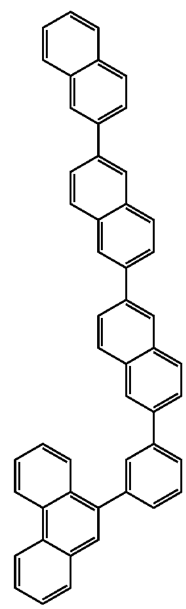
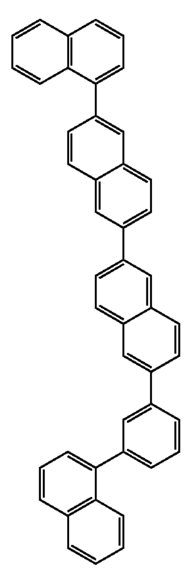
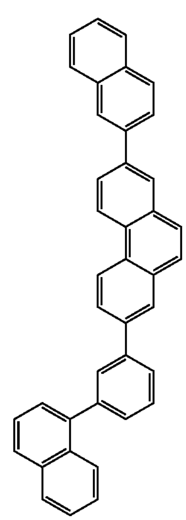

-continued
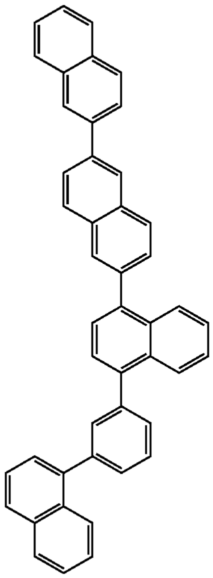
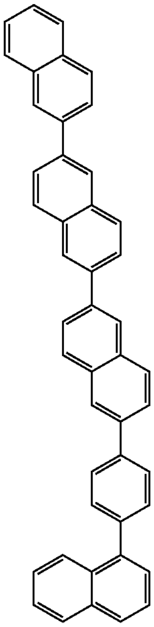
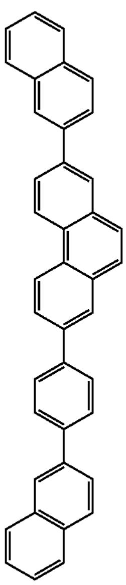
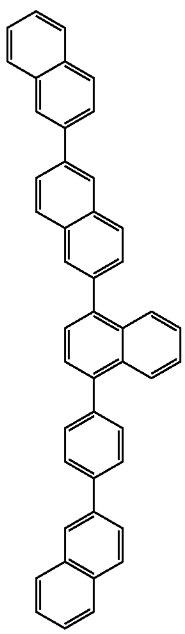
-continued
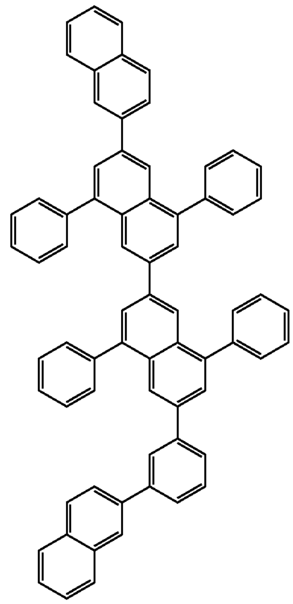
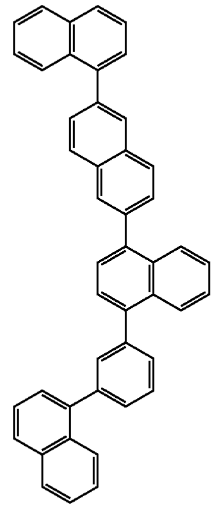
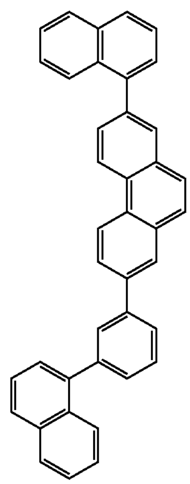
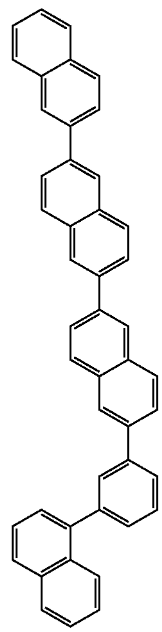
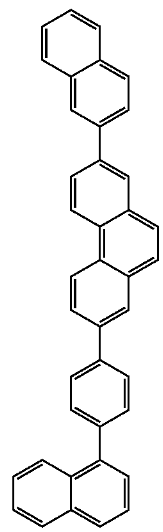
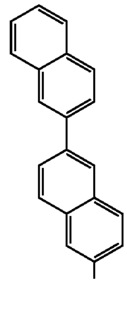
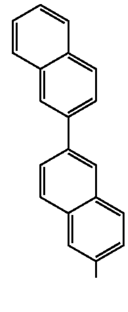

-continued

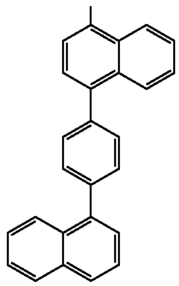

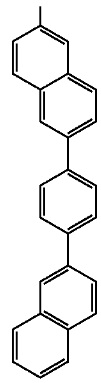

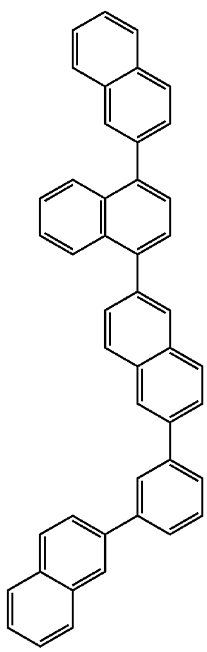

An example of the host material is an oligonaphthalene derivative represented by the following formula (49).

[Chemical Formula 73]

$$Ar^1 \leftarrow\!\!\left( Ar^2 \right)_n\!\!\rightarrow Ar^3 \quad (49)$$

(50)

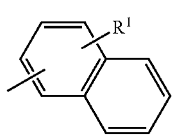

(51)

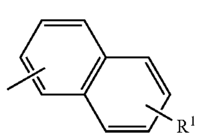

(52)

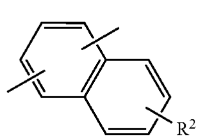

-continued (53)

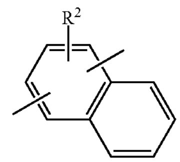

(54)

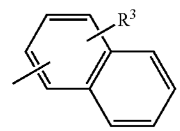

(55)

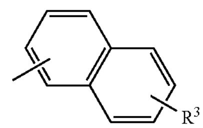

In the formula: n is 1 or 2; $Ar^1$ is a substituent represented by the general formula (50) or (51); $Ar^2$ is a substituent represented by the general formula (52) or (53); $Ar^3$ is a substituent represented by the general formula (54) or (55); $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (56).

[Chemical Formula 74]

$$Ar^1 - \left( Ar^2 \right)_n - Ar^3 \quad (56)$$

(57)

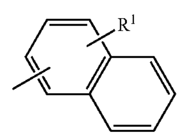

(58)

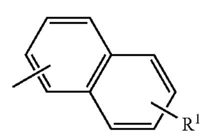

(59)

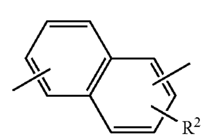

(60)

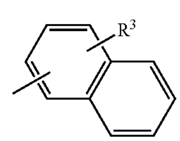

(61)

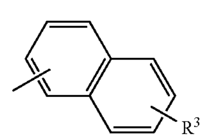

In the formula: n is 1 or 2; $Ar^1$ is a substituent represented by the general formula (57) or (58); $Ar^2$ is a substituent represented by the general formula (59); $Ar^3$ is a substituent represented by the general formula (60) or (61); and $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

More specifically, the oligonaphthalene derivative exemplarily have the structure represented by the general formula (62).

[Chemical Formula 75]

(62)

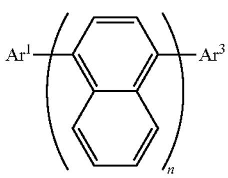

(63)

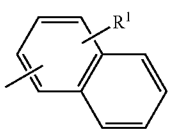

(64)

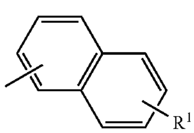

(65)

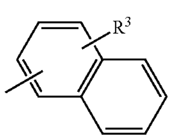

(66)

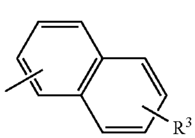

In the formula: n is 1 or 2; $Ar^1$ is a substituent represented by the general formula (63) or (64); $Ar^3$ is a substituent represented by the general formula (65) or (66); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (67).

[Chemical Formula 76]

(67)

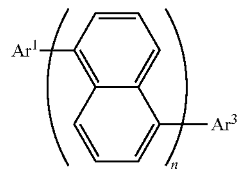

(68)

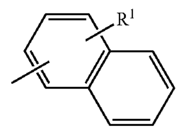

(69)

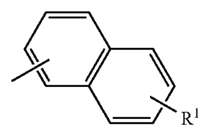

(70)

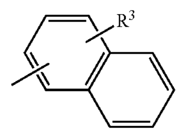

(71)

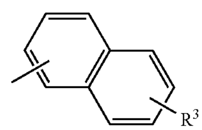

In the formula: n is 1 or 2; $Ar^1$ is a substituent represented by the general formula (68) or (69); $Ar^3$ is a substituent represented by the general formula (70) or (71); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Particularly, the structure represented by the general formula (72) is preferable.

[Chemical Formula 77]

(72)

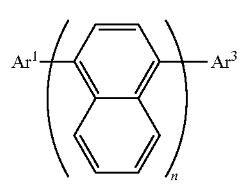

(73)

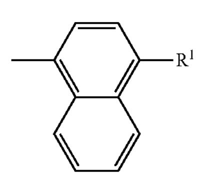

-continued (74)

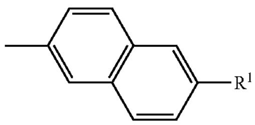

(75)

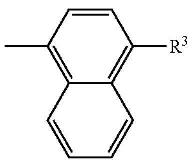

(76)

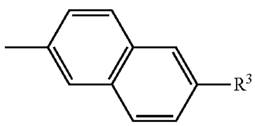

In the formula: n is 1 or 2; $Ar^1$ is a substituent represented by the general formula (73) or (74); $Ar^3$ is a substituent represented by the general formula (75) or (76); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Further, the structure represented by the general formula (77) is preferable.

[Chemical Formula 78]

(77)

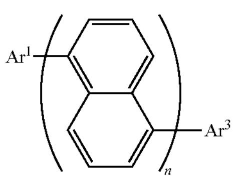

(78)

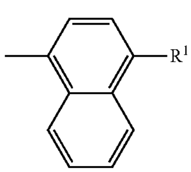

(79)

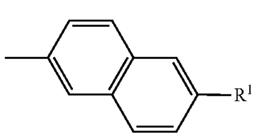

(80)

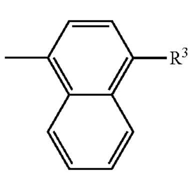

-continued (81)

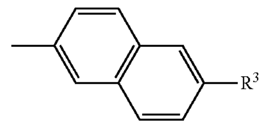

In the formula: n is 1 or 2; $Ar^1$ is a substituent represented by the general formula (78) or (79); $Ar^3$ is a substituent represented by the general formula (80) or (81); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Examples of the alkyl group having 6 or less carbon atoms are a methyl group, ethyl group, n-propyl group, i-propyl group, n-butyl group, i-butyl group, sec-butyl group, t-butyl group, n-pentyl group, i-pentyl group and n-hexyl group.

Examples of the alicyclic alkyl group are a cyclopropyl group, cyclobutyl group, cyclopentyl group and cyclohexyl group.

Examples of the substituted or unsubstituted aromatic ring are a phenyl group, naphthyl group, anthranil group, pyrenyl group and spirofluorenyl group.

Examples of the substituted or unsubstituted heteroaromatic ring are a pyridyl group, indolyl group, carbazolyl group, thienyl group and furyl group.

Examples of the oligonaphthalene derivative represented by the general formula (49) are oligonaphthalene derivatives represented by the following structural formulae. However, the invention is not limited to these compounds.

[Chemical Formula 79]

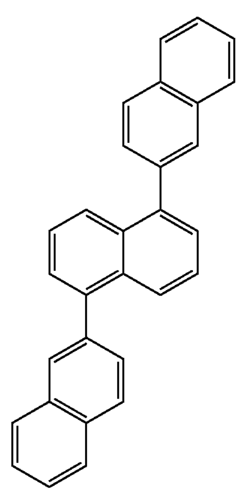

-continued
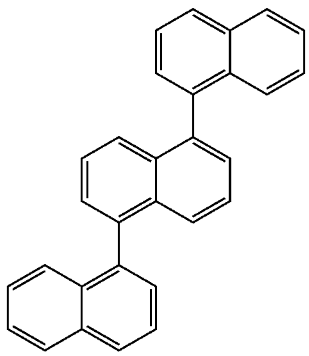
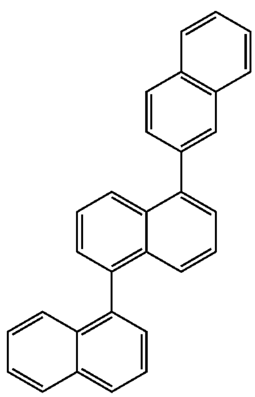
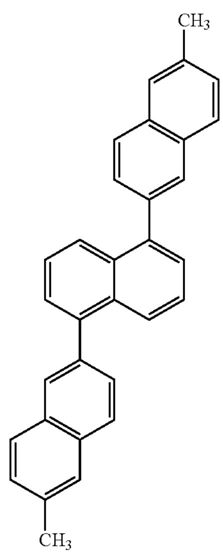
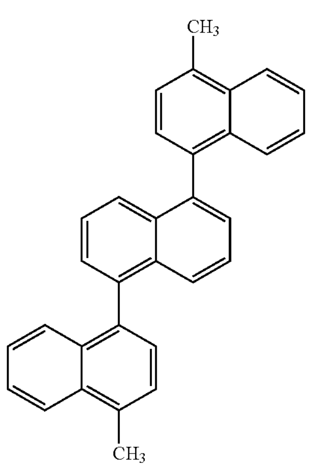
-continued
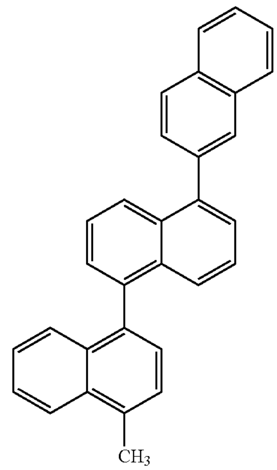
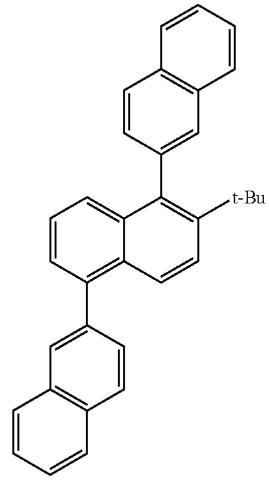
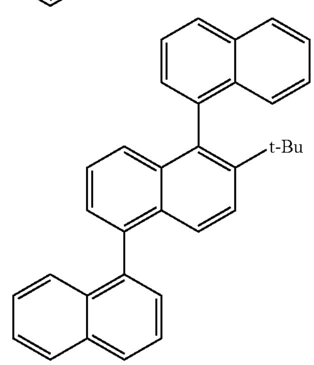
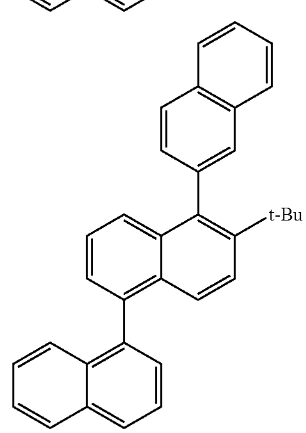

-continued
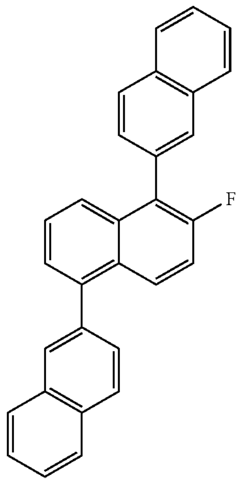
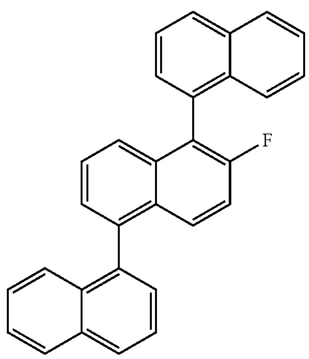
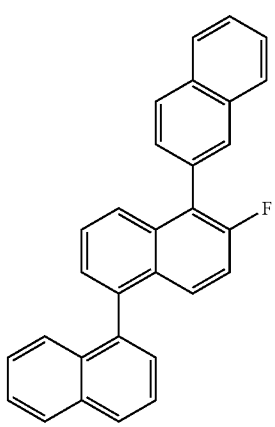
-continued
[Chemical Formula 80]
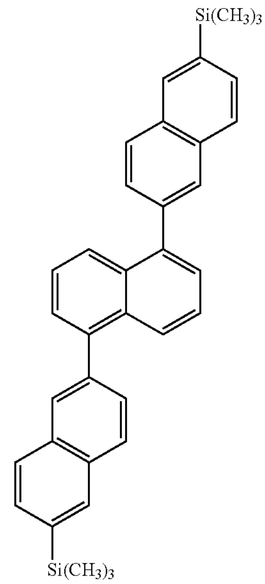
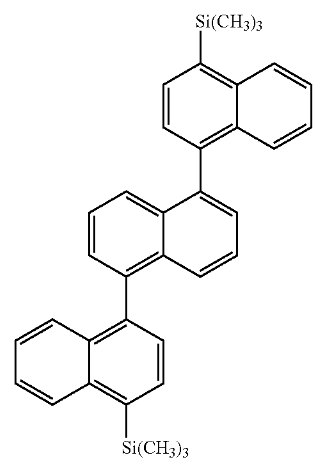
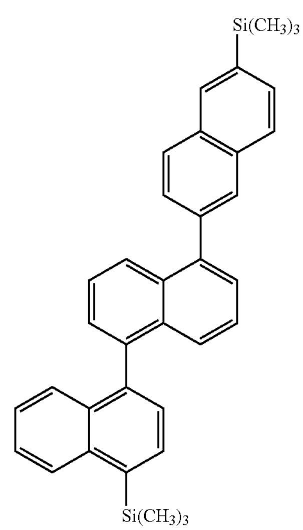

-continued
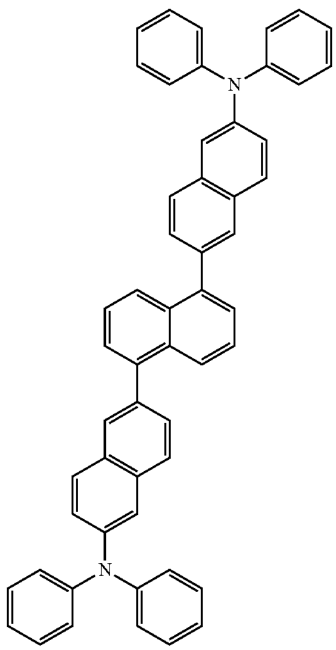
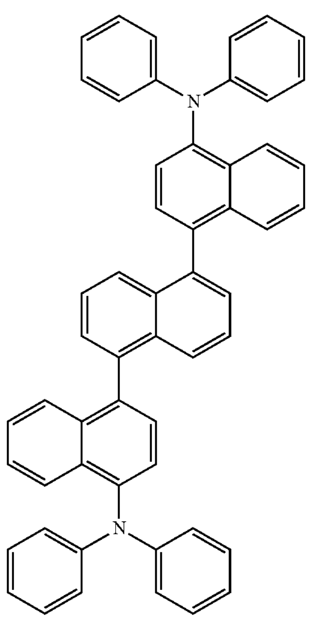
-continued
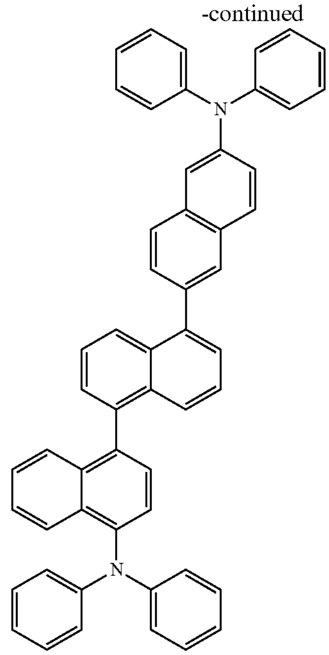
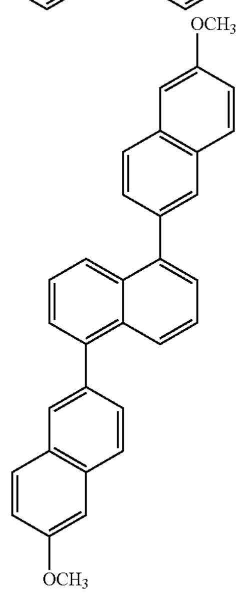
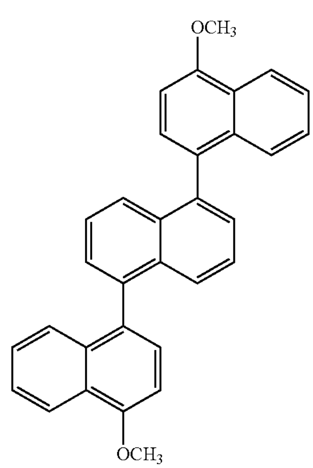

-continued
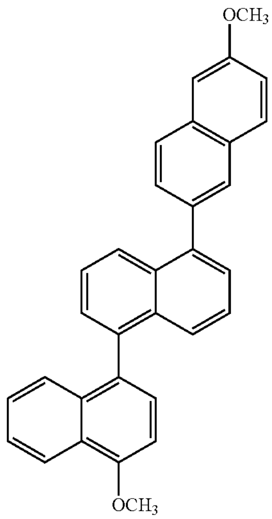
[Chemical Formula 81]
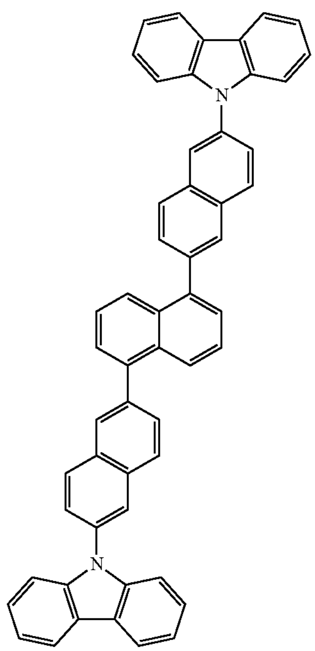
-continued
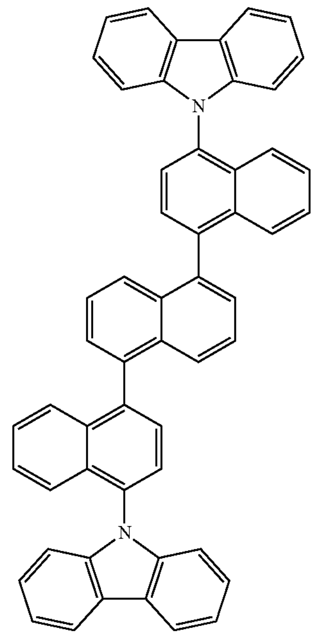
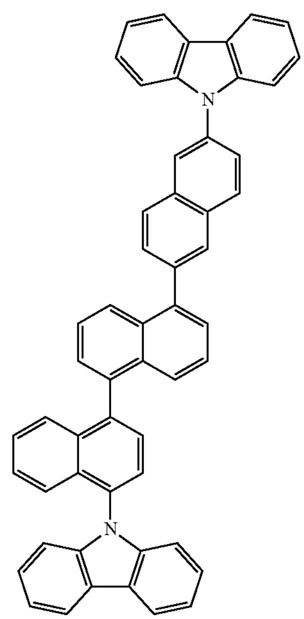
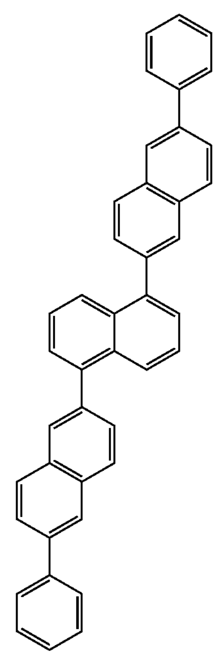

-continued
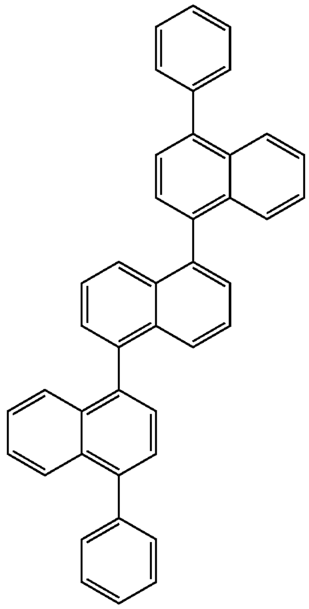
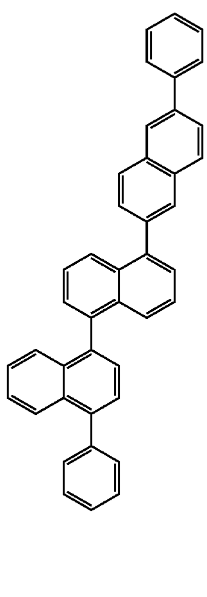
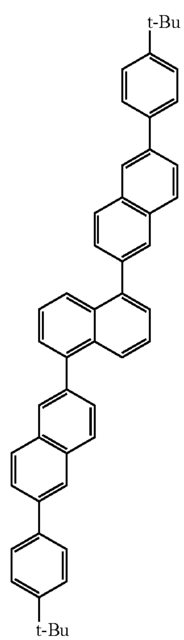
-continued
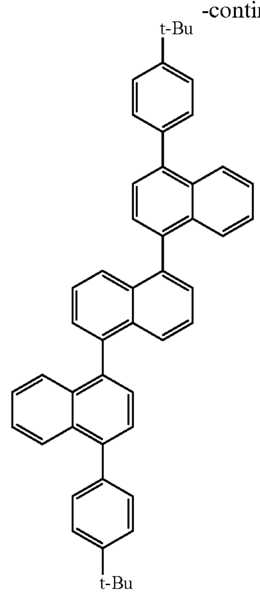
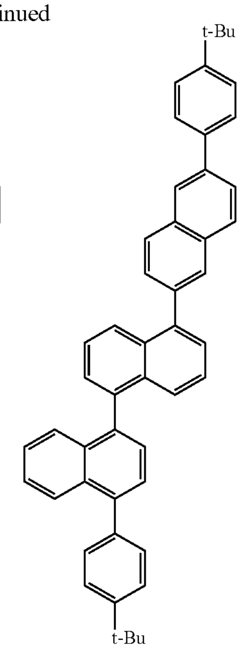
[Chemical Formula 82]
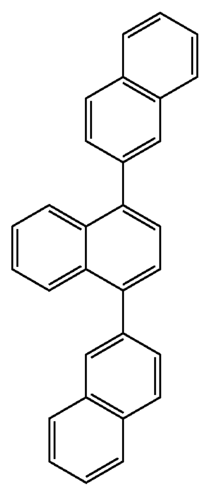
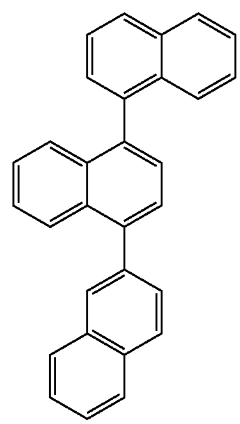
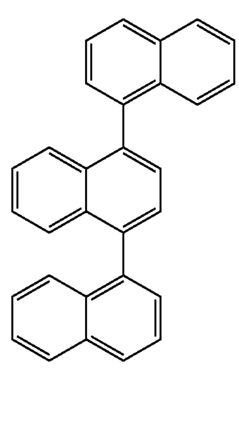
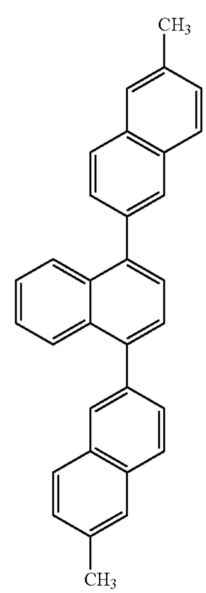

-continued
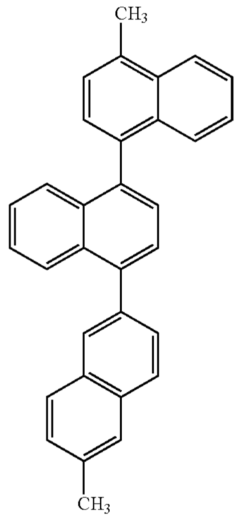
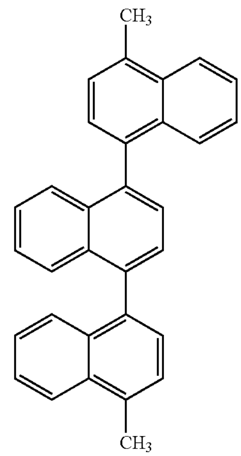
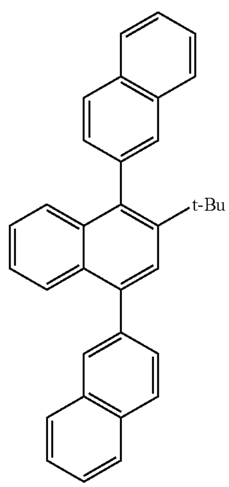
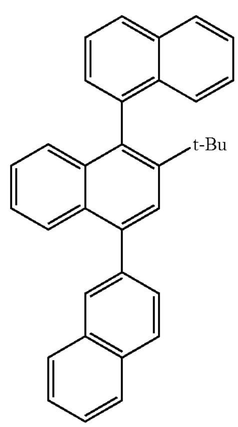
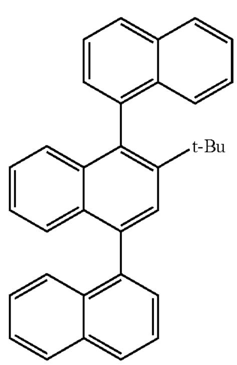
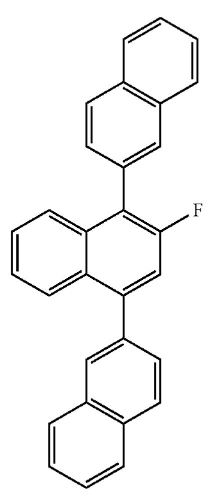
-continued
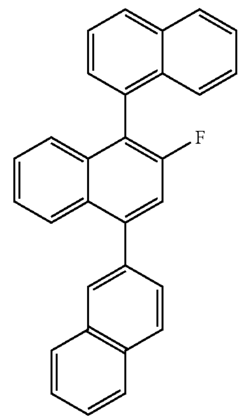
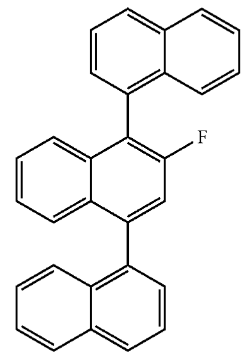
[Chemical Formula 83]
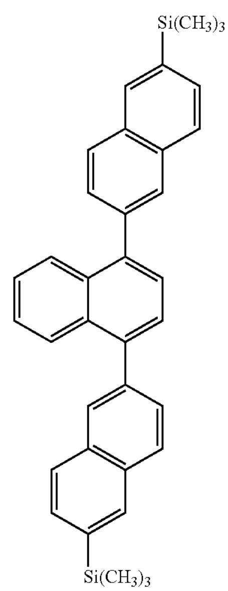
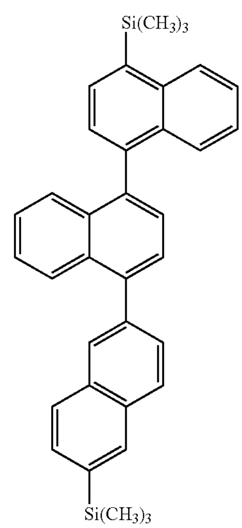
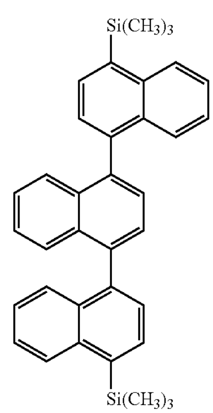
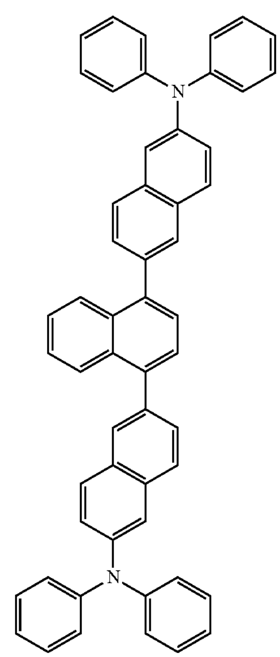

-continued
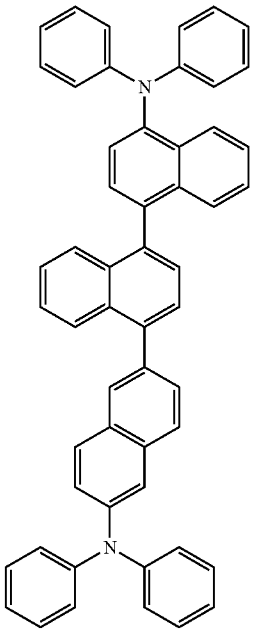
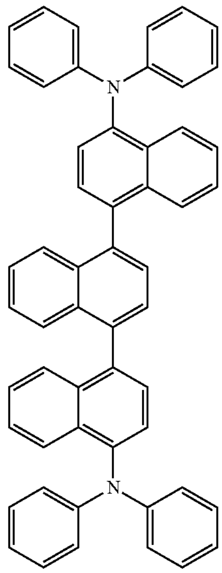
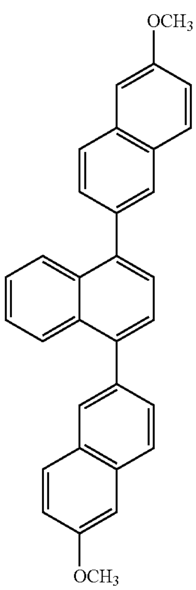
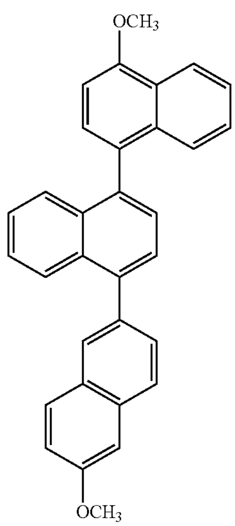
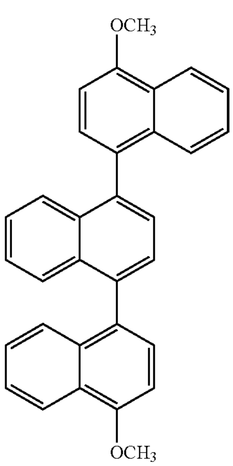
-continued
[Chemical Formula 84]
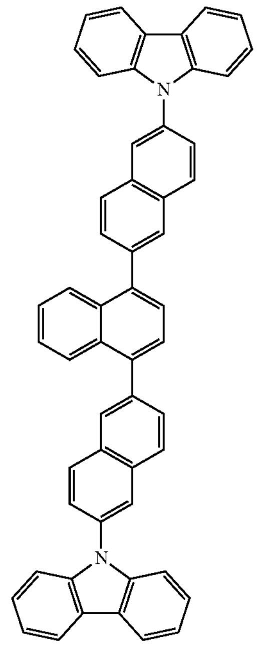
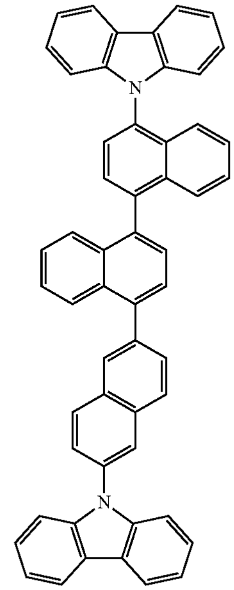
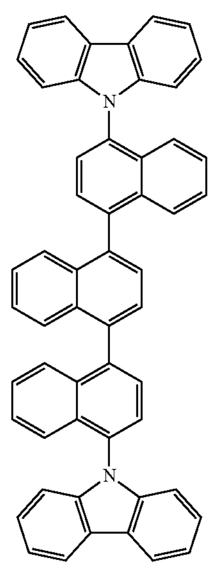
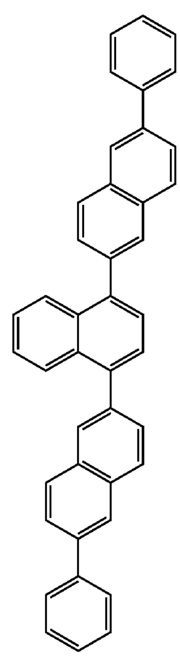

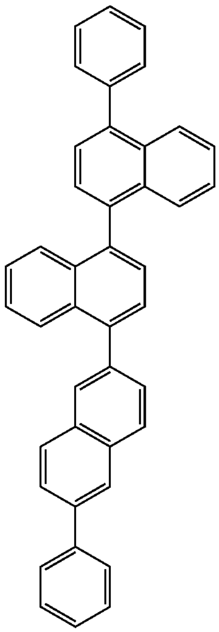
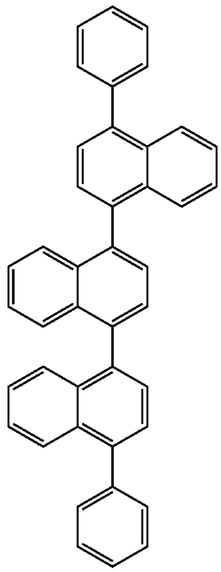
[Chemical Formula 85]
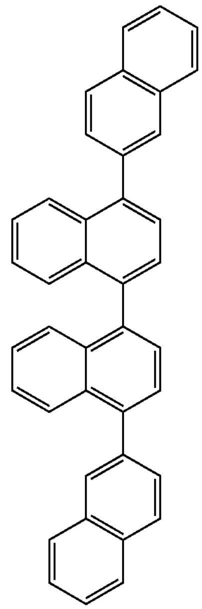
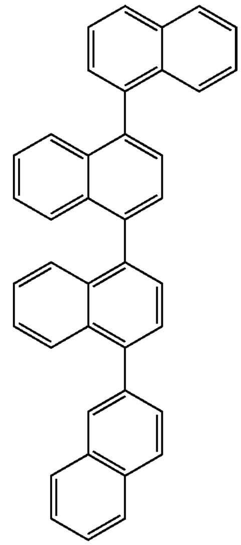
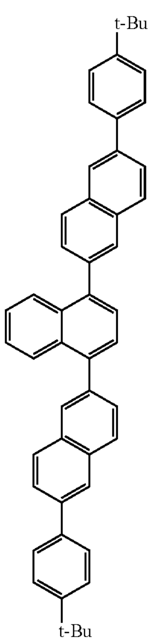
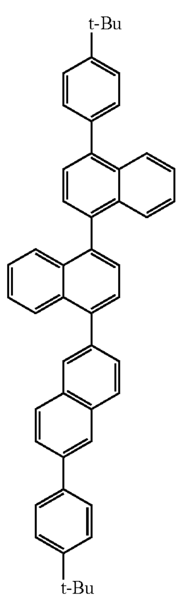
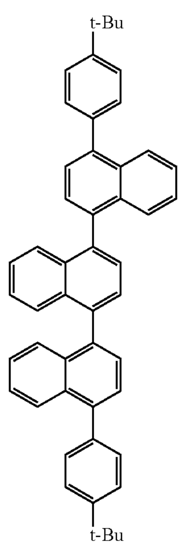
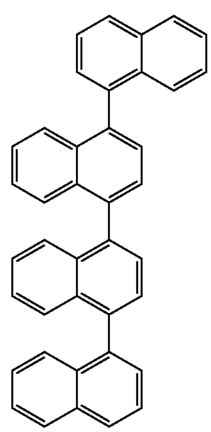
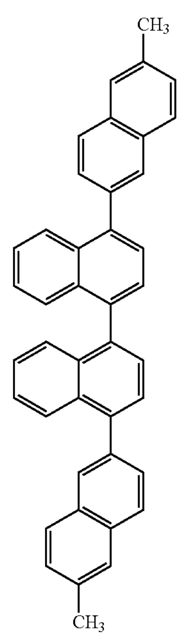

-continued
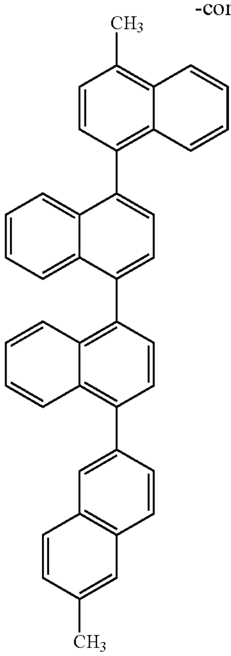
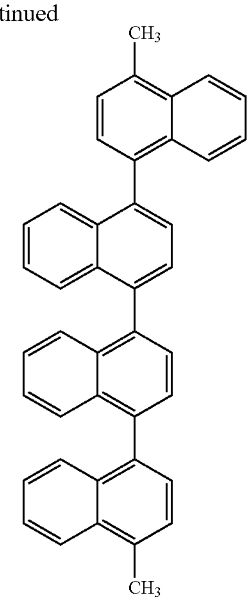
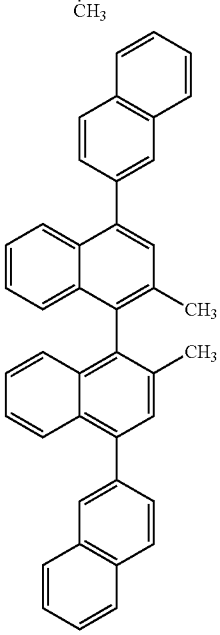
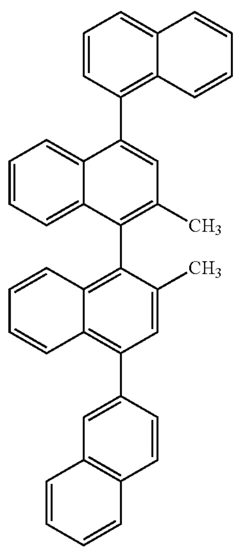
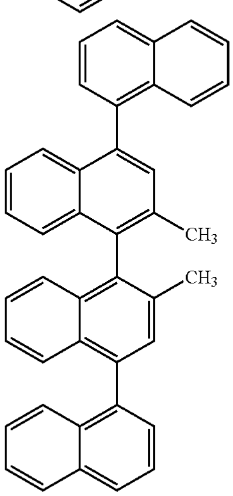
-continued
[Chemical Formula 86]
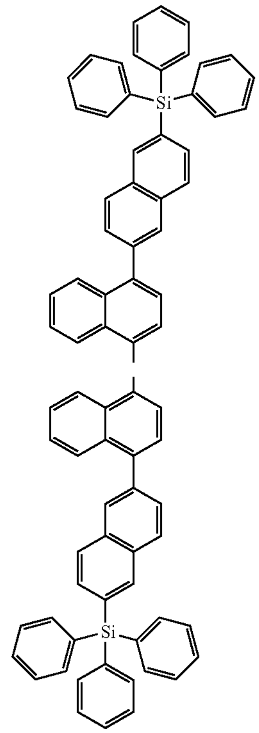
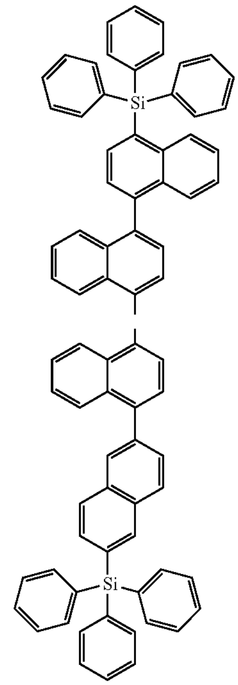
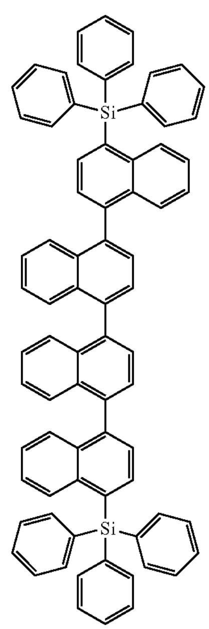
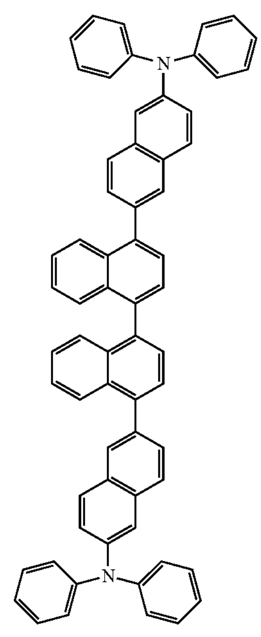

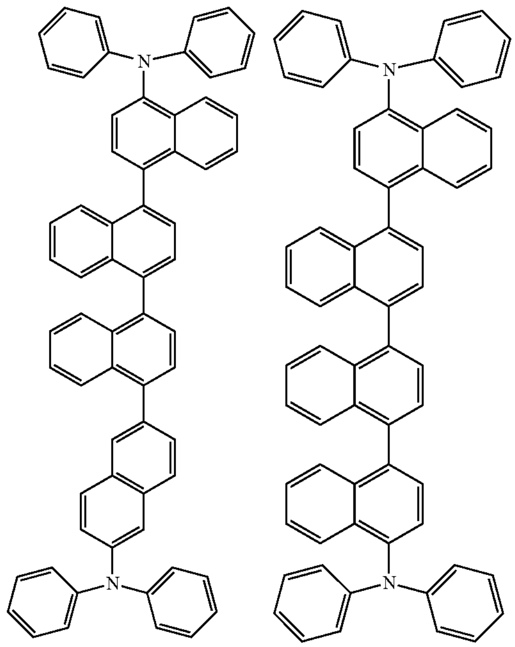
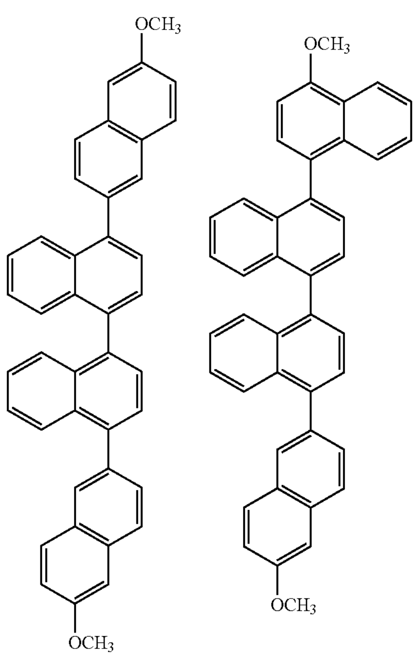
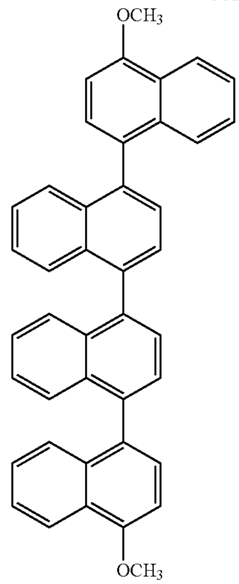
[Chemical Formula 87]
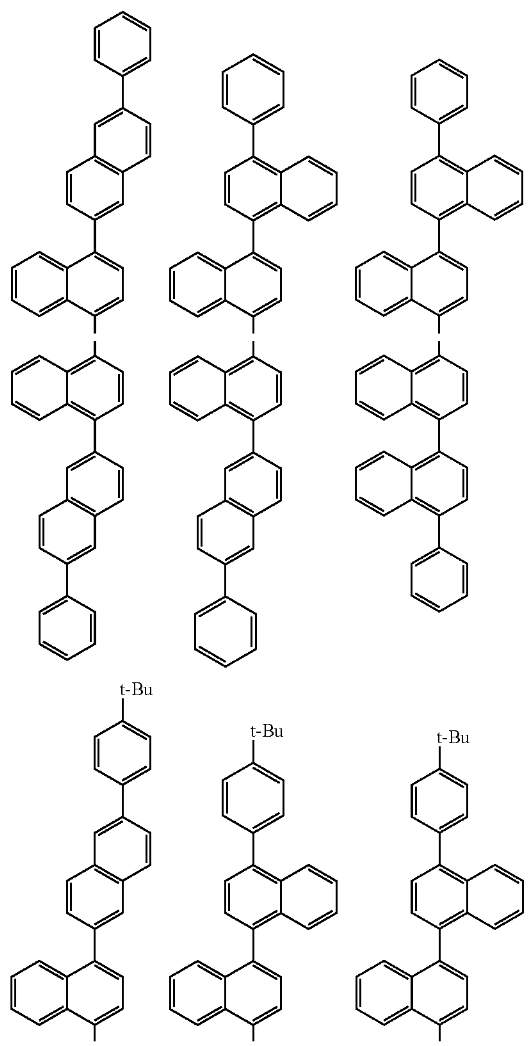

-continued
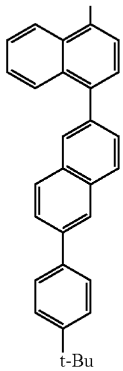
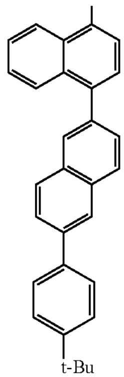
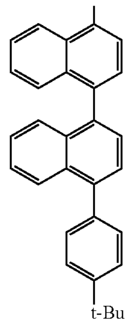
[Chemical Formula 88]
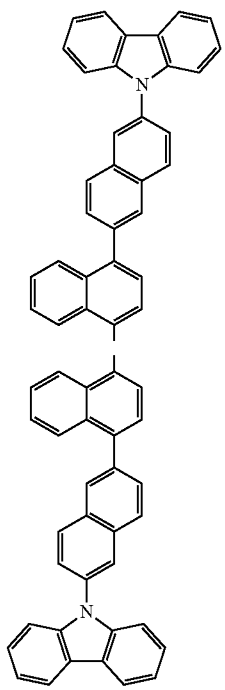
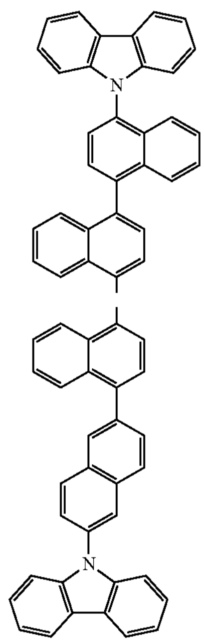
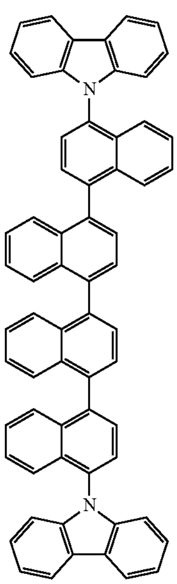
-continued
[Chemical Formula 89]
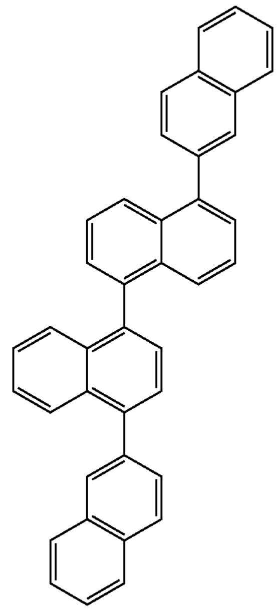
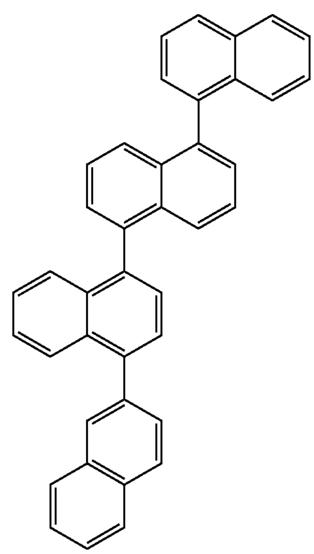

-continued
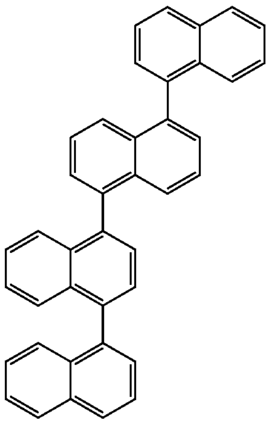
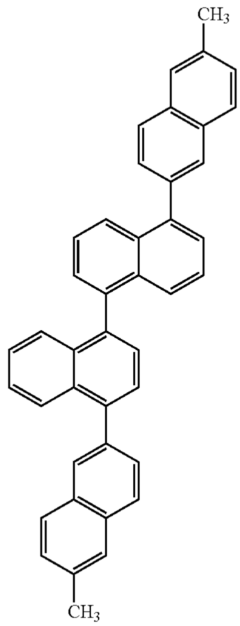
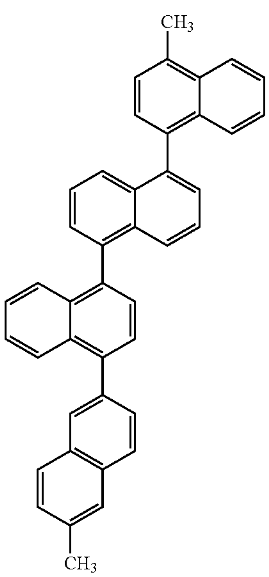
-continued
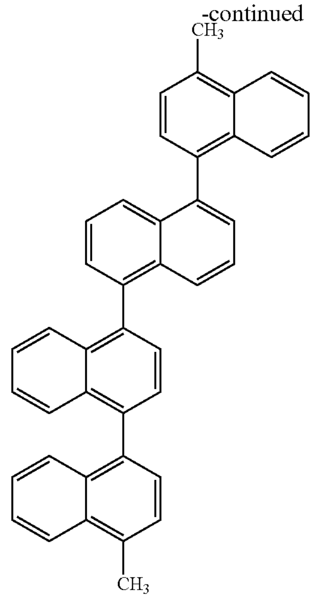
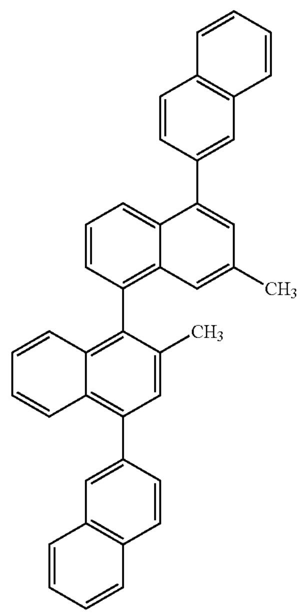
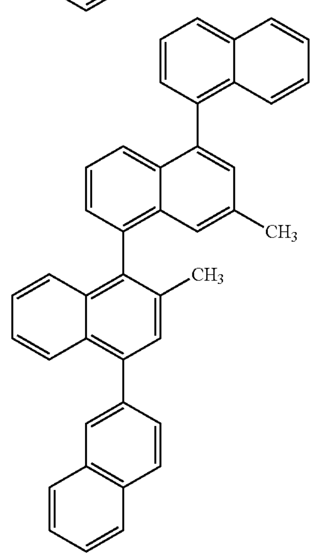

-continued
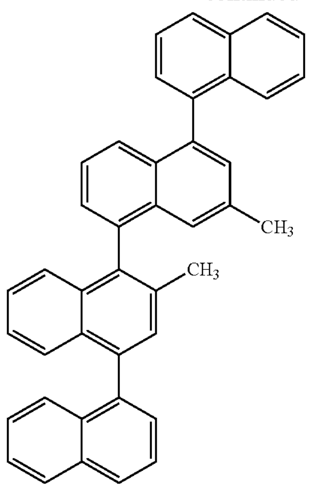
[Chemical Formula 90]
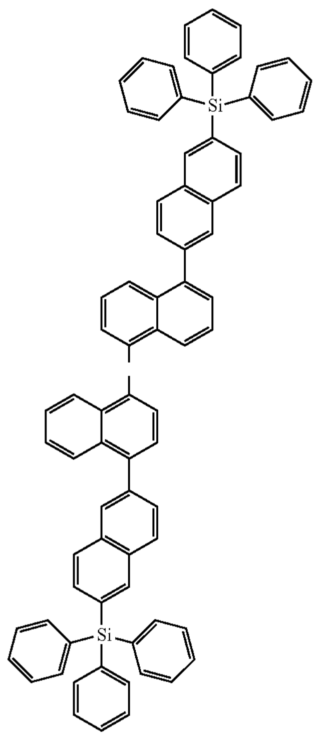
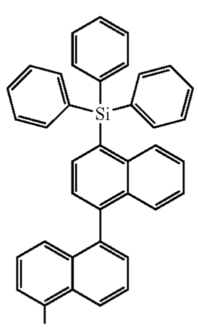
-continued
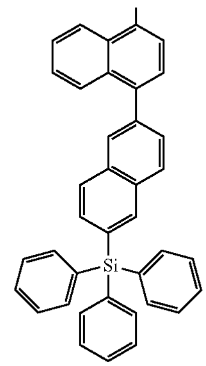
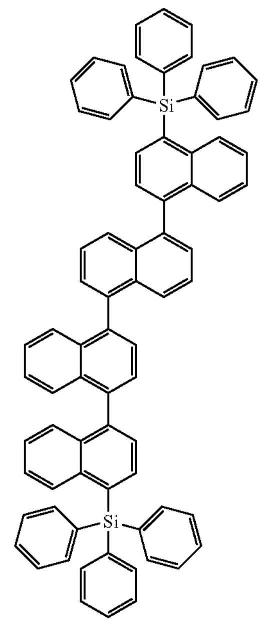
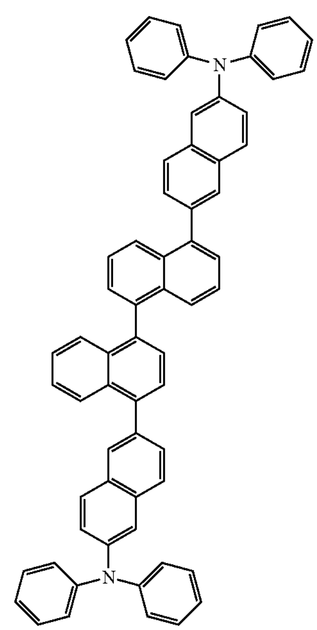

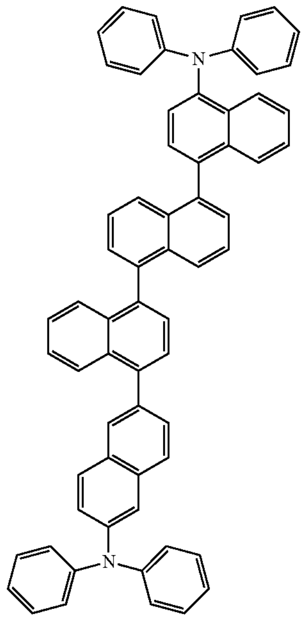
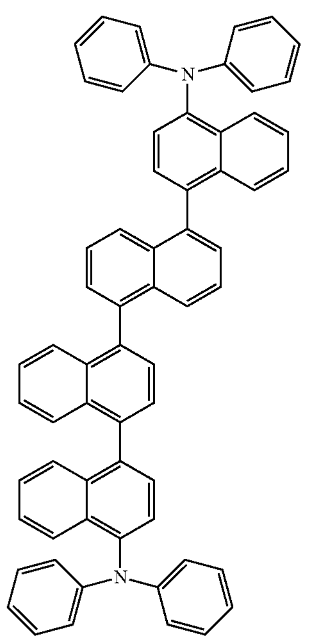
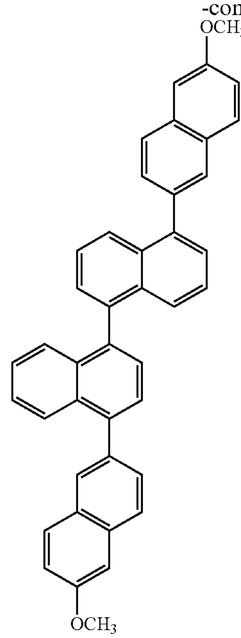
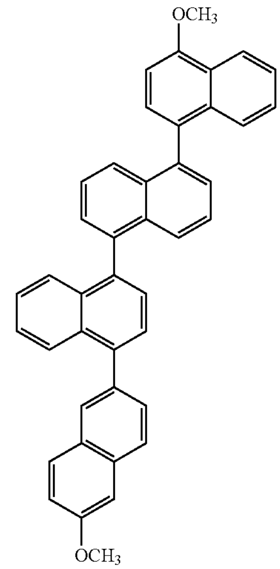
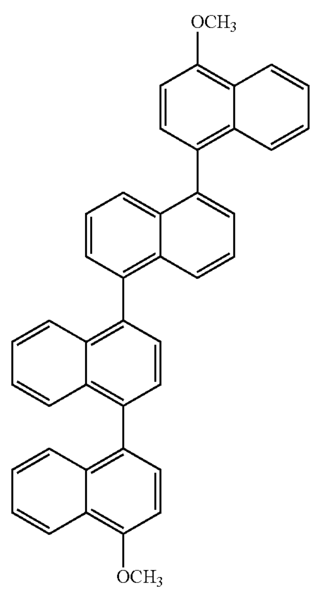
[Chemical Formula 91]
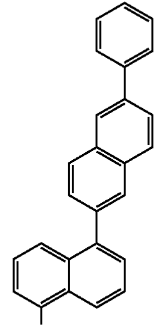
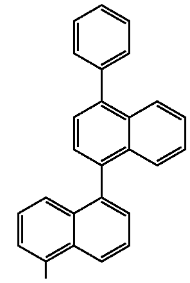

-continued

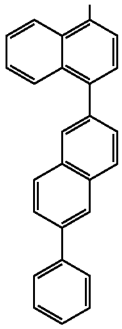

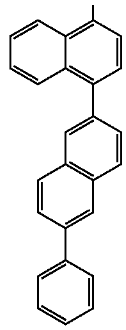

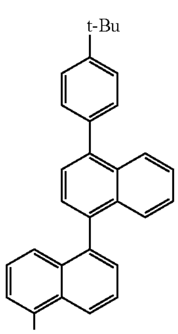

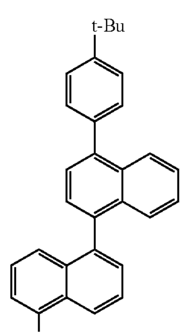

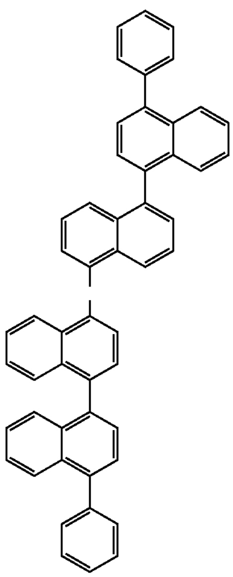

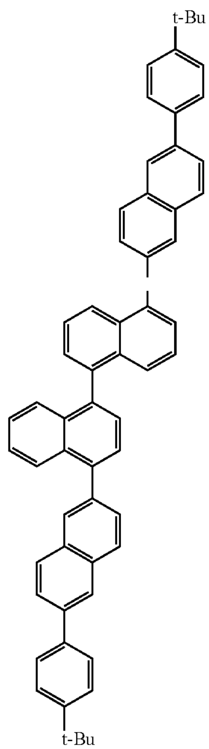

-continued

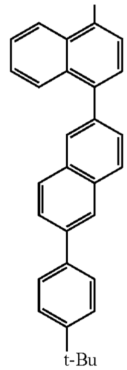

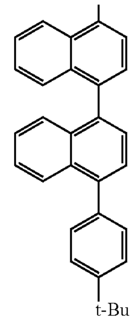

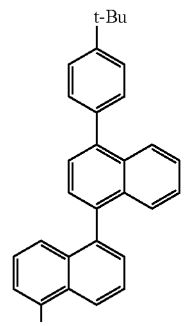

The oligonaphthalene derivative may be represented by the following formula (82).

[Chemical Formula 92]

(82)

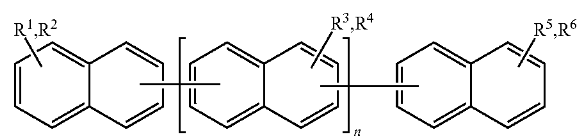

In the formula, $R^1$ to $R^6$ each are an independent group suitably selected from the group consisting of hydrogen, alkoxy group having 1 to 4 carbon atoms, alkyl group having 1 to 4 carbon atoms and substituted or unsubstituted amino group. n is an integer of 2 to 4.

Examples of such an oligonaphthalene compound are those represented by the following formulae.
[Chemical Formula 93]
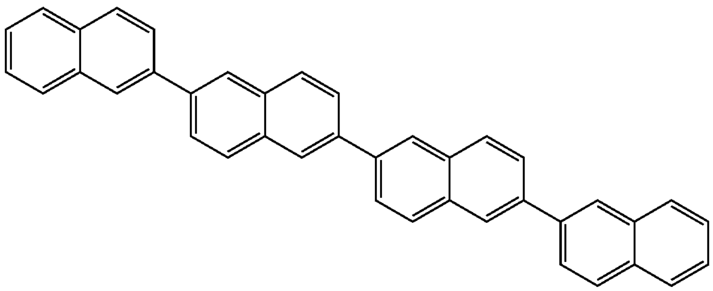
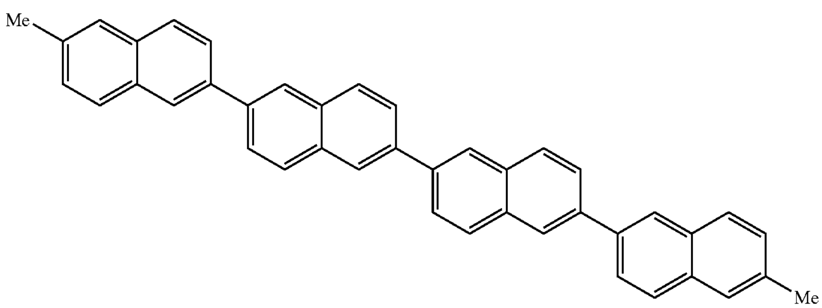
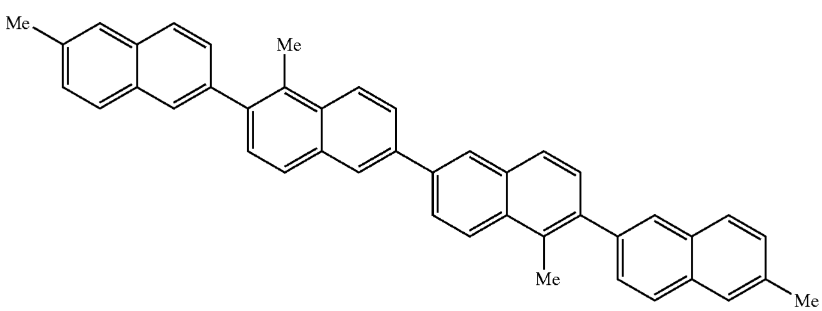
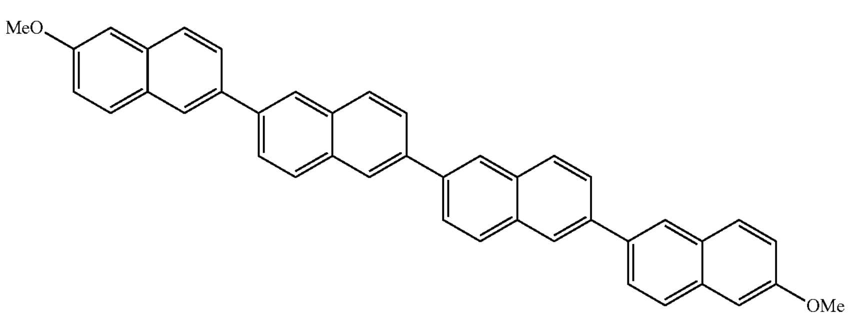

-continued
[Chemical Formula 94]
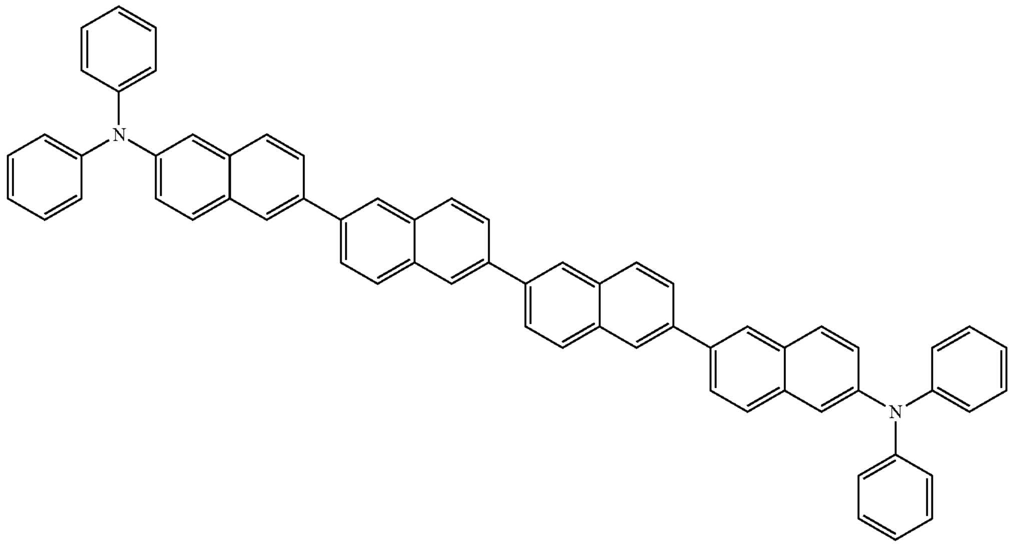
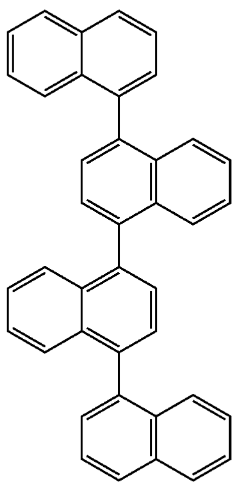
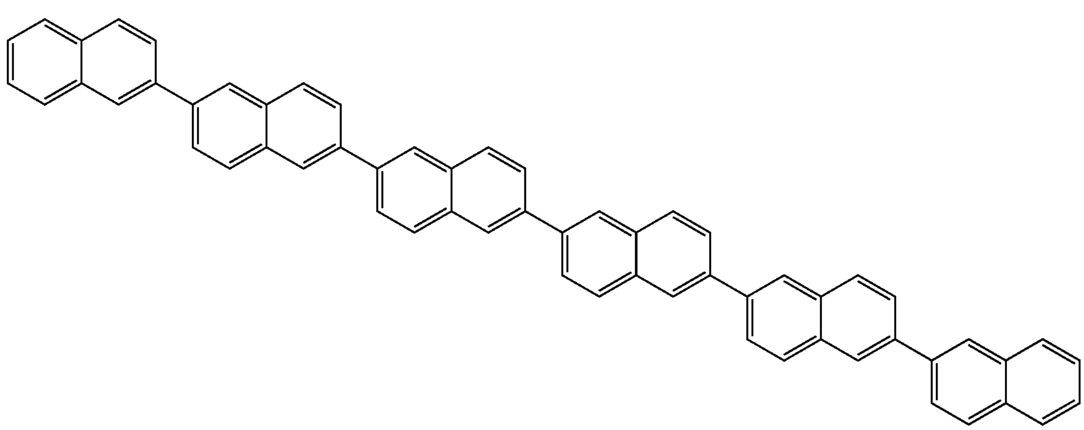

Examples of the host material used for the fluorescent-emitting layer and the red phosphorescent-emitting layer are the compounds shown below.

$$R^{1a}—Ar^{11}—Ar^{12}—Ar^{13}—R^{1b} \quad (21)$$

In the formula (21), $R^{1a}$, $R^{1b}$, $Ar^{11}$, $Ar^{12}$ and $Ar^{13}$ each represent a substituted or unsubstituted benzene ring or a substituted or unsubstituted fused aromatic hydrocarbon ring selected from a naphthalene ring, chrysene ring, fluoranthene ring, triphenylene ring, phenanthrene ring, benzophenanthrene ring, dibenzophenanthrene ring, benzotriphenylene ring, benzo[b]fluoranthene ring, benzochrysene ring, and picene ring.

When $Ar^{12}$ is a substituted or unsubstituted benzene ring or a substituted or unsubstituted 2,7-phenanthrene-diyl group or triphenylene ring, [$R^{1a}$—$Ar^{11}$—] and [$R^{1b}$—$Ar^{13}$—] are differently structured groups.

$$R^{2a}—Ar^{21}—Ar^{22}—R^{2b} \quad (22)$$

In the formula (22), $R^{2a}$ and $Ar^{21}$ each represent a substituted or unsubstituted naphthalene ring.

$R^{2b}$ represents a substituted or unsubstituted fused aromatic hydrocarbon group selected from a phenanthrene ring, a triphenylene ring, a benzophenanthrene ring, a dibenzophenanthrene ring, a benzotriphenylene ring, a fluoranthene ring, a benzochrysene ring and a picene ring.

$Ar^{22}$ represents a substituted or unsubstituted fused aromatic hydrocarbon group selected from a benzene ring, a naphthalene ring, a chrysene ring, a fluoranthene ring, a triphenylene ring, a benzophenanthrene ring, a dibenzophenanthrene ring, a benzotriphenylene ring, a benzochrysene ring, a benzo[b]fluoranthene ring and a picene ring.

Substituents for $R^{2a}$ and $R^{2b}$ are not aryl groups. Substituents for $Ar^{21}$ and $Ar^{22}$ are not aryl groups when $Ar^{21}$ or $Ar^{22}$ represents a naphthalene ring.

[Chemical Formula 95]

(22-1)

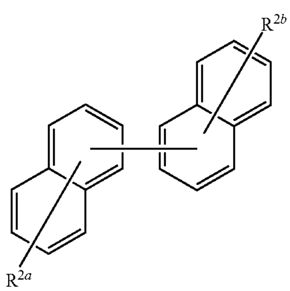

In the formula (22-1), $R^{2a}$ and $R^{2b}$ each represents a substituted or unsubstituted fused aromatic hydrocarbon group selected from a phenanthrene ring, a triphenylene ring, a benzophenanthrene ring, a dibenzophenanthrene ring, a benzotriphenylene ring, a benzo[b]fluoranthene ring, a fluoranthene ring, a benzochrysene ring and a picene ring.

Substituents for $R^{2a}$, $R^{2b}$, $Ar^{21}$ and $Ar^{22}$ are not aryl groups.

[Chemical Formula 96]

(23)

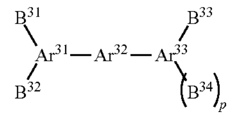

In the formula (23), when $Ar^{31}$, $Ar^{32}$, $Ar^{33}$, $B^{31}$, $B^{32}$, $B^{33}$ and $B^{34}$ have a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^{32}$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^{32}$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substituent having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

$$R^{4a}—Ar^{41}—R^{4b} \quad (24)$$

When $R^{4a}$, $R^{4b}$ and $Ar^{41}$ in the formula (24) have a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^{41}$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^{41}$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substituent having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

Specifically, the examples are the phenanthrene derivatives and triphenylene derivatives shown below.

[Chemical Formula 97]

A-1

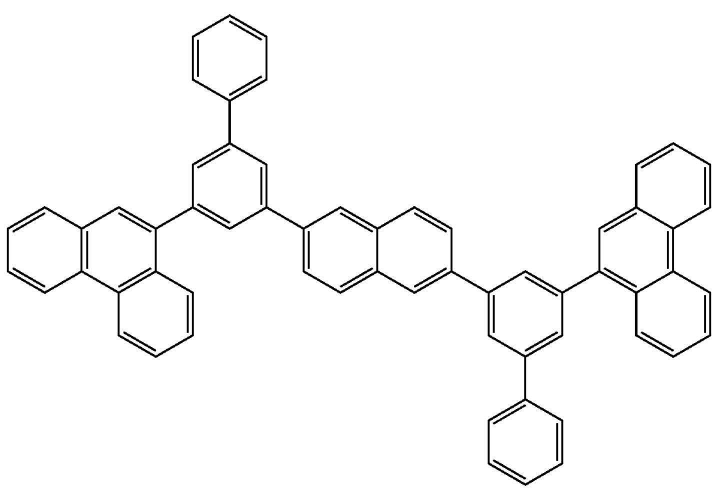

-continued
A-2
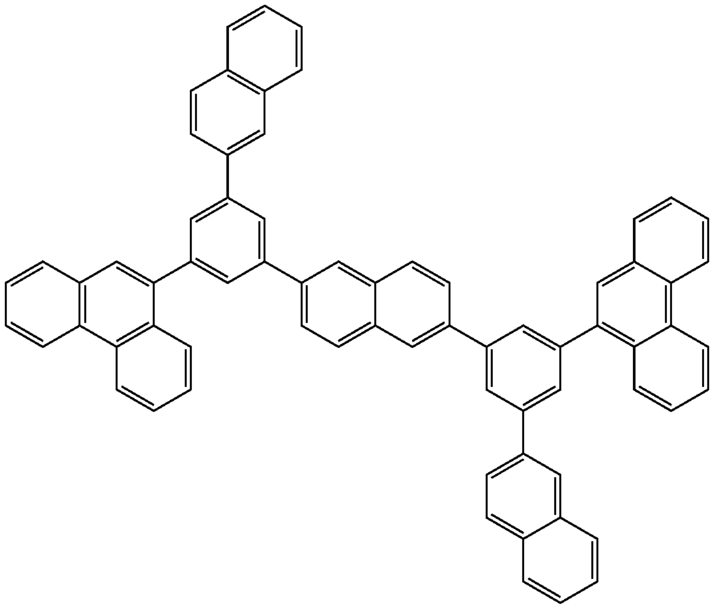
A-4
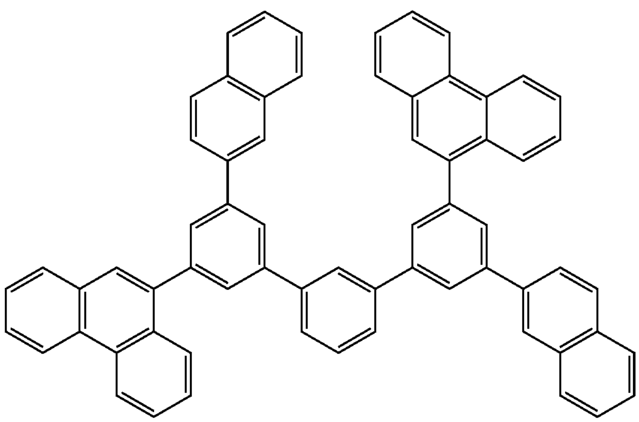
A-15
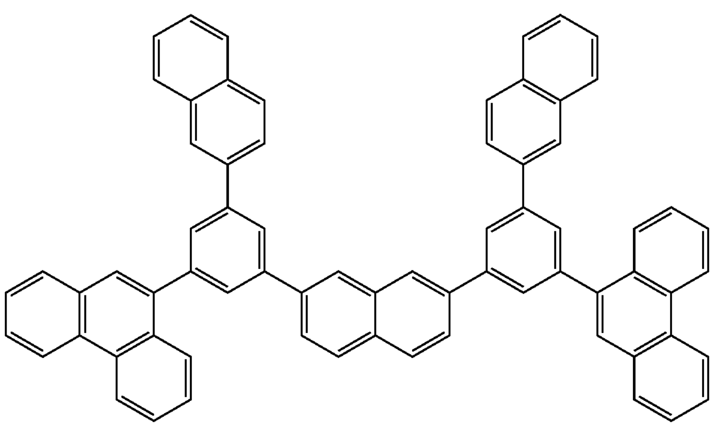

-continued
A-17
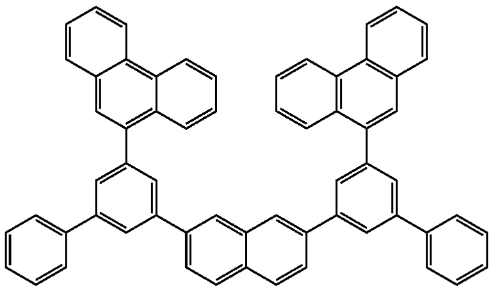
A-24
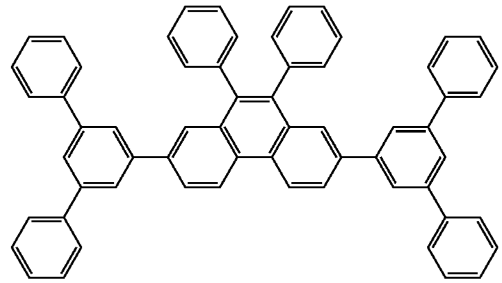
B-25
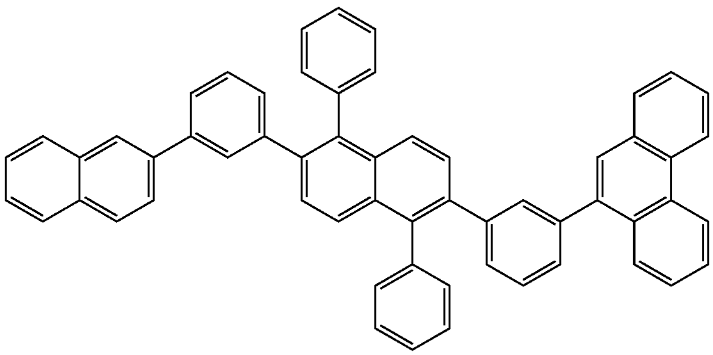
A-26
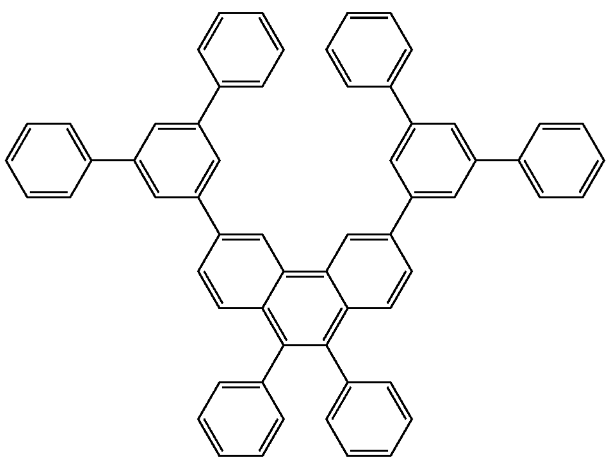
[Chemical Formula 98]
F-14
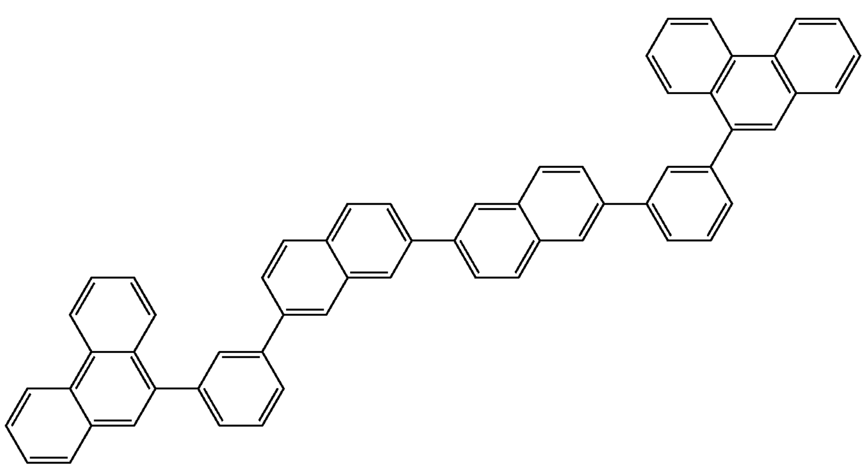

-continued
F-25
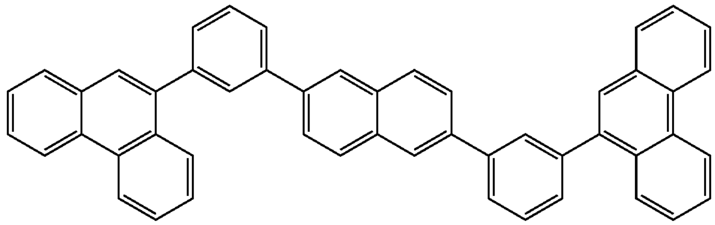
F-26
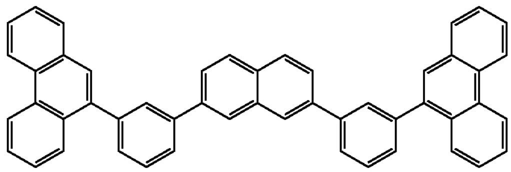
F-27
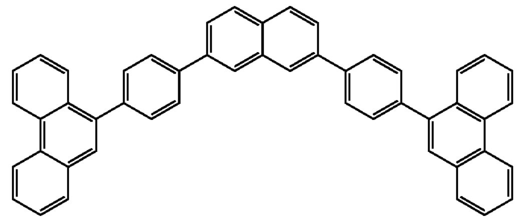
F-28
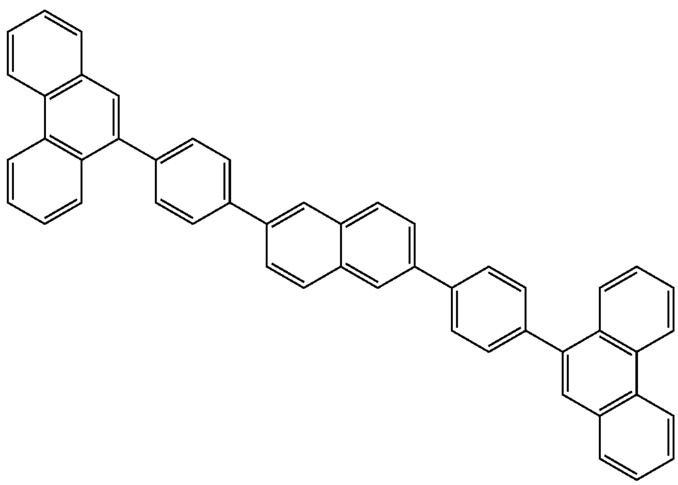
F-29
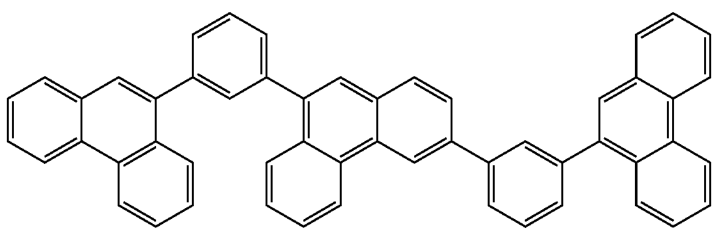
F-30
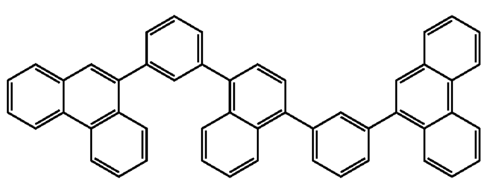
F-31
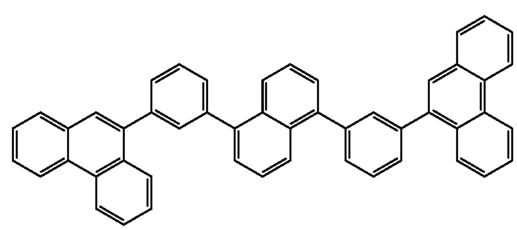
F-32
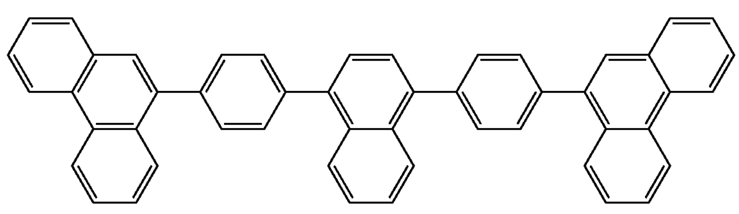

-continued
[Chemical Formula 99]
C-1
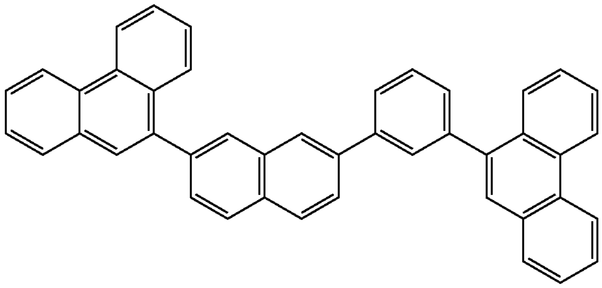
C-2
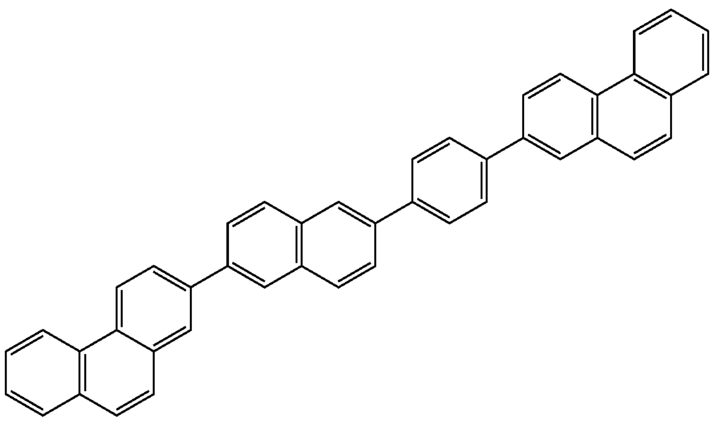
C-3
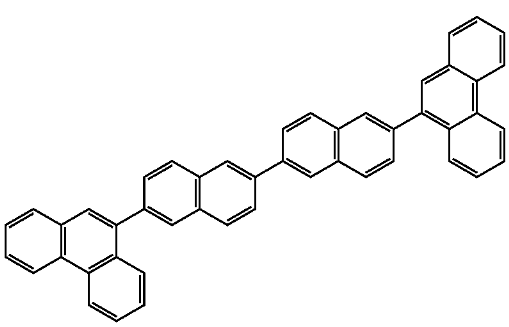
C-4
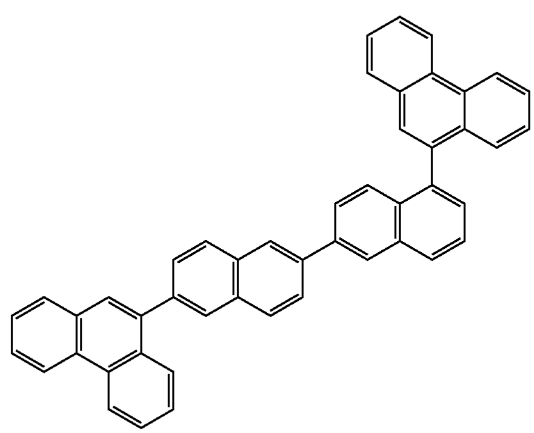

-continued
C-5
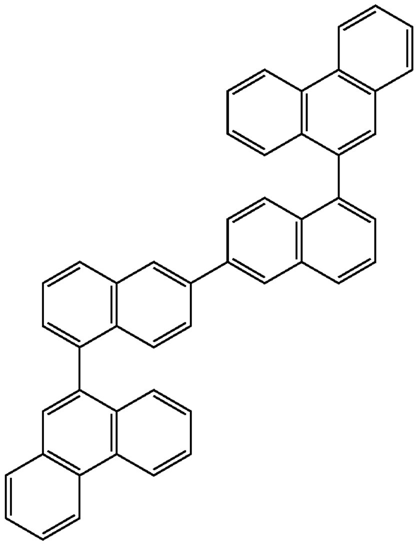
C-6
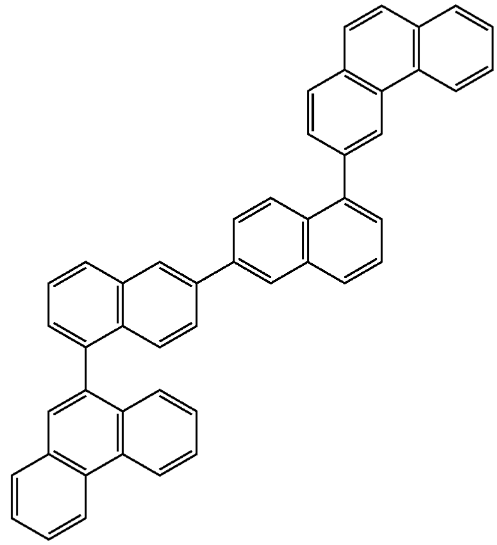
C-7
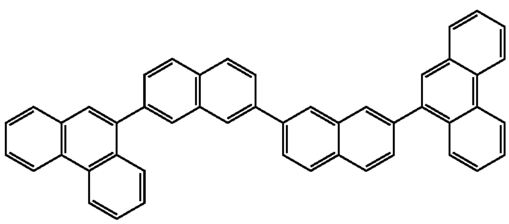
C-8
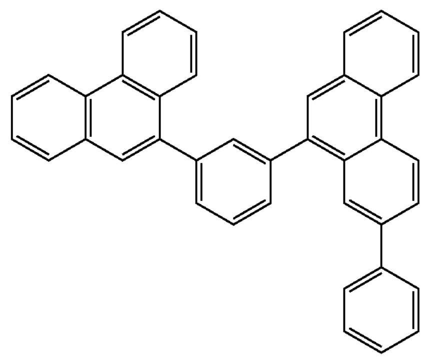
[Chemical Formula 100]
D-1
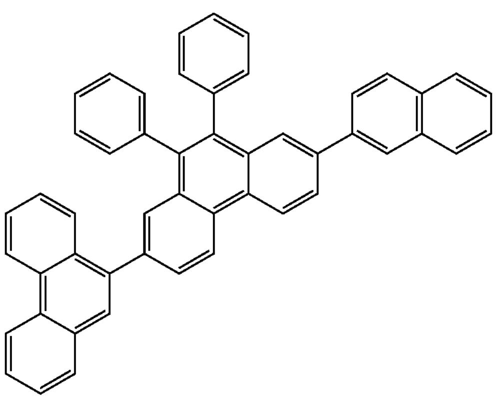
D-2
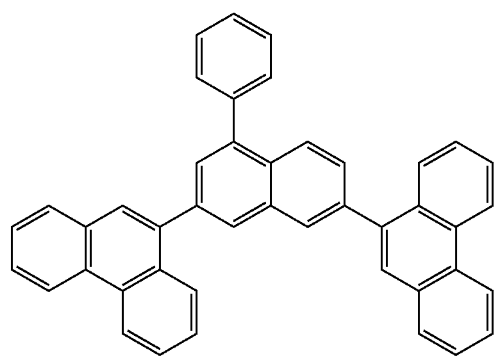
D-3
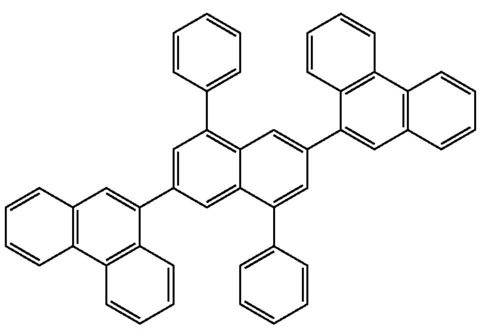
D-4
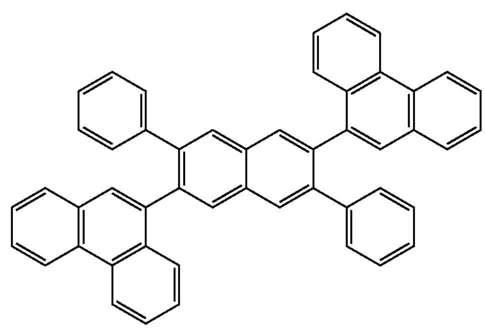

-continued
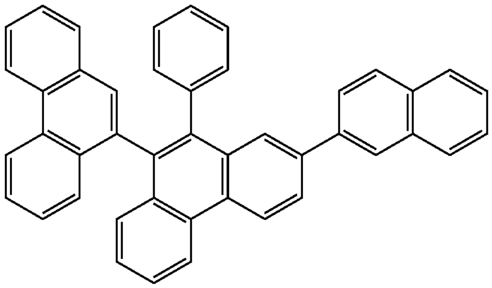
D-5
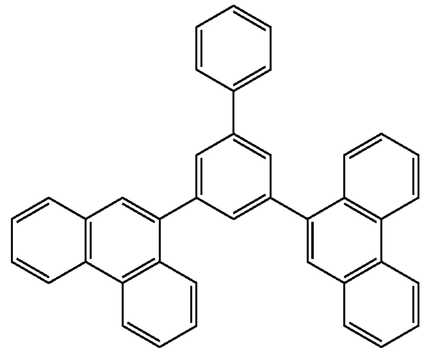
D-6
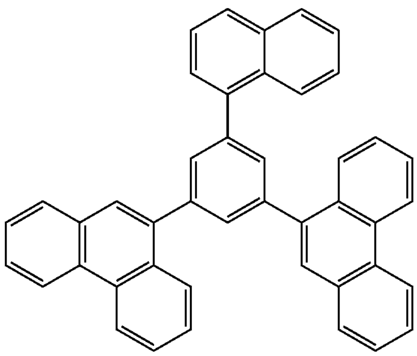
D-7
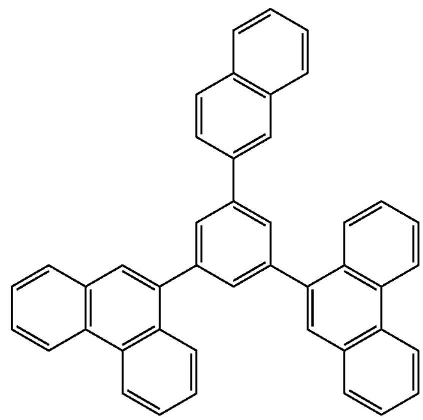
D-8
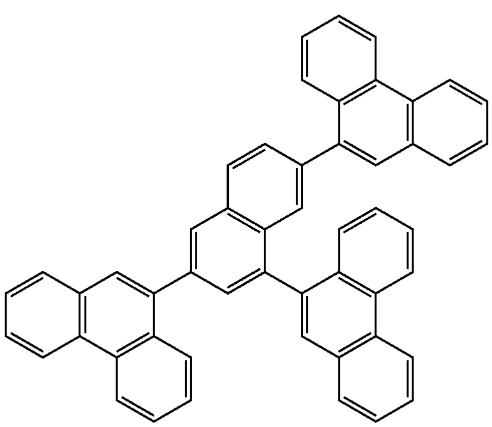
D-9
[Chemical Formula 101]
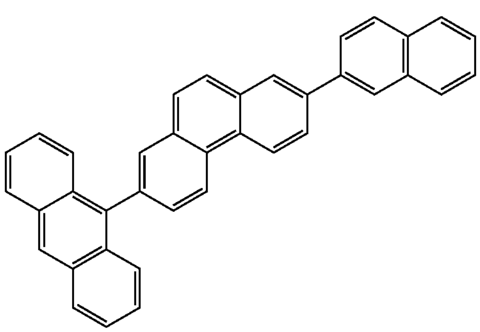
E-1
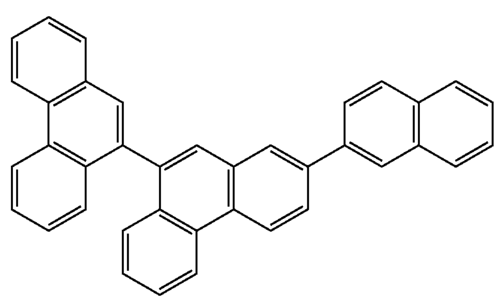
E-2

-continued
E-3
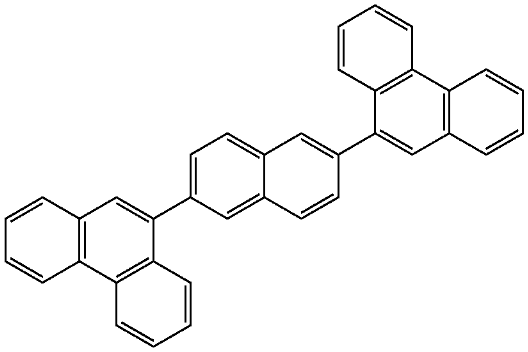
E-4
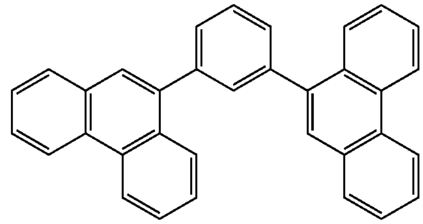
E-5
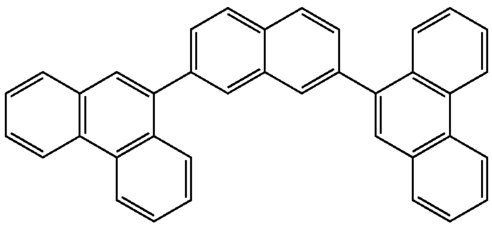
[Chemical Formula 102]
G-1
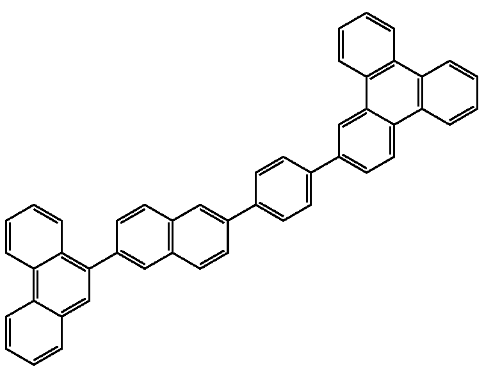
G-2
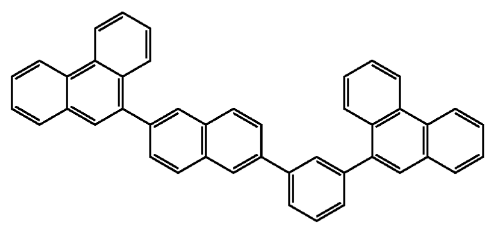
G-3
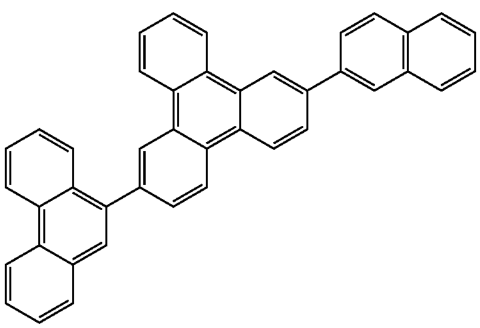
G-4
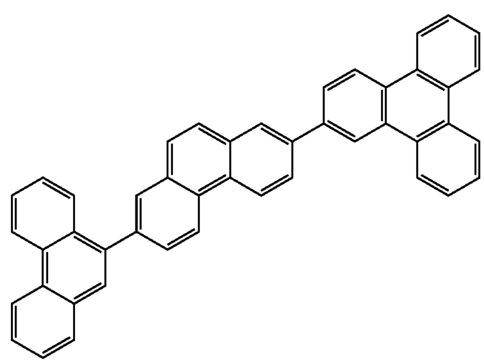

-continued
G-5
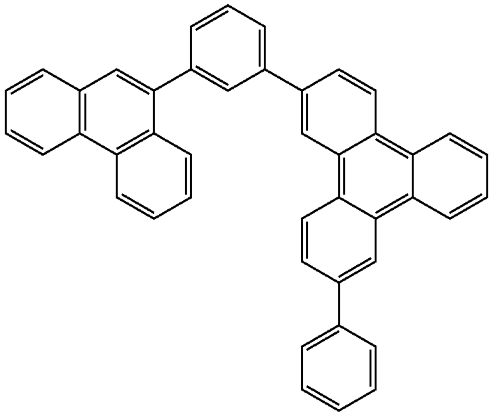
G-6
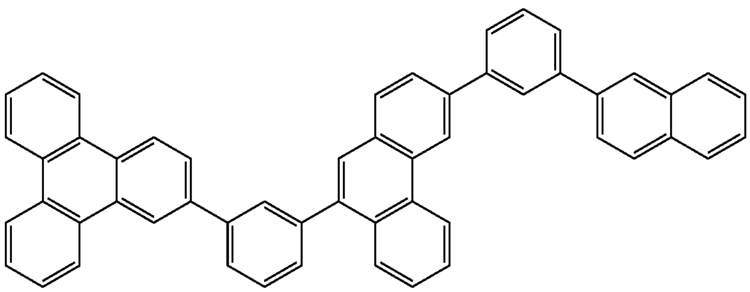
G-7
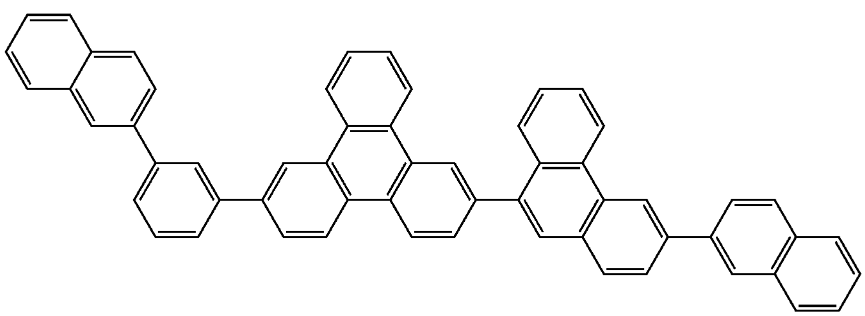
[Chemical Formula 103]
H-1
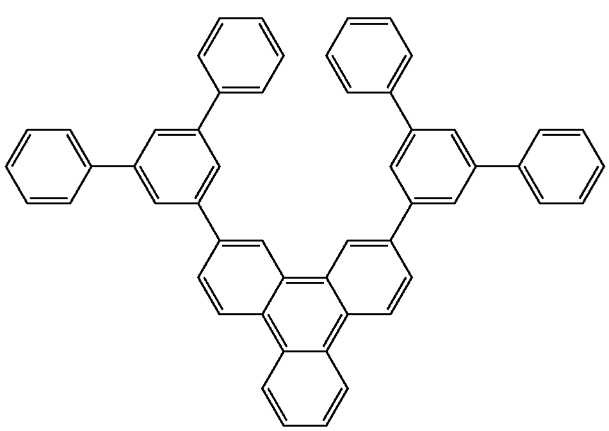

-continued

H-2

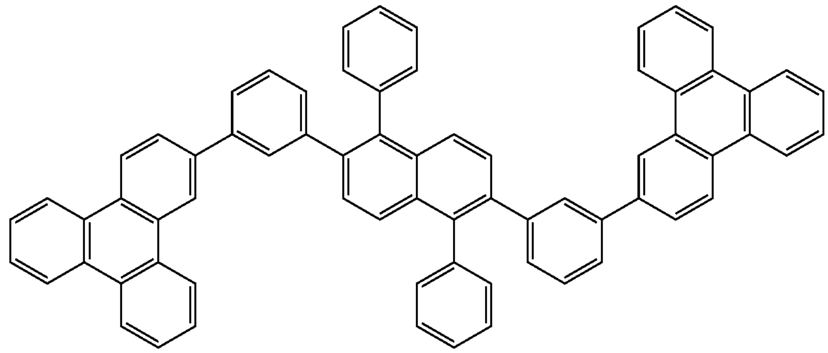

H-3

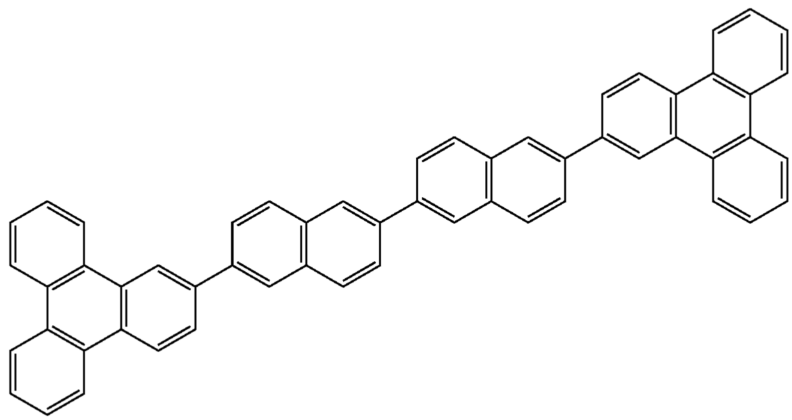

In the aspect of the invention, the fluorescent host preferably has a triplet energy gap of 2.1 eV to 2.7 eV, and the polycyclic fused aromatic skeleton preferably has 14 to 30 ring atoms.

When blue emission is to be obtained from the fluorescent-emitting layer and green and red emission is to be obtained from the phosphorescent-emitting layer, the host is required to have a relatively wide triplet energy gap.

A material having a large conjugation at π bonding exhibits a narrow triplet energy gap, so that the transfer of the energy to the phosphorescent dopant of the phosphorescent-emitting layer is difficult.

Accordingly, conventional structures have employed CBP, which has a fewer number of common π bonding and has a wider triplet energy gap, as a phosphorescent host material.

In contrast, according to the aspect of the invention, the polycyclic fused aromatic skeleton has 14 to 30 carbon atoms, and the triplet energy gap is 2.1 eV to 2.7 eV.

The host material according to the aspect of the invention, which exhibits a narrower triplet energy gap than a typical host material, is not capable of securing the transfer of the energy to the red phosphorescent dopant of the red phosphorescent-emitting layer.

However, a red phosphorescent dopant has a narrower triplet energy gap than a green phosphorescent dopant. Thus, as long as the host material has the triplet energy gap of approximately 2.1 eV to 2.7 eV, the transfer of the energy to the red phosphorescent dopant can be secured.

Further, since the host material has the suitable triplet energy gap of approximately 2.1 eV to 2.7 eV, the singlet energy gap can also become of a suitable size. Accordingly, it is possible to prevent the reduction in luminous efficiency caused by an excessively large singlet energy gap and inefficiency in the transfer of the energy to the fluorescent dopant. Thus, the lifetime of the organic EL device can be increased while the driving voltage is reduced.

In other words, the host material according to the aspect of the invention can exhibit a suitable energy gap as the host material for the fluorescent-emitting layer in the device including the fluorescent-emitting layer and phosphorescent-emitting layer. Hence, the host material can provide an organic EL device having practical lifetime.

According to the aspect of the invention, since the above-described host material is used for the fluorescent-emitting layer, an organic EL device including a fluorescent-emitting layer and a phosphorescent-emitting layer, requiring a lower driving voltage and having both of practical luminous efficiency and emission lifetime is obtainable.

In the aspect of the invention, the polycyclic fused aromatic skeleton preferably has no substituent having a carbazole skeleton.

When a carbazole group is introduced as the substituent, triplet energy gap is widened due to increase in ionization potential, and thus such a material becomes applicable as a host for a phosphorescent dopant for emission of a shorter wavelength. However, introduction of a carbazole group, which is typically vulnerable to oxidation, may unfavorably lead to shorter lifetime.

In this respect, according to the aspect of the invention, the lifetime can be prolonged although the triplet energy gap is narrowed.

When the fluorescent-emitting layer is formed of such a host material having an energy gap as described above, a difference in ionization potential (Ip) between the host material and the hole injecting/transporting layer etc. becomes so large that the holes can hardly be injected into the fluorescent-emitting layer and that a driving voltage required for providing sufficient luminance may be raised.

In the above instance, introducing a hole-injectable or hole-transportable assistance substance for assisting injection of charges in the fluorescent-emitting layer can contribute to facilitation of the injection of the holes into the fluorescent-emitting layer and to reduction of the driving voltage.

As the assistance material for assisting the injection of charges, for instance, a typical hole injecting/transporting material or the like can be used.

Examples of the assistance material are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, U.S. Pat. No. 3,820,989 and U.S. Pat. No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and U.S. Pat. No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961 and U.S. Pat. No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two fused aromatic rings disclosed in U.S. Pat. No. 5,061,569, 4,4',4"-tris(N-(3-methylphenyl)-N-phenylamino) triphenylamine (hereinafter, abbreviated as MTDATA) in which three triphenylamine units disclosed in JP-A-04-308688 are bonded in a starbust form and the like may also be used.

Further, a hexaazatriphenylene derivative disclosed in Japanese Patent No. 3614405 and No. 3571977 and U.S. Pat. No. 4,780,536 may also preferably be used as the hole-injecting material.

Alternatively, inorganic compounds such as p-type Si and p-type SiC can also be used as the hole-injecting material.

The hole injecting layer and the hole transporting layer, which aids the injection of the holes into the emitting layer and transports the holes to the emitting region, exhibits large hole mobility while typically exhibiting as small ionization energy as 5.5 eV or less. Materials for the hole injecting layer and the hole transporting layer are preferably capable of transporting the holes to the emitting layer at lower electric strength. In addition, the hole mobility thereof is preferably $10^{-4}$ $cm^2/V \cdot sec$ or more when applied with an electric field of, for instance, $10^4$ to $10^6$ V/cm.

The materials for the hole injecting layer and the hole transporting layer are not specifically limited, and may be suitably selected among those typically and widely used as hole charge transporting materials in photoconductive materials and those typically used in hole injecting layers and hole transporting layers of organic EL devices.

For the hole injecting layer and the hole transporting layer, for instance, an aromatic amine derivative represented by the following formula is usable.

[Chemical Formula 104]

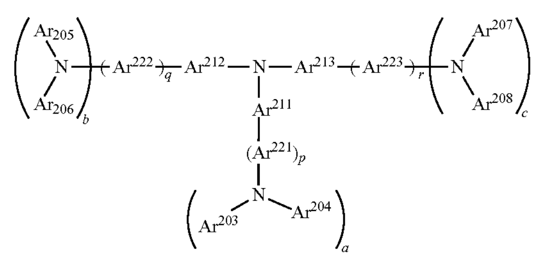

In the formula, $Ar^{211}$ to $Ar^{213}$ and $Ar^{221}$ $Ar^{223}$ each represent a substituted or unsubstituted arylene group having 6 to 50 ring carbon atoms or a substituted or unsubstituted heteroarylene group having 5 to 50 ring atoms. $Ar^{203}$ to $Ar^{208}$ each represent a substituted or unsubstituted aryl group having 6 to 50 ring carbon atoms or a substituted or unsubstituted heteroaryl group having 5 to 50 ring atoms. a to c and p to r each represent an integer of 0 to 3. $Ar^{203}$ and $Ar^{204}$, $Ar^{205}$ and $Ar^{206}$, and $Ar^{207}$ and $Ar^{208}$ may be respectively linked together to form saturated or unsaturated rings.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or unsubstituted arylene group having 6 to 50 ring carbon atoms are groups obtained by eliminating one hydrogen atom from the above aryl groups.

Examples of the substituted or unsubstituted heteroaryl group having 5 to 50 ring atoms are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted heteroarylene group having 6 to 50 ring carbon atoms are groups obtained by eliminating one hydrogen atom from the above heteroaryl groups.

Further, the hole injecting layer and the hole transporting layer may contain a compound represented by the following formula.

[Chemical Formula 105]

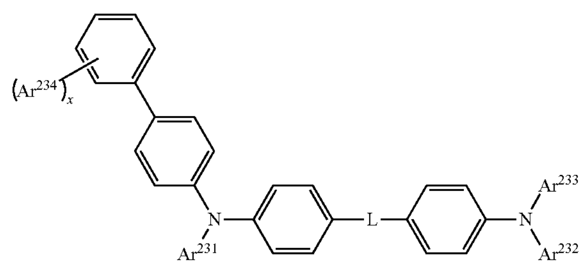

In the formula, $Ar^{231}$ to $Ar^{234}$ each represent a substituted or unsubstituted aryl group having 6 to 50 ring carbon atoms or a substituted or unsubstituted heteroaryl group having 5 to 50 ring atoms. L represents a single bond, a substituted or unsubstituted arylene group having 6 to 50 ring carbon atoms or a substituted or unsubstituted heteroarylene group having 5 to 50 ring atoms. x is an integer of 0 to 5.

$Ar^{232}$ and $Ar^{233}$ may be linked together to form saturated or unsaturated ring. Examples of the substituted or unsubstituted aryl group and arylene group having 6 to 50 ring carbon atoms, and of the substituted or unsubstituted heteroaryl group and heteroarylene group having 5 to 50 ring atoms are the same as enumerated above.

Examples of the materials for the hole injecting layer and the hole transporting layer are triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, tyrylanthracene derivatives, fluorenone derivatives, hydrazone derivatives, stilbene derivatives, silazane derivatives, aniline copolymers and conductive polymer oligomers (particularly thiophene oligomer).

While the above materials are usable for the hole injecting layer and the hole transporting layer, porphyrin compounds, aromatic tertiary amine compounds and styrylamine compounds are preferable, among which aromatic tertiary amine compounds are particularly preferable.

Further usable examples are compounds having two fused aromatic rings in their molecules such as NPD and 4,4',4"-tris(N-(3-methylphenyl)-N-phenylamino)triphenylamine in which three units of triphenylamine are linked together in a starburst form (hereinafter abbreviated as MTDATA).

In addition, a nitrogen-containing heterocyclic derivative represented by the following formula is also usable.

[Chemical Formula 106]

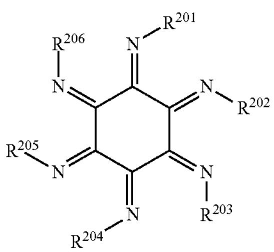

In the formula, $R^{201}$ to $R^{206}$ each represent any one of a substituted or unsubstituted alkyl group having 1 to 50 carbon atoms, substituted or unsubstituted aryl group having 6 to 50 ring carbon atoms, substituted or unsubstituted aralkyl group having 7 to 50 carbon atoms and substituted or unsubstituted heterocyclic group having 5 to 50 ring atoms. $R^{201}$ and $R^{202}$, $R^{203}$ and $R^{204}$, $R^{205}$ and $R^{206}$, $R^{201}$ and $R^{206}$, $R^{202}$ and $R^{203}$ or $R^{204}$ and $R^{205}$ may form a fused ring.

Further, the compound represented by the following formula is also usable.

[Chemical Formula 107]

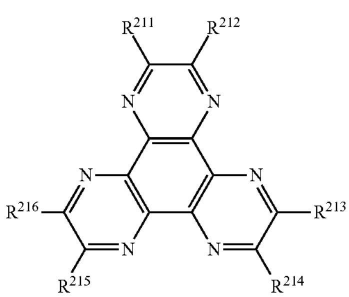

$R^{211}$ to $R^{216}$ each represent a substituent, preferably an electron absorbing group such as cyano group, nitro group, sulfonyl group, carbonyl group, trifluoromethyl group and halogen.

Alternatively, inorganic compounds such as p-type Si and p-type SiC are also usable for the hole injecting layer and the hole transporting layer. The hole injecting layer and the hole transporting layer can be formed by thinly layering the above-described compound by a known method such as vacuum deposition, spin coating, casting and LB method.

The thickness of the hole injecting layer and the hole transporting layer is not particularly limited. Typically, the thickness is 5 nm to 5 μm. The hole injecting layer and the hole transporting layer may be a single-layered layer made of the single one of the above materials or a combinations of two or more of the above materials. Alternatively, the hole injecting layer and the hole transporting layer may be a multilayer layer in which a plurality of hole injecting layers and hole transporting layers made of different materials are layered.

Alternatively, inorganic compounds such as p-type Si and p-type SiC can also be used as the material for the hole injecting layer.

The compound represented by the following formula is also preferable for the hole injecting layer.

[Chemical Formula 108]

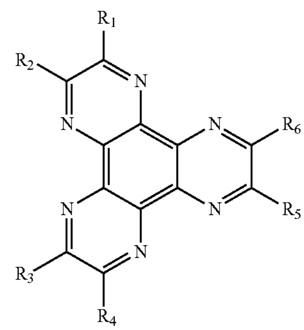

In the formula, $R_1$ to $R_6$ each represent halogen, a cyano group, nitro group, alkyl group or trifluoromethyl group. $R_1$ to $R_6$ may be mutually the same or different. Preferably, $R_1$ to $R_6$ represent a cyano group.

The hole injecting layer can be formed by thinly layering the above-described compound by a known method such as vacuum deposition, spin coating, casting and LB method.

The thickness of the hole injecting layer is not particularly limited. Typically, the thickness is 5 nm to 5 μm.

Preferably in the aspect of the invention, the red phosphorescent dopant and the green phosphorescent dopant each contain a metal complex having: a metal selected from Ir, Pt, Os, Au, Cu, Re and Ru; and a ligand.

Preferably in the aspect of the invention, the red phosphorescent dopant provides the maximum emission luminance at a wavelength of 580 nm to 700 nm, and the green phosphorescent dopant provides the maximum emission luminance at a wavelength of 490 nm to 580 nm.

According to such a structure, by using the above metal complex as the phosphorescent dopant, red and green phosphorescent emission is obtainable.

Examples of the red and green phosphorescent dopants are PQIr (iridium(III)bis(2-phenyl quinolyl-N,$C^{2'}$)acetylacetonate) and $Ir(ppy)_3$(fac-tris(2-phenylpyridine)iridium). Further examples are compounds shown below.

[Chemical Formula 109]

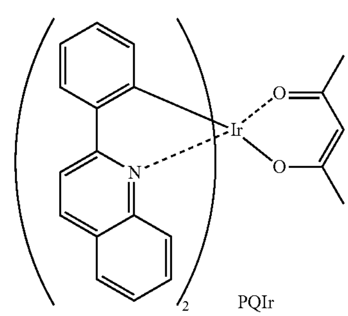

PQIr

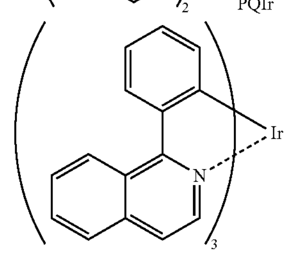

-continued
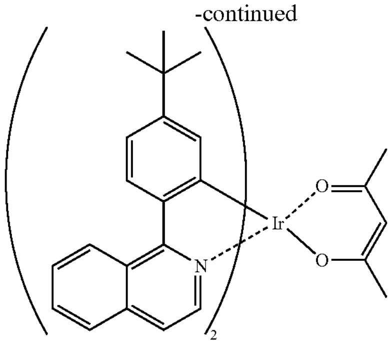
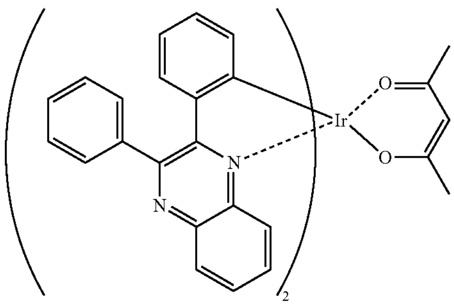
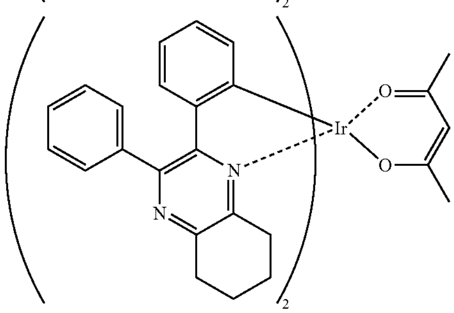
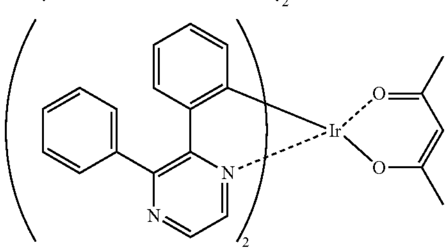
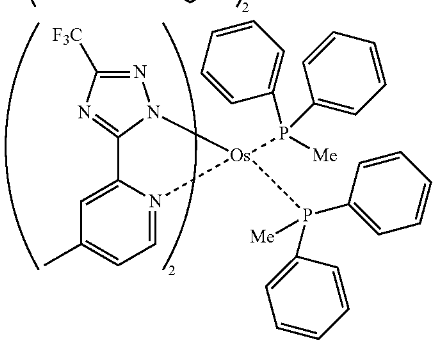
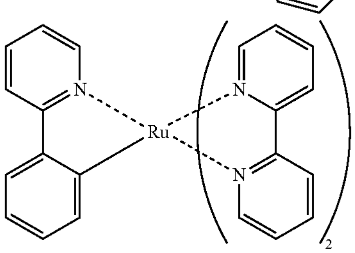
-continued
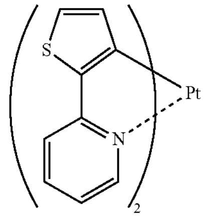
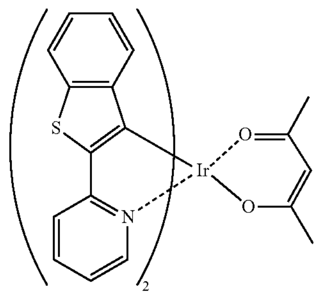
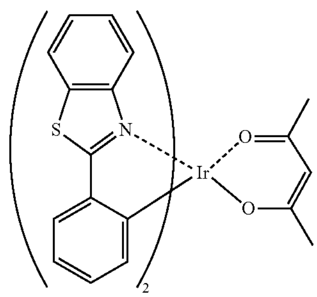
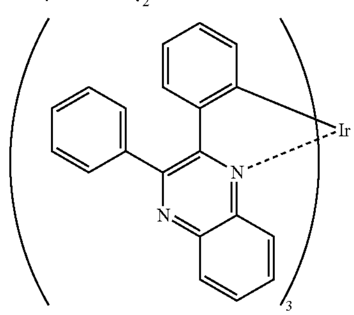
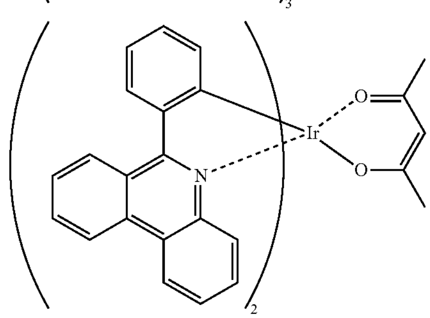
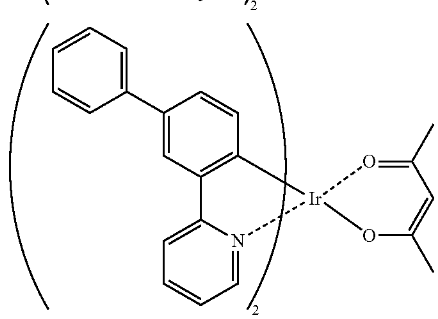

-continued
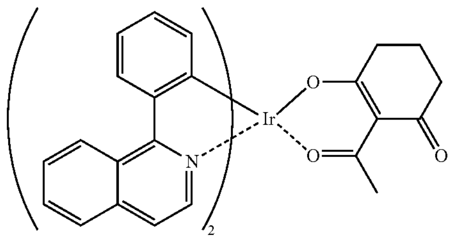
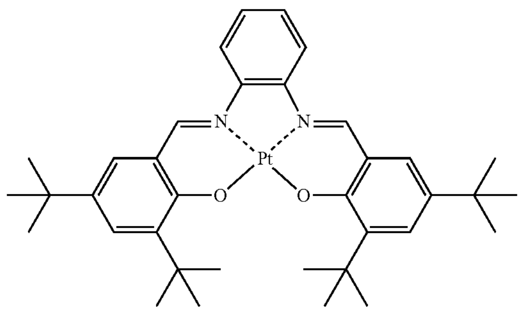
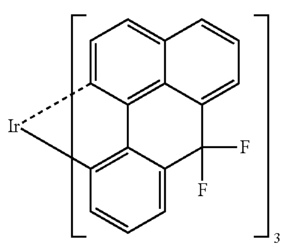
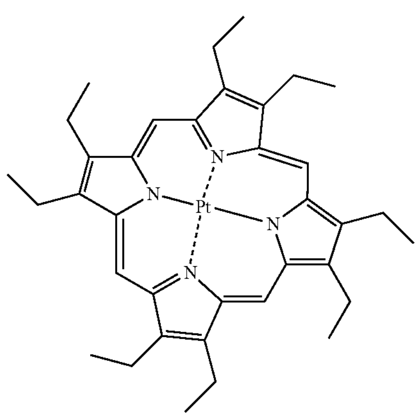
[Chemical Formula 110]
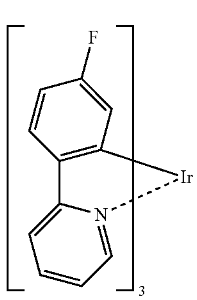
-continued
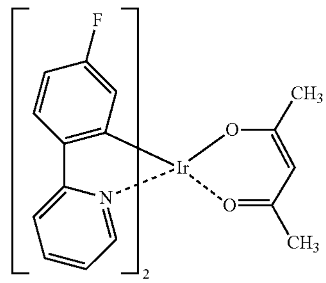
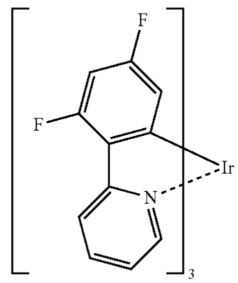
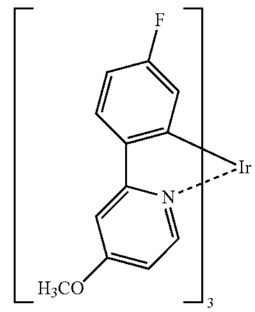
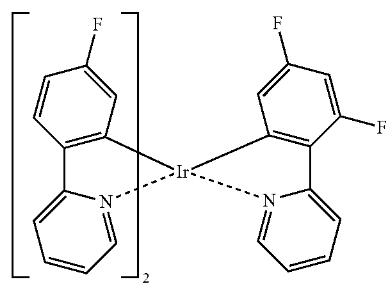
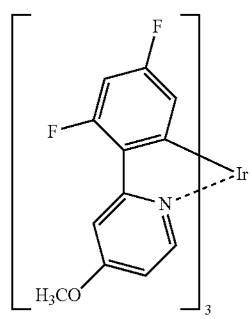
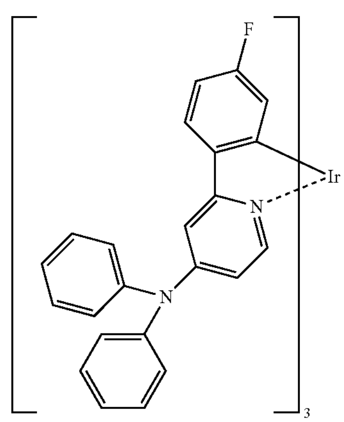

-continued
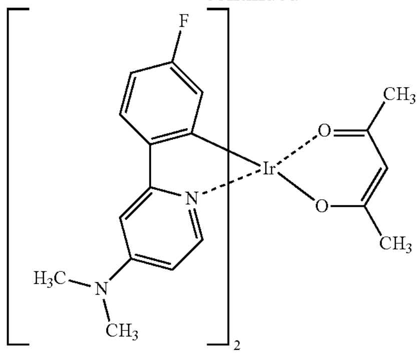
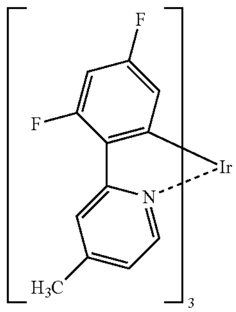
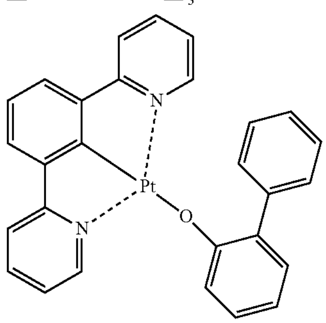
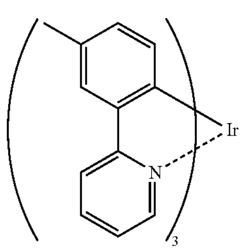
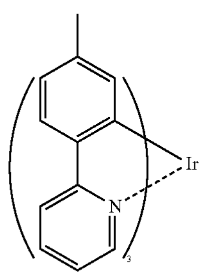
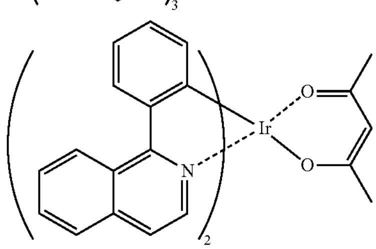
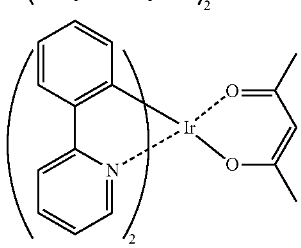
-continued
[Chemical Formula 111]
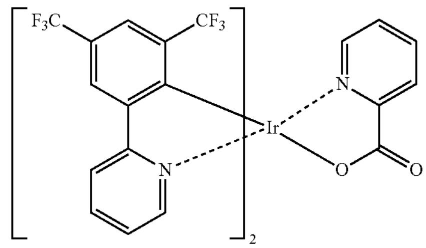
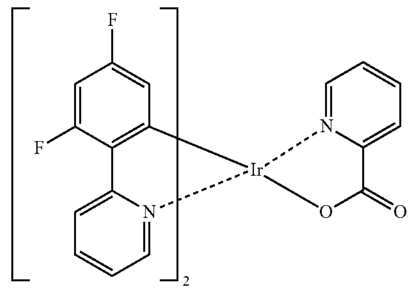
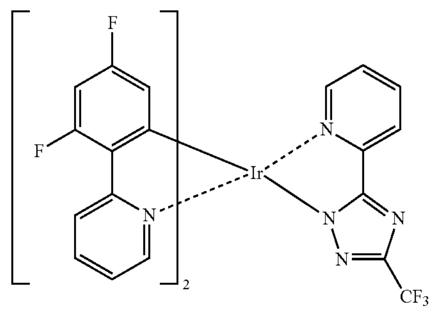
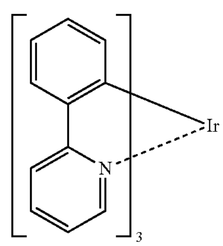
Ir(ppy)$_3$
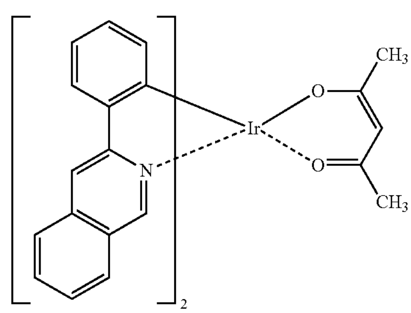

-continued
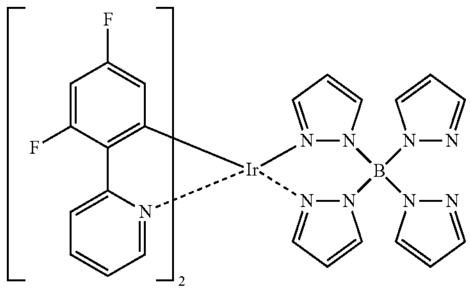
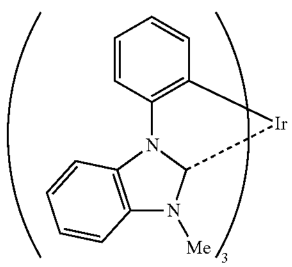
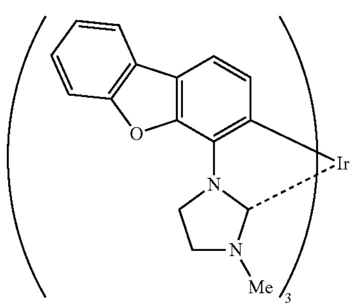
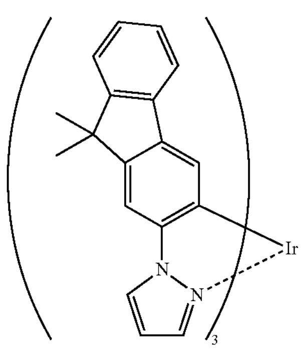
[Chemical Formula 112]
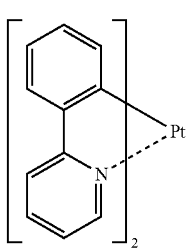
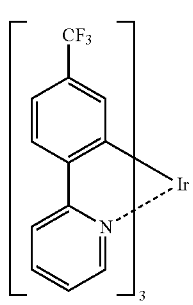
-continued
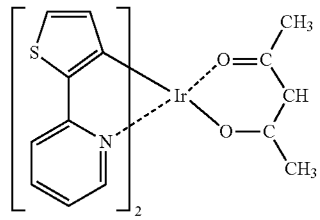
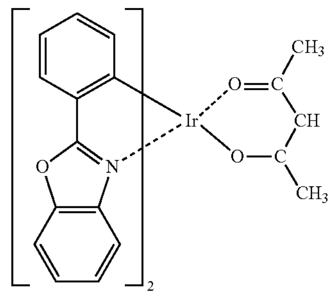
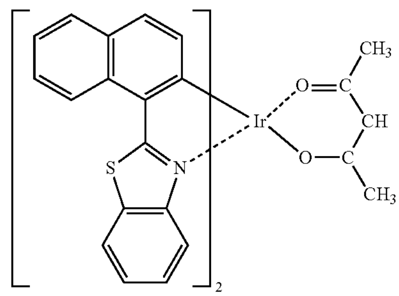
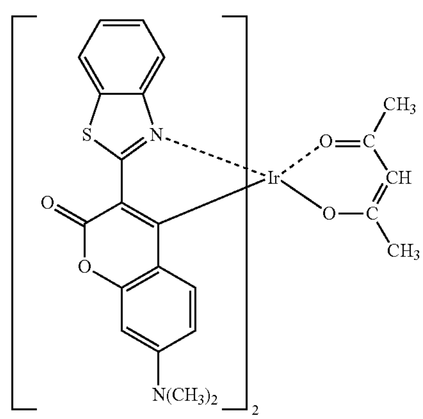
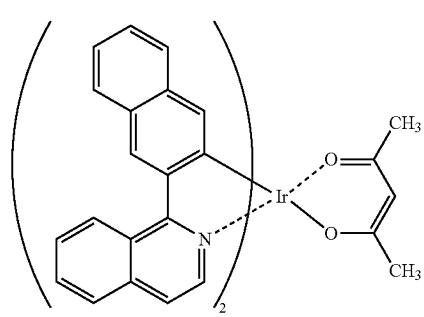

-continued

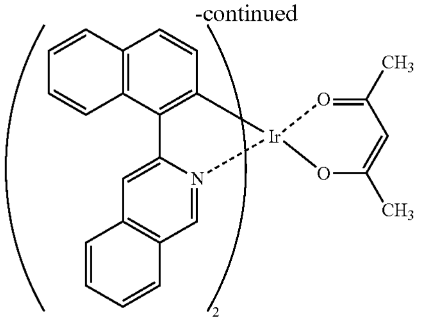

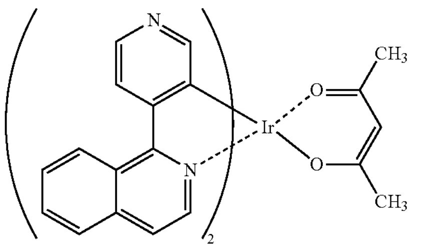

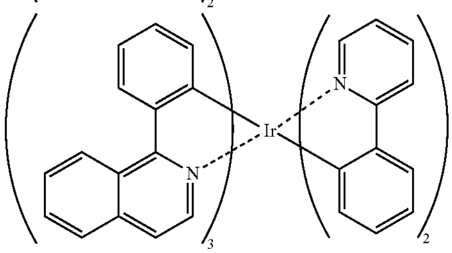

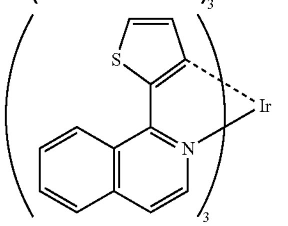

In the aspect of the invention, the red phosphorescent dopant more preferably provides the maximum emission luminance at a wavelength of 560 nm to 700 nm, further preferably at a wavelength of 580 nm to 650 nm. The green phosphorescent dopant more preferably provides the maximum emission luminance at a wavelength of 500 nm to 560 nm, further preferably at a wavelength of 510 nm to 540 nm.

Next, the fluorescent dopant will be described.

The fluorescent dopant to be doped in the fluorescent-emitting layer is not specifically limited, but is preferably a dopant that emits blue light (i.e., short-wavelength light hardly obtainable from phosphorescent emission) in order for the device as a whole to provide white emission.

Examples of the fluorescent dopant are those represented by the following formulae.

[Chemical Formula 113]

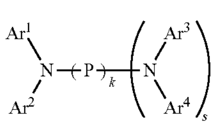

(20)

In the formula (20): P represents a substituted or unsubstituted aromatic hydrocarbon group having 6 to 40 ring carbon atoms, a substituted or unsubstituted heterocyclic group having 3 to 40 ring atoms, or a substituted or unsubstituted styryl group; k is an integer of 1 to 3;

$Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms; s is an integer of 0 to 4;

An adjacent set of substituents for suitably-selected two of $Ar^1$, $Ar^2$ and P may be bonded together to form a ring. When k is 2 or more, P may be mutually the same or different.

Examples of the aromatic hydrocarbon group and the heterocyclic group represented by P are respectively a substituted or unsubstituted aromatic hydrocarbon group having 6 to 40 ring carbon atoms and a substituted or unsubstituted heterocyclic group having 3 to 40 carbon atoms, such as residues of benzene, biphenyl, terphenyl, naphthalene, phenanthrene, fluoranthene, anthracene, pyrene, perylene, coronene, chrysene, picene, dinaphthyl, trinaphthyl, phenylanthracene, diphenylanthracene, florene, triphenylene, rubicene, benzanthracene, dibenzanthracene, acenaphthofluoranthene, tribenzopentaphene, fluoranthenofluoranthene, benzodifluoranthene, benzofluoranthene and diindenoperylene. In particular, residues of naphthalene, phenanthrene, fluoranthene, anthracene, pyrene, perylene, chrysene, phenylanthracene and diphenylanthracene, and residues of combination of two or more thereof are preferable.

In the formula (20), $Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms. s is an integer of 0 to 4.

Examples of the aromatic hydrocarbon group represented by $Ar^1$ to $Ar^4$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the heterocyclic group represented by $Ar^1$ to $Ar^4$ are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

As examples of the amine compound represented by the formula (20), fused aromatic amine, styryl amine, benzidine and the like are shown below, but the invention is not limited thereto. Me represents a methyl group.

[Chemical Formula 114]

(A)-1

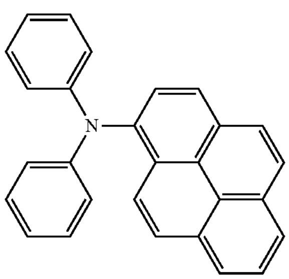

(A)-2

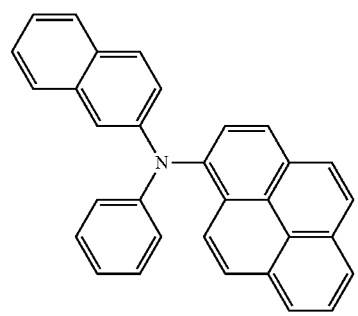

(A)-3

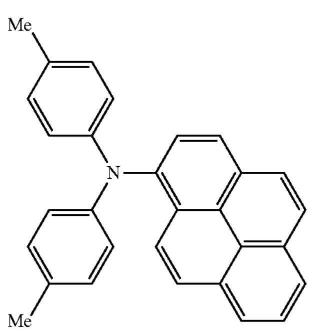

(A)-4

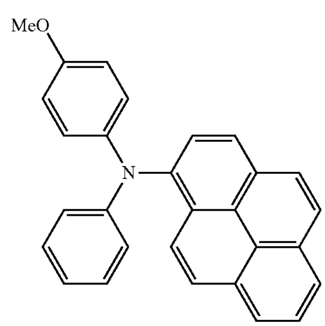

-continued
(A)-5
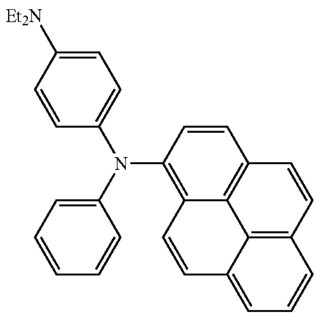
(A)-6
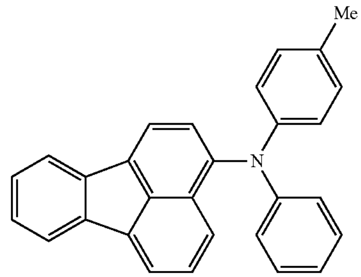
(A)-7
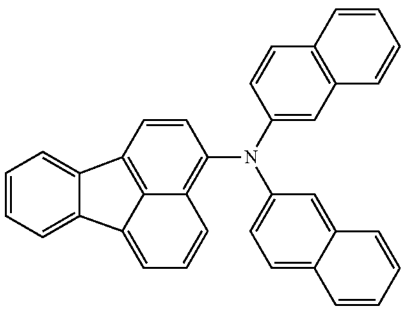
(A)-8
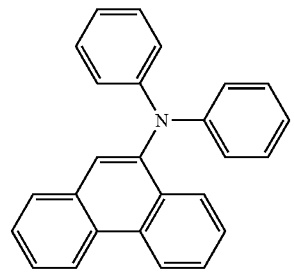
(A)-9
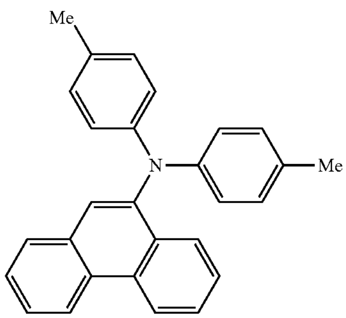
(A)-10
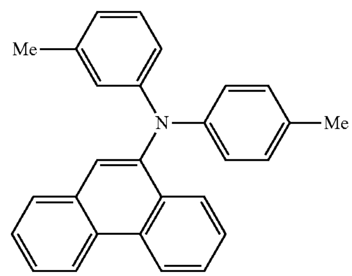
(A)-11
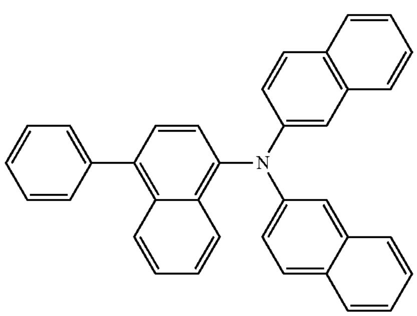
(A)-12
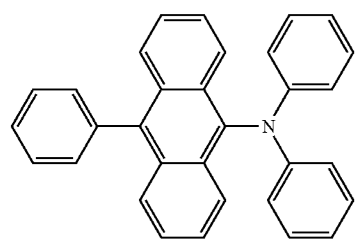
(A)-13
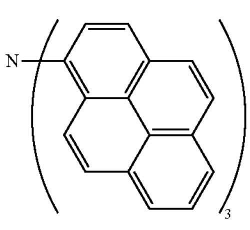
(A)-14
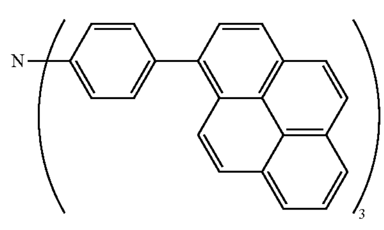

-continued
(A)-15
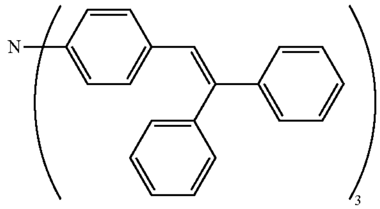
[Chemical Formula 115]
(A)-16
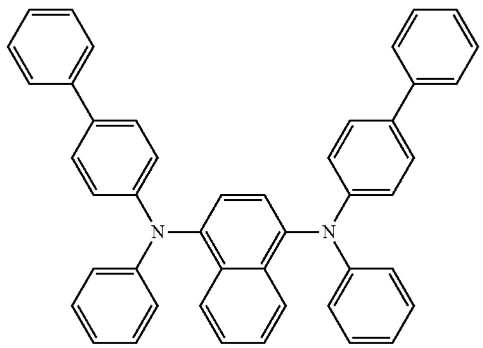
(A)-17
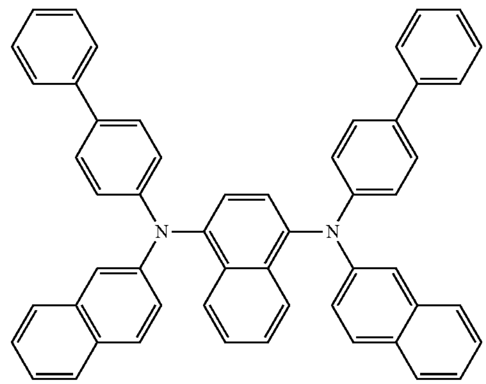
(A)-18
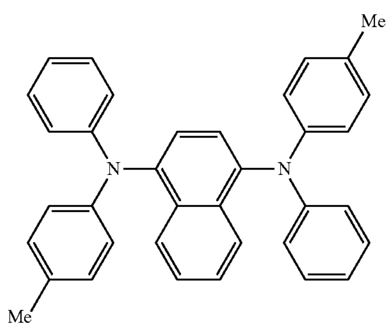
(A)-19
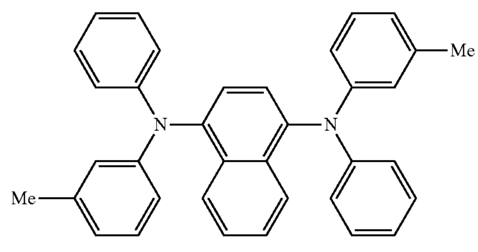
(A)-20
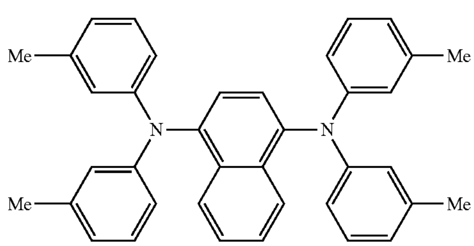
(A)-21
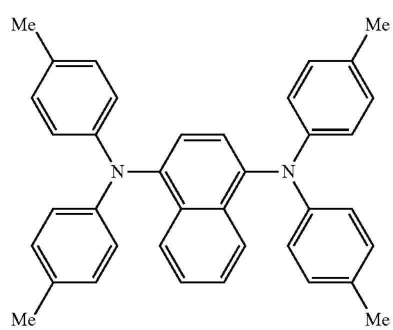

-continued
(A)-22
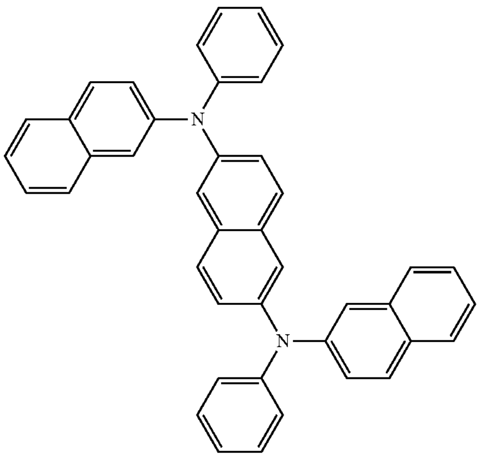
(A)-23
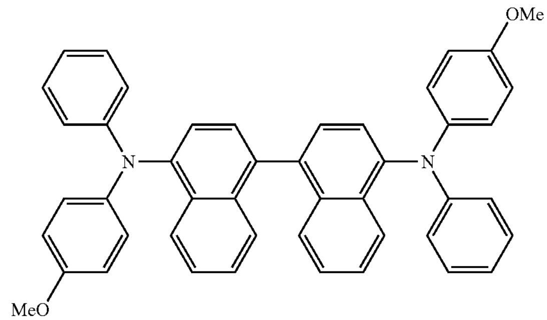
(A)-24
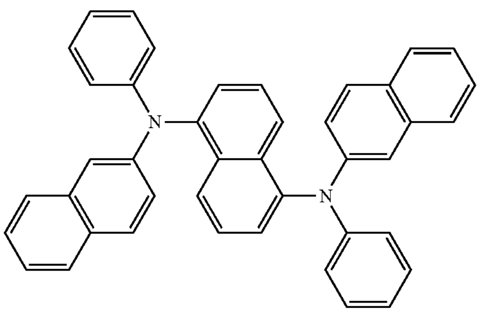
(A)-25
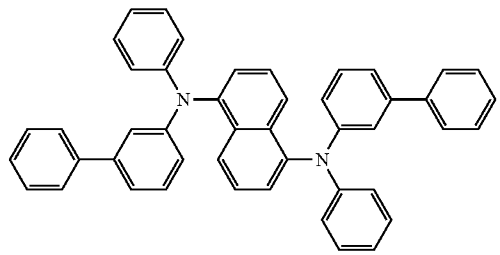
(A)-26
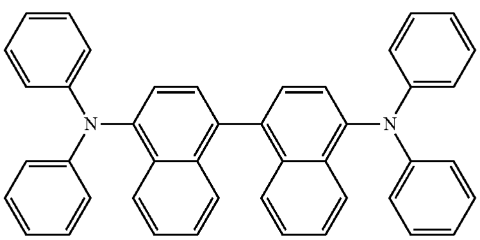
(A)-27
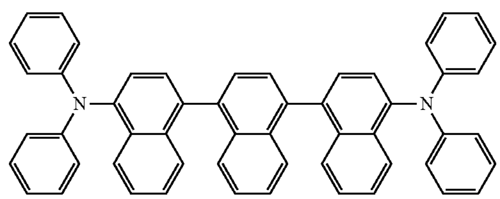
[Chemical Formula 116]
(A)-28
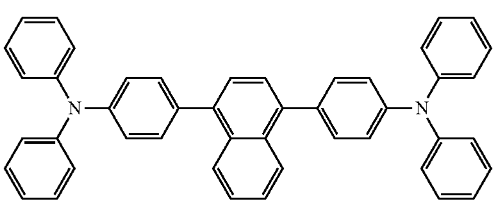
(A)-29
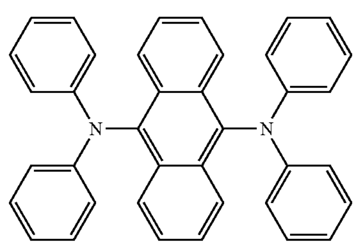

-continued
(A)-30
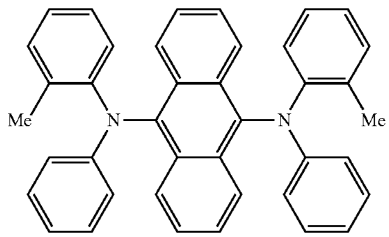
(A)-31
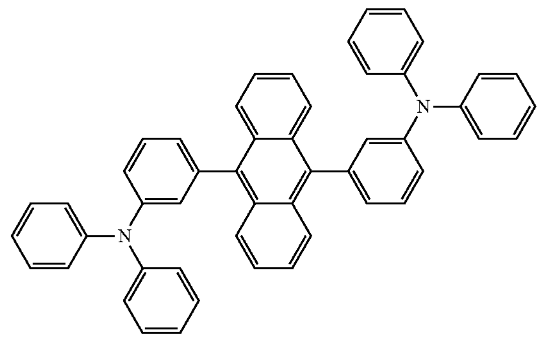
(A)-32
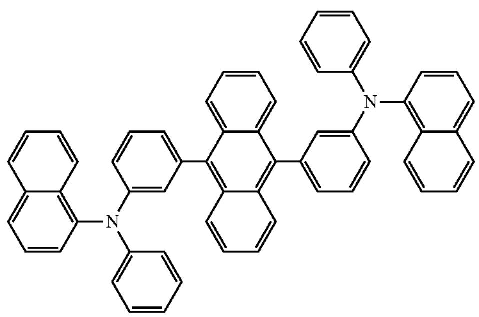
(A)-33
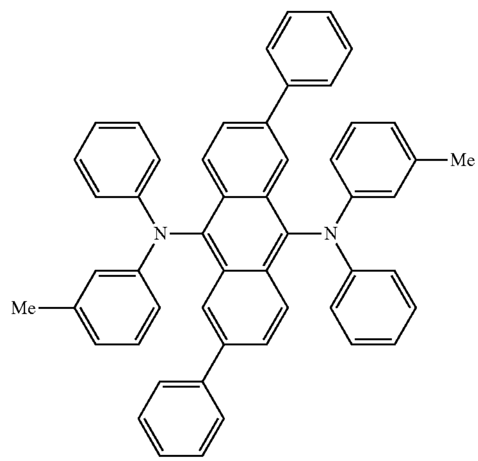
(A)-34
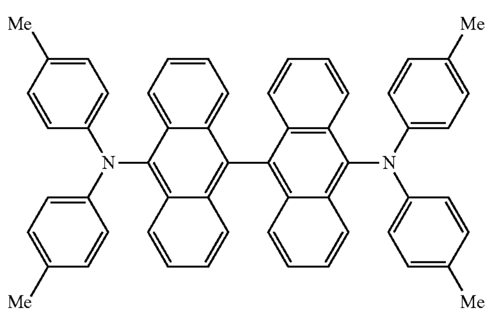
(A)-35
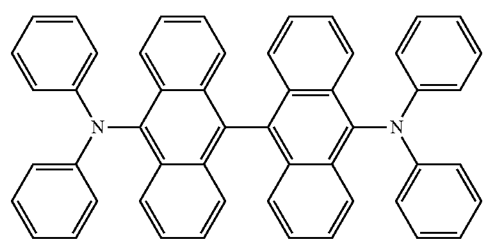
(A)-36
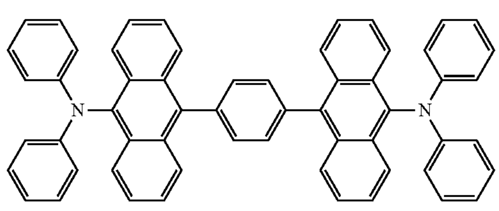
(A)-37
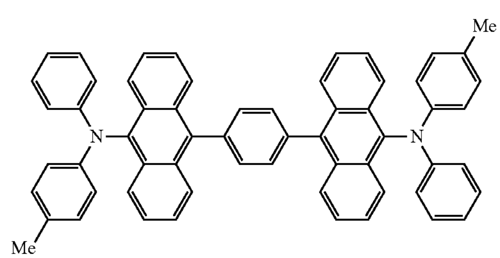

-continued
(A)-38
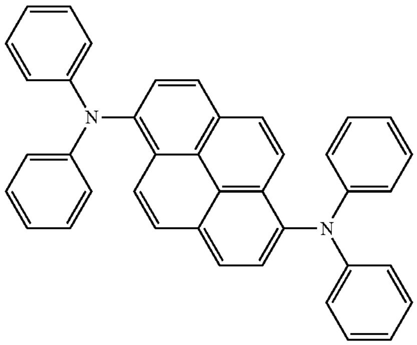
(A)-39
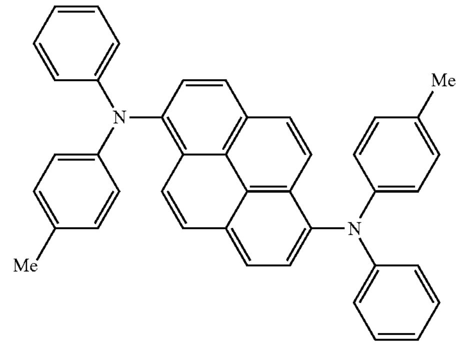
[Chemical Formula 117]
(A)-40
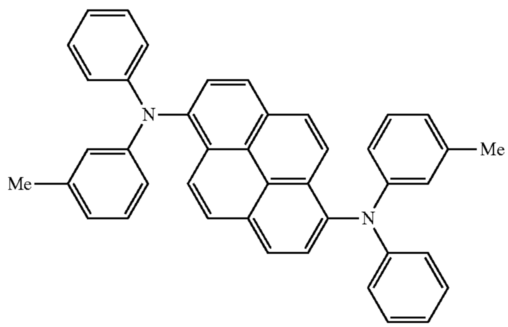
(A)-41
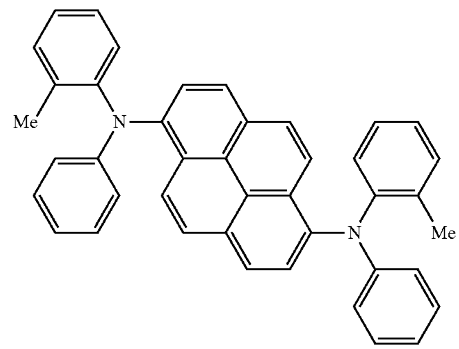
(A)-42
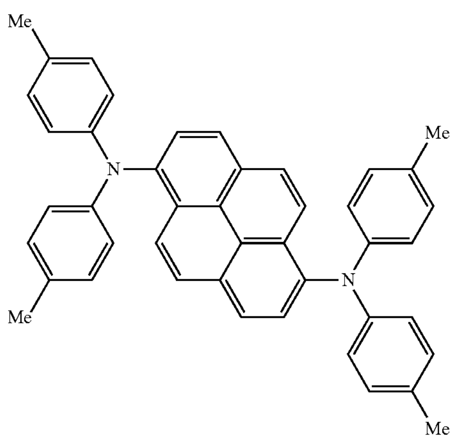
(A)-43
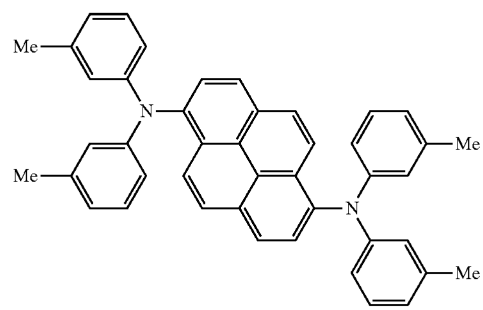
(A)-44
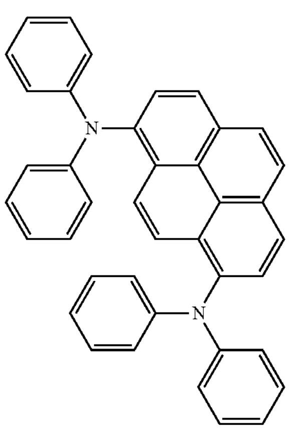
(A)-45
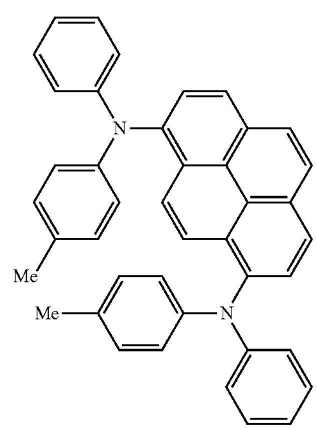

-continued
(A)-46
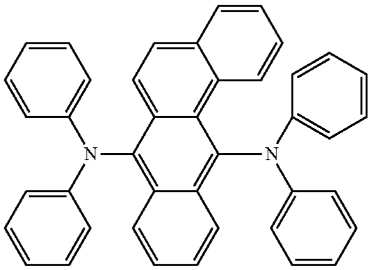
(A)-47
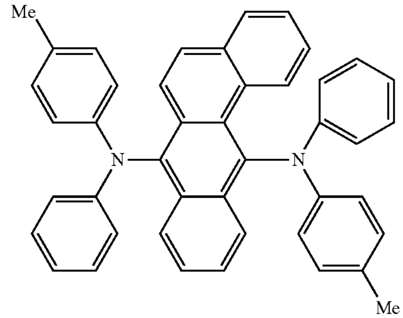
(A)-48
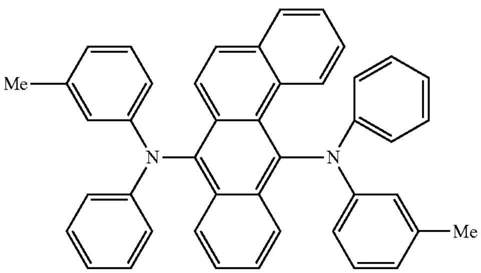
(A)-49
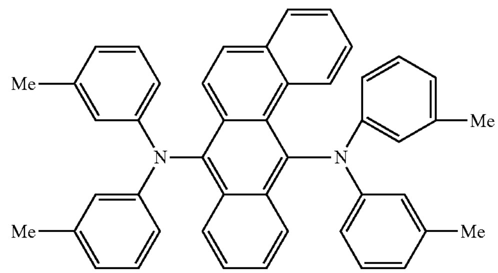
(A)-50
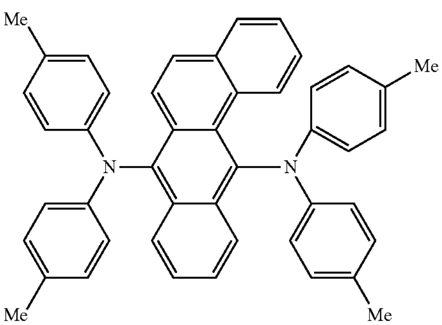
(A)-51
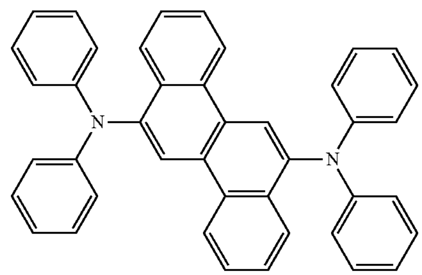
(A)-52
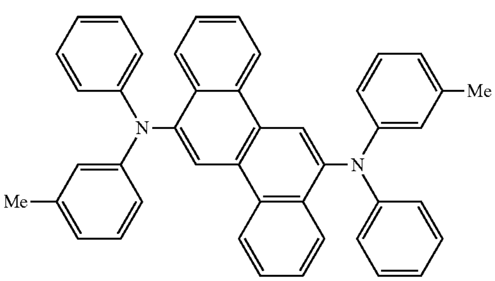
[Chemical Formula 118]
(A)-53
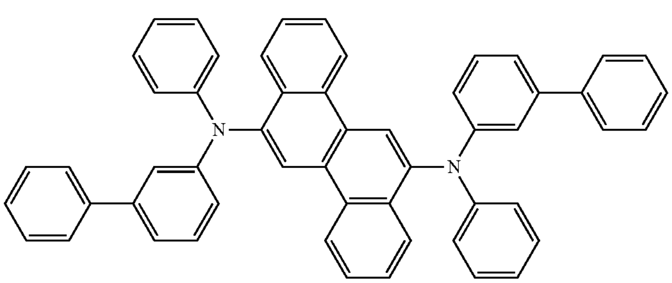

-continued
(A)-54
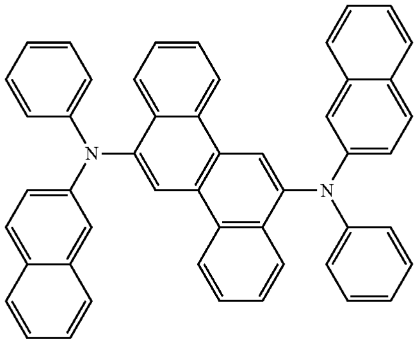
(A)-55
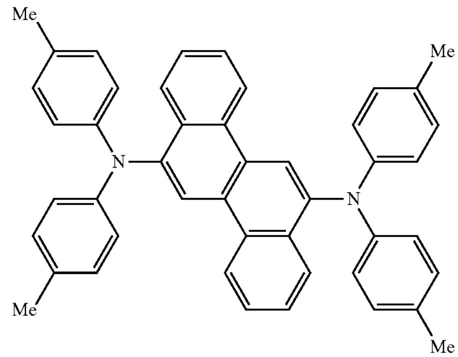
(A)-56
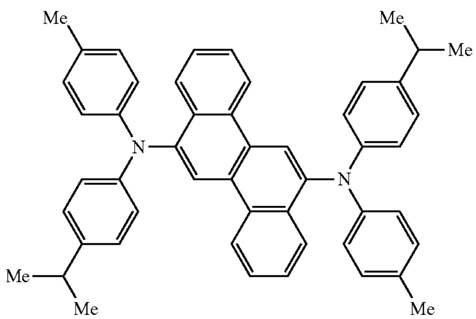
(A)-57
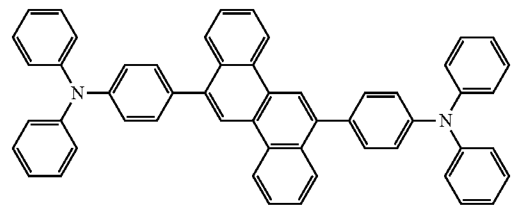
(A)-58
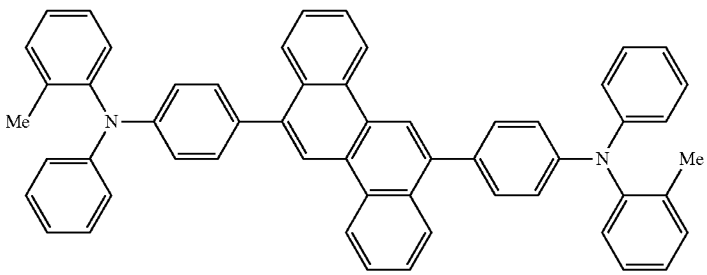
(A)-59
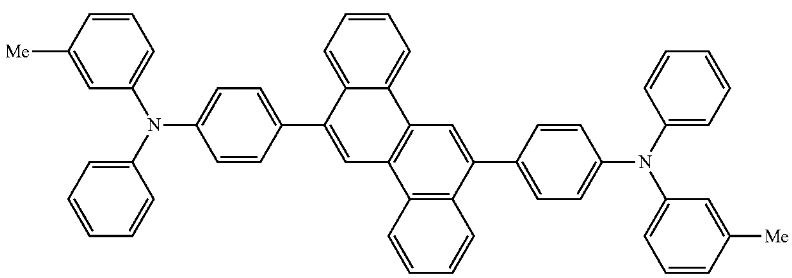
(A)-60
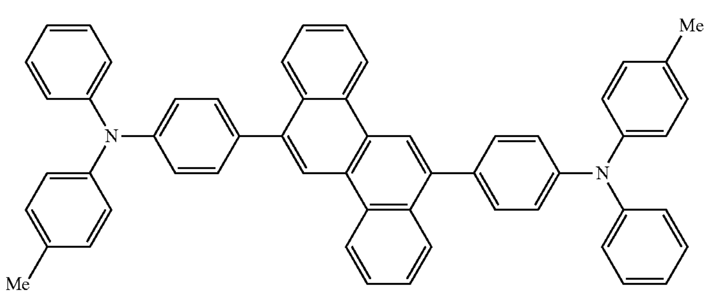

-continued
(A)-61
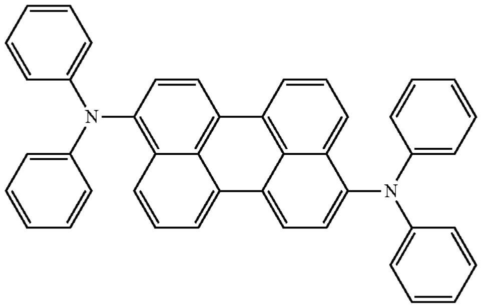
(A)-62
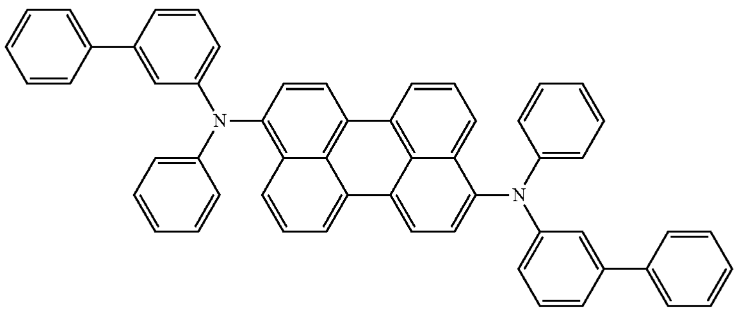
(A)-63
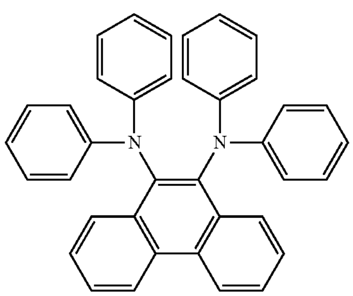
(A)-64
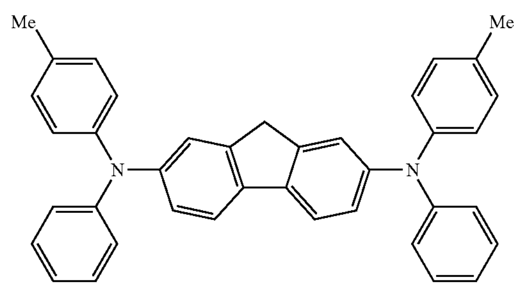
(A)-65
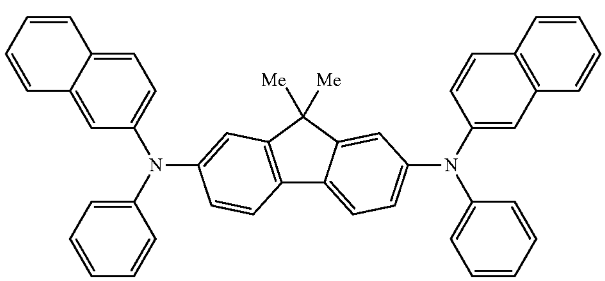

-continued
[Chemical Formula 119]
(A)-66
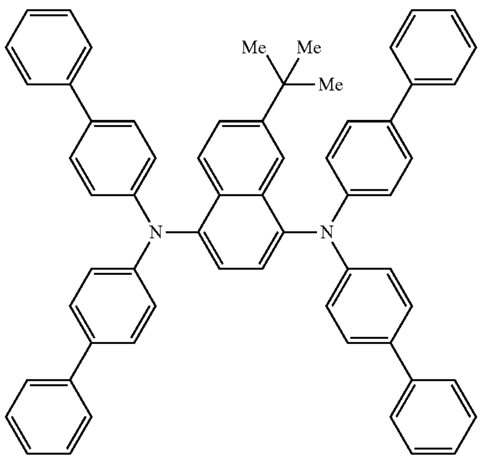
(A)-67
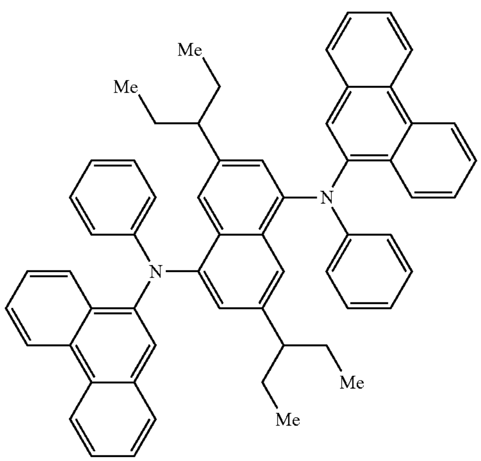
(A)-68
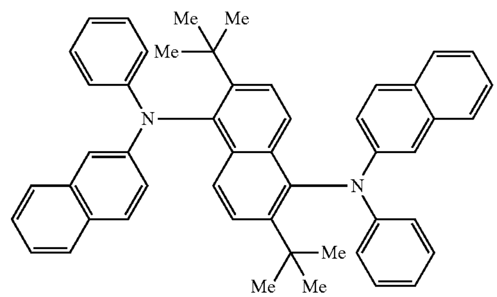
(A)-69
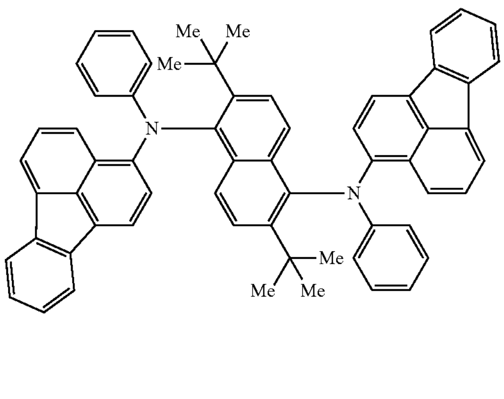
(A)-70
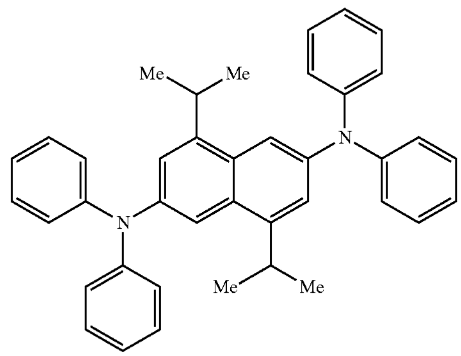

-continued
(A)-71
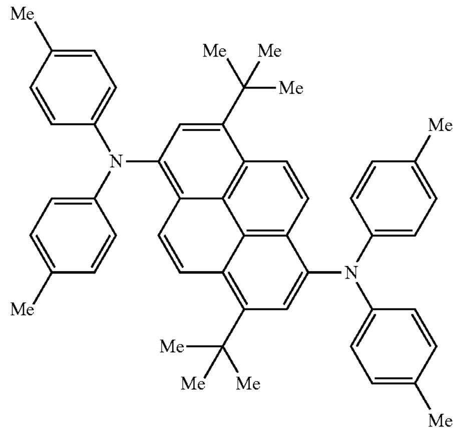
(A)-72
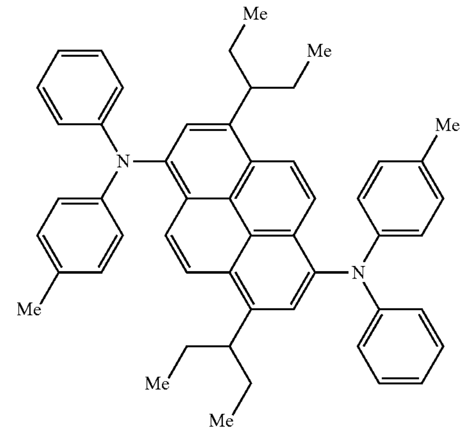
(A)-73
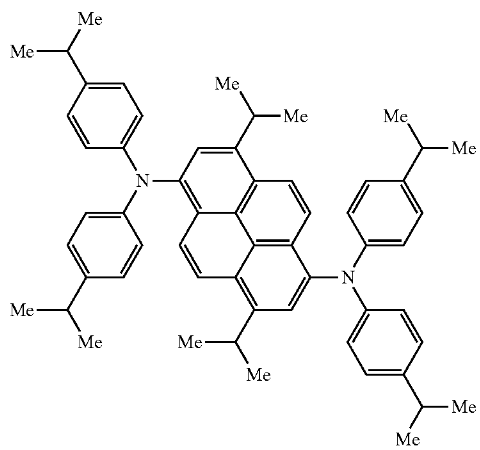
(A)-74
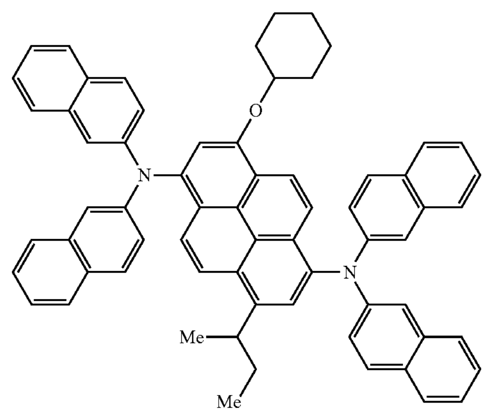
(A)-75
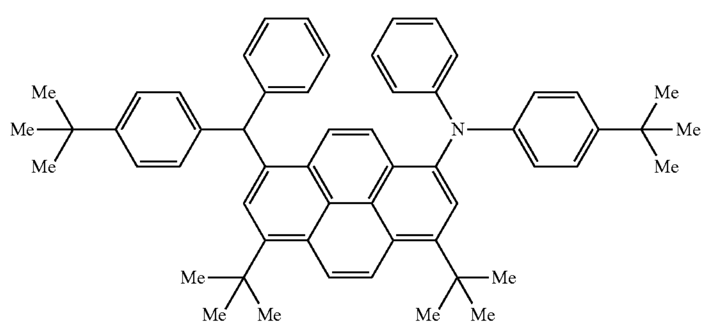

-continued
(A)-76
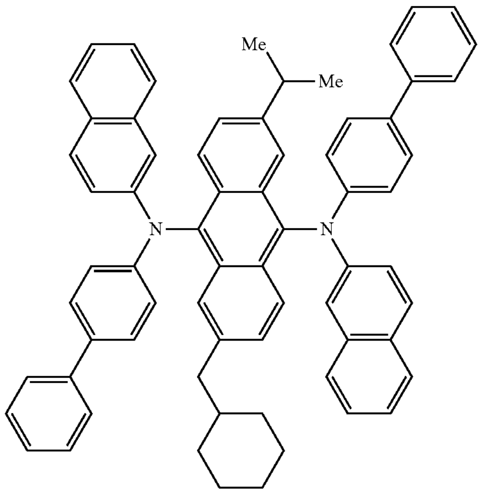
(A)-77
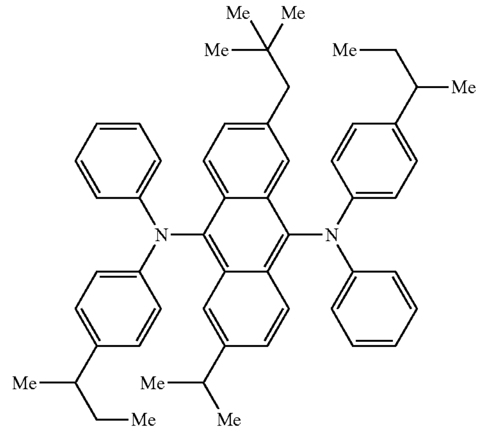
[Chemical Formula 120]
(A)-78
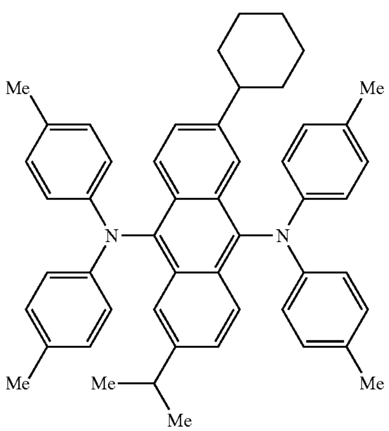
(A)-79
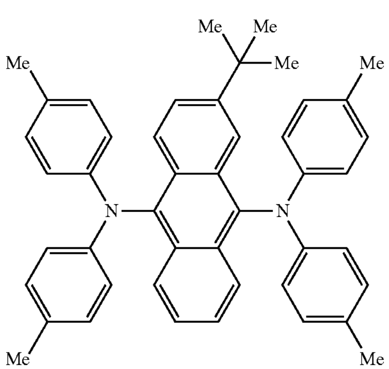
(A)-80
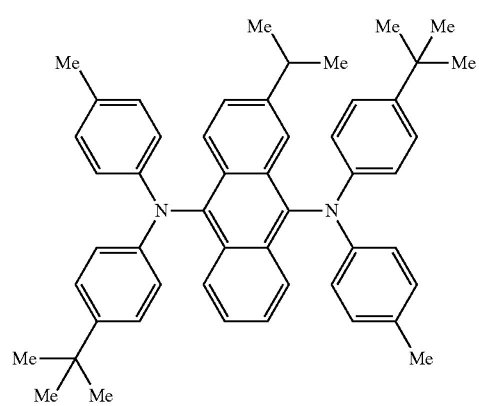

-continued
(A)-81
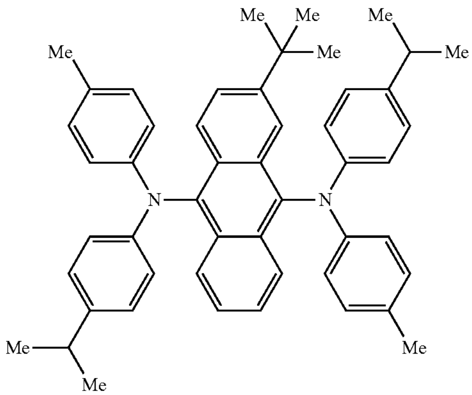
(A)-82
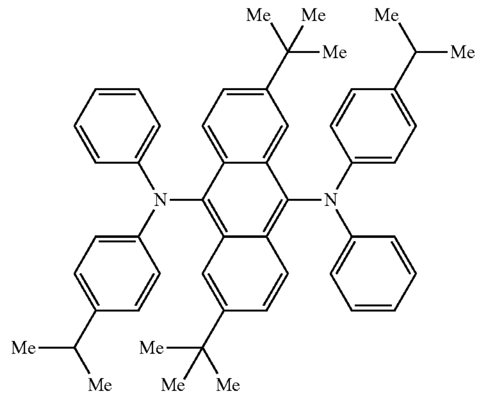
(A)-83
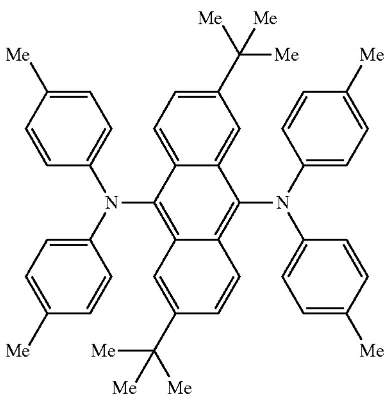
(A)-84
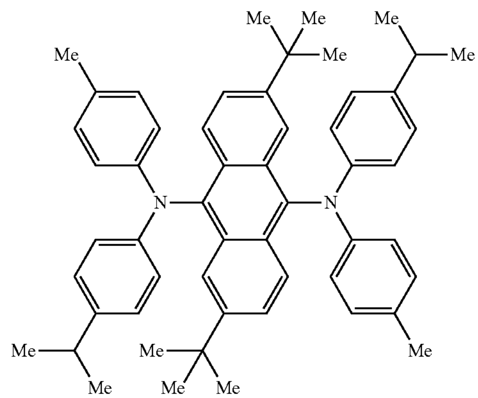
(A)-85
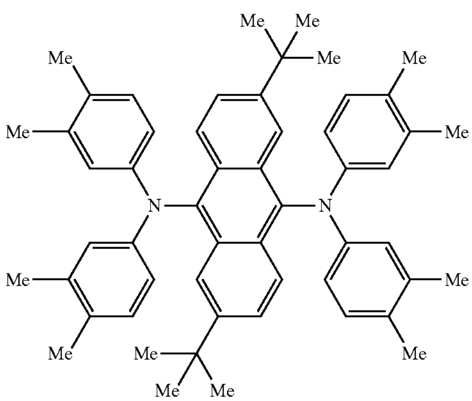
(A)-86
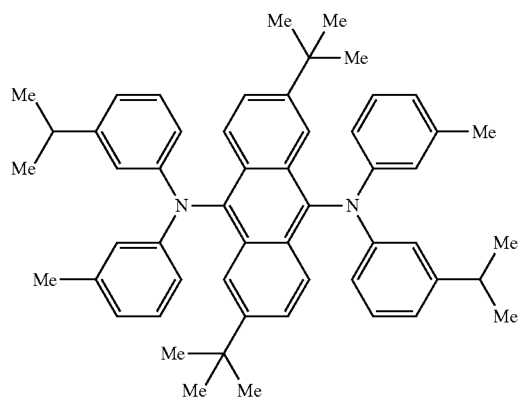
(A)-87
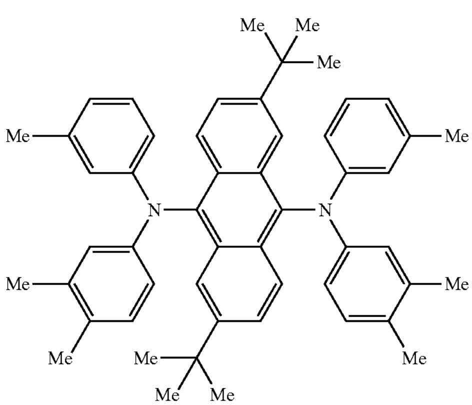
(A)-88
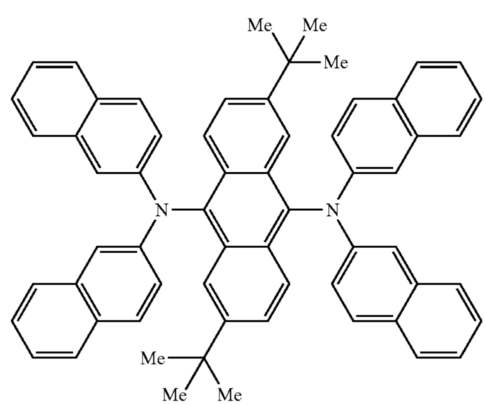

-continued
(A)-89
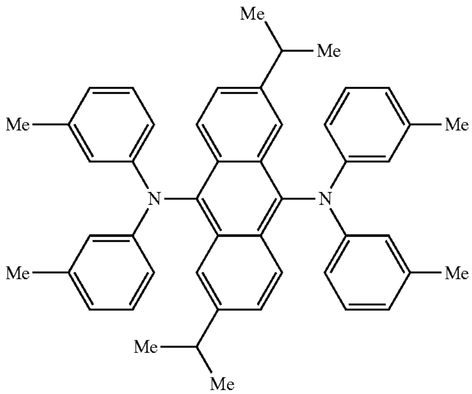
[Chemical Formula 121]
(A)-90
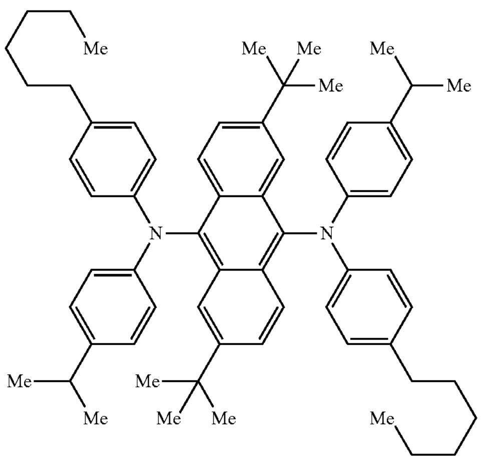
(A)-91
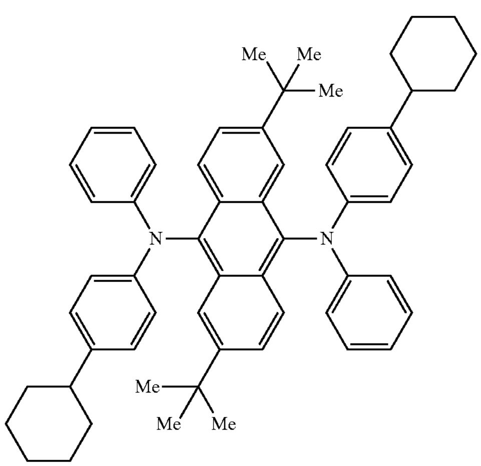
(A)-92
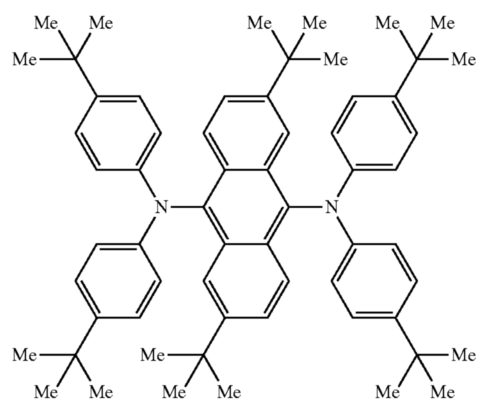

-continued
(A)-93
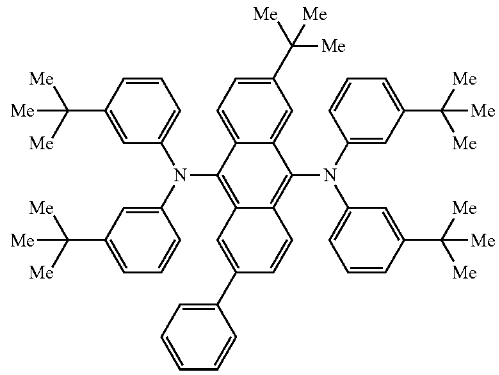
(A)-94
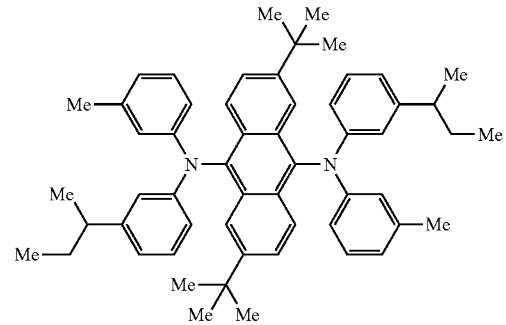
(A)-95
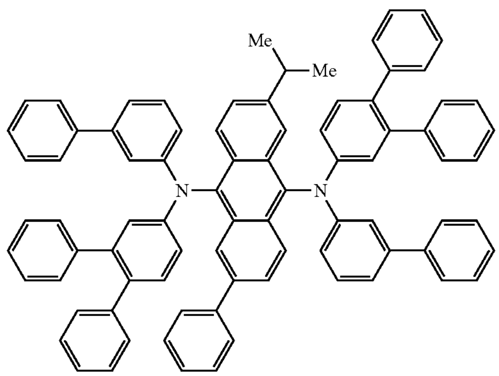
(A)-96
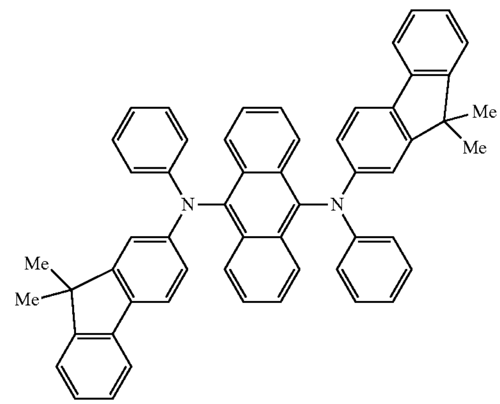
(A)-97
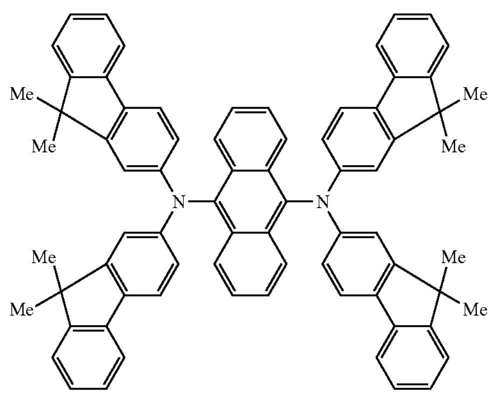
(A)-98
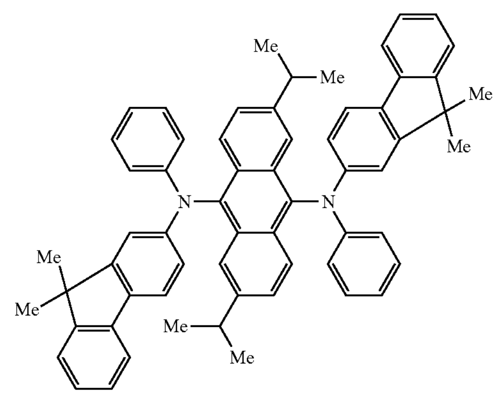
(A)-99
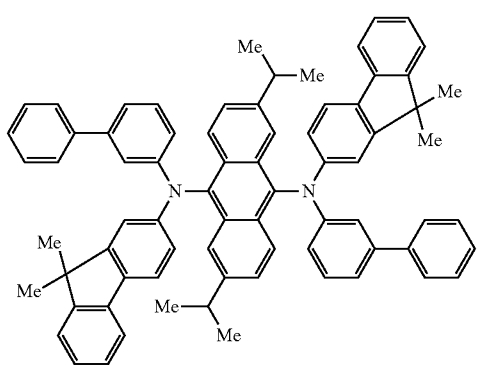
(A)-100
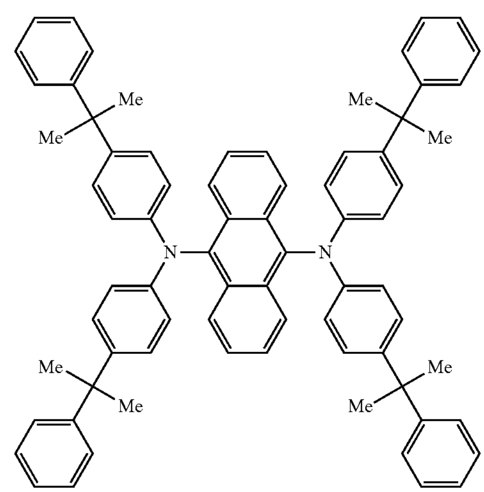

-continued
[Chemical Formula 122]
(A)-101
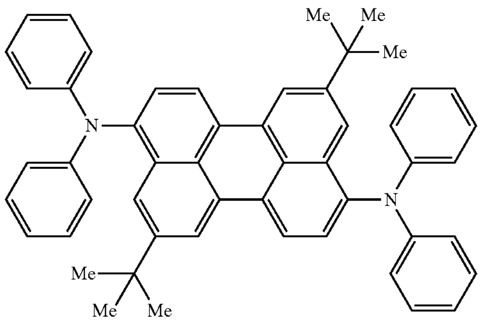
(A)-102
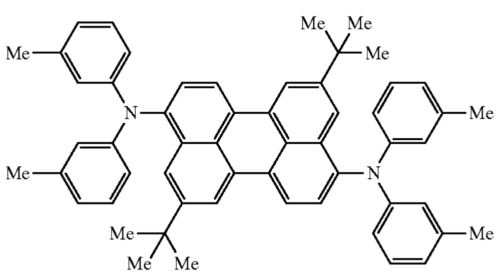
(A)-103
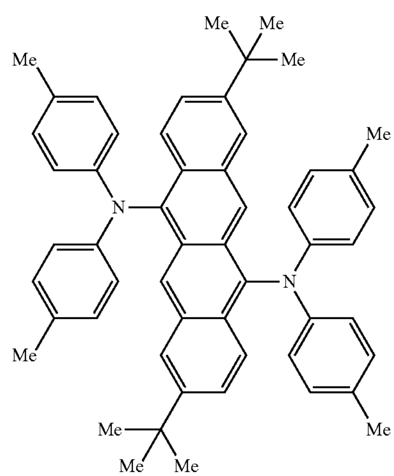
(A)-104
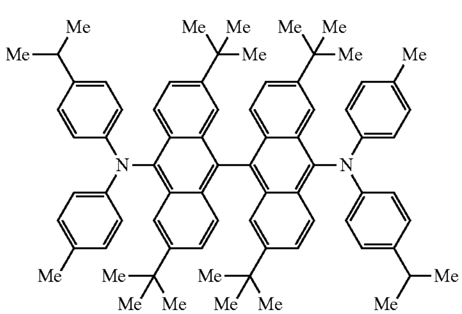
(A)-105
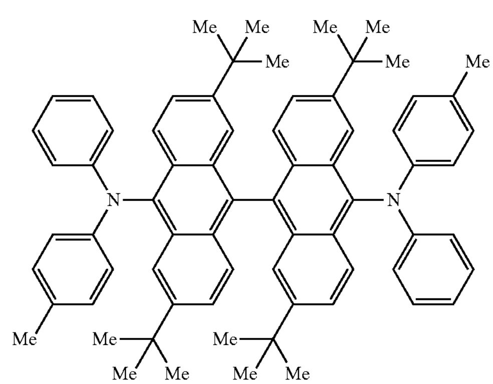

-continued
(A)-106
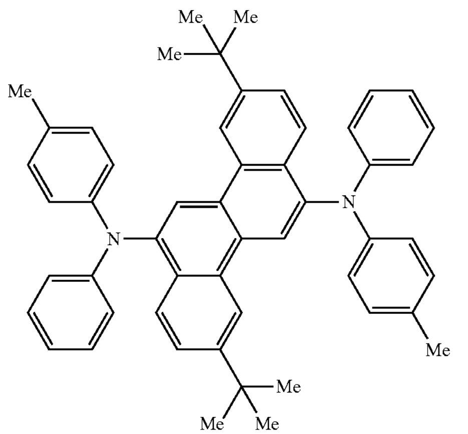
(A)-107
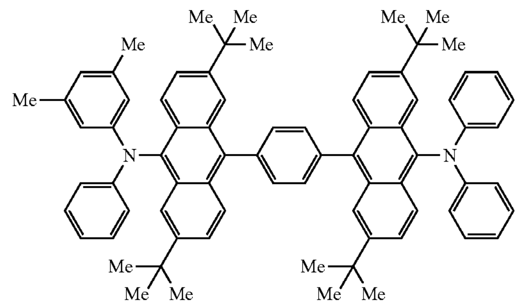
(A)-108
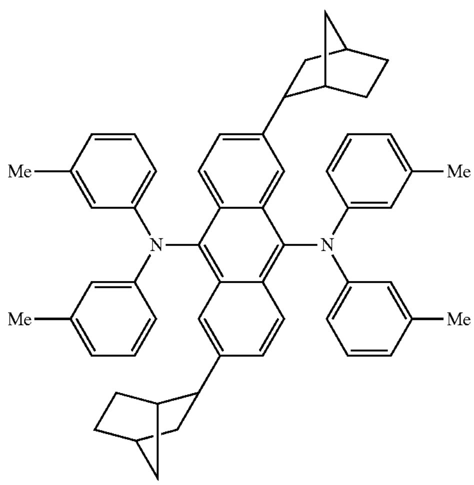
[Chemical Formula 123]
(A)-109
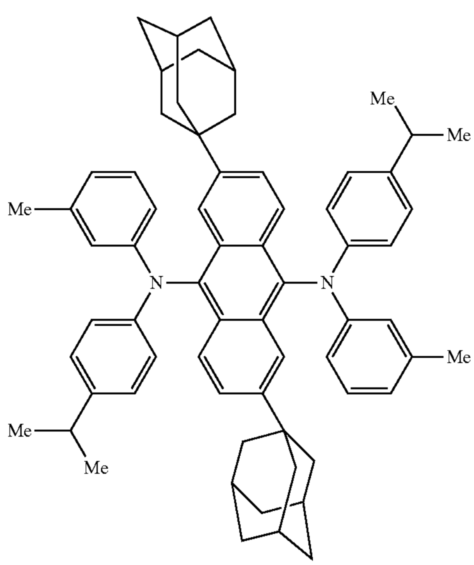

-continued
(A)-110
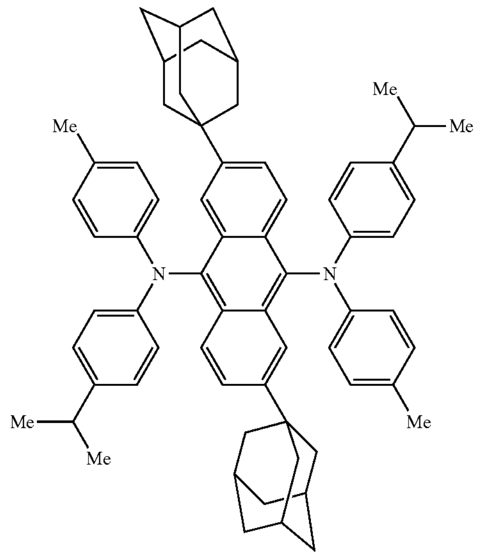
(A)-111
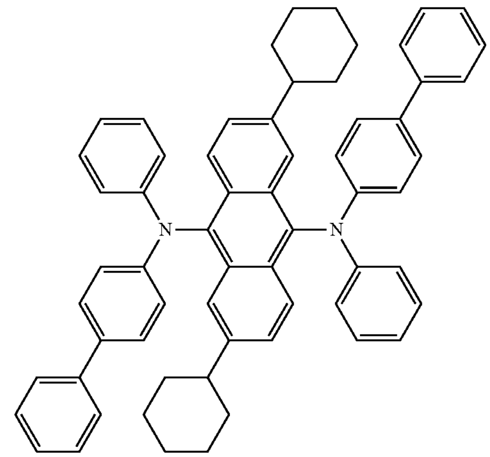
(A)-112
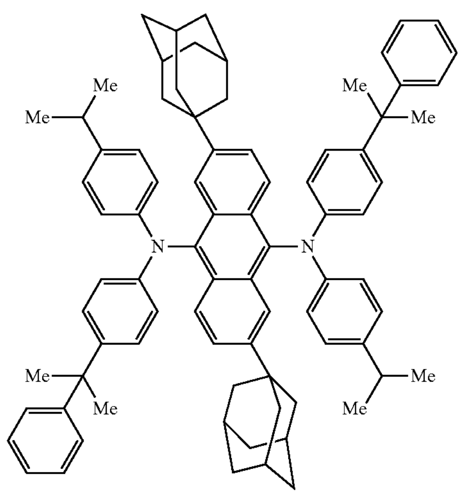
(A)-113
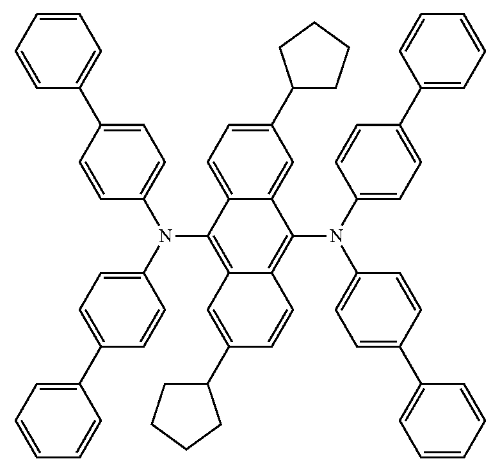
(A)-114
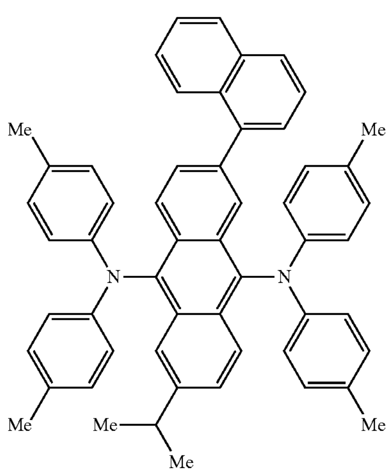
(A)-115
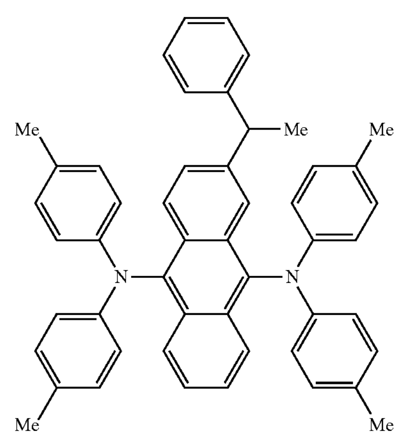

-continued
(A)-116
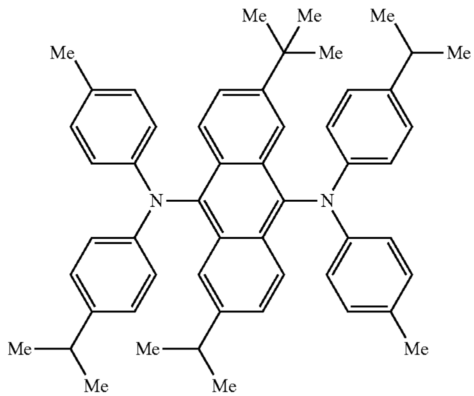
(A)-117
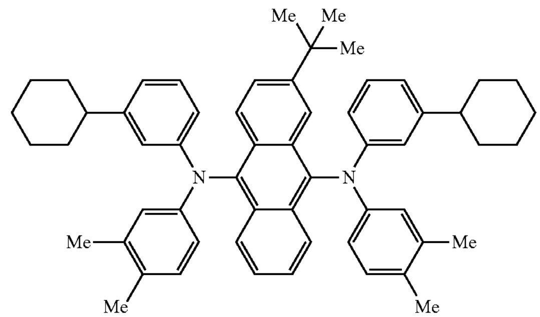
[Chemical Formula 124]
(A)-118
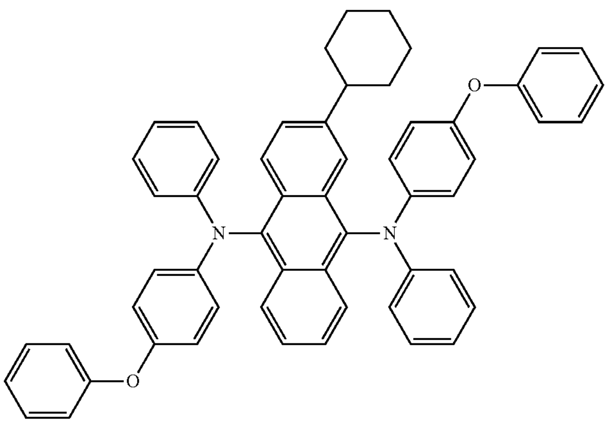
(A)-119
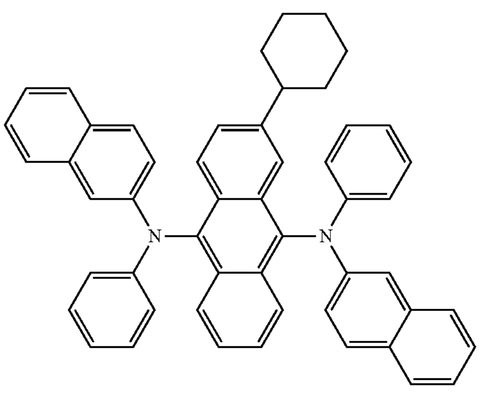
(A)-120
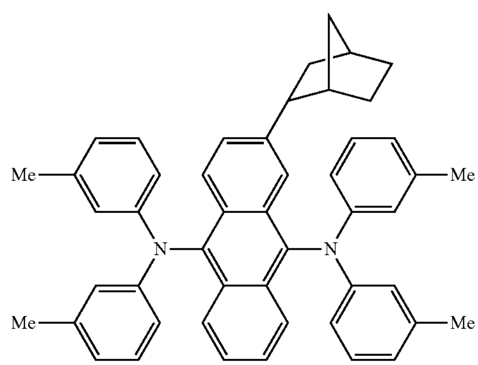

-continued
(A)-121
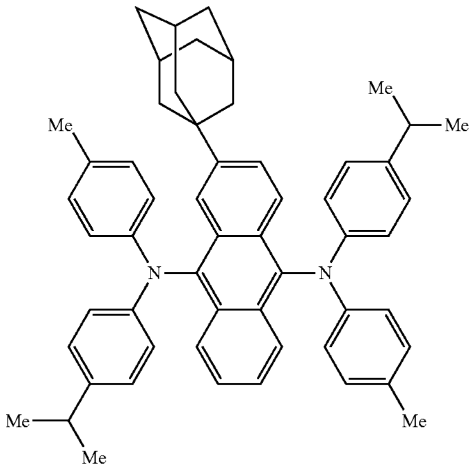
(A)-122
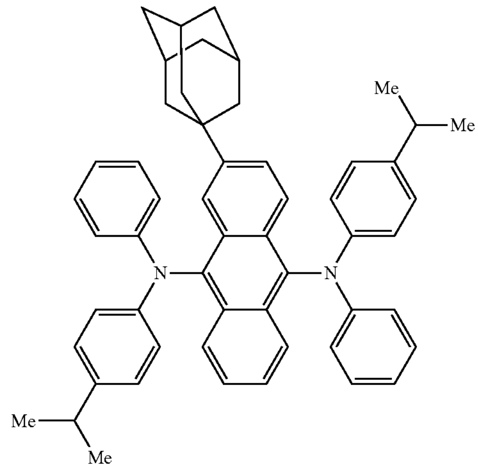
(A)-123
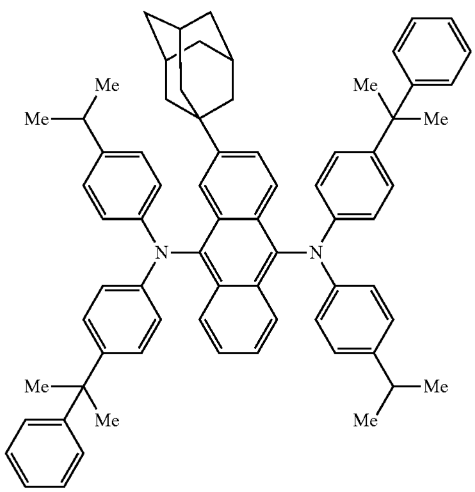
(A)-124
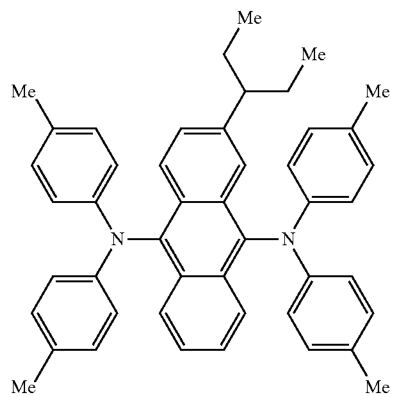
(A)-125
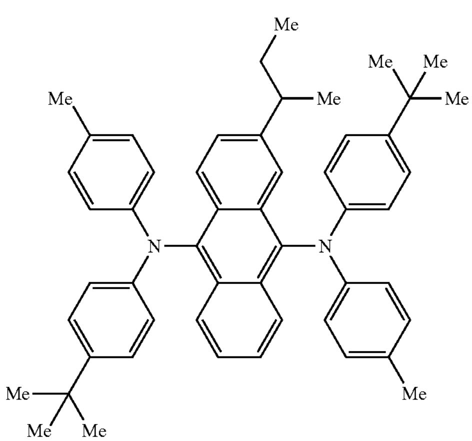
(A)-126
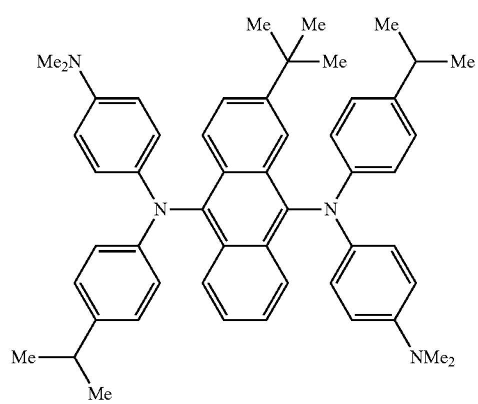

-continued
(A)-127
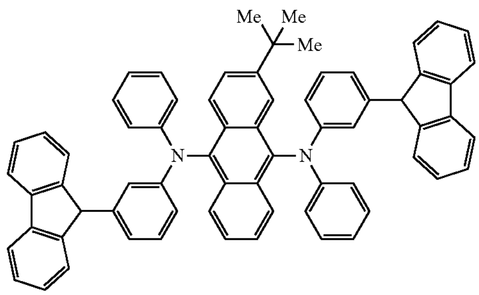
(A)-128
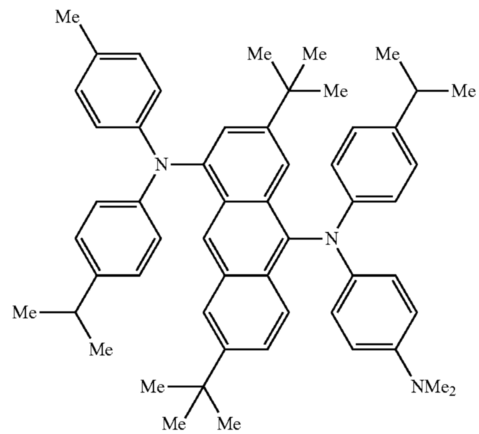
(A)-129
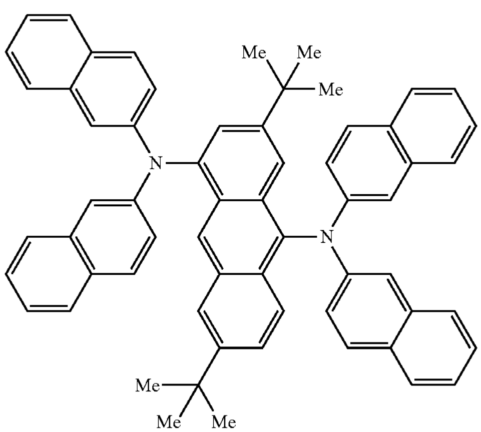
[Chemical Formula 125]
(A)-130
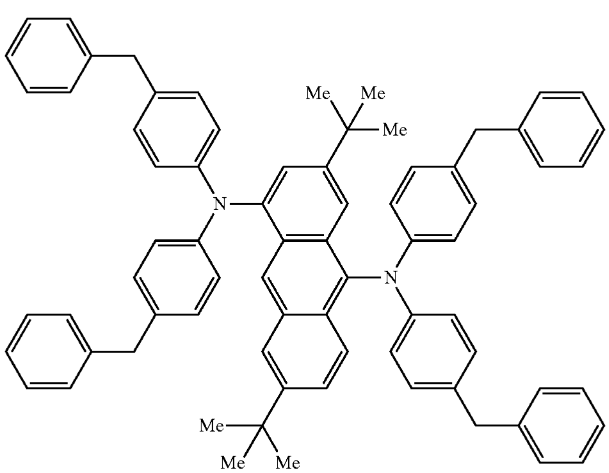

-continued
(A)-131
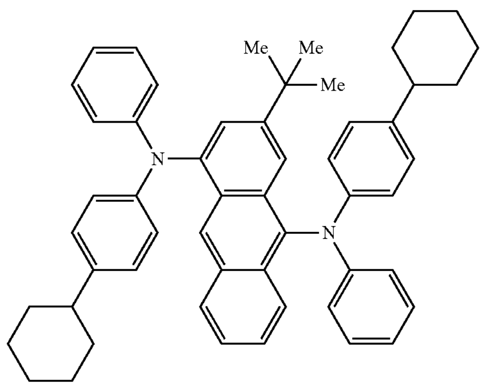
(A)-132
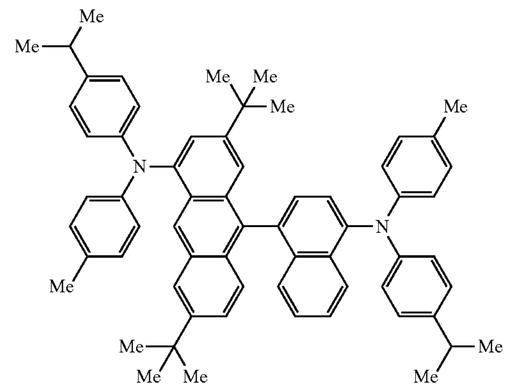
(A)-133
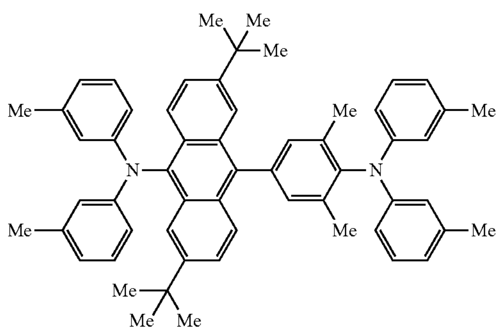
(A)-134
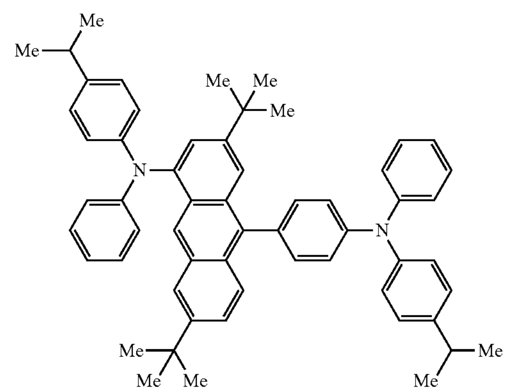
(A)-135
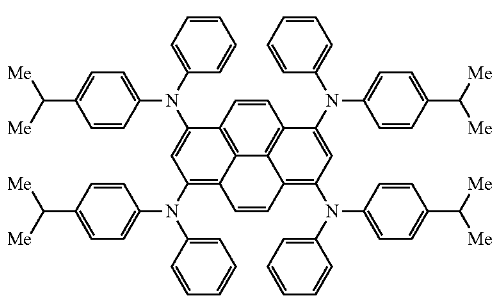
(A)-136
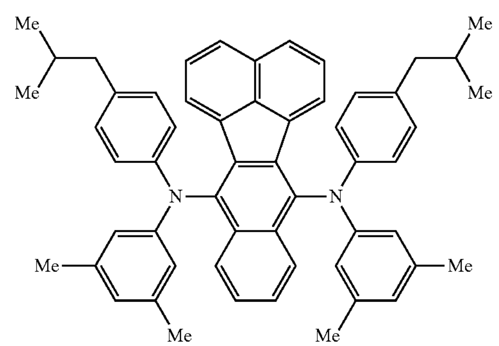
(A)-137
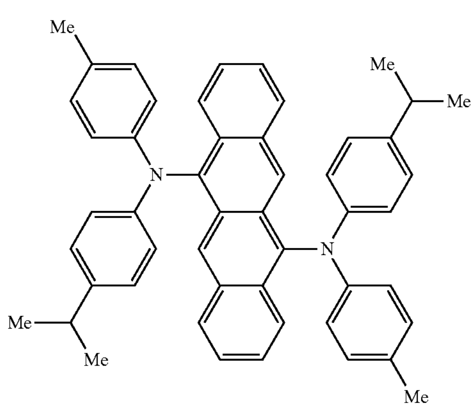
(A)-138
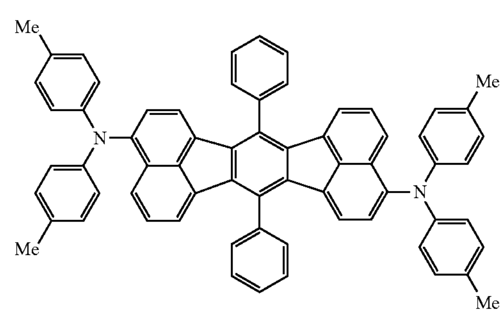

-continued
(A)-139
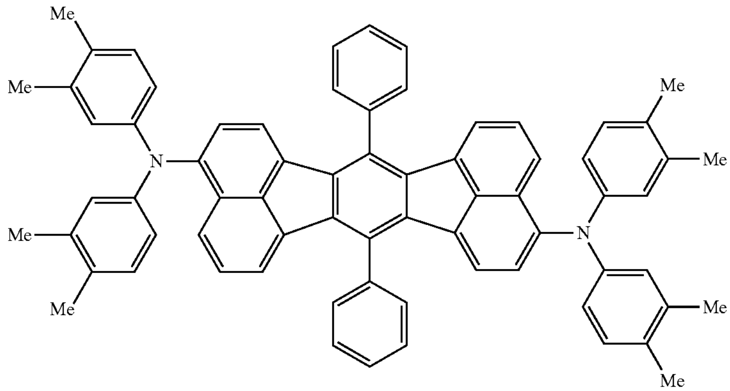
[Chemical Formula 126]
(A)-140
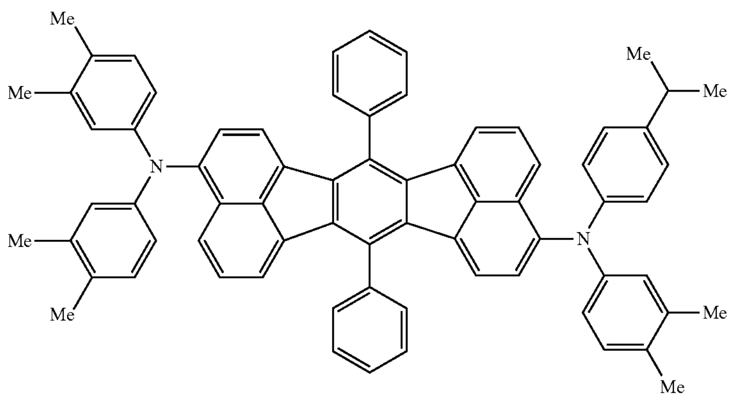
(A)-141
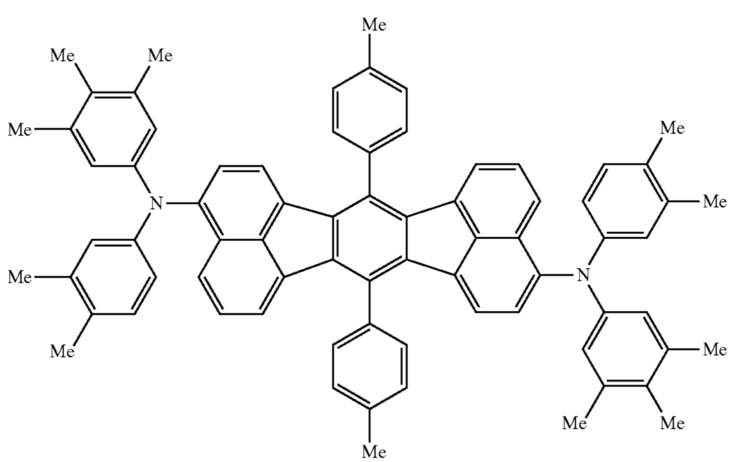

-continued
(A)-142
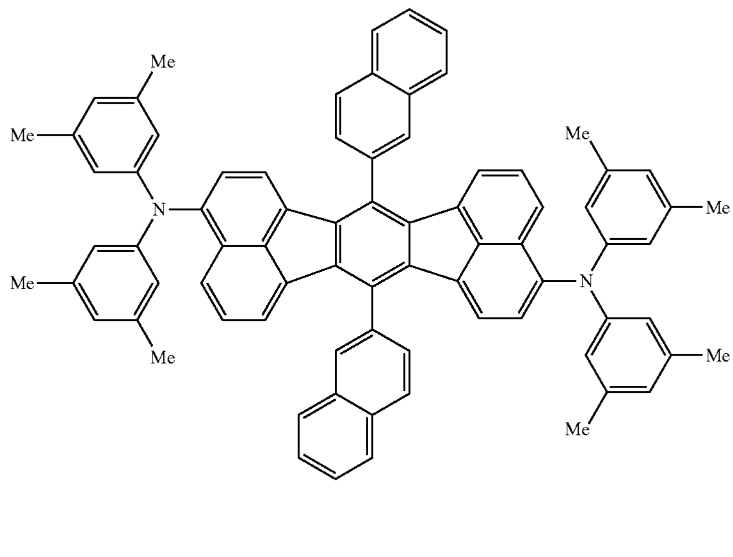
(A)-143
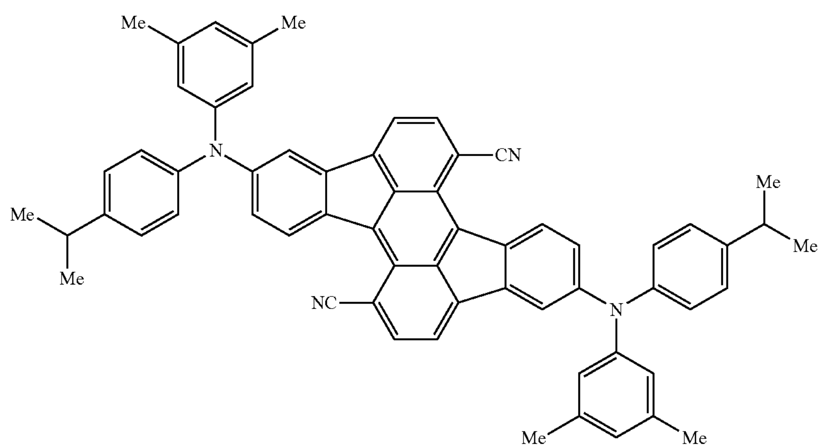
(A)-144
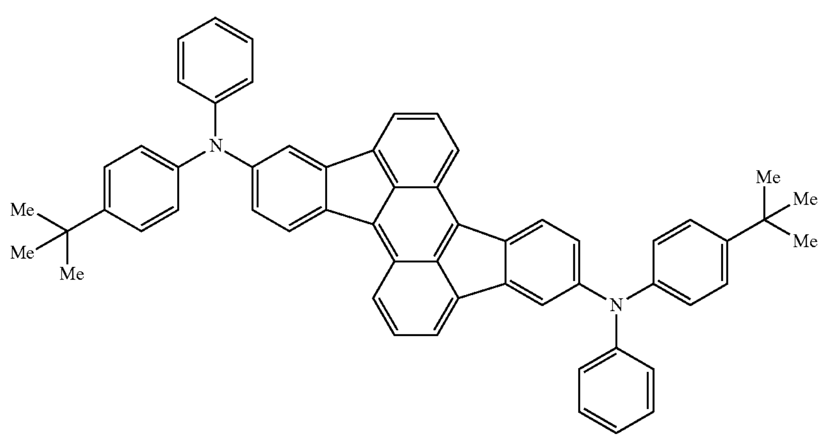

-continued
(A)-145
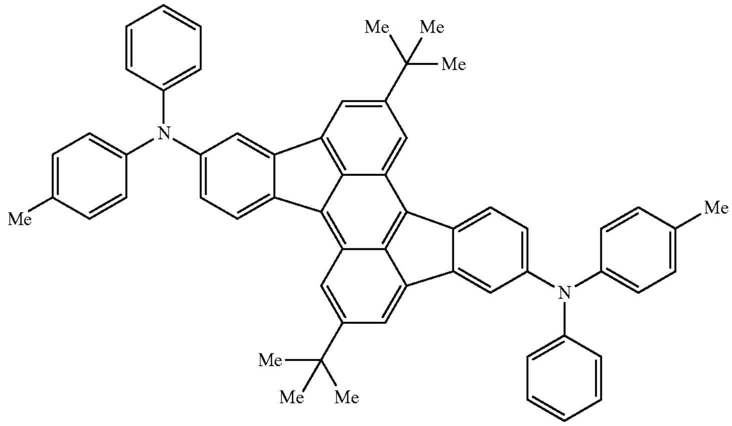
(A)-146
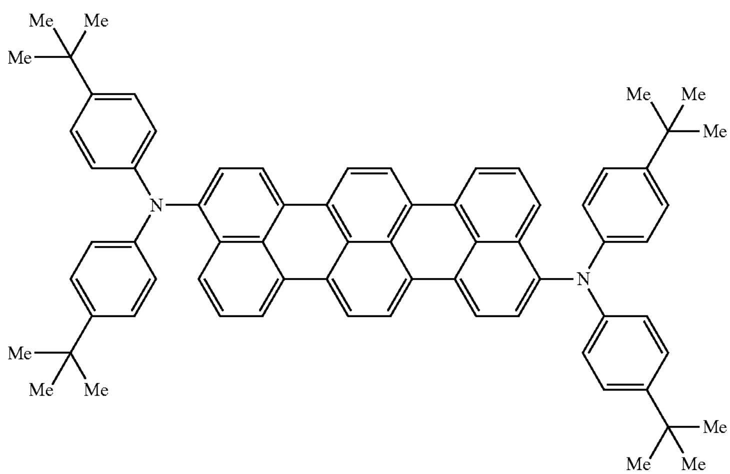
(A)-147
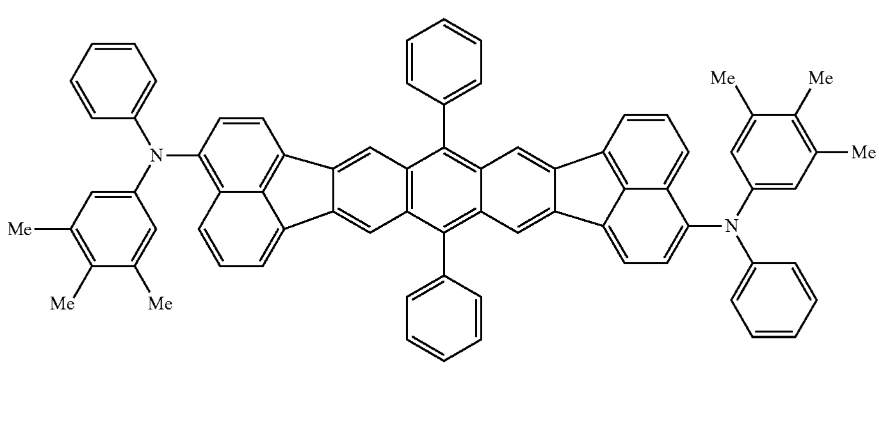

-continued
[Chemical Formula 127]
(A)-148
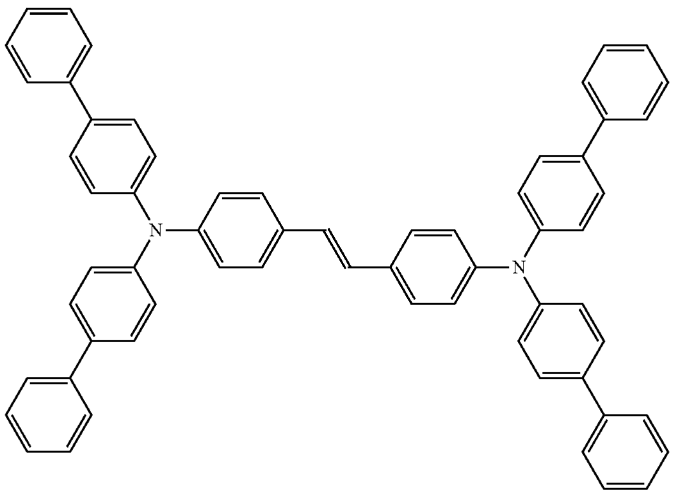
(A)-149
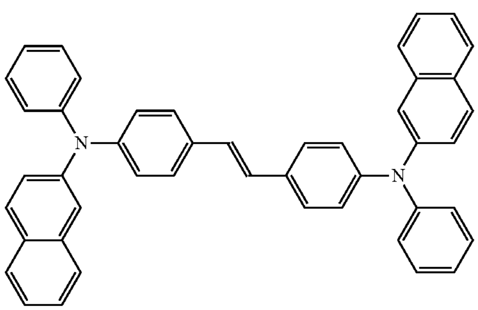
(A)-150
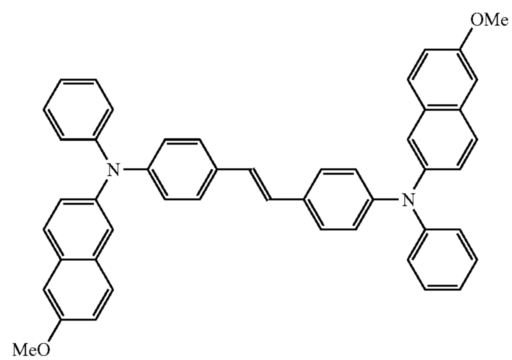
(A)-151
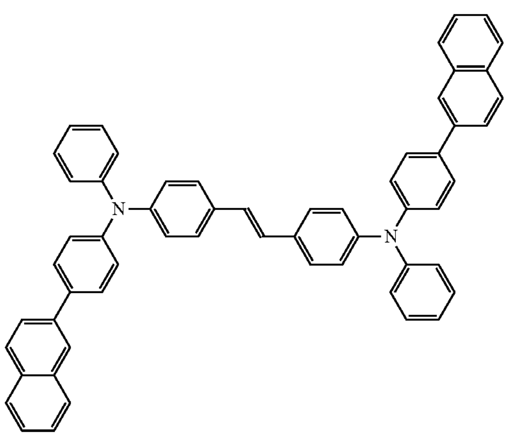
(A)-152
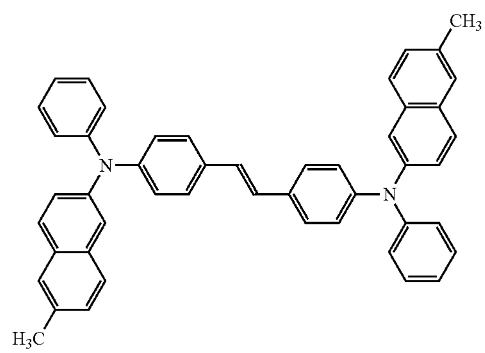
(A)-153
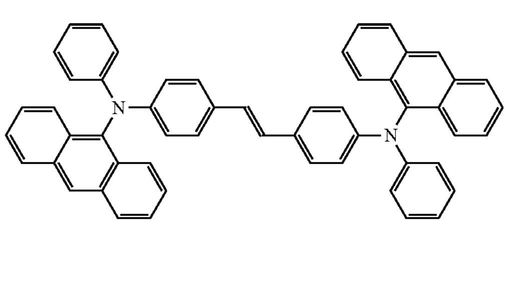
(A)-154
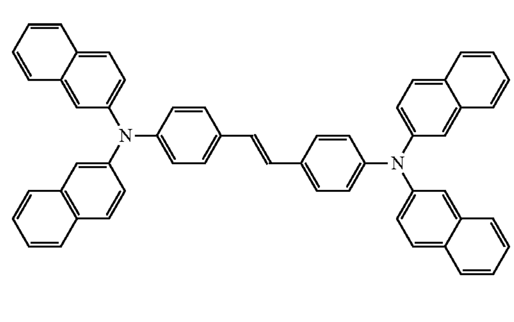

-continued
(A)-155
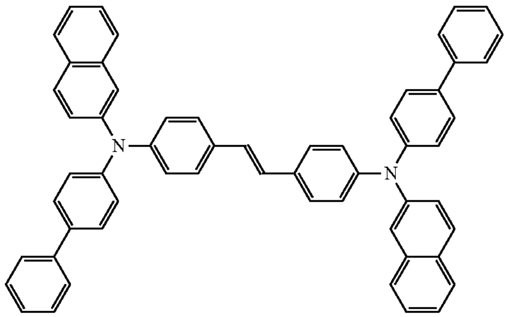
(A)-156
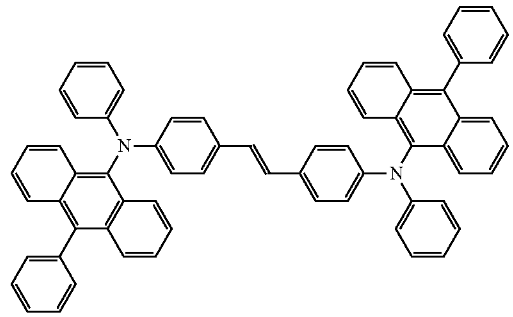
[Chemical Formula 128]
(A)157
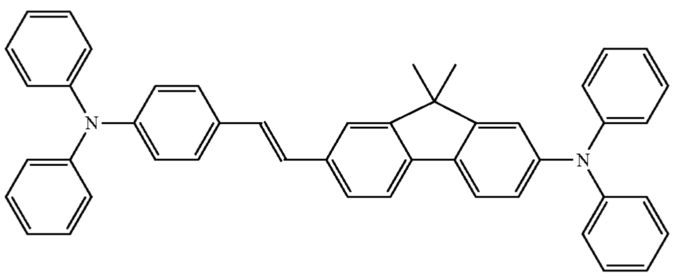
(A)-158
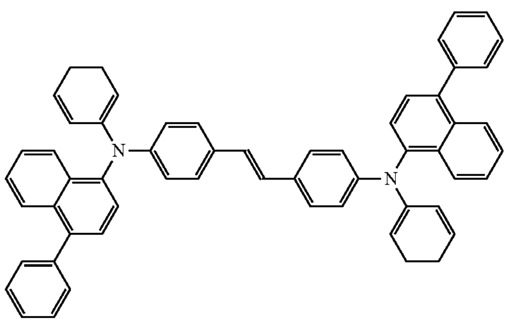
(A)-159
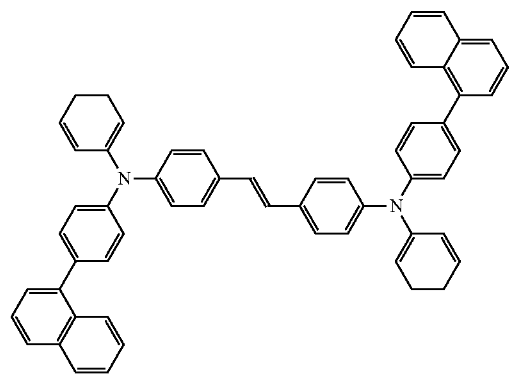
(A)-160
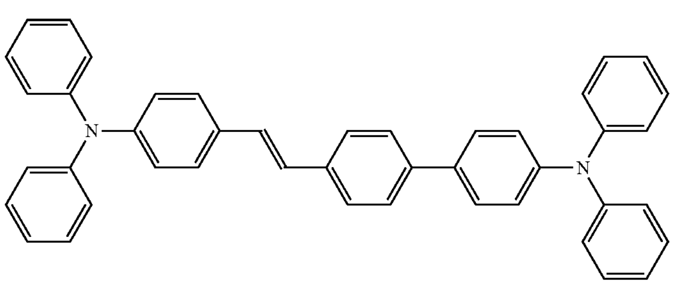
(A)-161
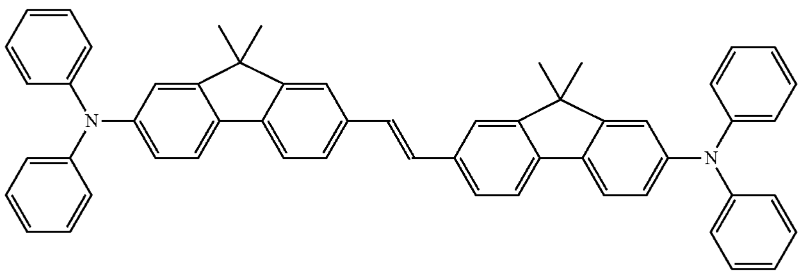

-continued
(A)-162
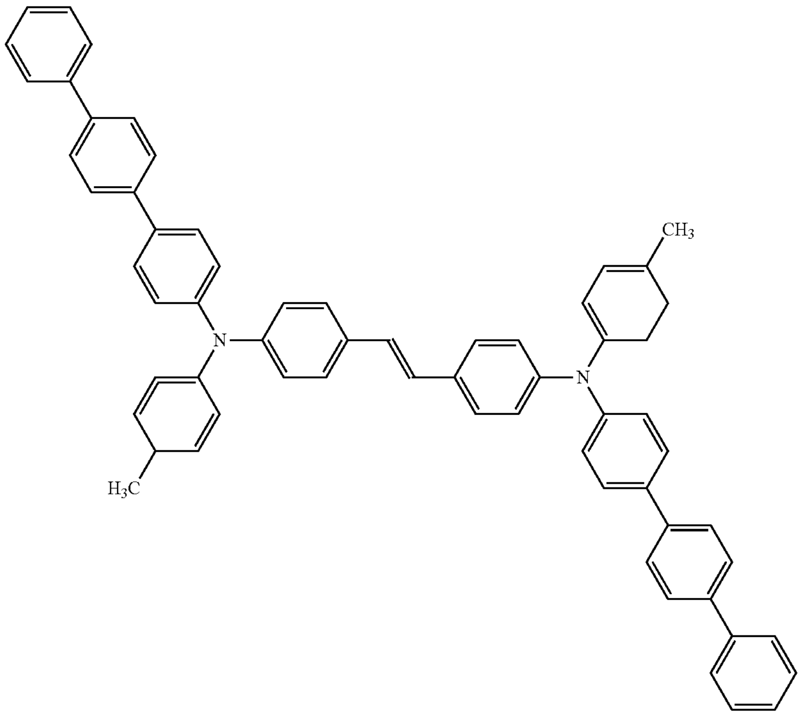
(A)-165
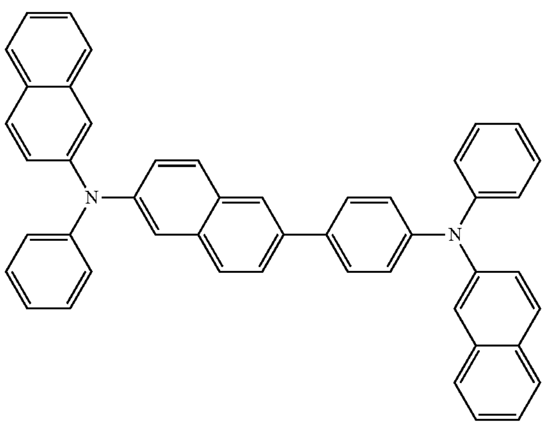
[Chemical Formula 129]
(A)-166
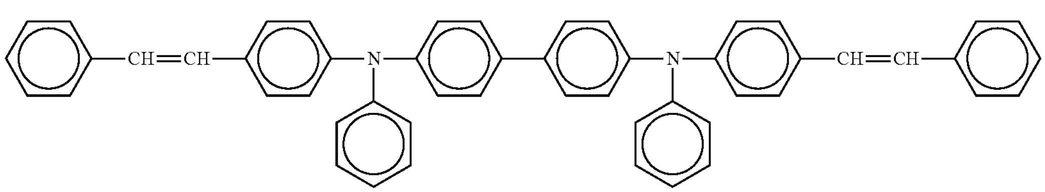
EM32
(A)-167
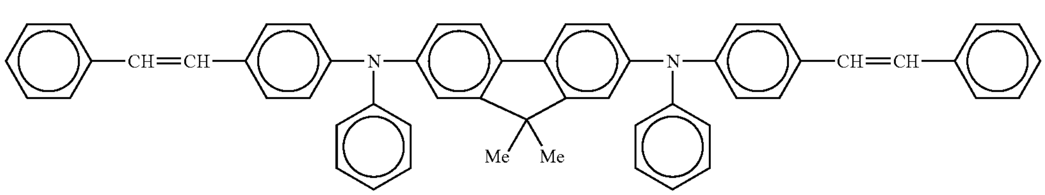
EM33

-continued
(A)-168
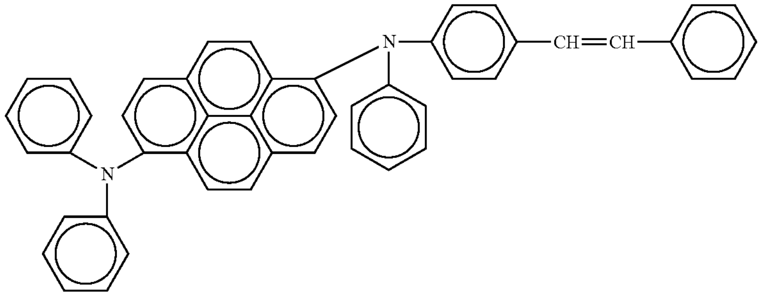
EM34
(A)-169
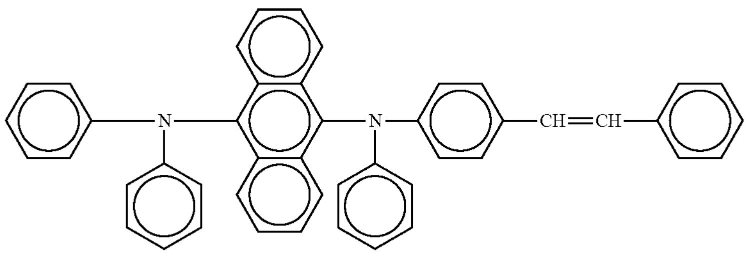
EM35
(A)-170
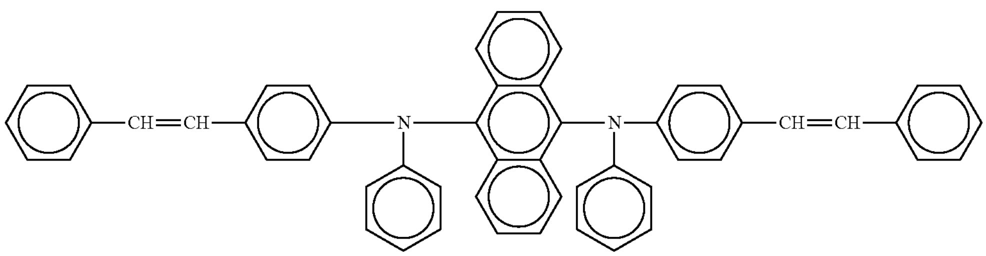
EM36
[Chemical Formula 130]
(A)-171
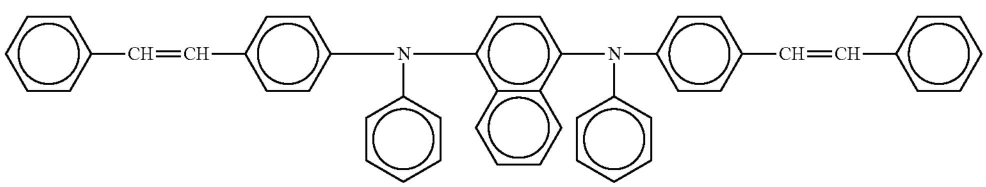
EM41
(A)-172
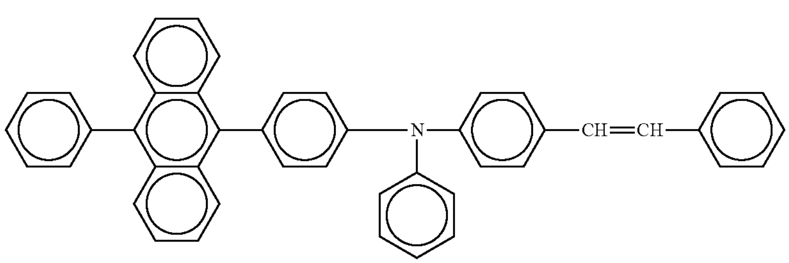
EM42

-continued
(A)-173
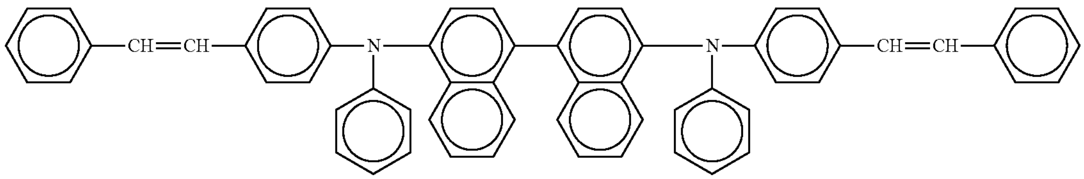
EM43
(A)-174
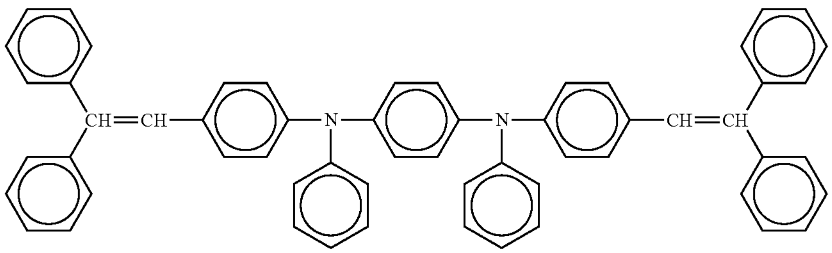
EM44
(A)175
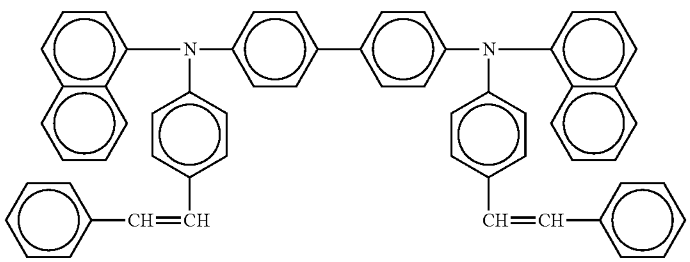
EM45
[Chemical Formula 131]
(A)-176
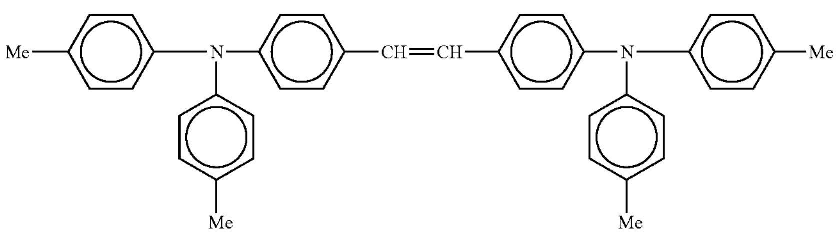
EM46
(A)-177
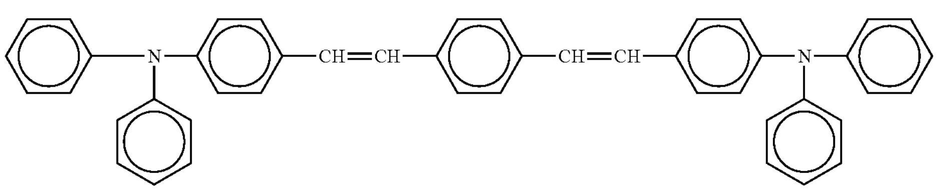
EM47
(A)-178
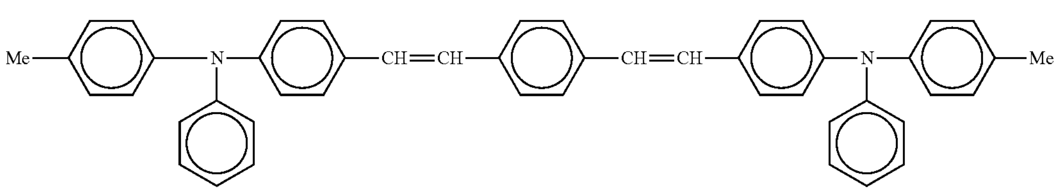
EM48

-continued
(A)-179
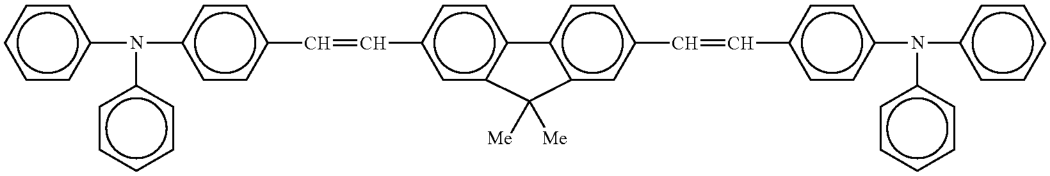
EM49
(A)-180
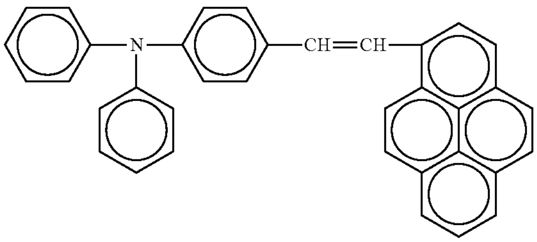
EM50
[Chemical Formula 132]
(A)-181
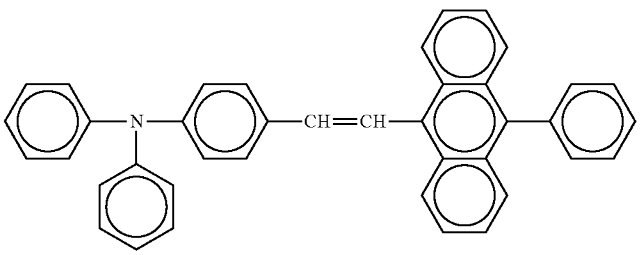
EM51
(A)-182
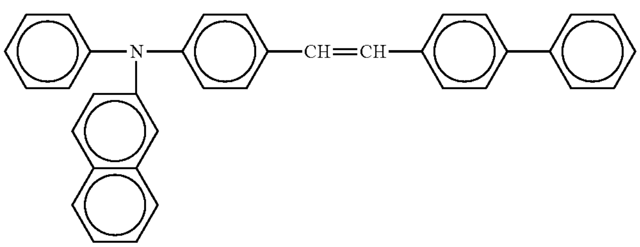
EM52
(A)-183
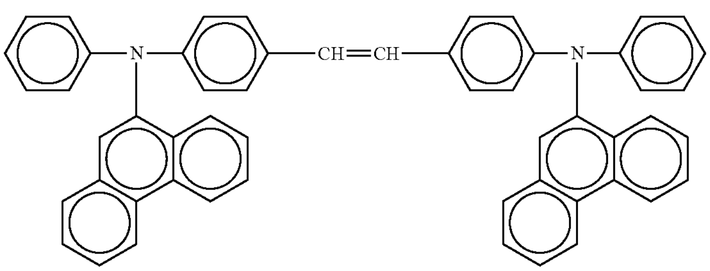
EM53

-continued
(A)-184
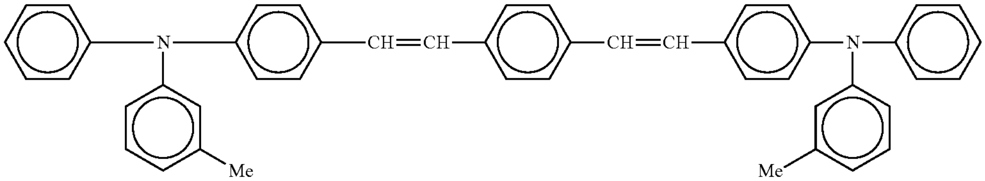
EM54
(A)-185
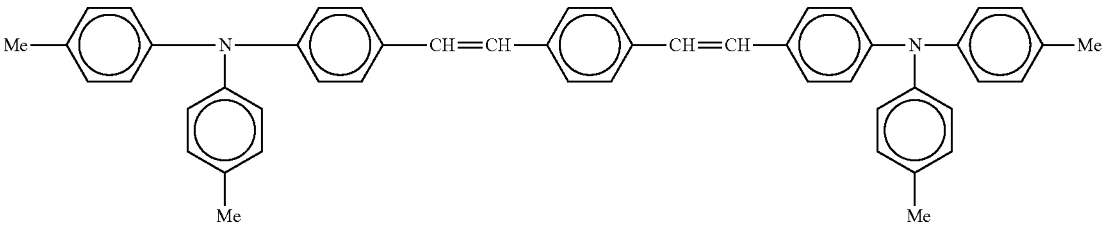
EM55
[Chemical Formula 133]
(A)-186
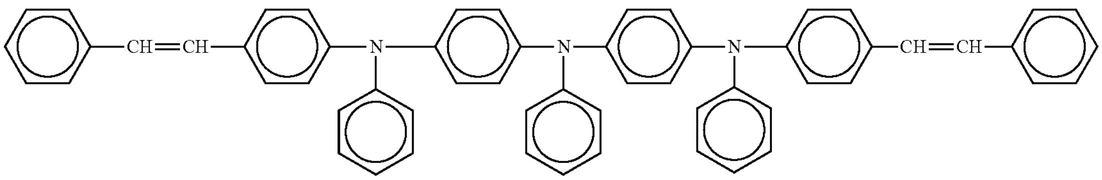
EM56
(A)-187
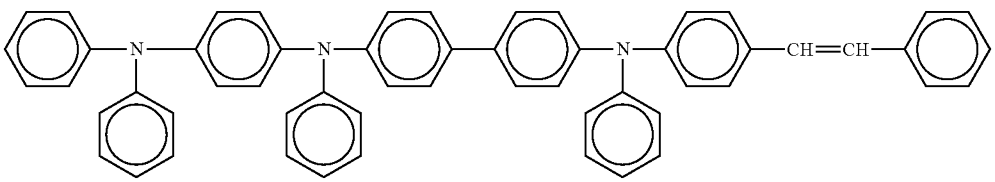
EM57
(A)-188
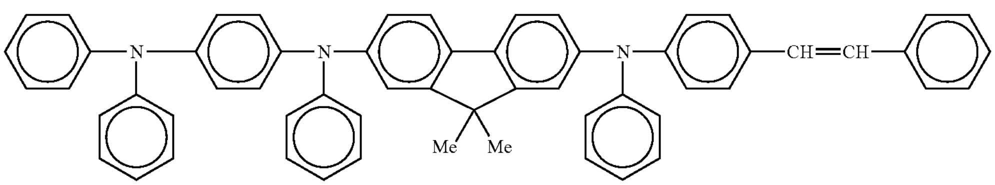
EM58
(A)-189
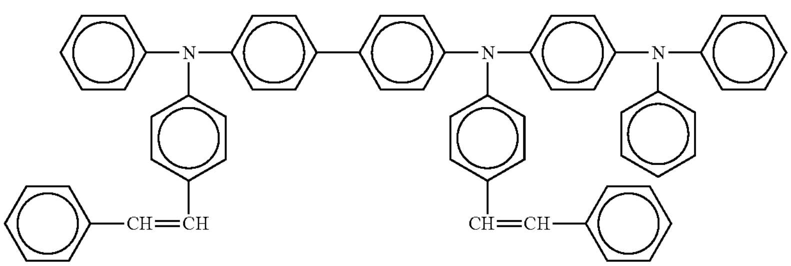
EM59

-continued
(A)-190
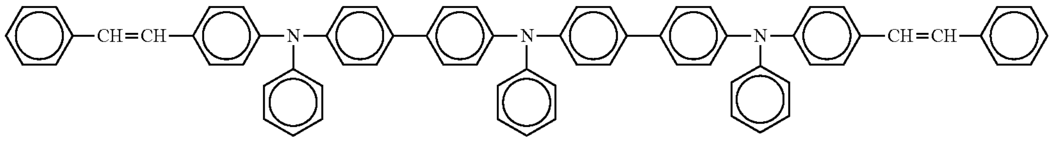
EM60
(A)-191
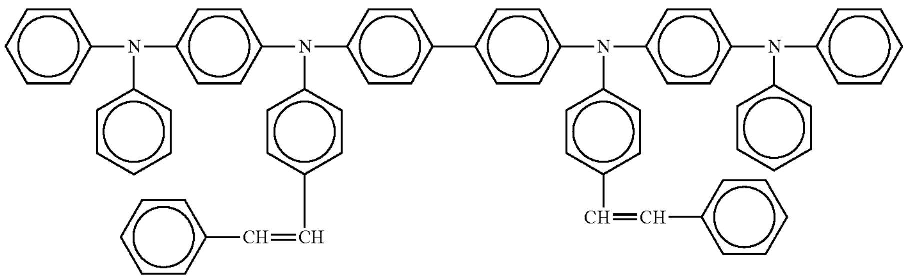
EM61
(A)-192
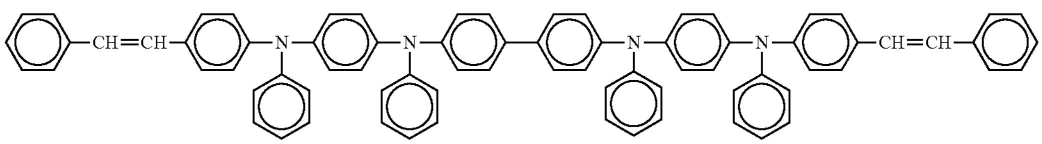
EM62
[Chemical Formula 134]
(A)-193
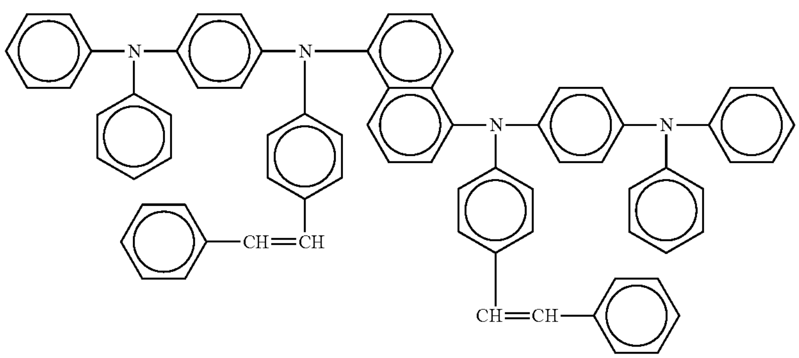
EM63
(A)-194
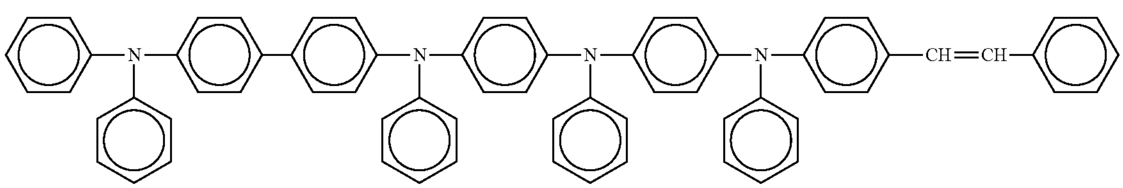
EM64
(A)-195
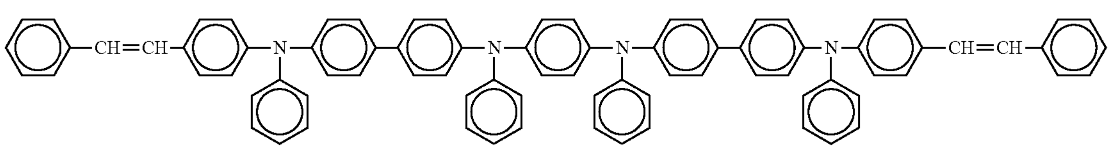
EM65

-continued
[Chemical Formula 135]
(A)-196
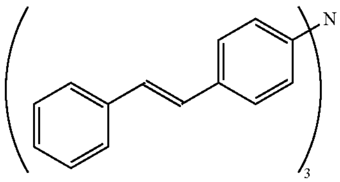
(A)-197
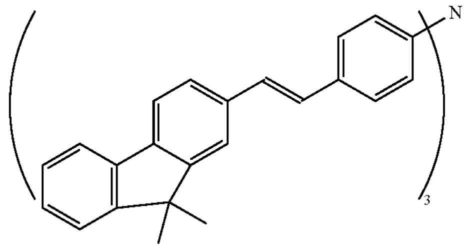
(A)-198
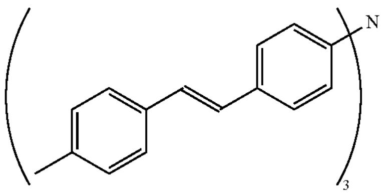
(A)-199
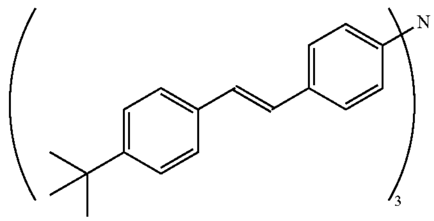
(A)-201
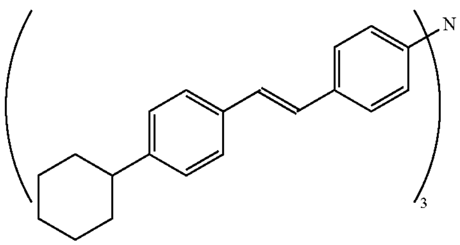
(A)-202
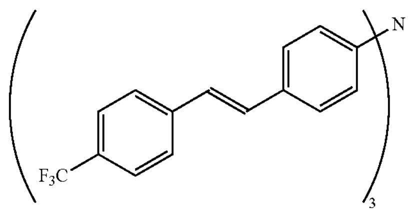
(A)-203
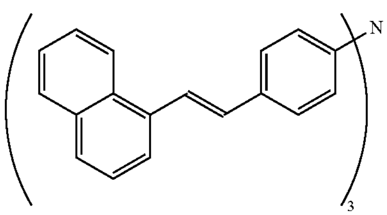
(A)-204
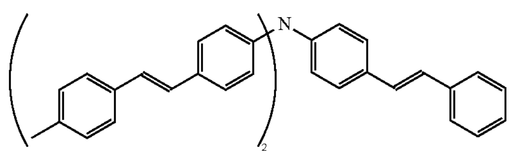
Compounds containing a carbazole group such as those shown below may be used.
[Chemical Formula 136]
(A)-163
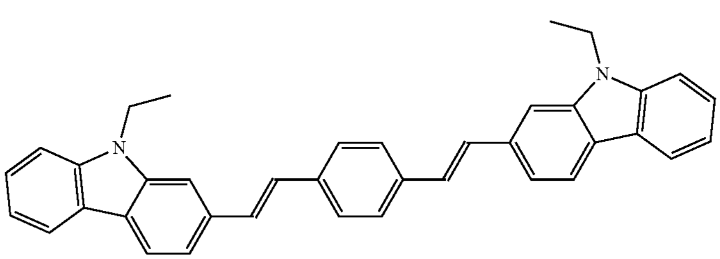

-continued (A)-164

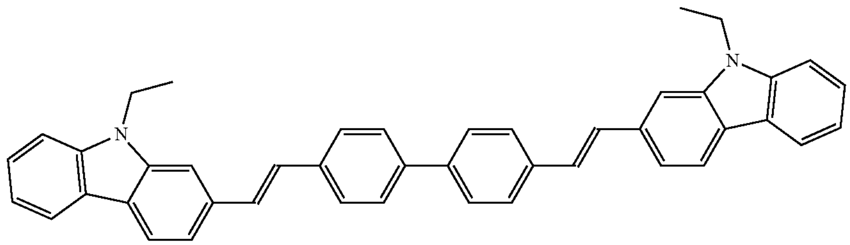

Preferably in the aspect of the invention, the fluorescent dopant is a fluoranthene derivative represented by any one of the following formulae (21) to (24).

[Chemical Formula 137]

(21)

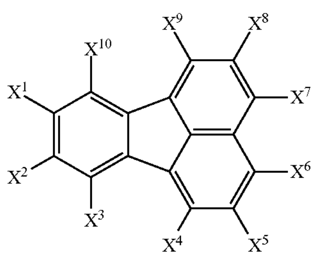

(22)

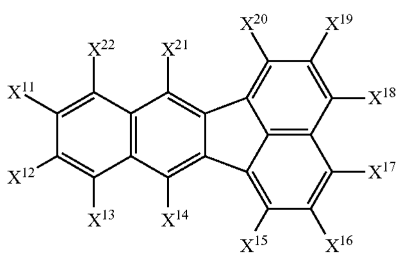

(23)

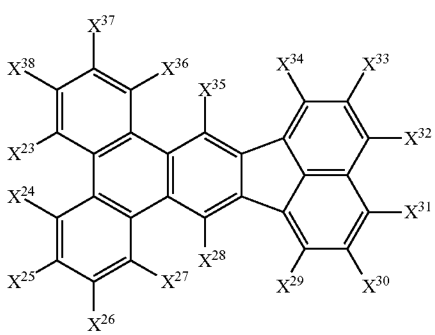

(24)

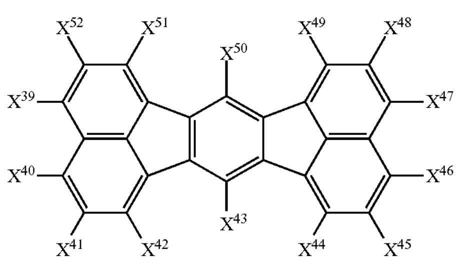

In the formulae (21) to (24): $X^1$ to $X^{52}$ each independently represent a hydrogen atom, halogen atom, substituted or unsubstituted liner, branched or cyclic alkyl group having 1 to 30 carbon atoms, substituted or unsubstituted liner, branched or cyclic alkoxy group having 1 to 30 carbon atoms, substituted or unsubstituted liner, branched or cyclic alkylthio group having 1 to 30 carbon atoms, substituted or unsubstituted liner, branched or cyclic alkenyl group having 2 to 30 carbon atoms, substituted or unsubstituted liner, branched or cyclic alkenyloxy group having 2 to 30 carbon atoms, substituted or unsubstituted liner, branched or cyclic alkenylthio group having 2 to 30 carbon atoms, substituted or unsubstituted aralkyl group having 7 to 30 carbon atoms, substituted or unsubstituted aralkyloxy group having 7 to 30 carbon atoms, substituted or unsubstituted aralkylthio group having 7 to 30 carbon atoms, substituted or unsubstituted aryl group having 6 to 20 carbon atoms, substituted or unsubstituted aryloxy group having 6 to 20 carbon atoms, substituted or unsubstituted arylthio having 6 to 20 carbon atoms, substituted or unsubstituted amino group having 2 to 30 carbon atoms, cyano group, silyl group, hydroxyl group, —$COOR^1$ group wherein $R^1$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms or substituted or unsubstituted aryl group having 6 to 30 carbon atoms, —$COR^2$ group wherein $R^2$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, substituted or unsubstituted aryl group having 6 to 30 carbon atoms or amino group, or —$OCOR^3$ group wherein $R^3$ represents a substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, or substituted or unsubstituted aryl group having 6 to 30 carbon atoms; an adjacent set of groups of $X^1$ to $X^{52}$ and an adjacent set of substituents of $X^1$ to $X^{52}$ may be bonded together to form a substituted or unsubstituted carbocycle.

Examples of the fluoranthene derivative are those represented by the following formulae.
[Chemical Formula 138]
1-1
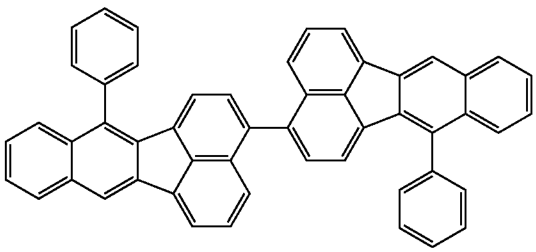
1-2
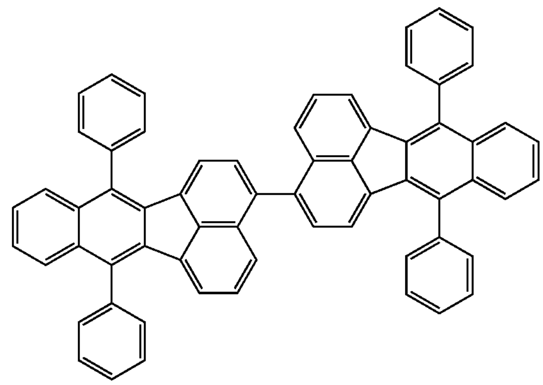
1-3
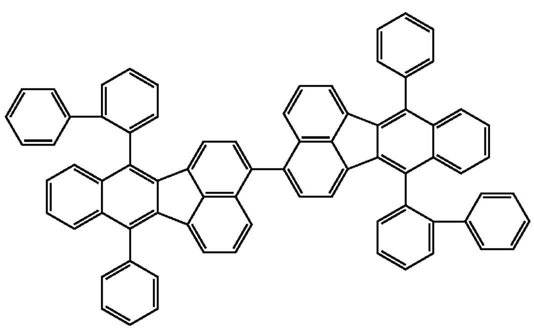
1-4
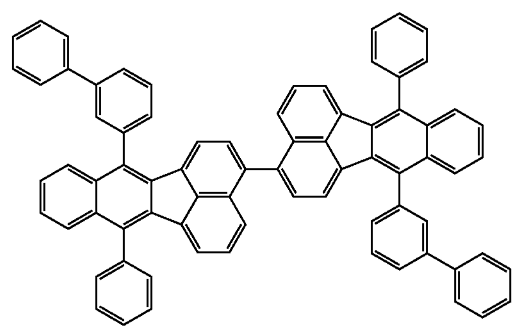
1-5
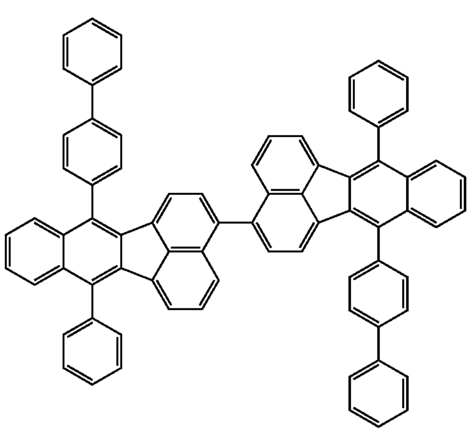
1-6
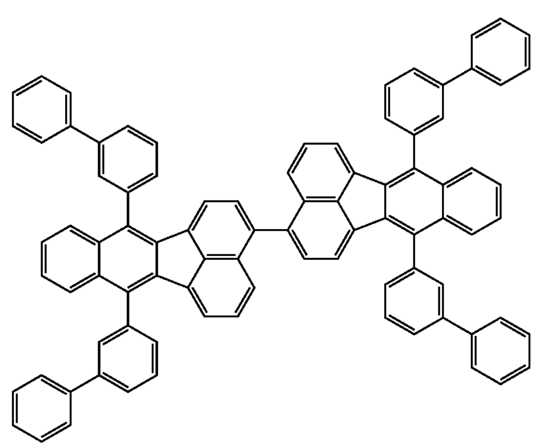

-continued
1-7
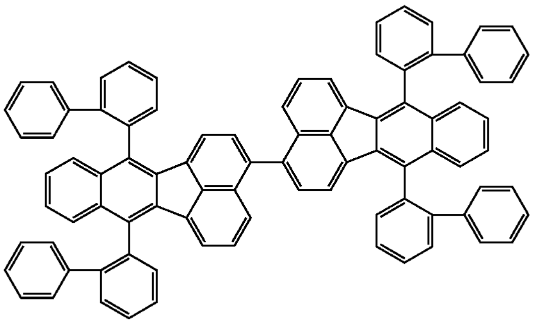
1-8
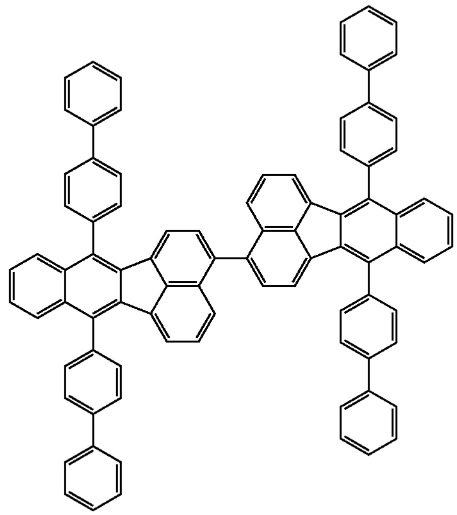
1-9
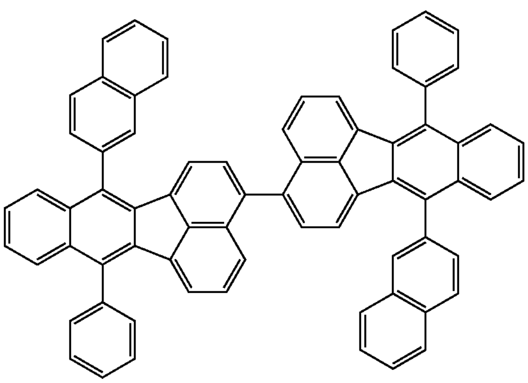
[Chemical Formula 139]
1-10
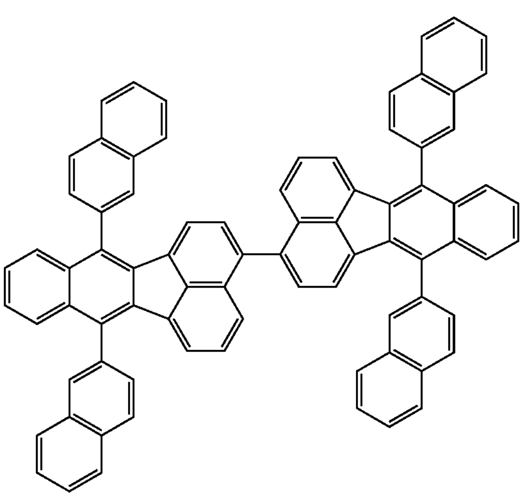
1-11
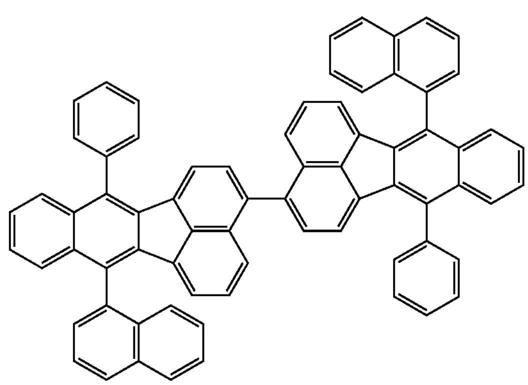

-continued
1-12
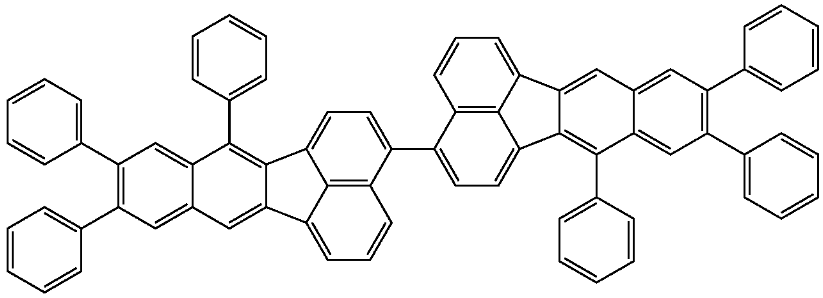
1-13
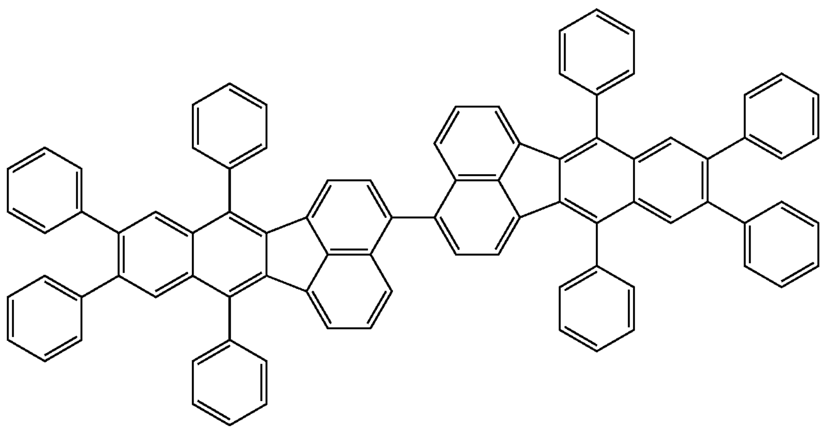
1-14
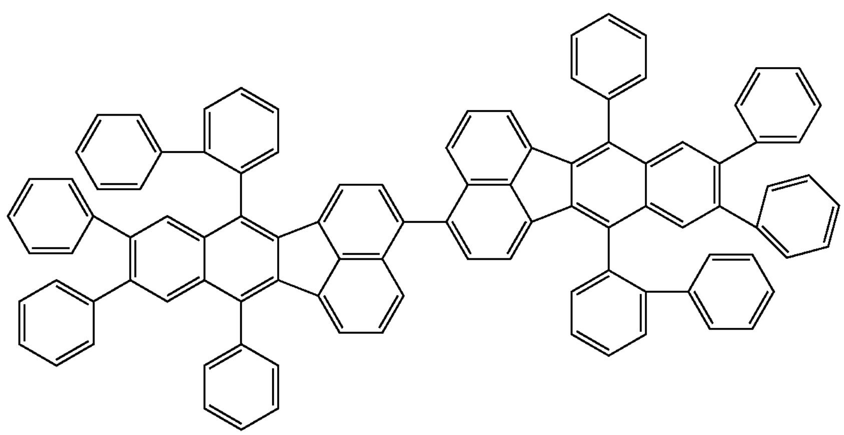
1-15
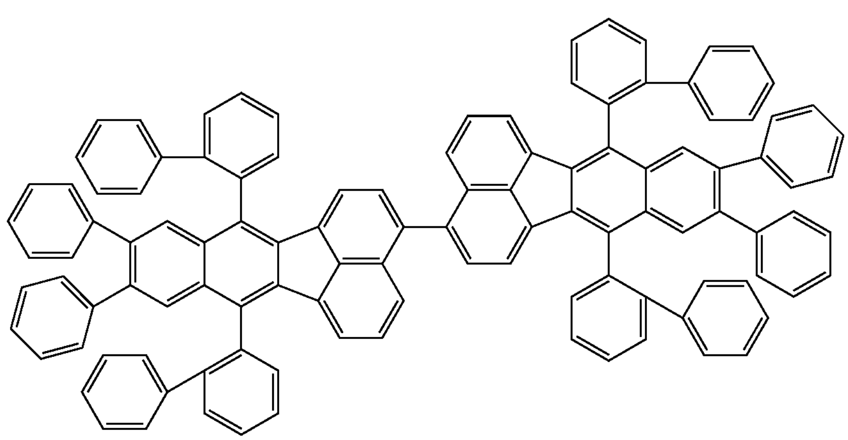

-continued
1-16
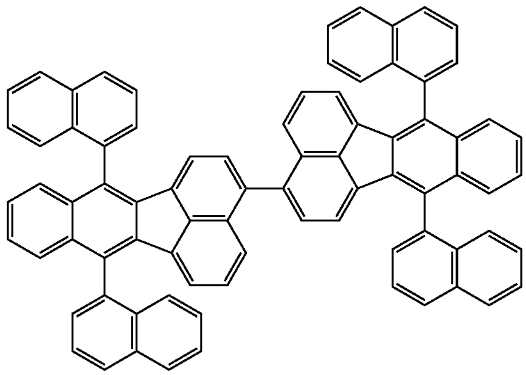
1-17
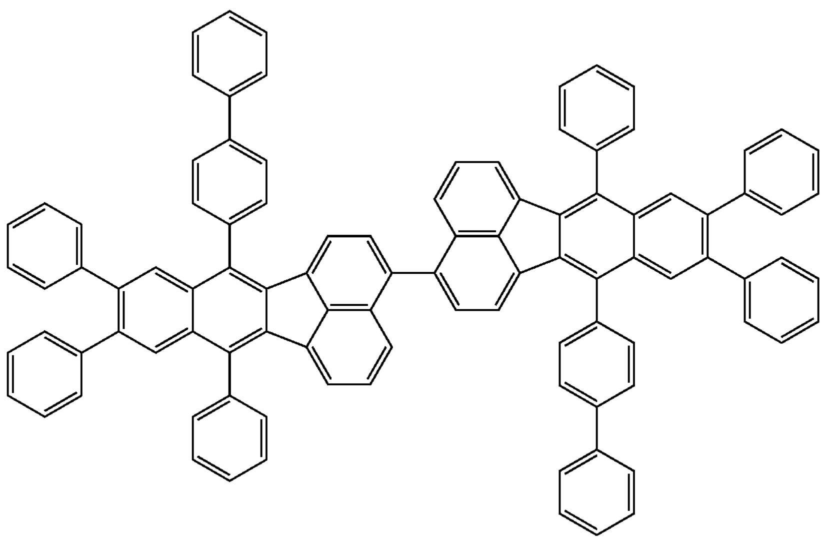
1-18
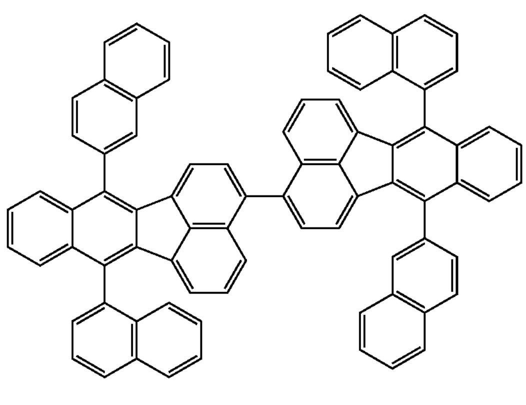

-continued
[Chemical Formula 140]
1-19
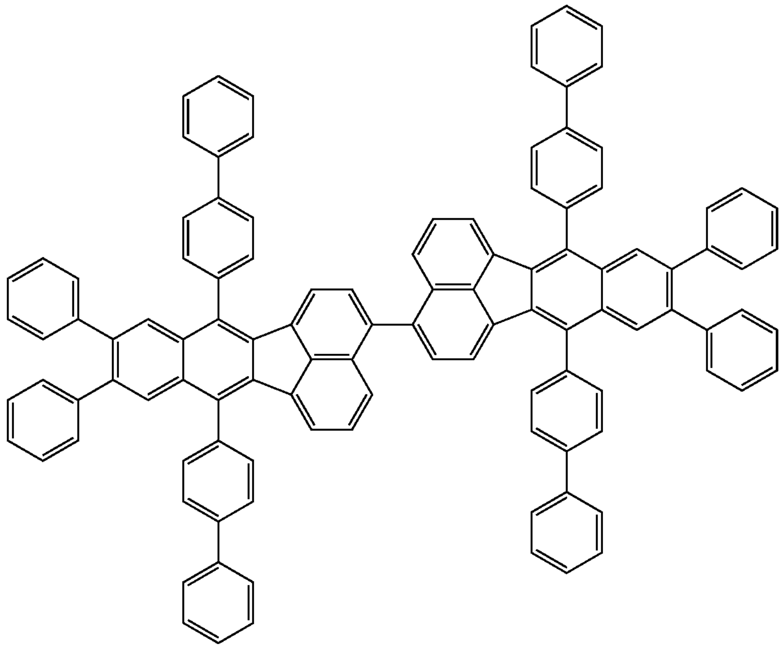
1-20
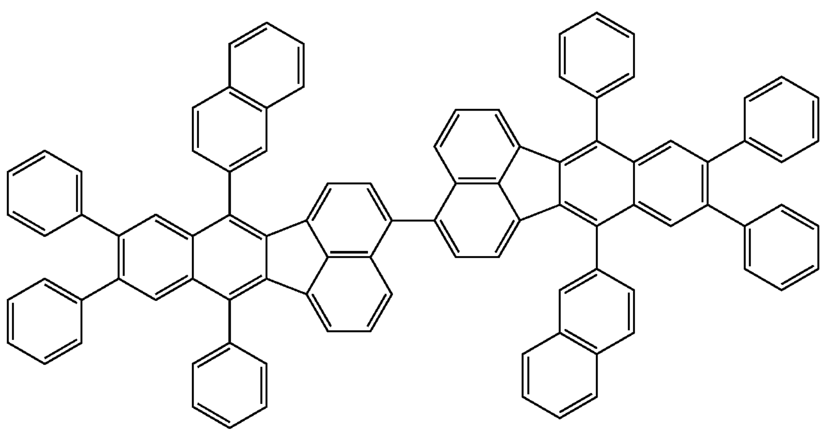
1-21
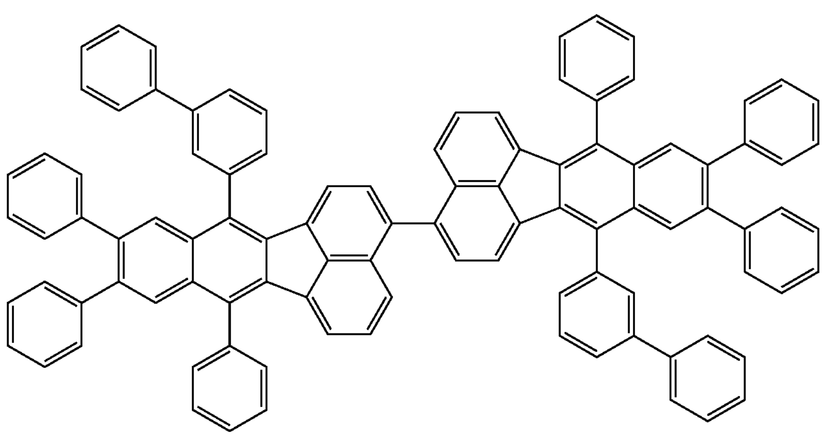

-continued
1-22
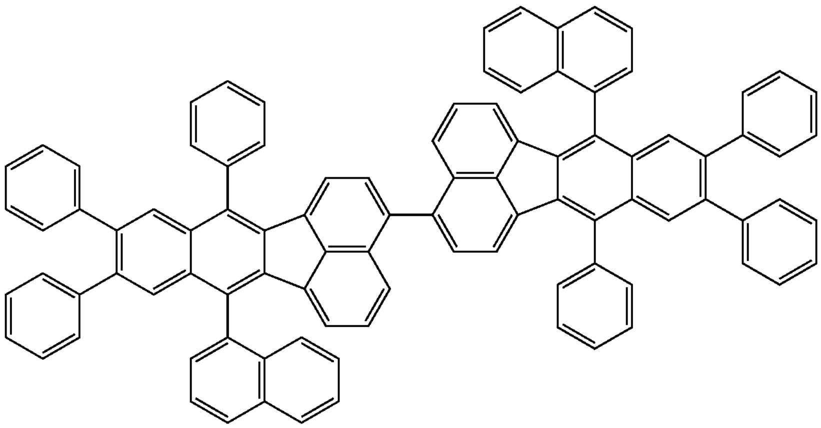
1-23
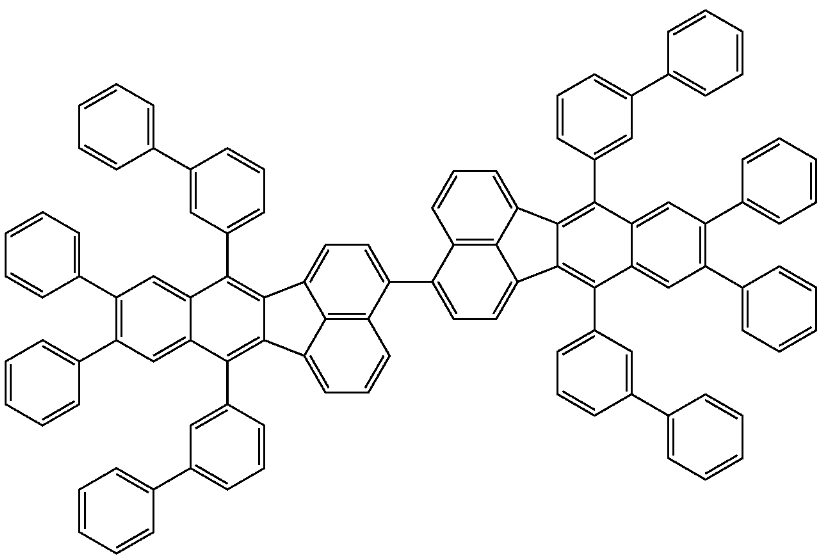
1-24
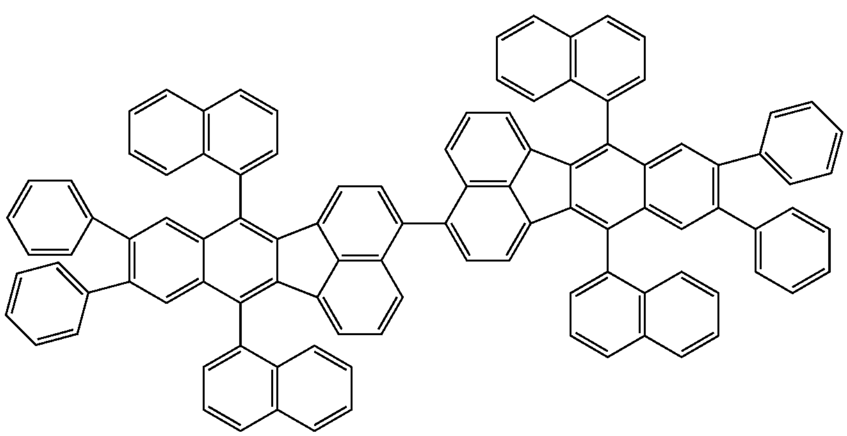

-continued
1-25
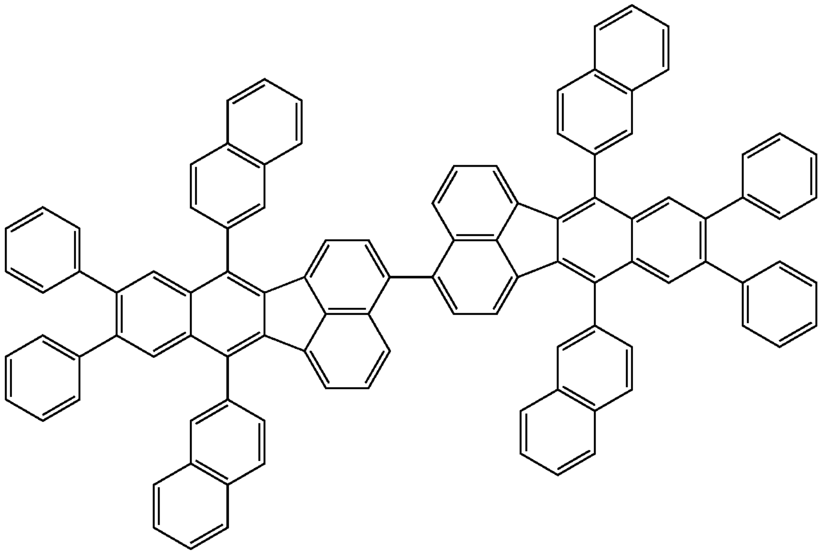
1-26
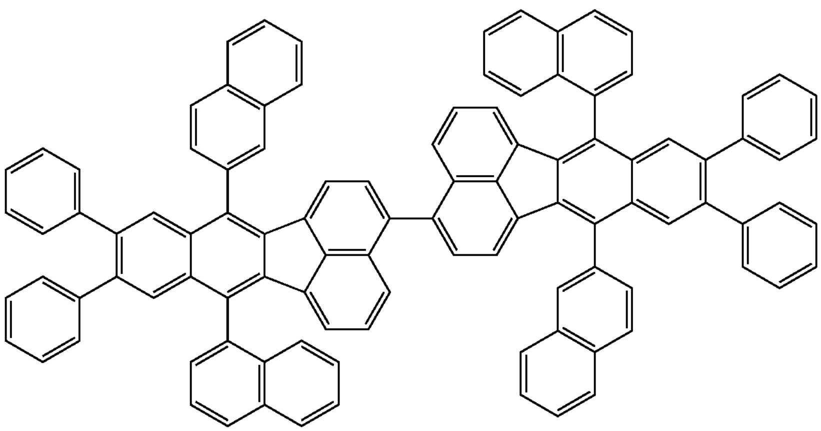
[Chemical Formula 141]
1-27
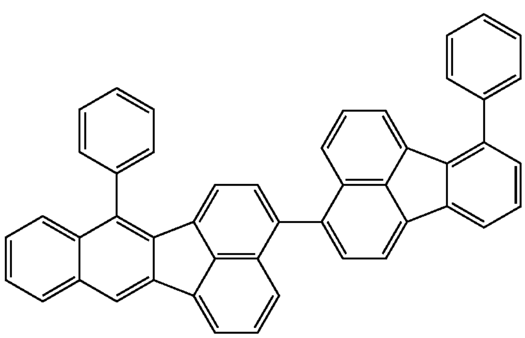
1-28
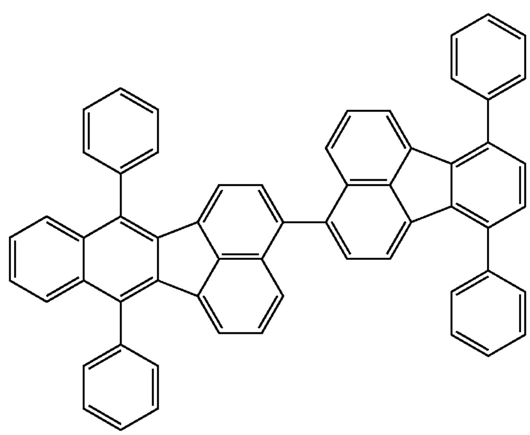

-continued
1-29
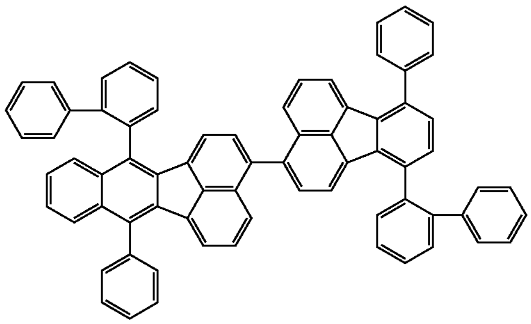
1-30
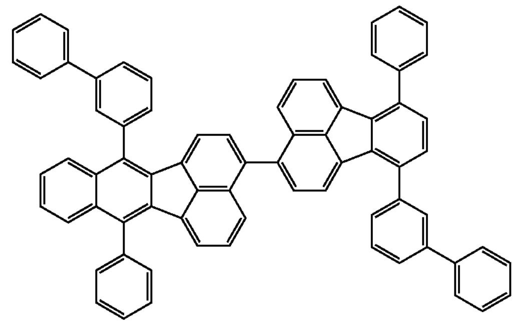
1-31
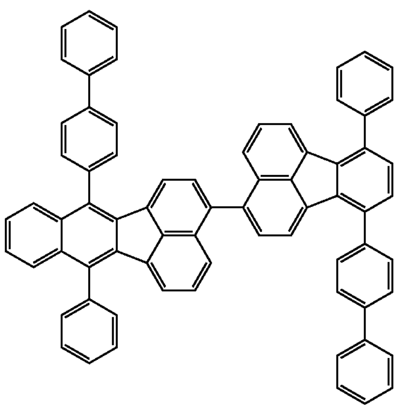
1-32
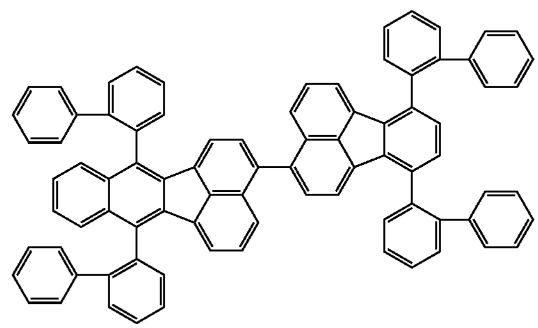
1-33
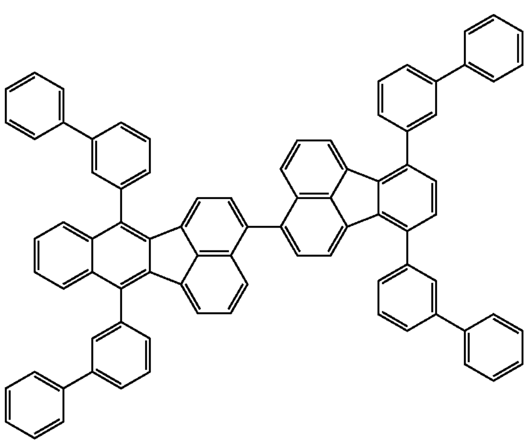
1-34
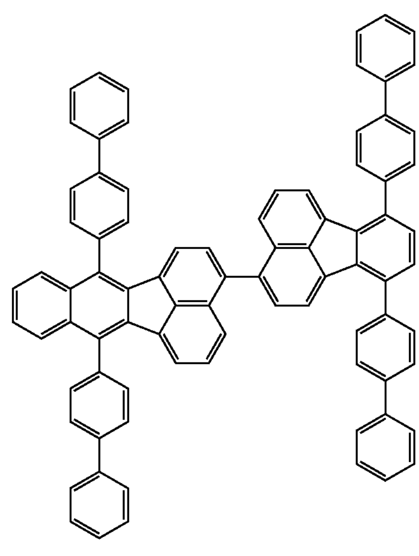

-continued
1-35
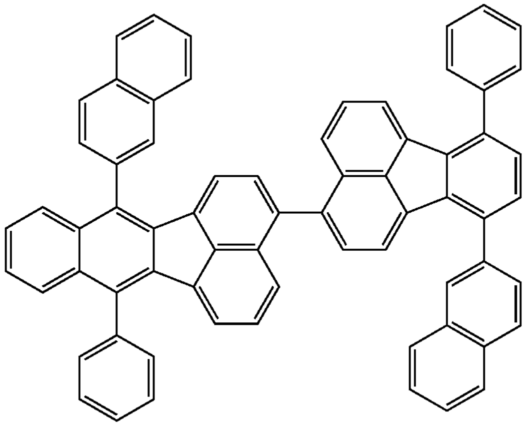
[Chemical Formula 142]
1-36
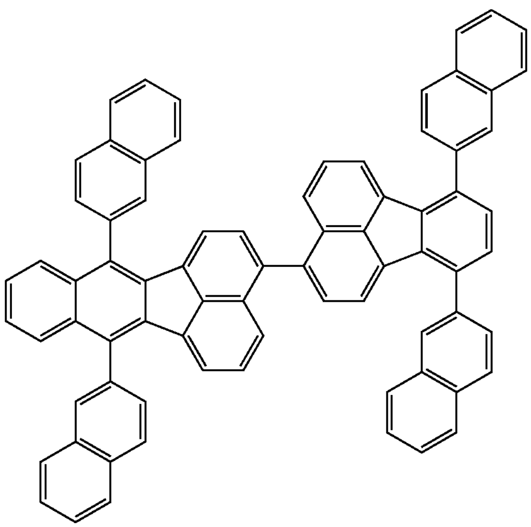
1-37
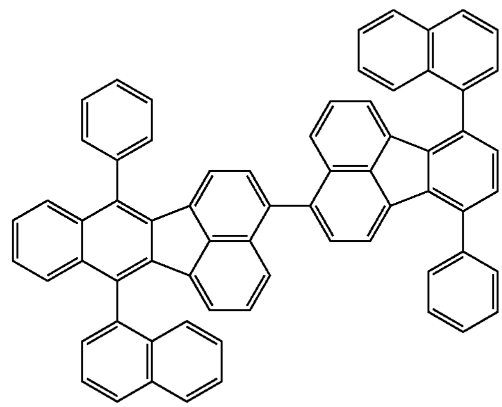
1-38
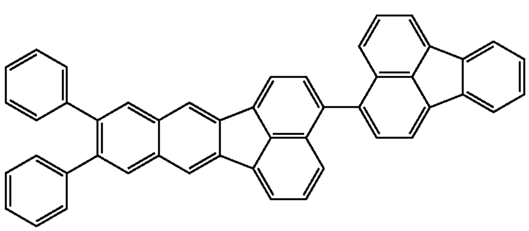
1-39
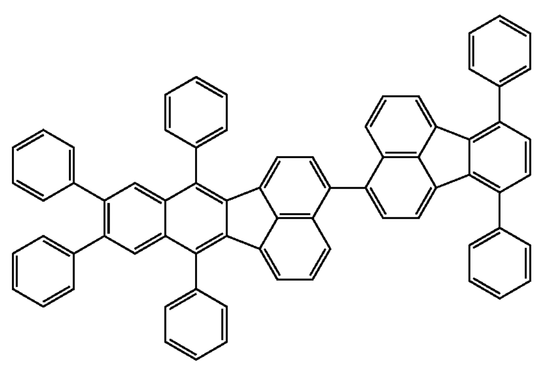

-continued
1-40
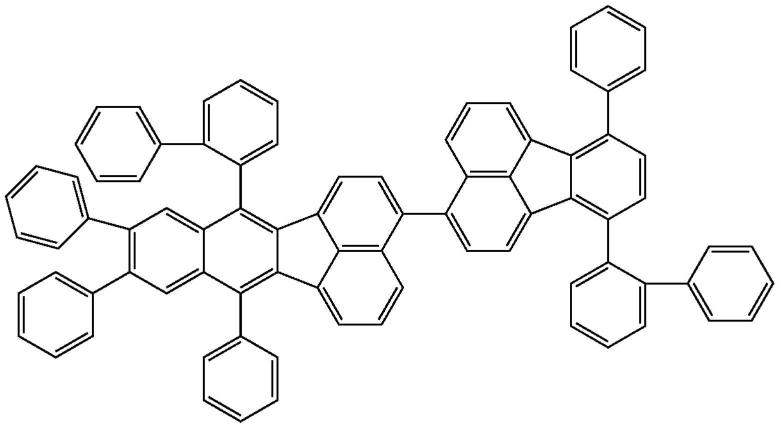
1-41
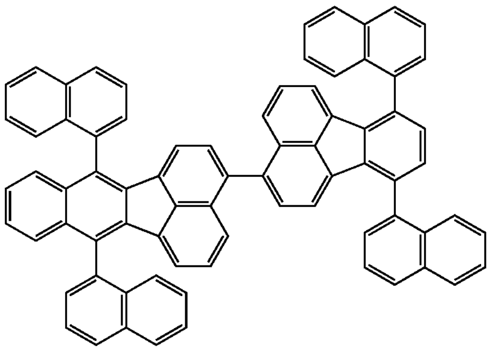
1-42
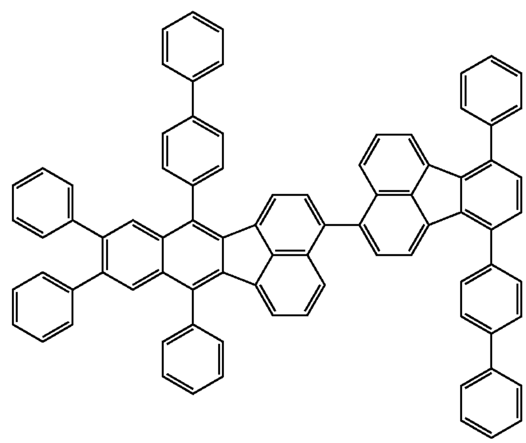
1-43
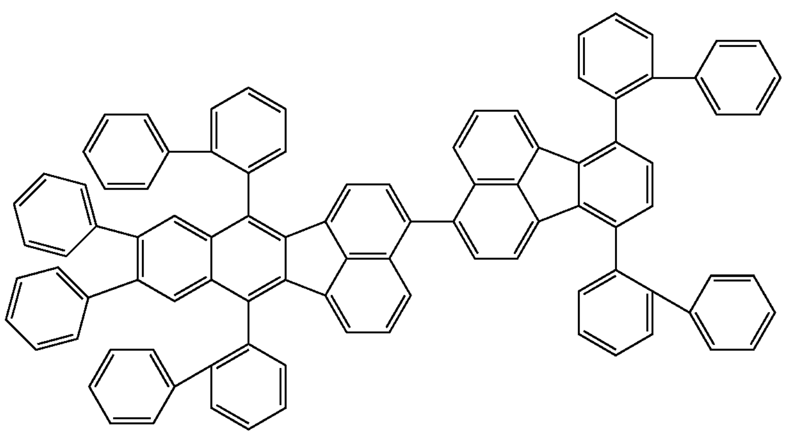

-continued
1-44
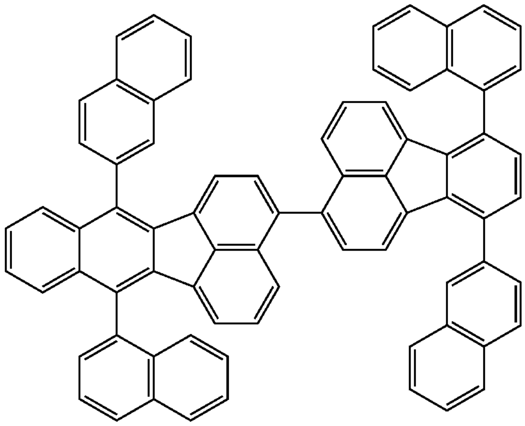
[Chemical Formula 143]
1-45
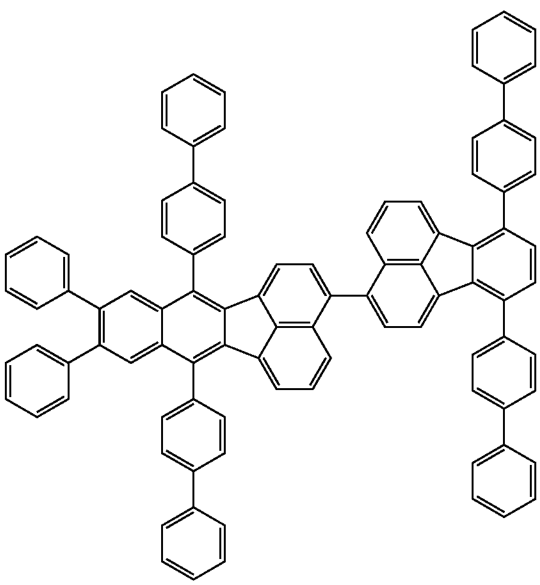
1-46
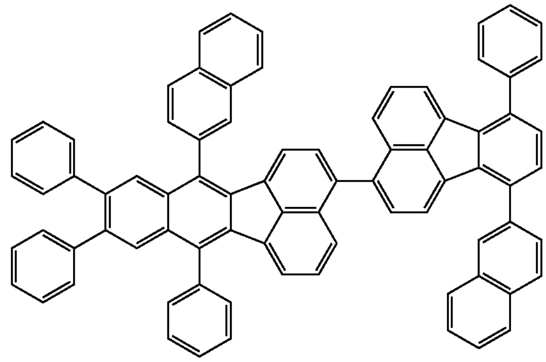
1-47
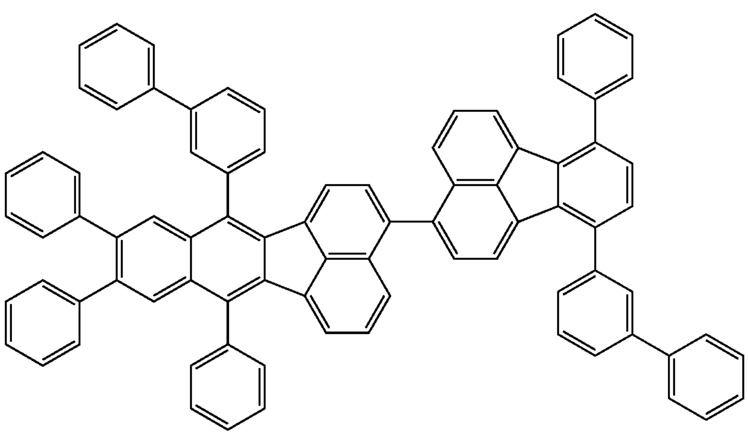

-continued
1-48
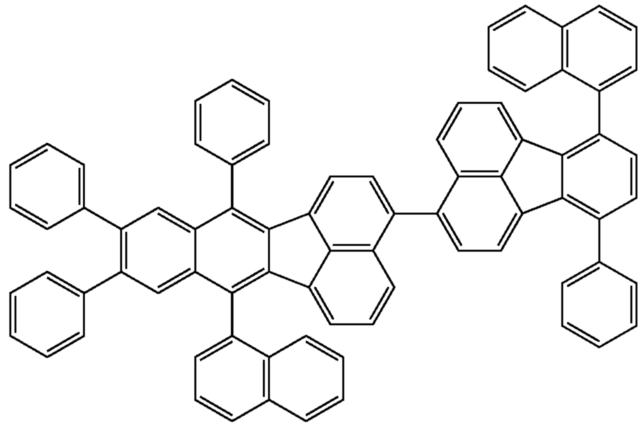
1-49
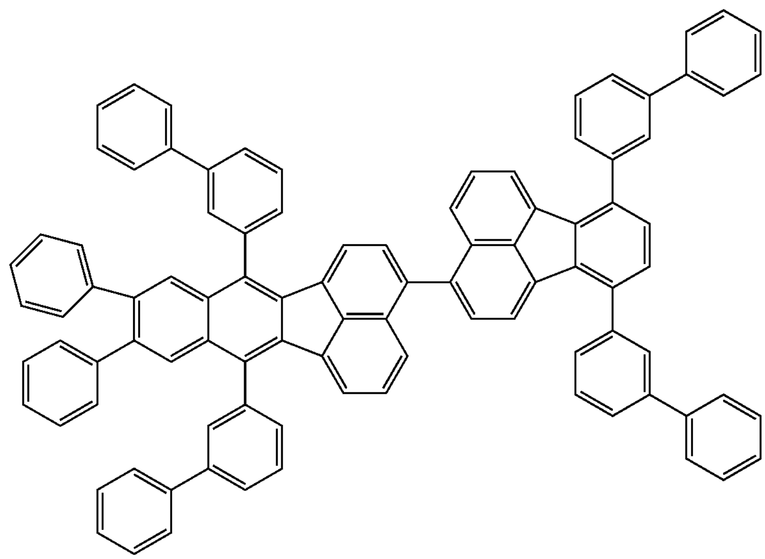
1-50
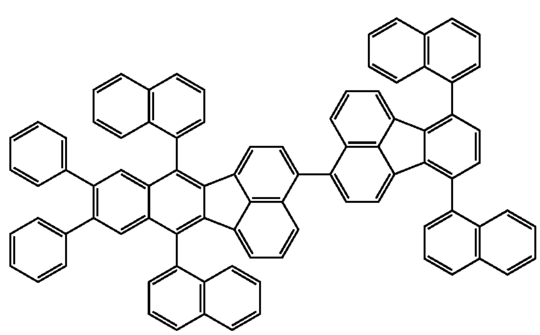
1-51
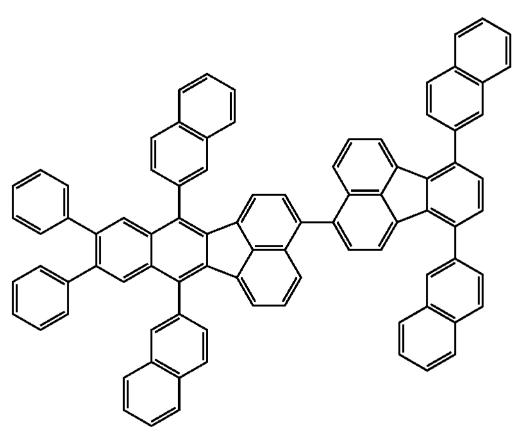

-continued
1-52
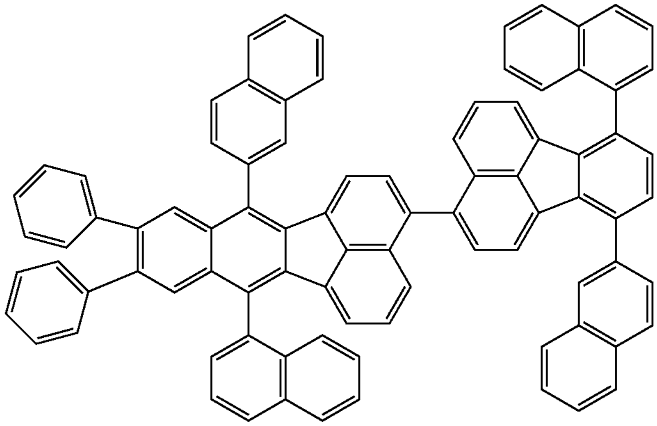
[Chemical Formula 144]
1-53
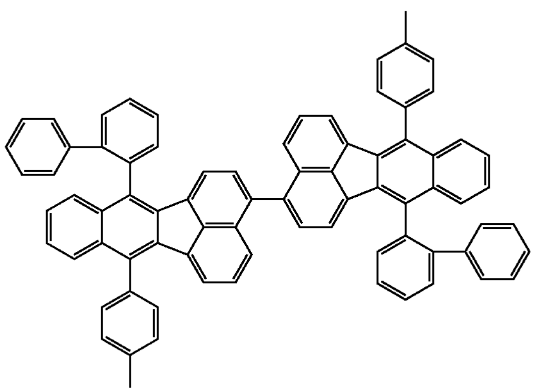
1-54
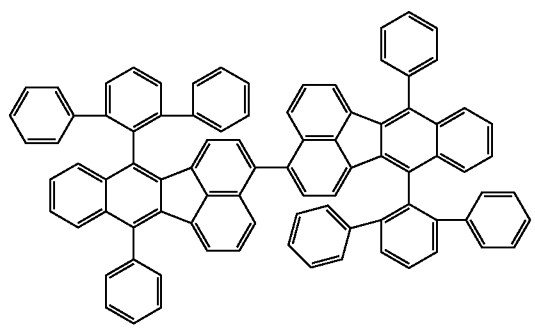
1-55
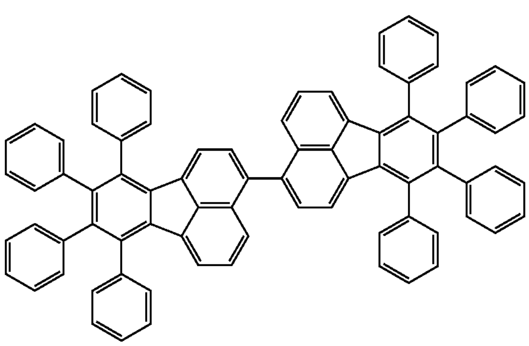
1-56
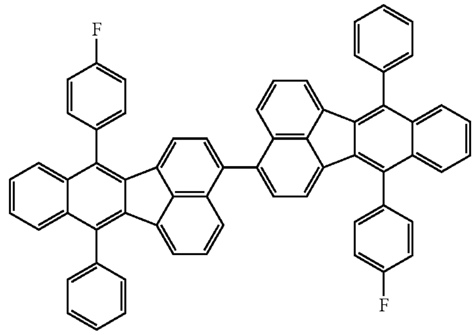

-continued
1-57
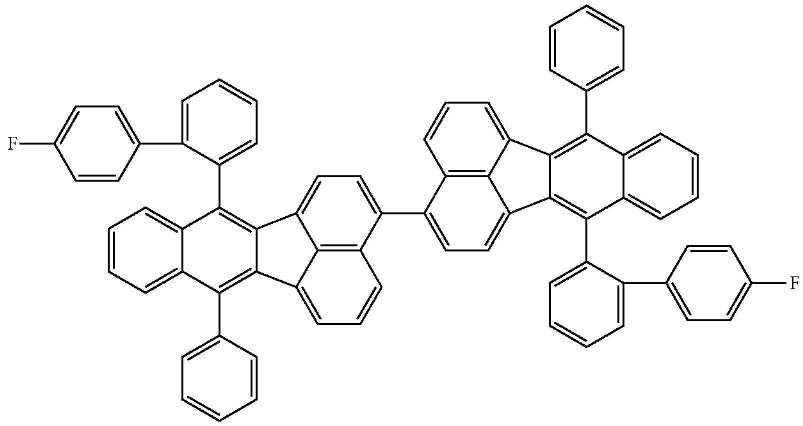
1-58
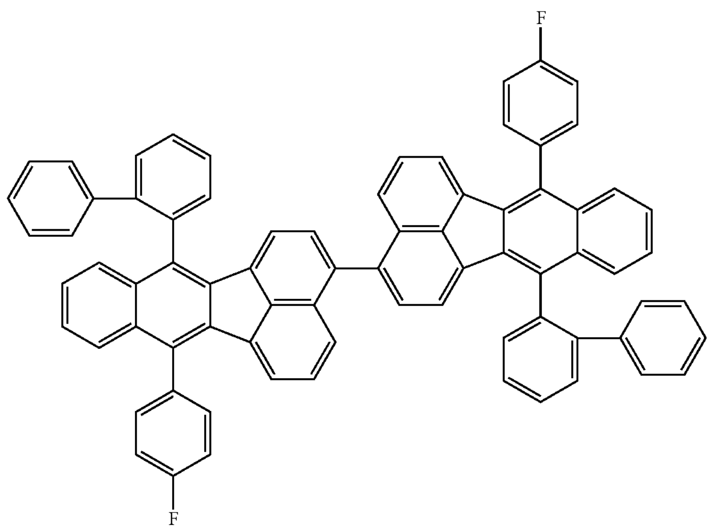
1-59
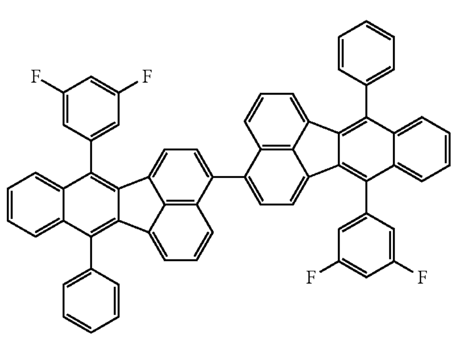
1-60
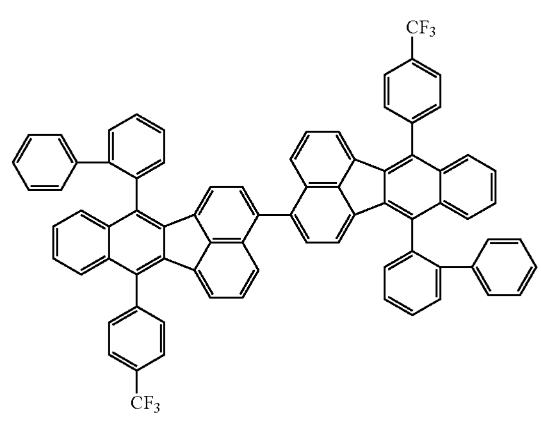

-continued
[Chemical Formula 145]
1-61
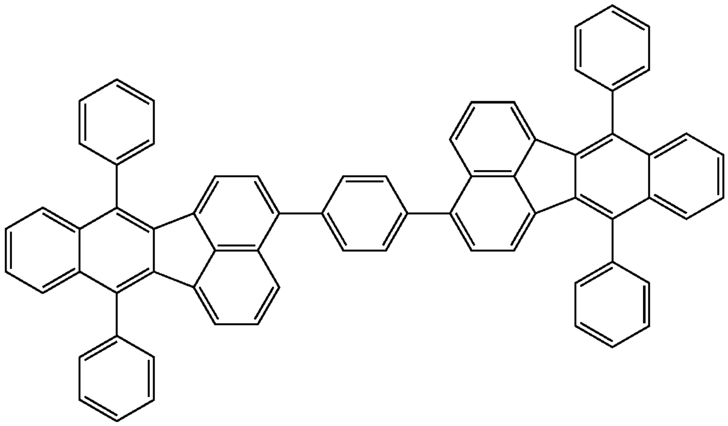
1-62
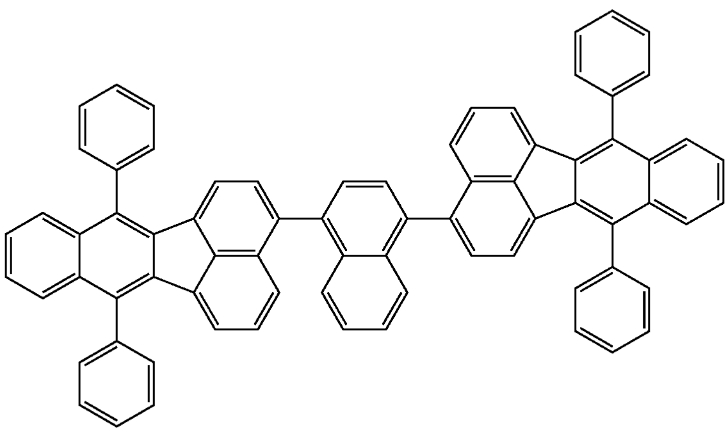
1-63
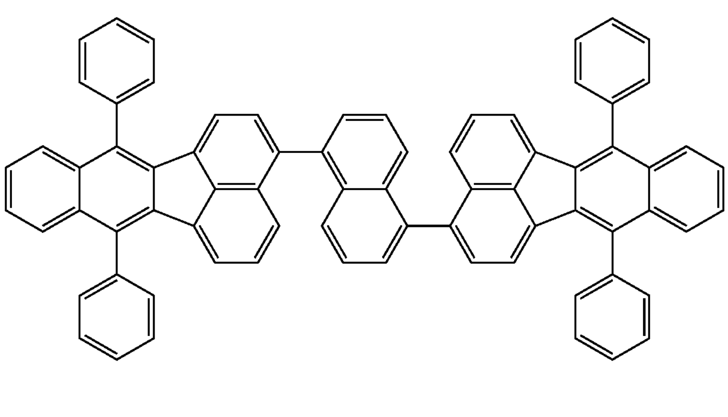

-continued
1-64
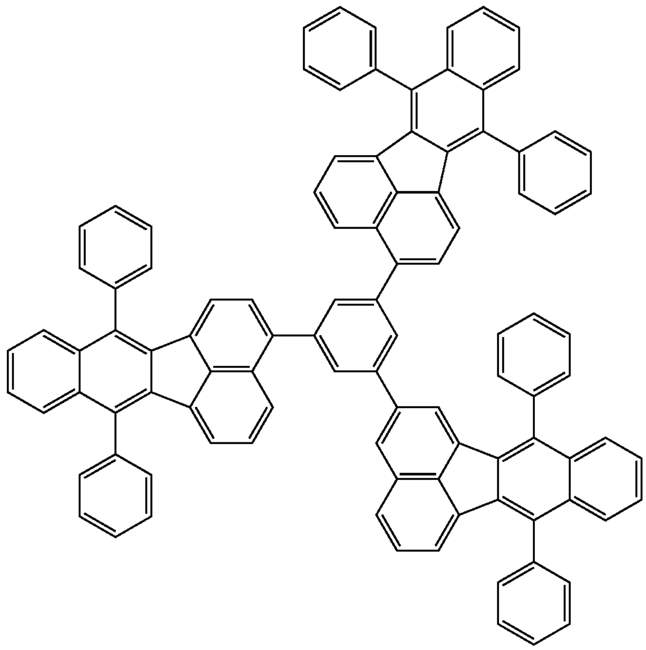
1-65
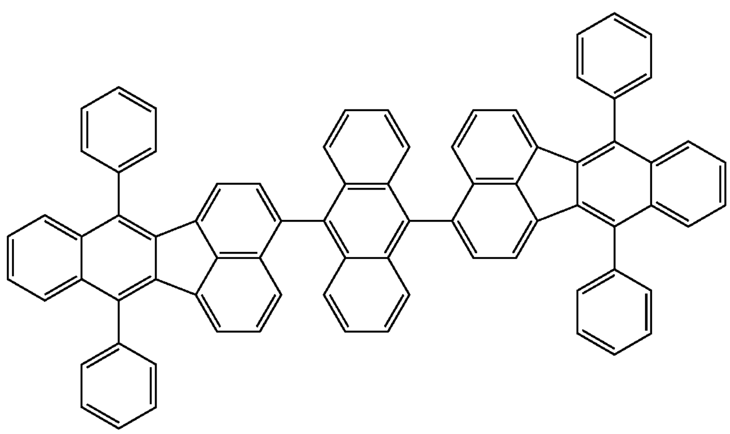
1-66
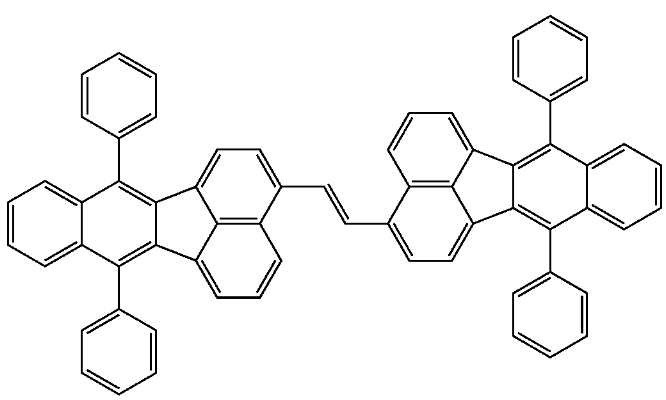

-continued
1-67
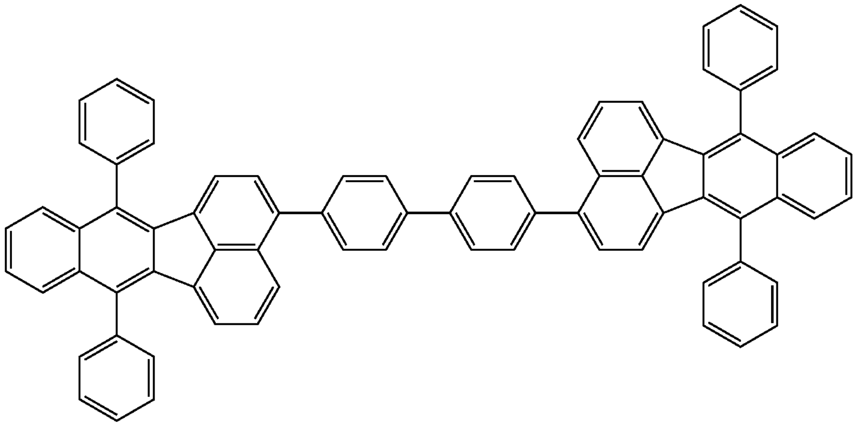
1-68
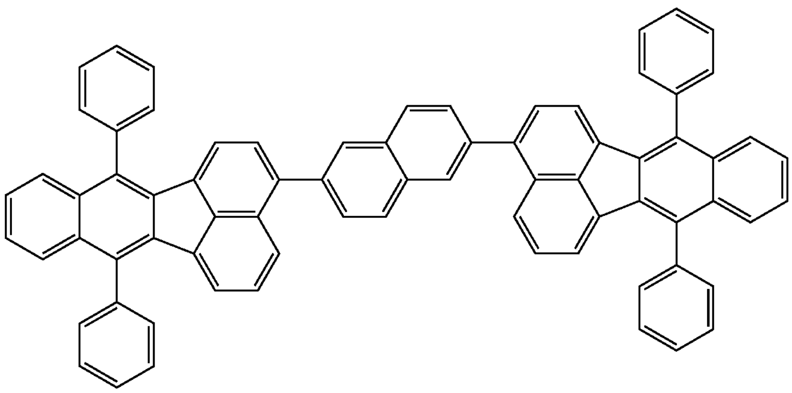
1-69
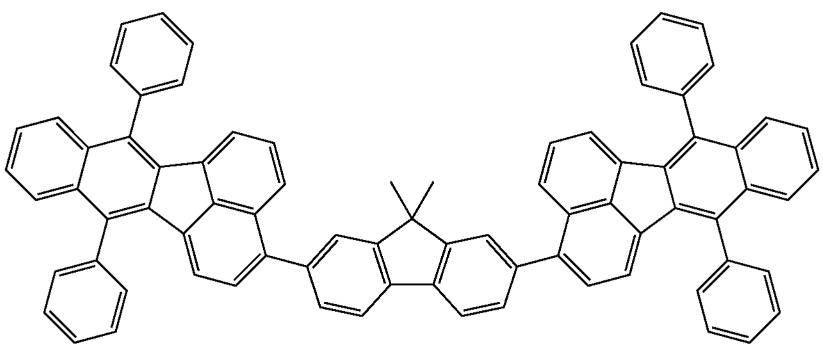
[Chemical Formula 146]
1-70
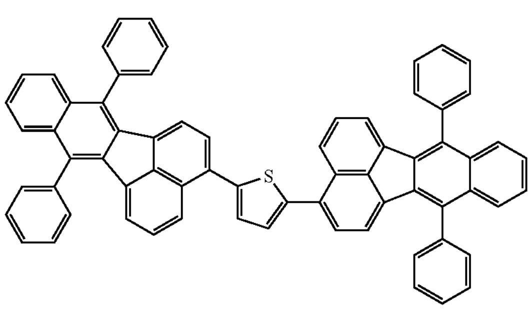
1-71
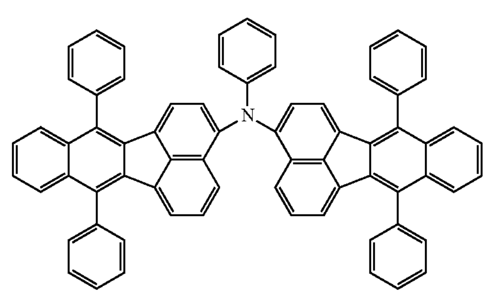

-continued
1-72
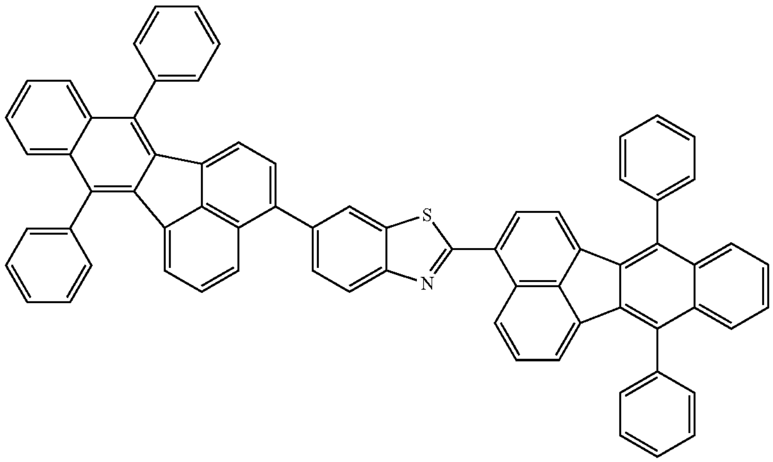
1-73
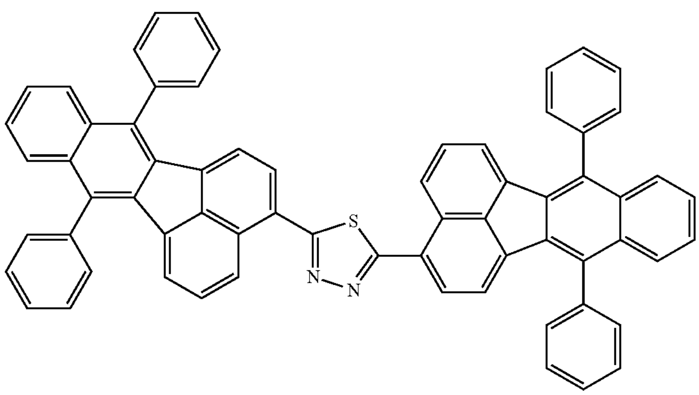
1-74
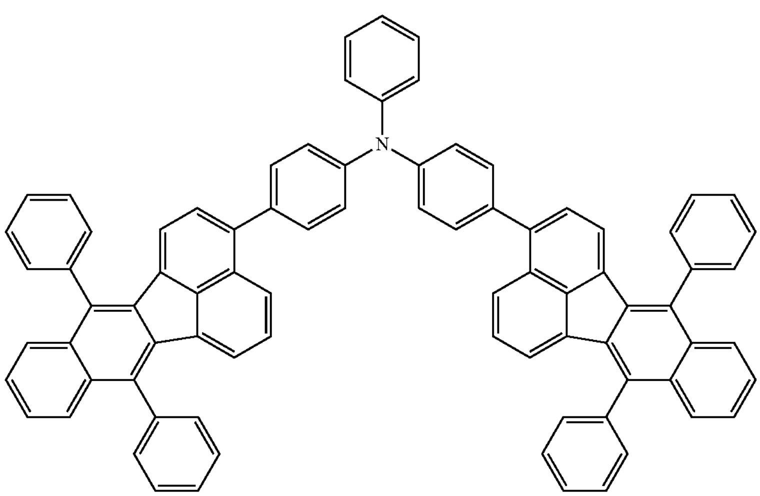

-continued
1-75
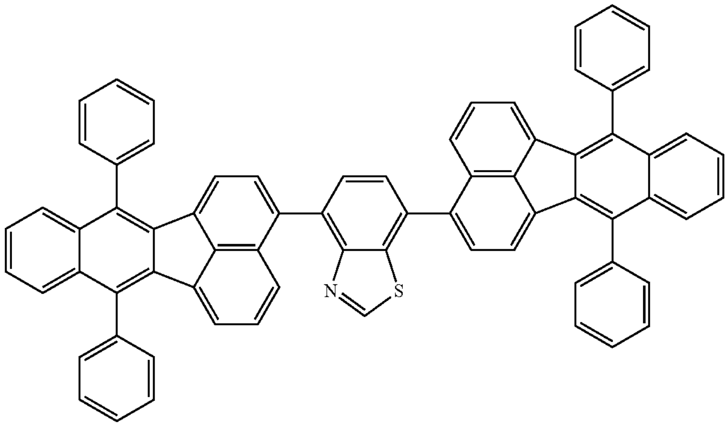
1-76
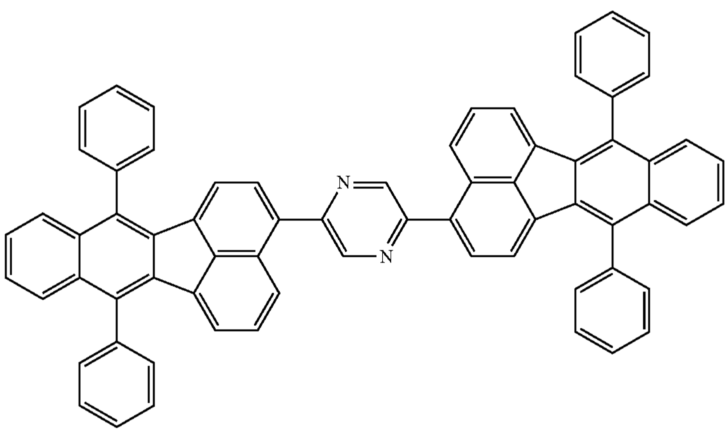
1-77
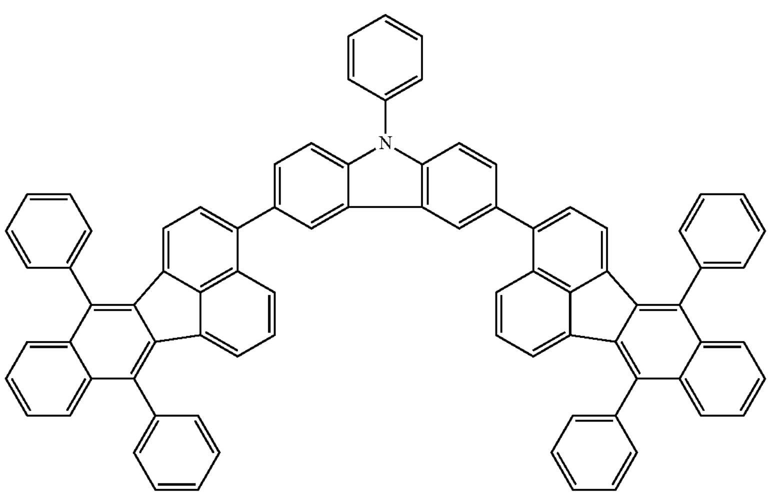

-continued
1-78
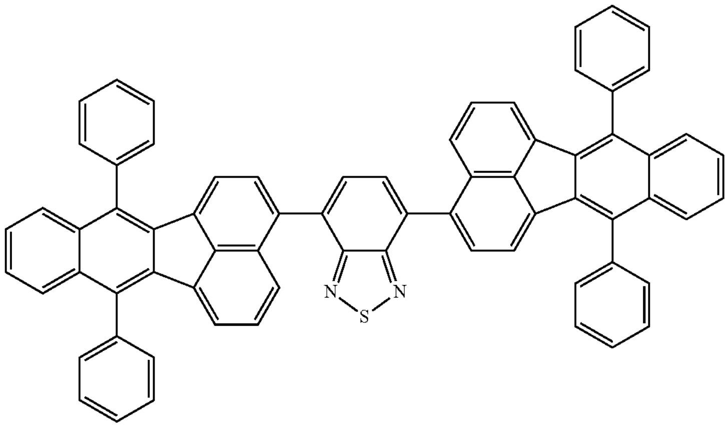
[Chemical Formula 147]
1-79
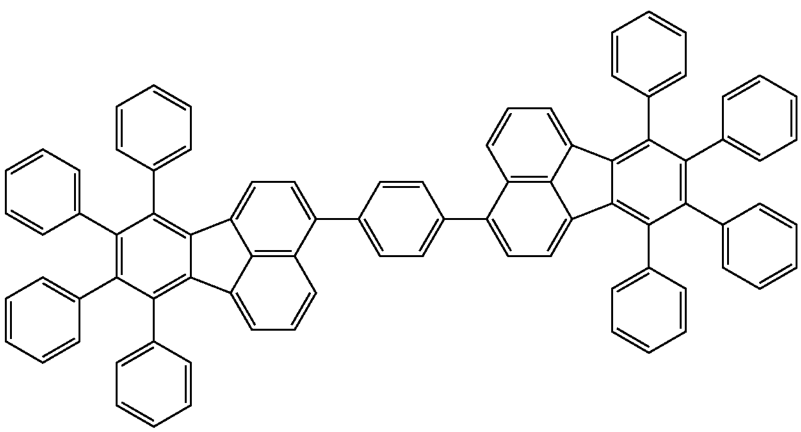
1-80
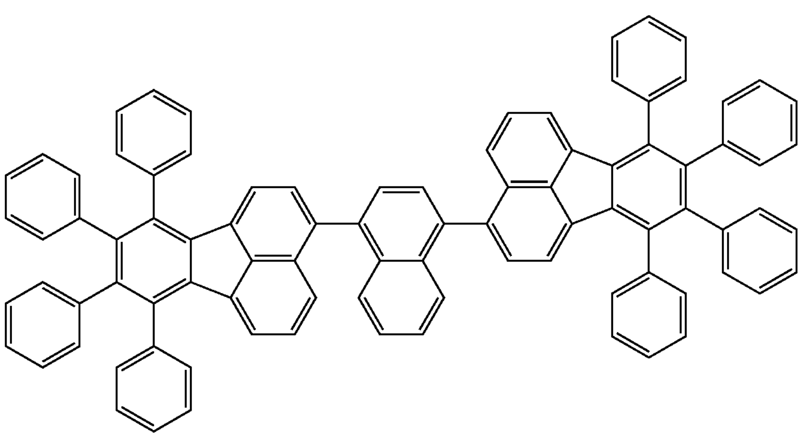

-continued
1-81
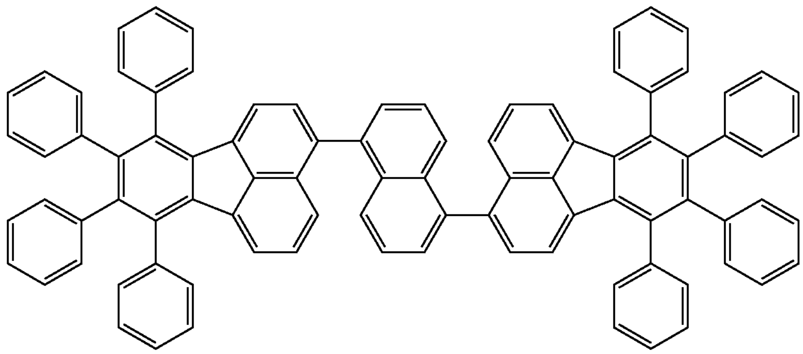
1-82
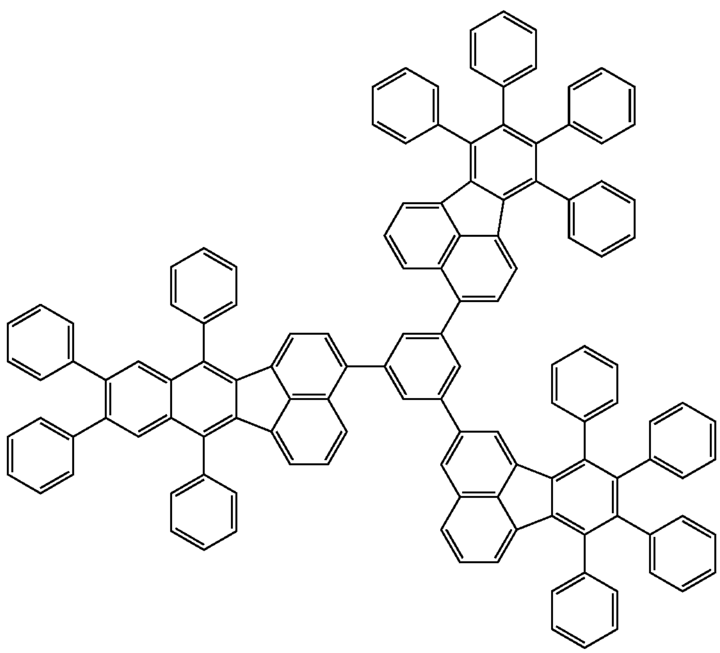
1-83
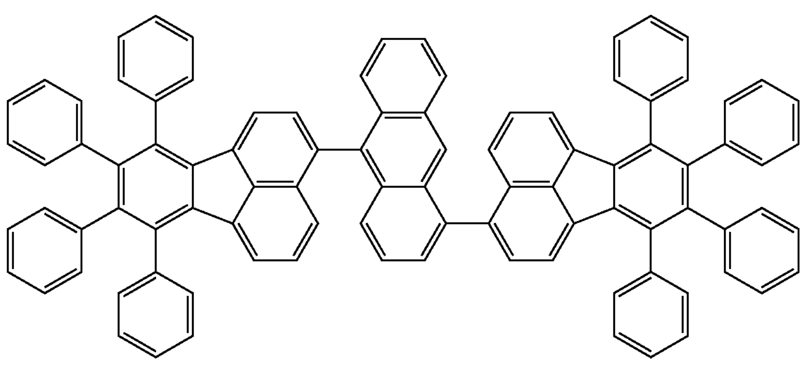

-continued
1-84
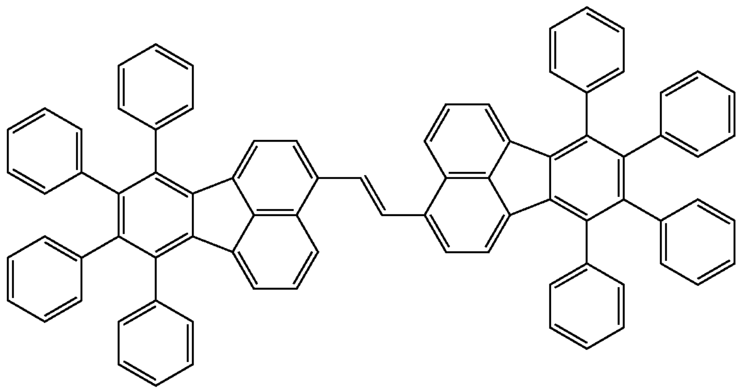
1-85
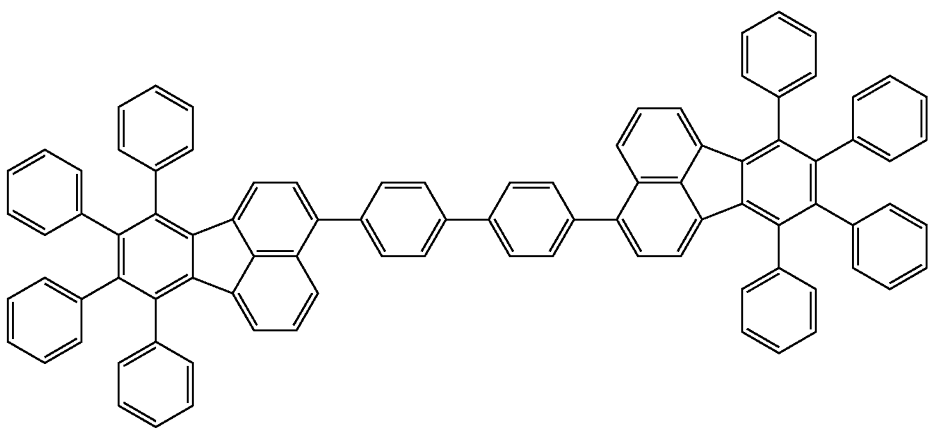
1-86
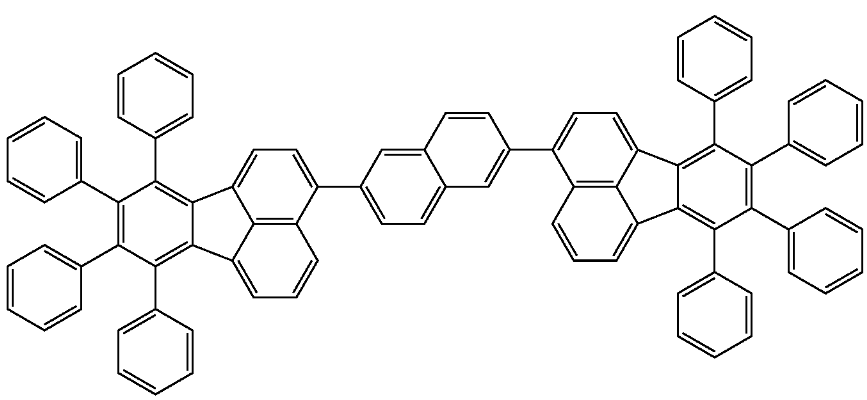
1-87
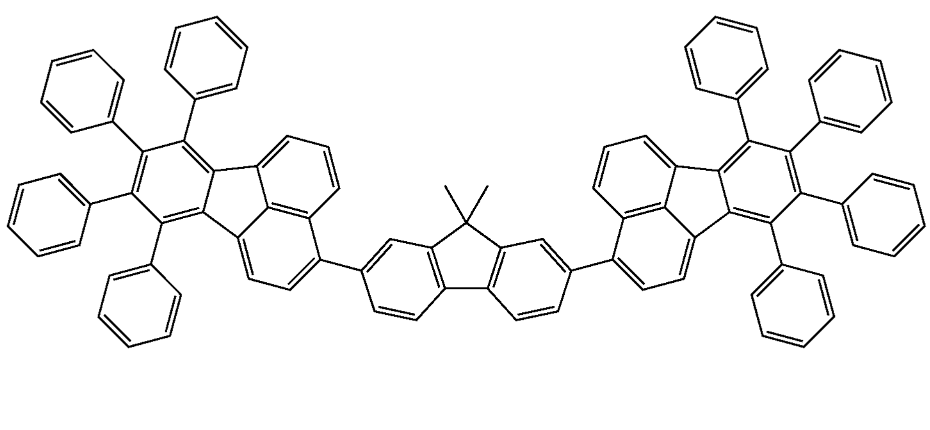

-continued
[Chemical Formula 148]
1-88
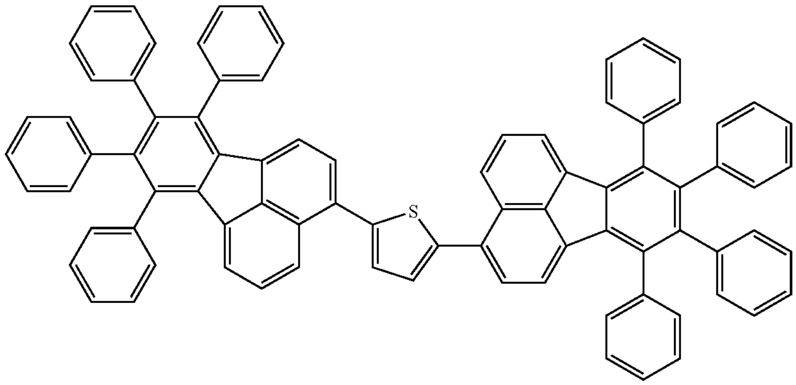
1-89
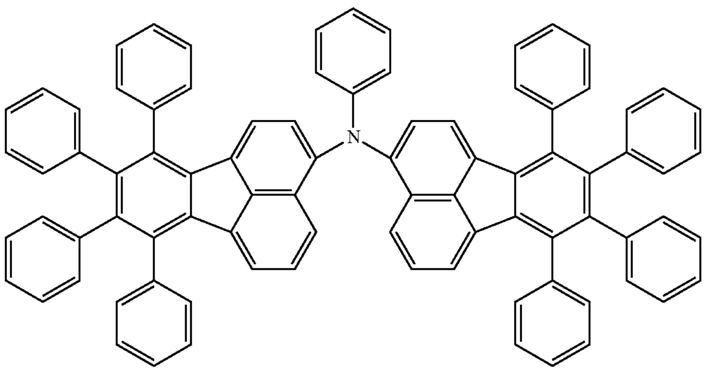
1-90
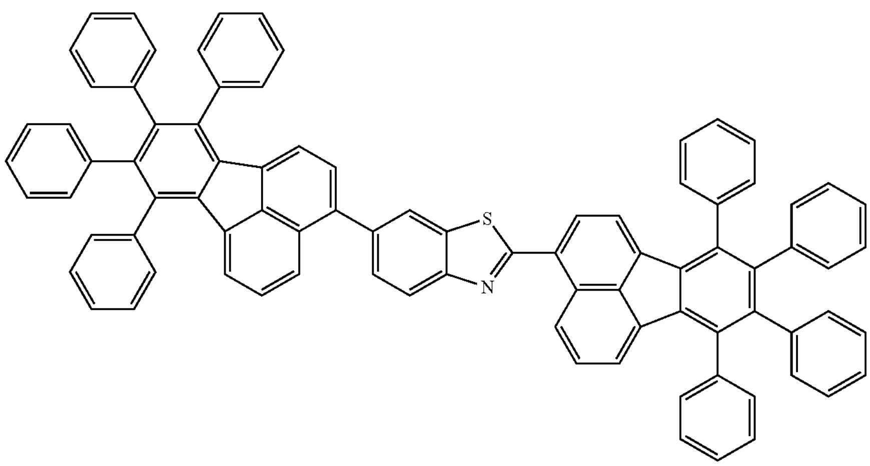
1-91
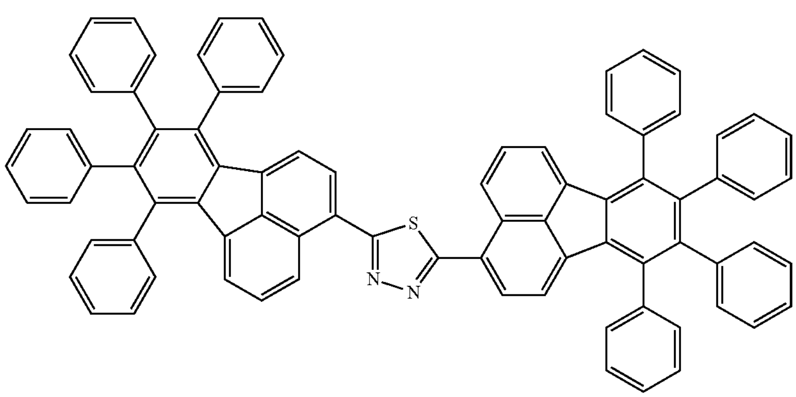

-continued
1-92
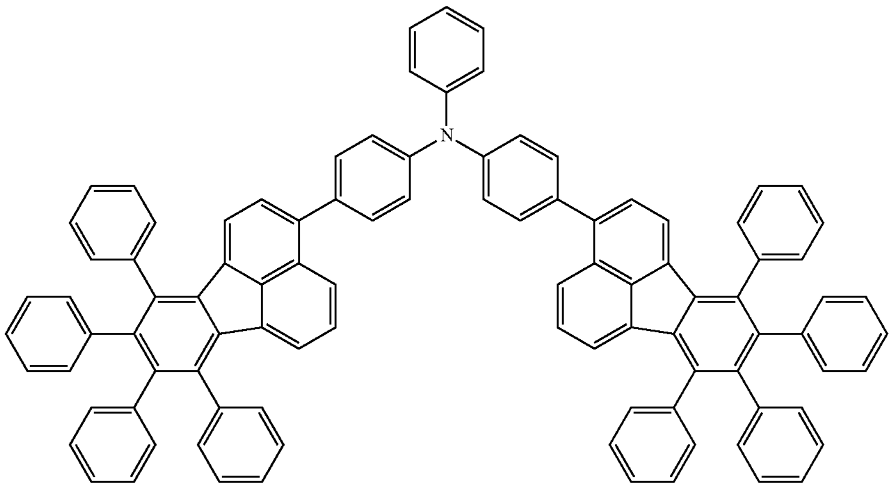
1-93
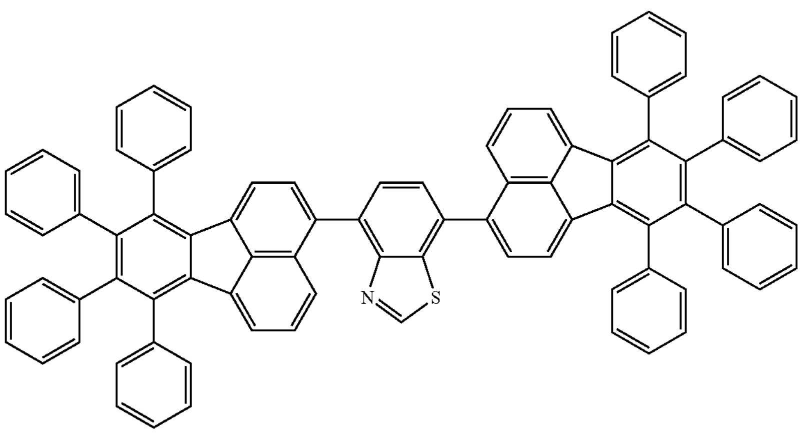
1-94
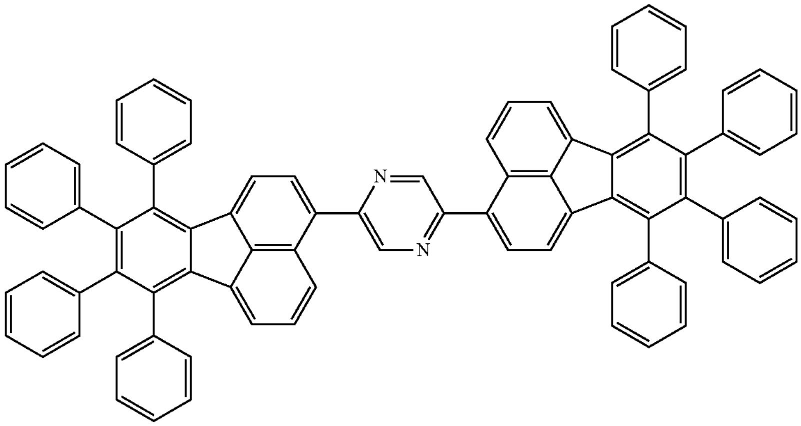

-continued
1-95
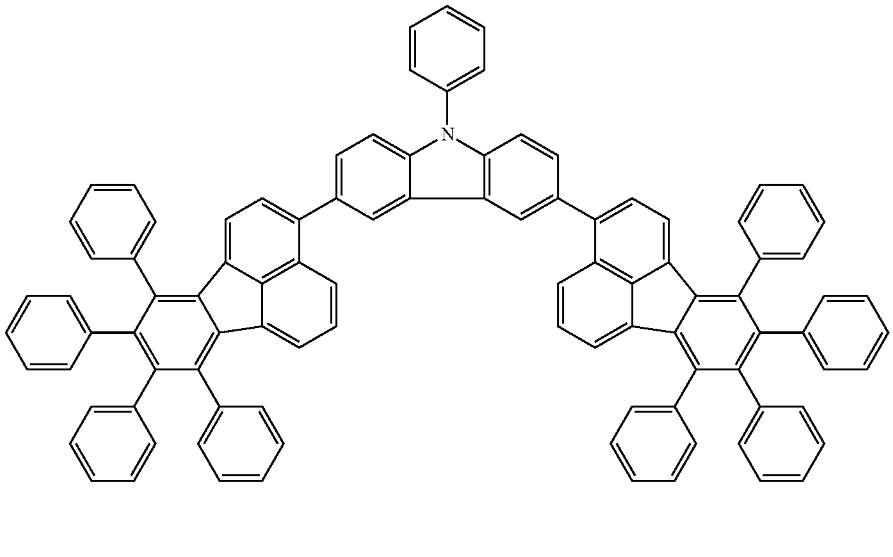
1-96
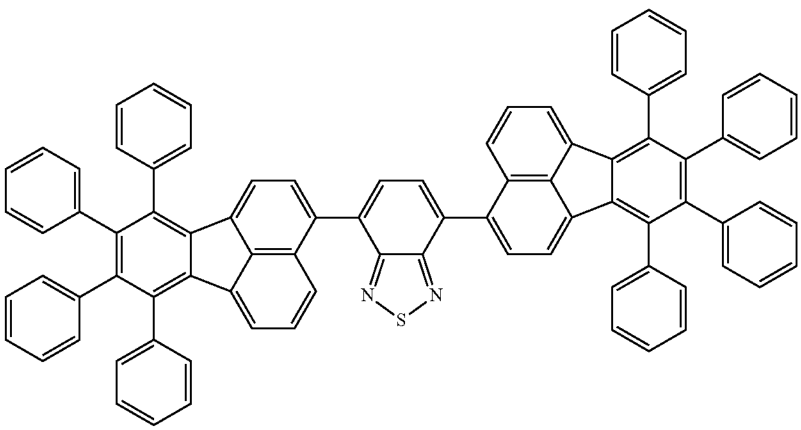
[Chemical Formula 149]
1-97
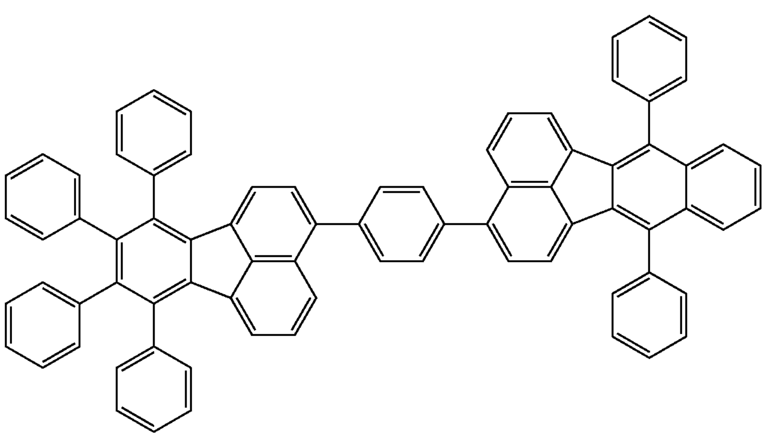

-continued
1-98
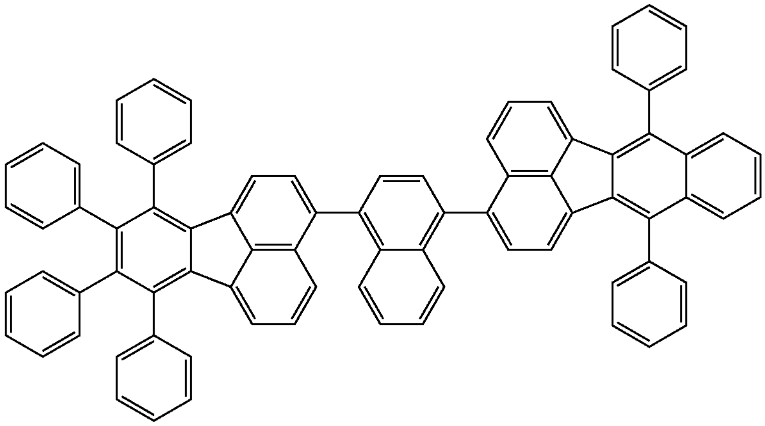
1-99
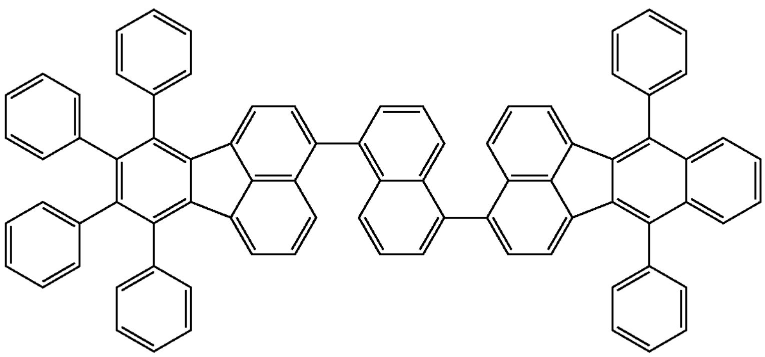
1-100
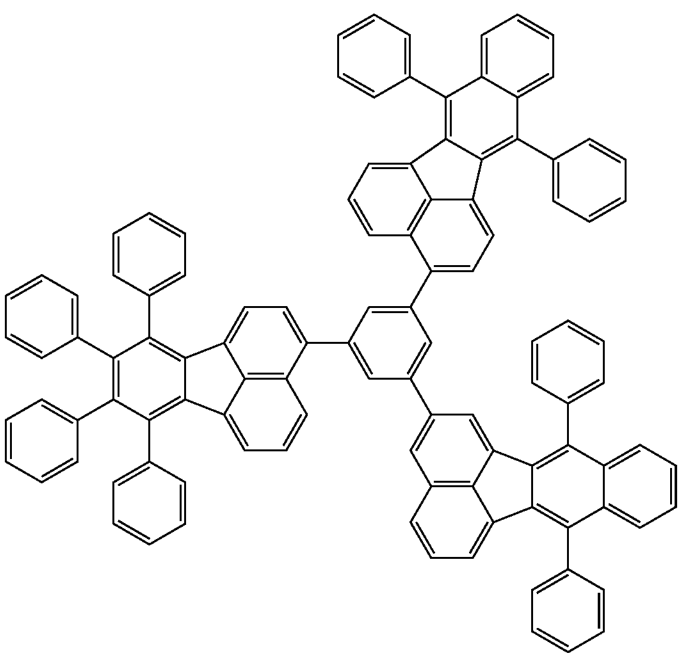

-continued
1-101
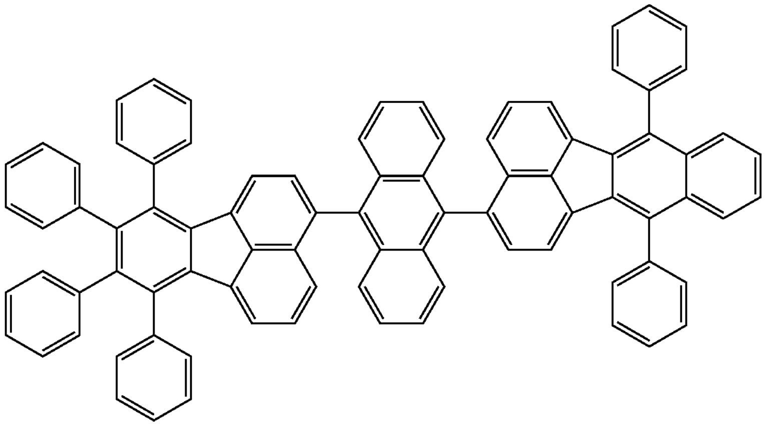
1-102
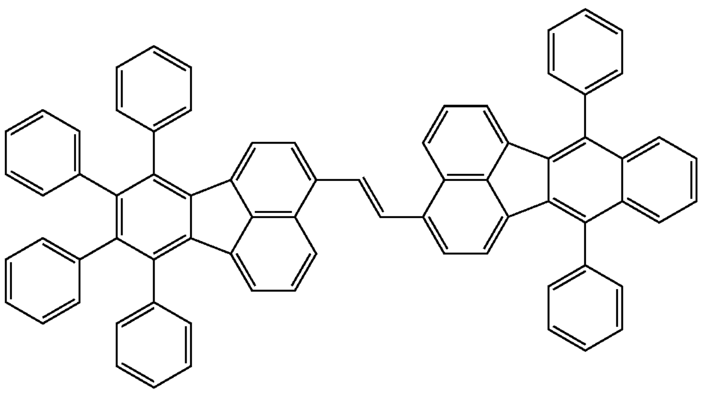
1-103
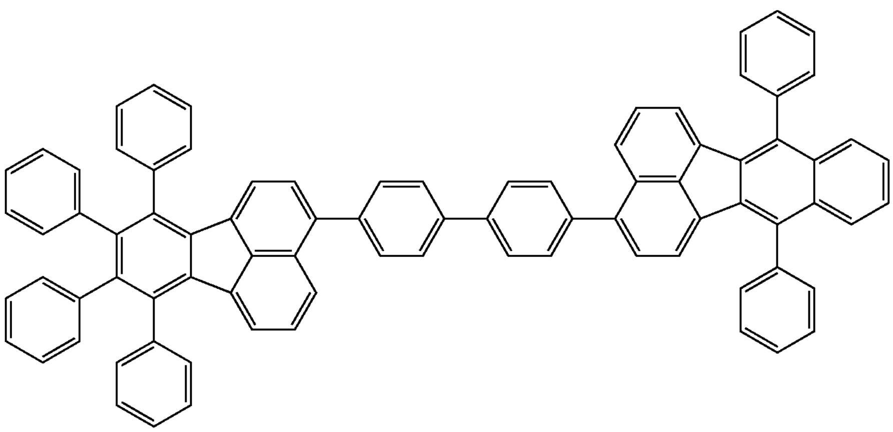
1-104
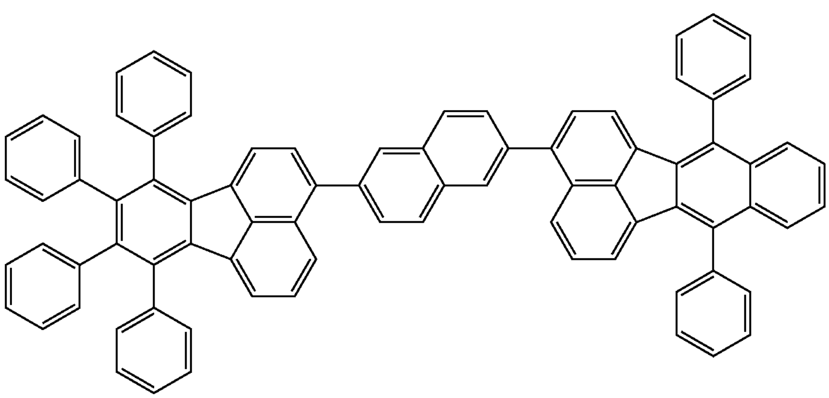

-continued
1-105
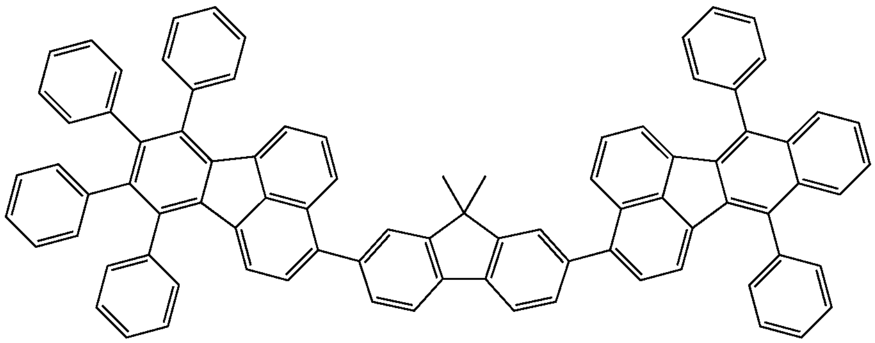
[Chemical Formula 150]
1-106
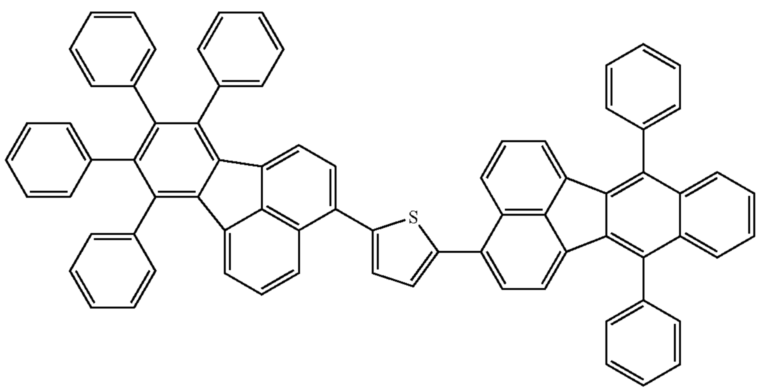
1-107
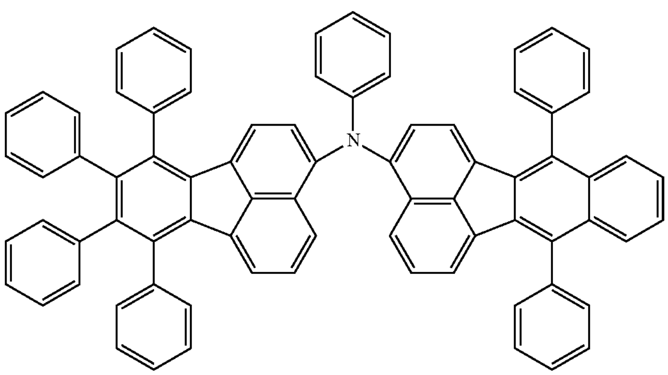
1-108
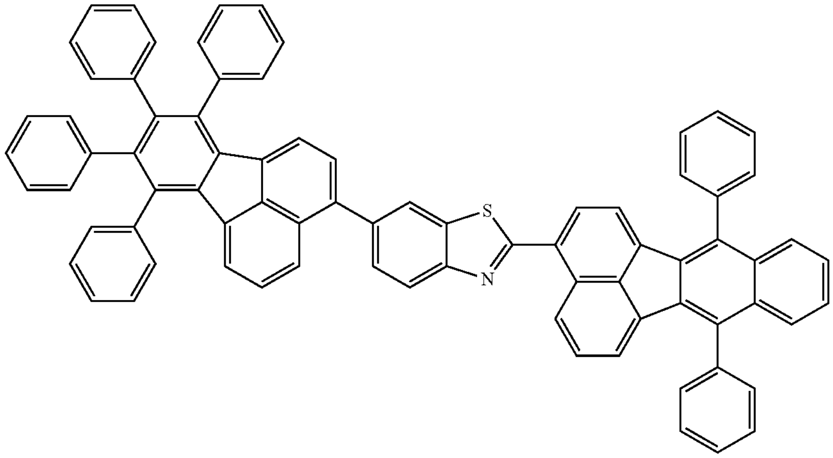

-continued
1-109
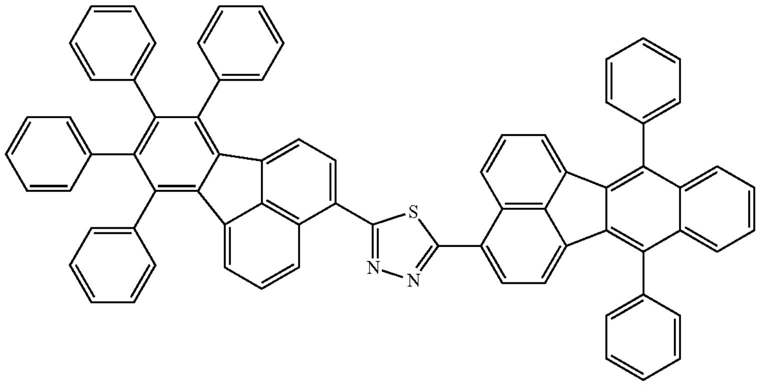
1-110
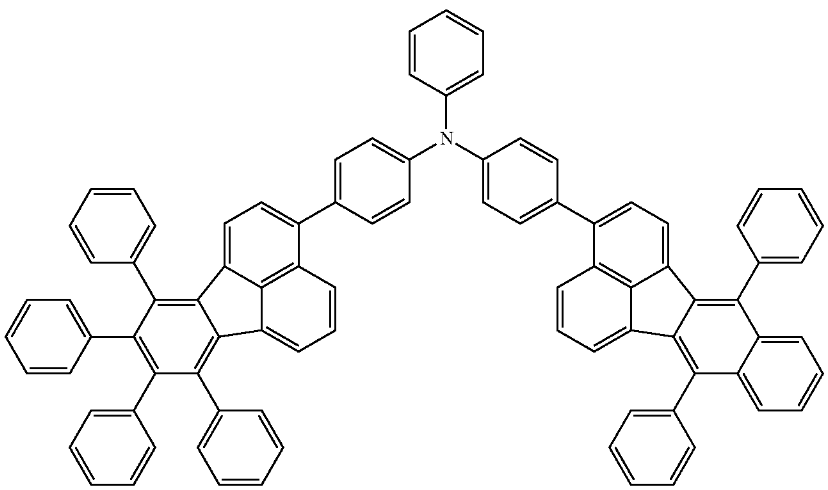
1-111
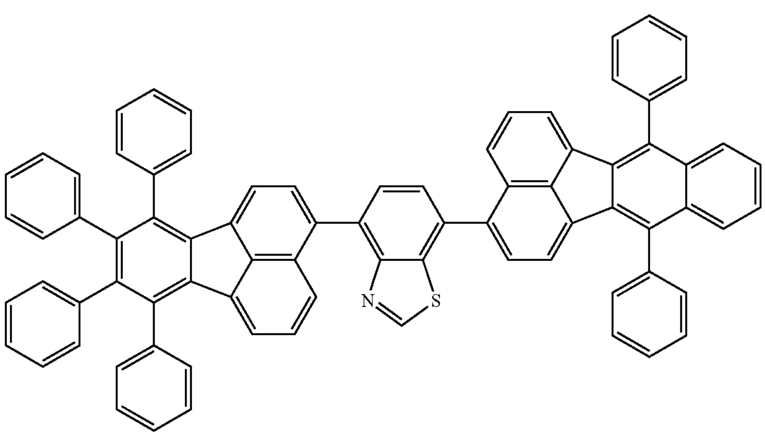

-continued
1-112
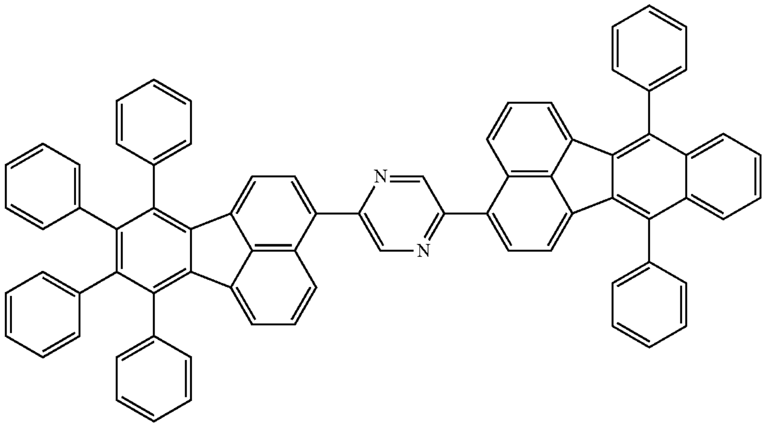
1-113
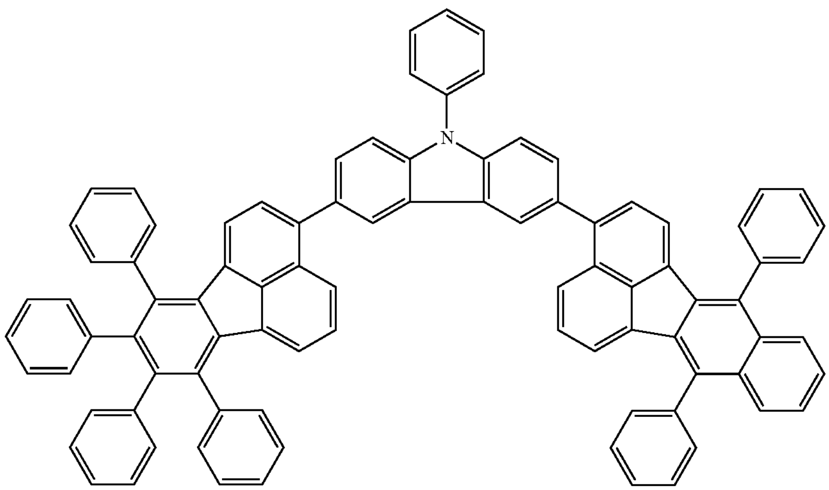
1-114
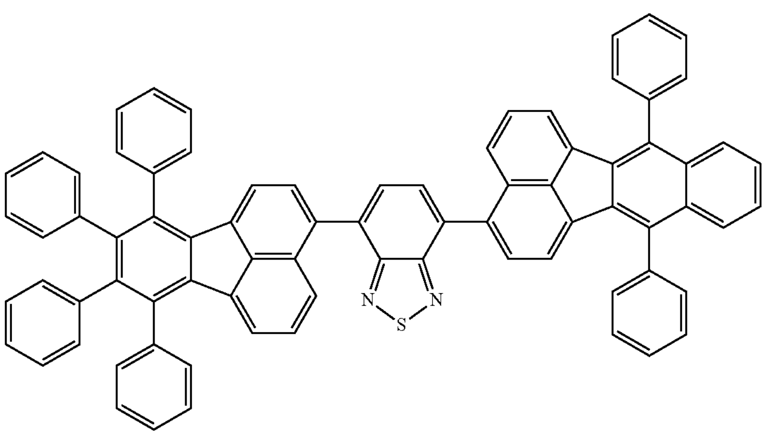

-continued
[Chemical Formula 151]
2-1
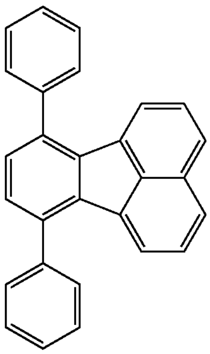
2-2
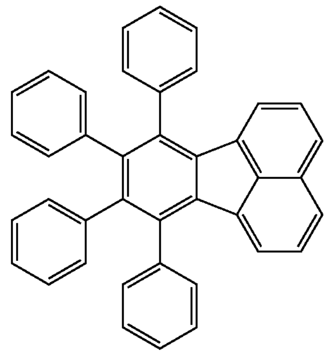
2-3
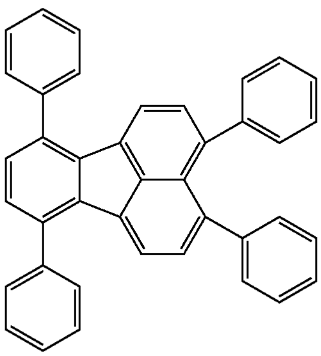
2-4
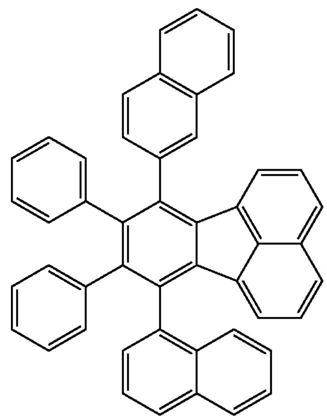
2-5
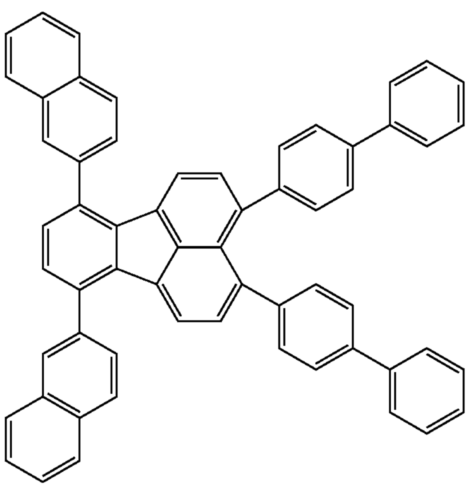
2-6
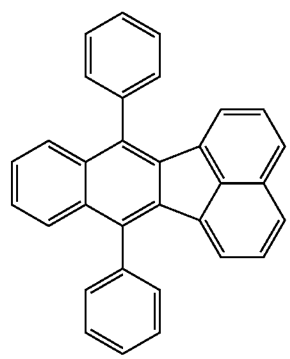
2-7
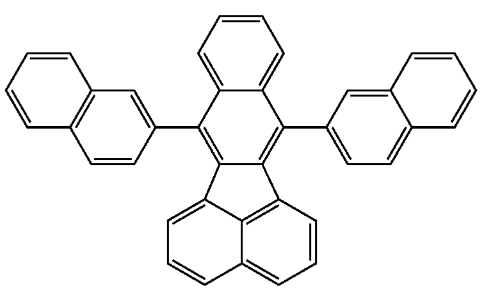
2-8
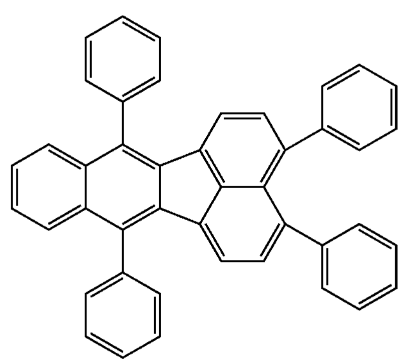

-continued
2-9
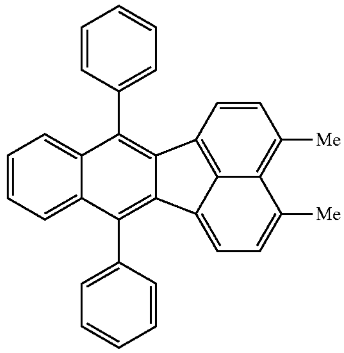
2-10
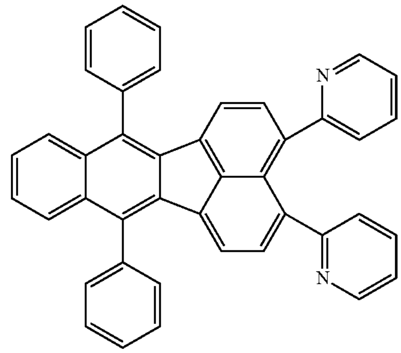
2-11
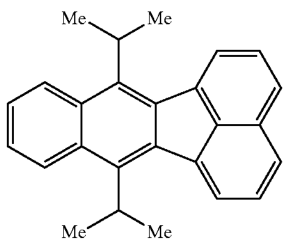
2-12
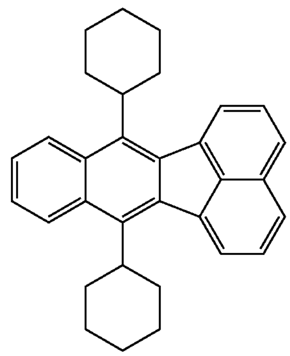
2-13
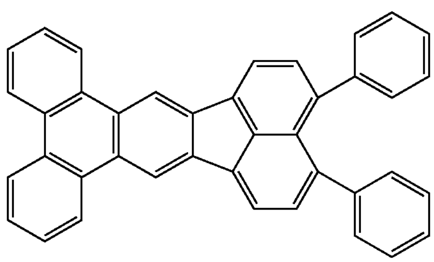
2-14
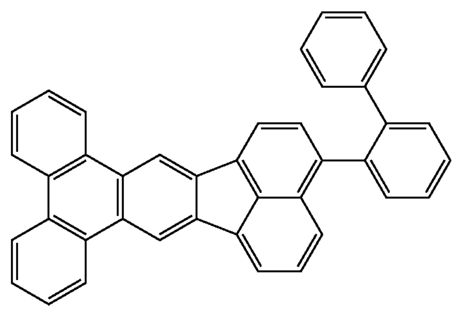
2-15
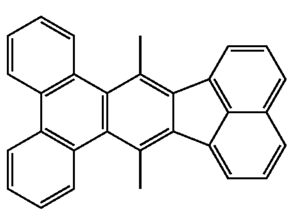
2-16
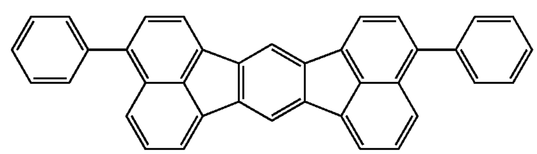
2-17
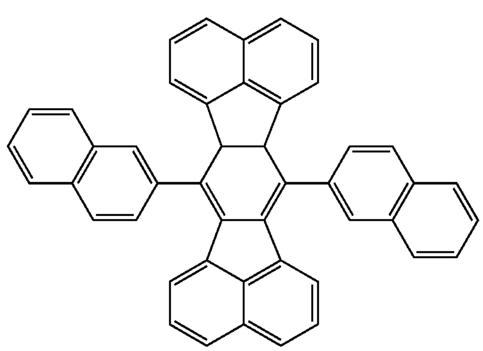
2-18
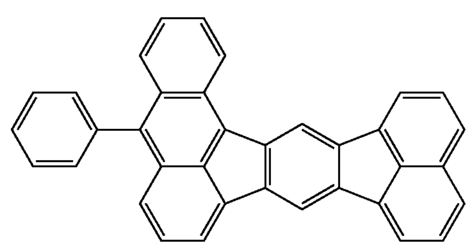

-continued
2-19
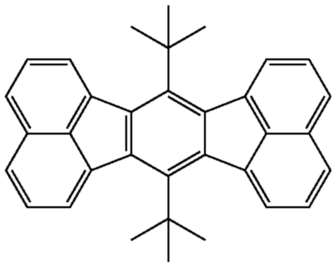
[Chemical Formula 152]
2-20
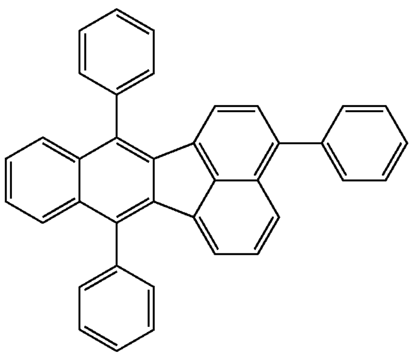
2-21
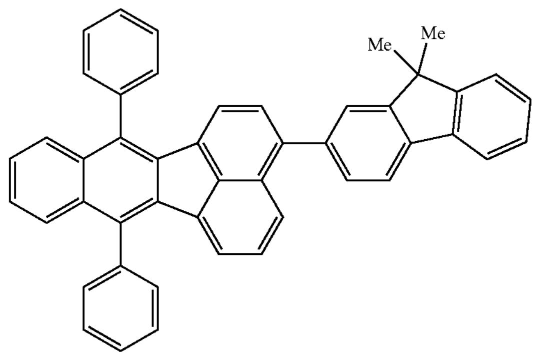
2-22
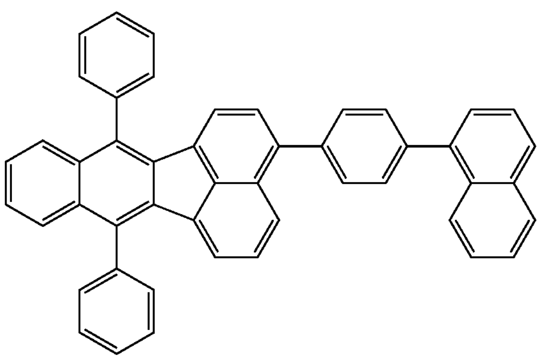
2-23
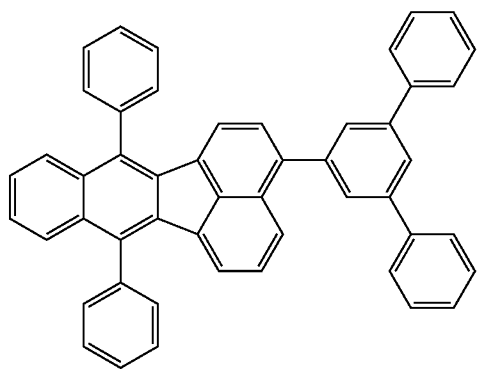
2-24
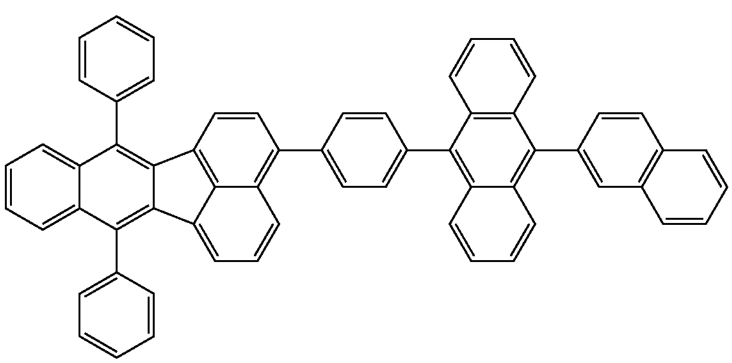

-continued
2-25
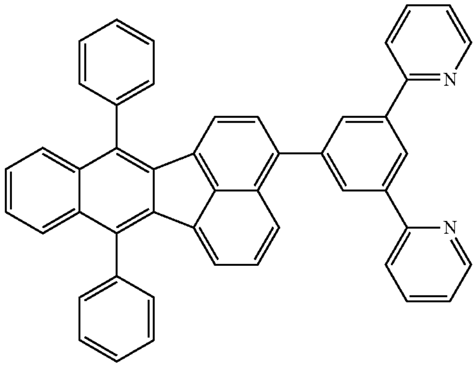
2-26
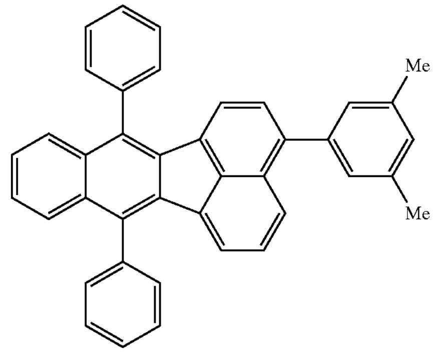
2-27
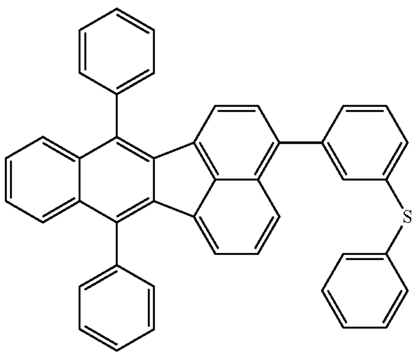
2-28
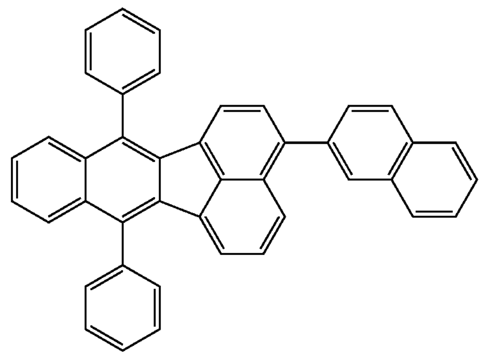
2-29
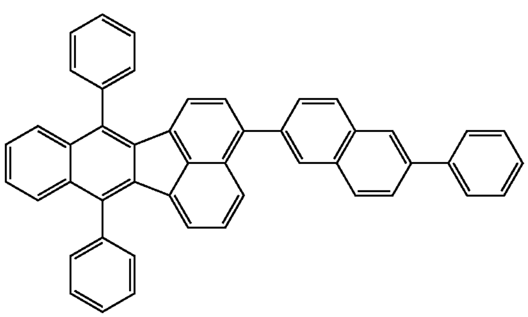
2-30
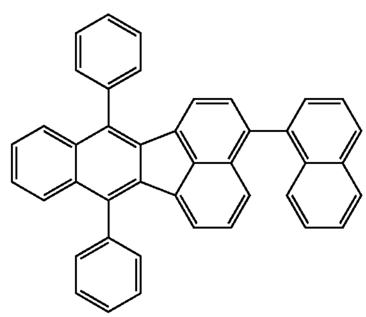
2-31
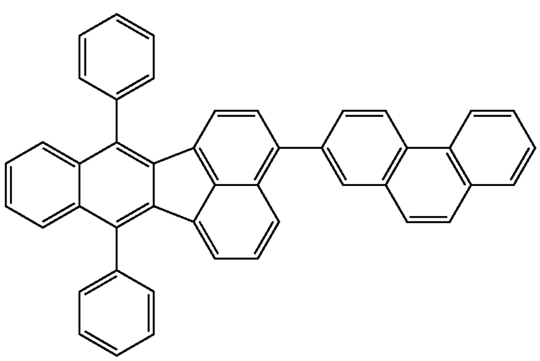
2-32
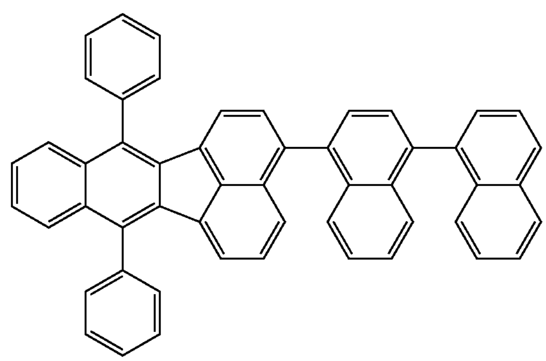

-continued
2-33
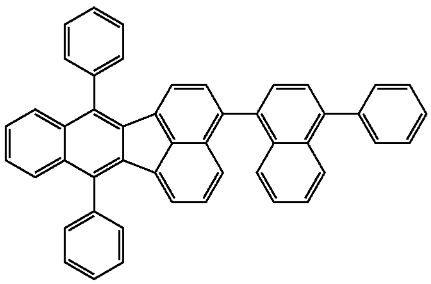
2-34
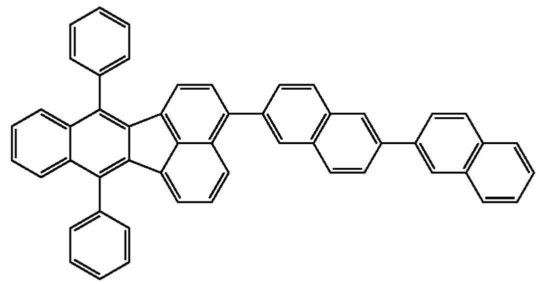
2-35
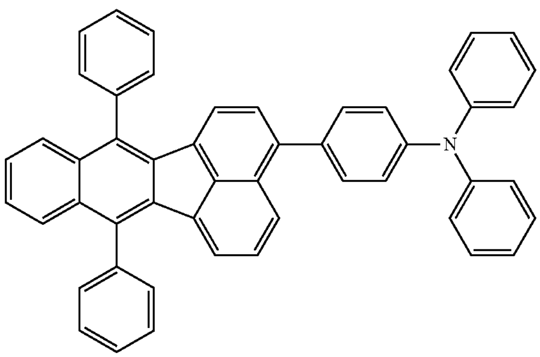
[Chemical Formula 153]
2-36
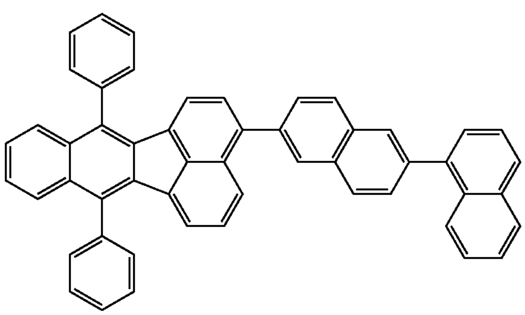
2-37
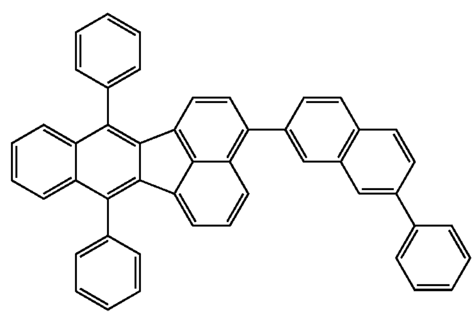
2-38
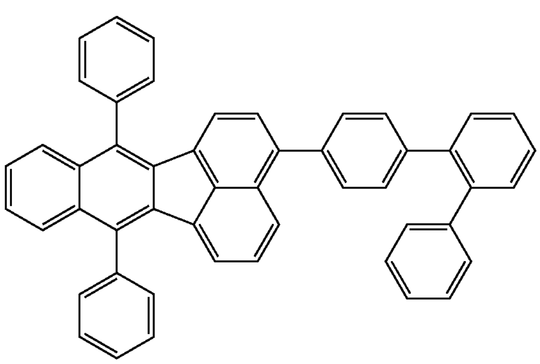
2-39
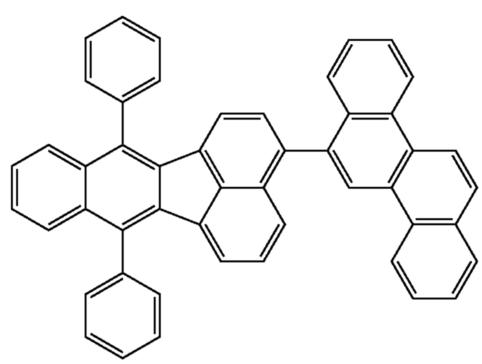

-continued
2-40
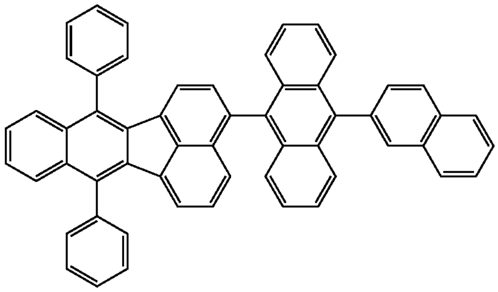
2-41
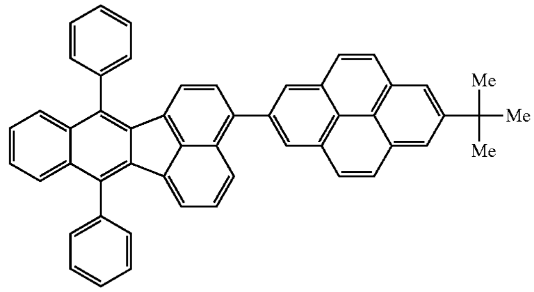
2-42
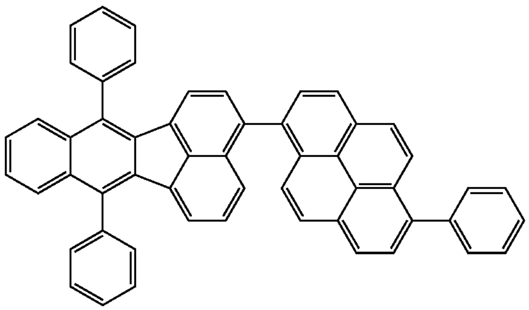
2-43
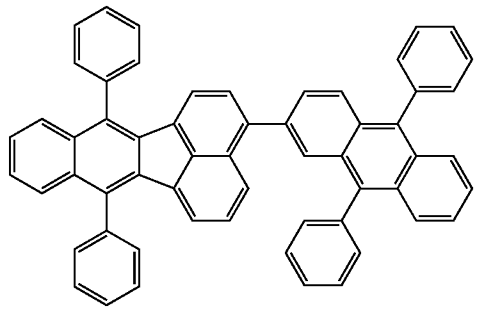
2-44
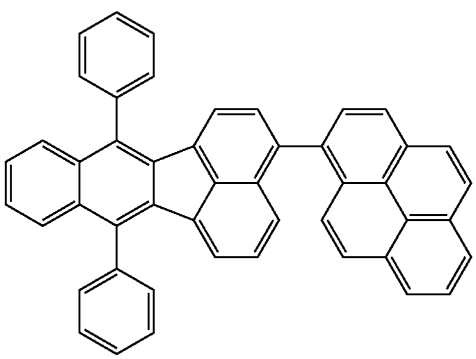
2-45
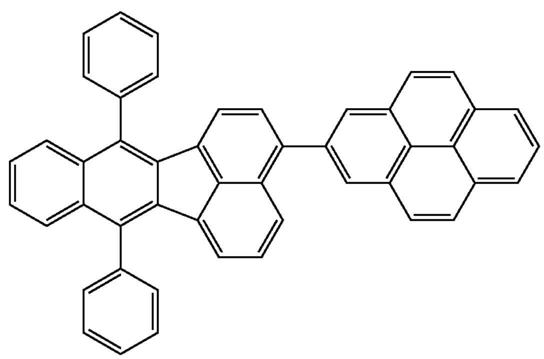
2-46
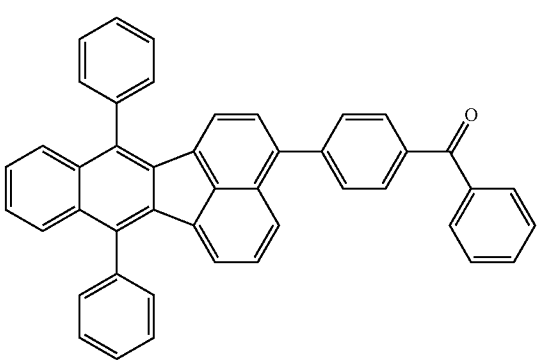
2-47
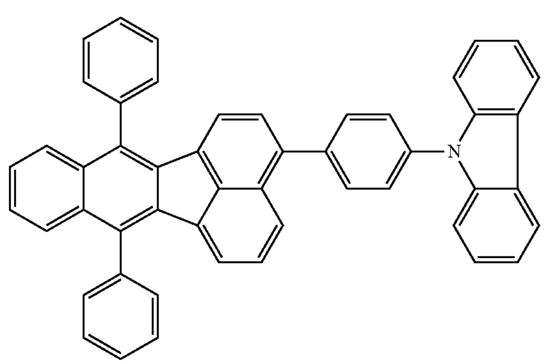

-continued
2-48
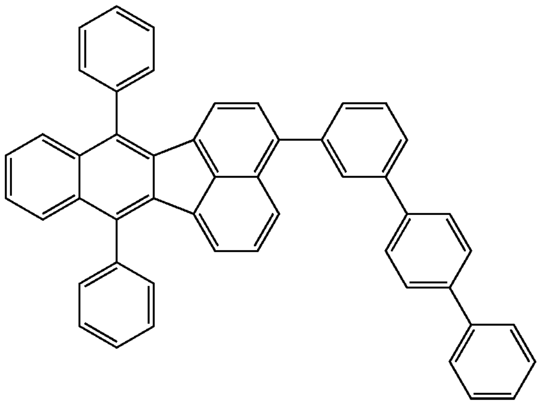
2-49
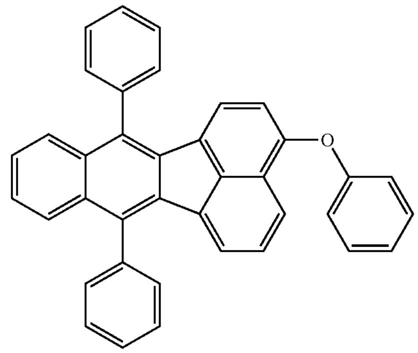
2-50
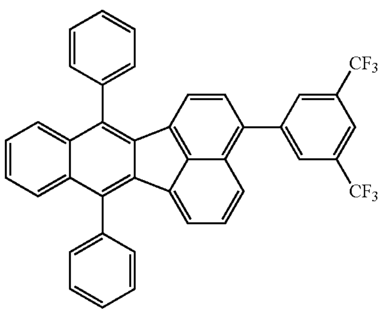
2-51
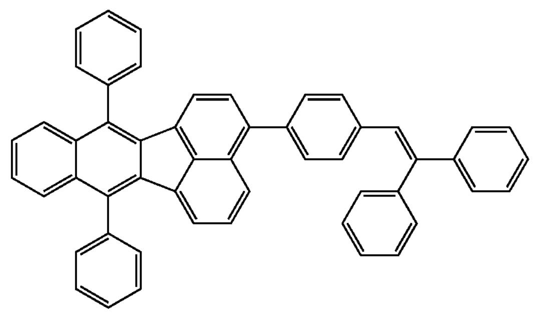
[Chemical Formula 154]
2-52
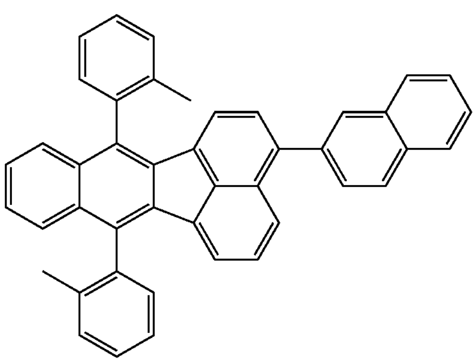
2-53
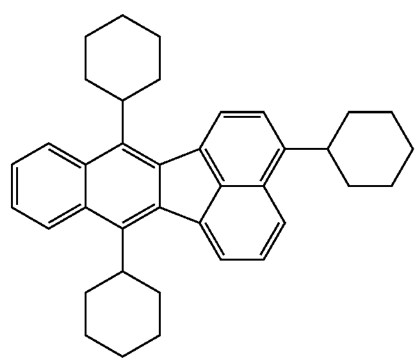
2-54
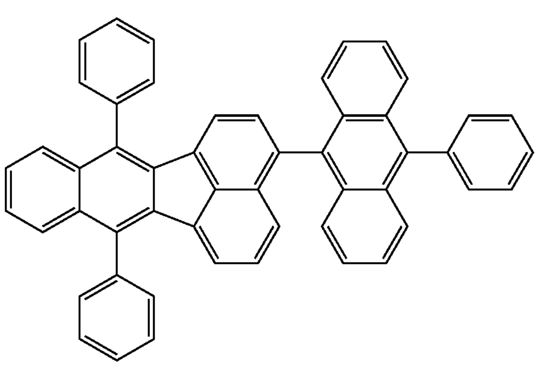
2-55
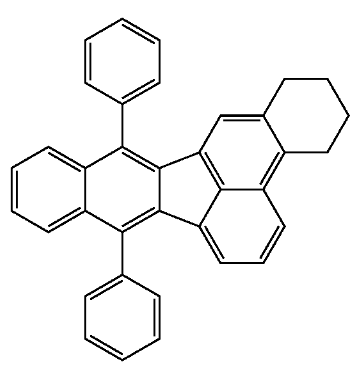

-continued
2-56
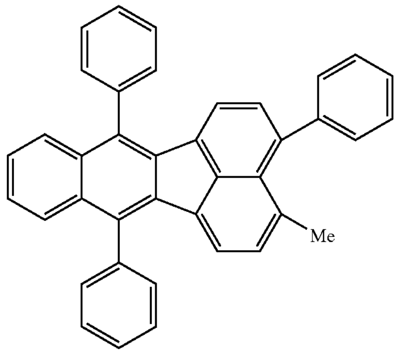
2-57
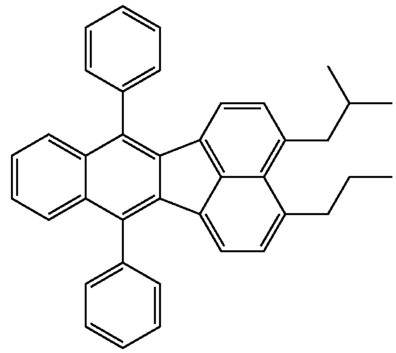
2-58
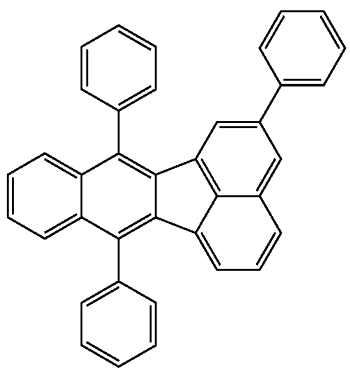
2-59
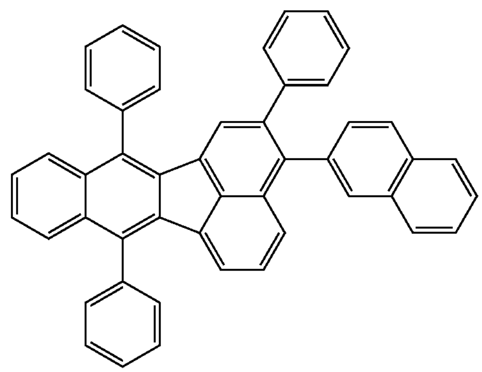
2-60
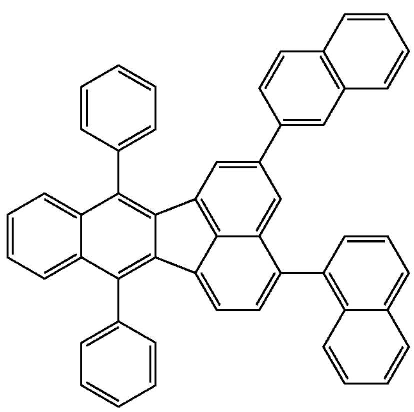
2-61
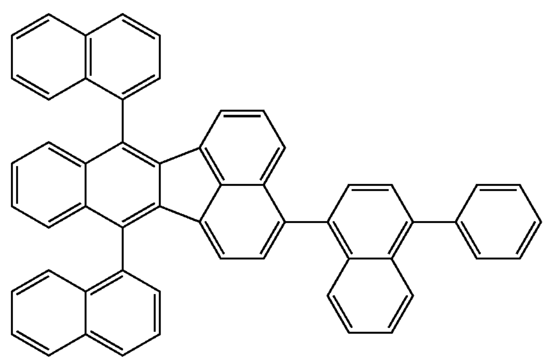
2-62
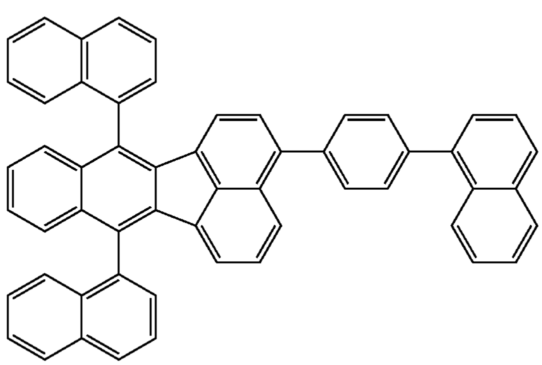
2-63
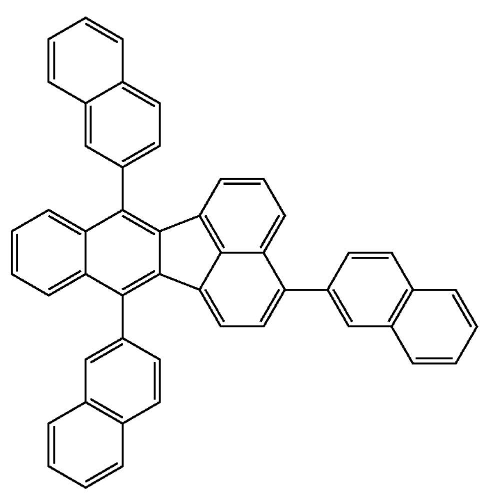

-continued
2-64
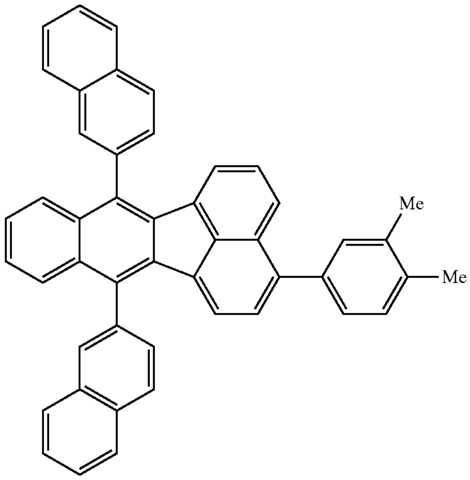
2-65
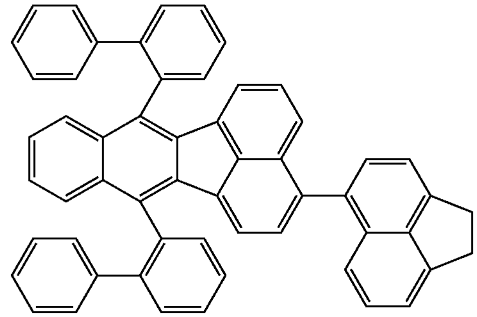
2-66
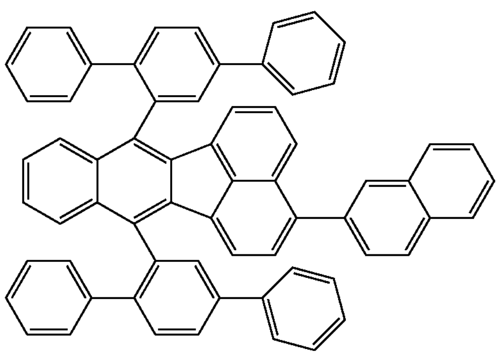
2-67
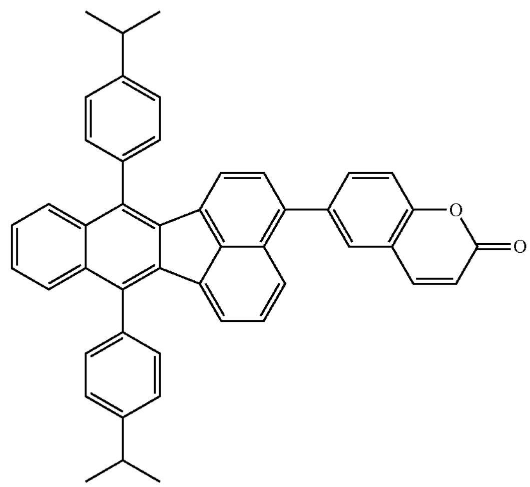
2-68
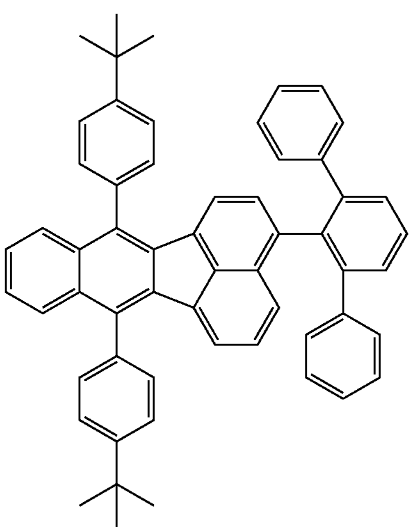

-continued
[Chemical Formula 155]
2-69
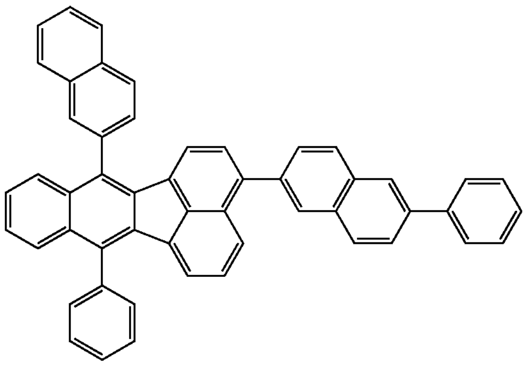
2-70
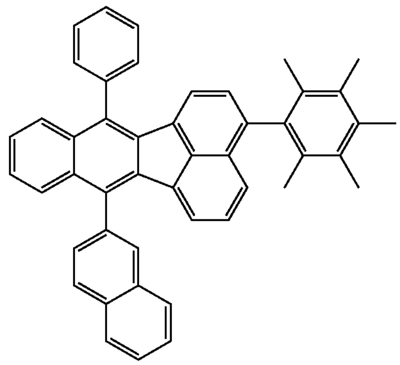
2-71
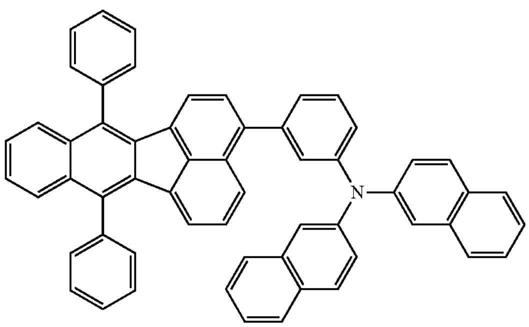
2-72
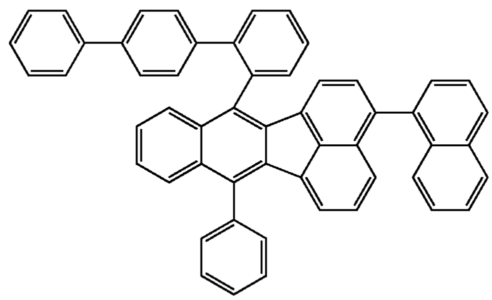
2-73
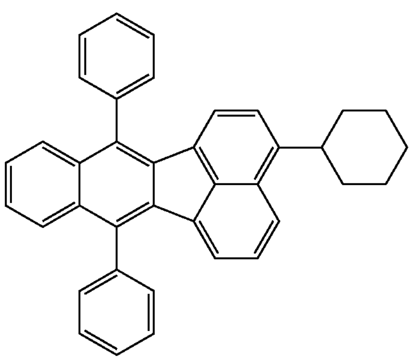
2-74
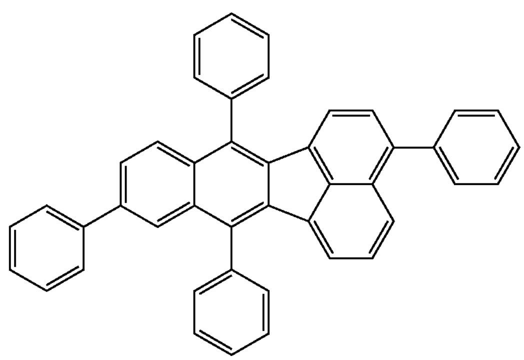
2-75
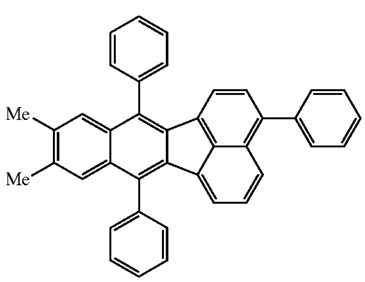
2-76
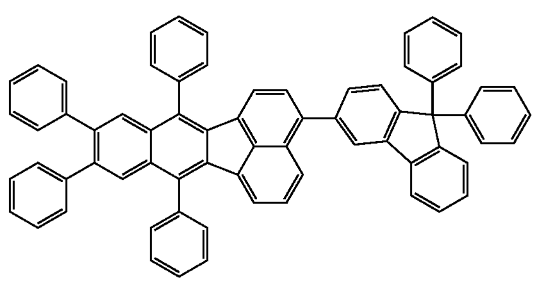

-continued
2-77
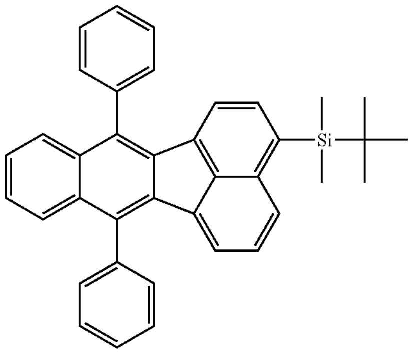
2-78
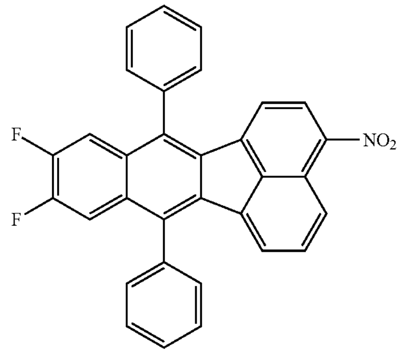
2-79
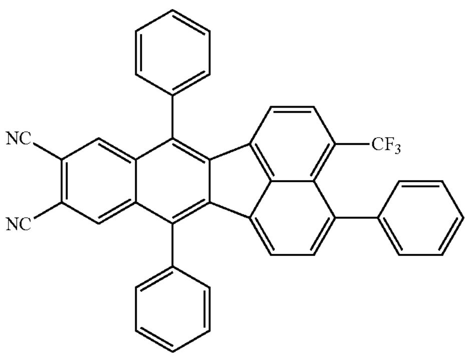
2-80
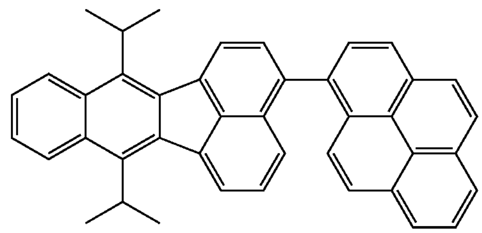
2-81
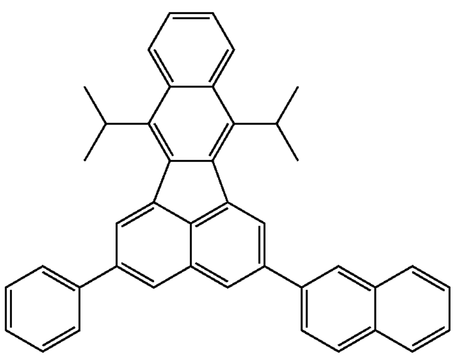
2-82
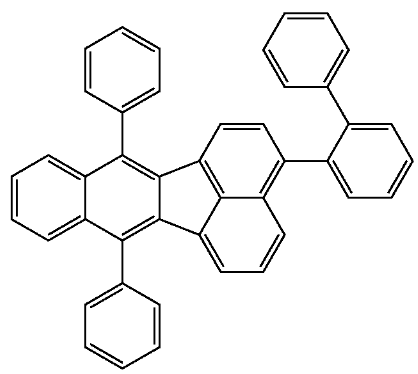
2-83
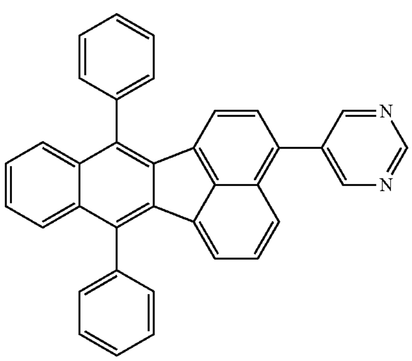
2-84
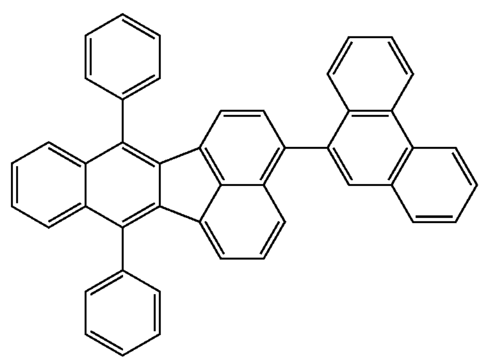

-continued

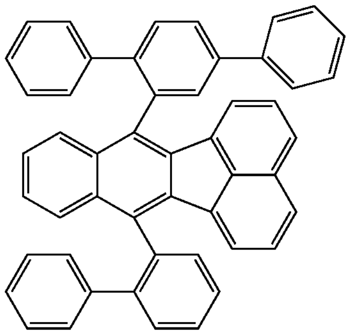

2-85

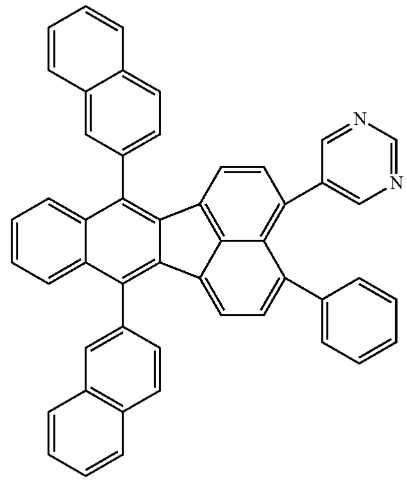

2-86

The fluorescent dopant according to the aspect of the invention may be represented by a formula (25) below.

[Chemical Formula 156]

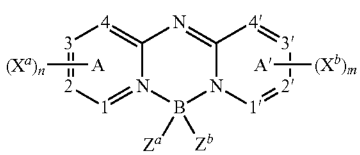

(25)

In the formula (25), A and A' each represent an independent azine ring system corresponding to a six-membered aromatic ring containing one or more nitrogen. $X^a$ and $X^b$ represent independently-selected substituents capable of being bonded together to form a fused ring with respect to A or A'. m and n each independently represent 0 to 4. $Z^a$ and $Z^b$ represent independently-selected substituents. 1, 2, 3, 4, 1', 2', 3' and 4' are each independently selected from a carbon atom and nitrogen atom.

The azine ring is preferably a quinolinyl ring or isoquinolinyl ring in which: all of 1, 2, 3, 4, 1', 2', 3' and 4' are carbon atoms; m and n each are 2 or more; and $X^a$ and $X^b$ represent 2 or more carbon-substituted groups bonded to form an aromatic ring. $Z^a$ and $Z^b$ are preferably fluorine atoms.

A fluorescent dopant of one preferable embodiment is structured such that: the two fused ring systems are quinoline or isoquinoline systems; aryl or heteroaryl substituents are phenyl groups; at least two $X^a$ groups and two $X^b$ groups are present to form 6-6 fused rings by bonding together; the fused ring systems each are fused in 1-2 position, 3-4 position, 1'-2' position or 3'-4' position; and at least either one of the fused rings is substituted by a phenyl group. The fluorescent dopant is represented by the following formula (91), (92) or (93).

[Chemical Formula 157]

(91)

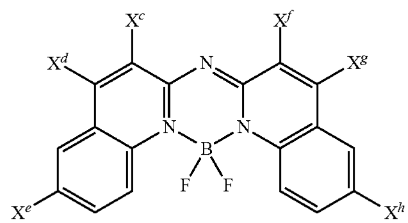

(92)

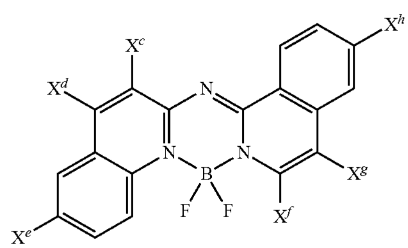

(93)

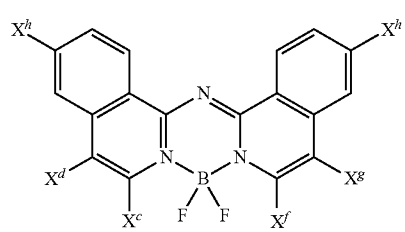

In the formulae (91) to (93), each of $X^c$, $X^d$, $X^e$, $X^f$, $X^g$ and $X^h$ represents a hydrogen atom or an independently-selected substituent. One of them must represent an aryl group or heteroaryl group.

The azine ring is preferably a quinolinyl ring or isoquinolinyl ring in which: all of 1, 2, 3, 4, 1', 2', 3' and 4' are carbon atoms; m and n each are 2 or more; $X^a$ and $X^b$ represent 2 or more carbon-substituted groups bonded to form an aromatic ring; and one of $X^a$ and $X^b$ represents an aryl group or substituted aryl group. $Z^a$ and $Z^b$ are preferably fluorine atoms.

A boron compound usable in the aspect of the invention will be exemplified below. The boron compound is complexated by two ring nitrogen atoms of deprotonated bis(azinyl) amine ligand, and the two ring nitrogen atoms are parts of different 6,6 fused ring systems. At least either one of the 6,6 fused ring systems contains an aryl or heteroaryl substituent.

[Chemical Formula 158]

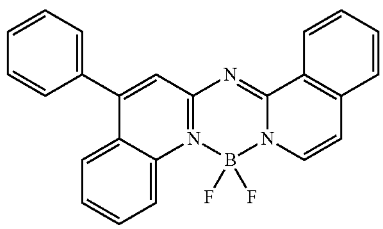

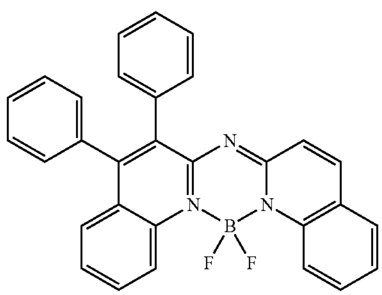

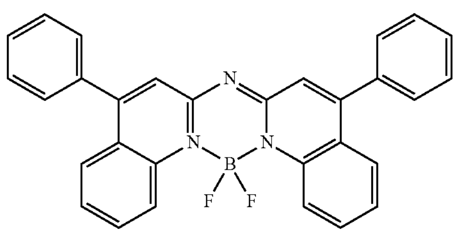

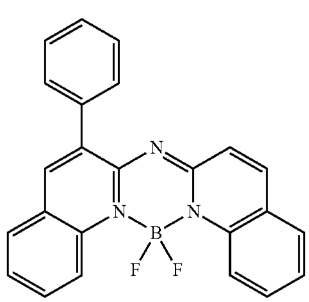

[Chemical Formula 159]

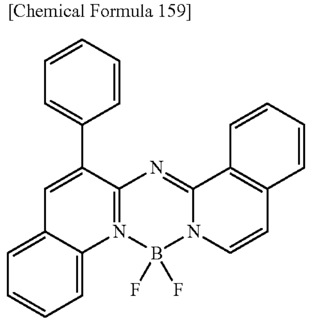

-continued

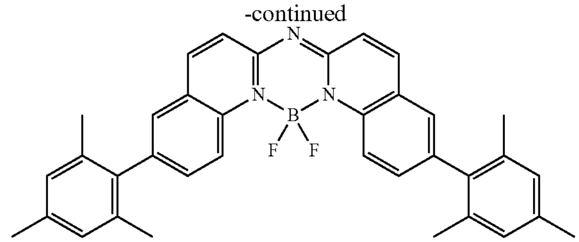

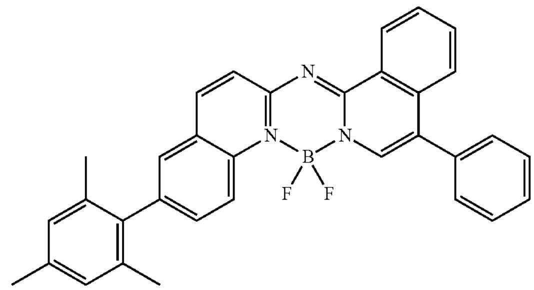

Preferably in the aspect of the invention, the organic thin-film layer includes an electron injecting/transporting layer provided between the cathode and the fluorescent-emitting layer, and the electron injecting/transporting layer contains a nitrogen-containing heterocyclic derivative.

With use of the nitrogen-containing cyclic derivative having high electron performance in the electron injecting/transporting layer, the driving voltage can be lowered.

Particularly in the aspect of the invention, the emitting layer (fluorescent emitting layer and phosphorescent emitting layer) is formed of a host having a wider gap than a conventional host for a fluorescent emitting layer such as an anthracene derivative. Thus, the charge injection barrier may be easily increased, so that the driving voltage may be easily raised.

In this respect, since the electron transporting layer exhibiting a high electron transporting capability is included, increase in the driving voltage can be avoided.

The electron injecting layer or the electron transporting layer, which aids injection of the electrons into the emitting layer, has a high electron mobility. The electron injecting layer is provided for adjusting energy level, by which, for instance, sudden changes of the energy level can be reduced. As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

[Chemical Formula 160]

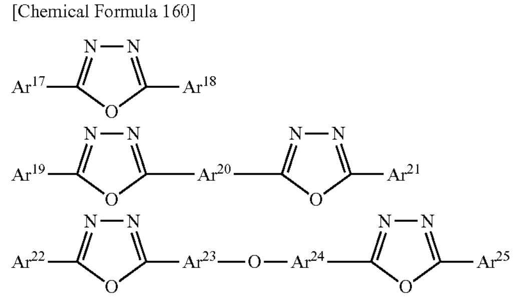

In the formula, $Ar^{17}$, $Ar^{18}$, $Ar^{19}$, $Ar^{21}$, $Ar^{22}$ and $Ar^{25}$ each represent a substituted or unsubstituted arylene group. $Ar^{17}$, $Ar^{19}$, and $Ar^{22}$ may be the same as or different from $Ar^{18}$, $Ar^{21}$ and $Ar^{25}$ respectively. $Ar^{20}$, $Ar^{23}$ and $Ar^{24}$ each represent a substituted or unsubstituted arylene group. $Ar^{23}$ and $Ar^{24}$ may be mutually the same or different.

Examples of the aryl group in the general formulae are a phenyl group, biphenyl group, anthranil group, perylenyl group and pyrenyl group. Examples of the arylene group are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group. Such an electron transport compound is preferably an electron transport compound that can be favorably formed into a thin film(s). Examples of the electron transport compounds are as follows.

In the formula, X represents a carbon atom or a nitrogen atom. $Z_1$ and $Z_2$ each independently represent an atom group capable of forming a nitrogen-containing heterocycle.

In the formula (B), X represents a carbon atom or nitrogen atom. $Z_1$ and $Z_2$ each independently represent an atom group capable of forming a nitrogen-containing heterocycle.

[Chemical Formula 163]

(C)

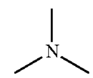

The nitrogen-containing heterocyclic derivative is preferably an organic compound having a nitrogen-containing five-membered or six-membered aromatic polycyclic group. When the number of the nitrogen atoms is plural, the nitrogen

[Chemical Formula 161]

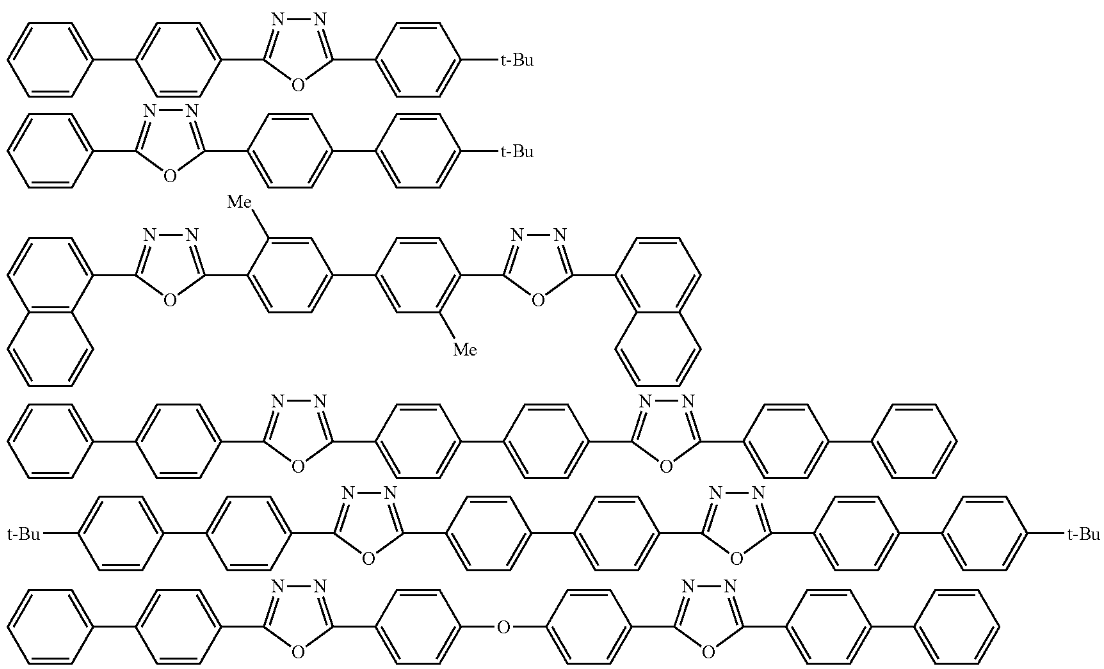

An example of the nitrogen-containing heterocyclic derivative is a nitrogen-containing compound that is not a metal complex, the derivative being formed of an organic compound represented by one of the following general formulae. Examples of the nitrogen-containing heterocyclic derivative are five-membered ring or six-membered ring derivative having a skeleton represented by the formula (A) and a derivative having a structure represented by the formula (B).

[Chemical Formula 162]

(A)

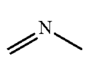

(B)

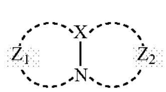

atoms bonded to the skeleton thereof in non-adjacent positions. When the nitrogen-containing heterocyclic derivative includes such nitrogen-containing aromatic polycyclic series having plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

[Chemical Formula 164]

(2)

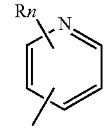

-continued (3)

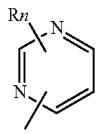

(4)

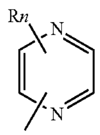

(5)

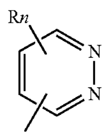

(6)

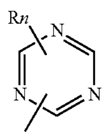

(7)

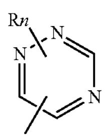

(8)

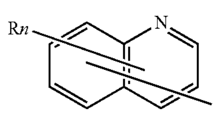

(9)

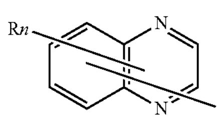

(10)

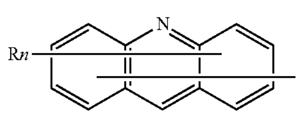

(11)

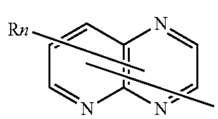

(12)

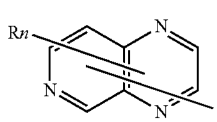

(13)

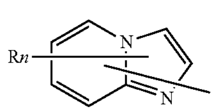

(14)

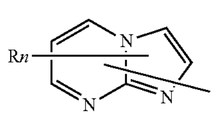

-continued (15)

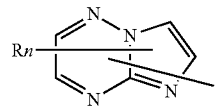

(16)

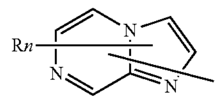

(17)

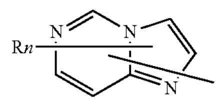

(18)

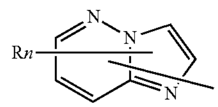

(19)

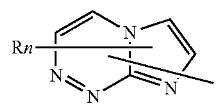

(20)

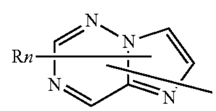

(21)

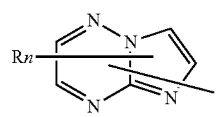

(22)

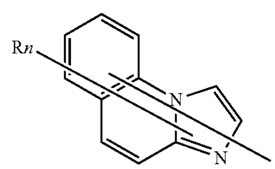

(23)

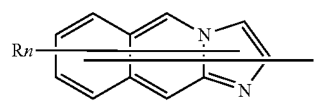

(24)

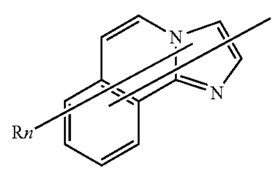

In the formulae (2) to (24): R represents an aryl group having 6 to 40 carbon atoms, a heteroaryl group having 3 to 40 carbon atoms, an alkyl group having 1 to 20 carbon atoms or an alkoxy group having 1 to 20 carbon atoms; and n represents an integer in a range of 0 to 5. When n is an integer of 2 or more, the plurality of R may be mutually the same or different.

A preferable specific compound is a nitrogen-containing heterocyclic derivative represented by the following formula.

[Chemical Formula 165]

$$HAr\text{-}L^1\text{-}Ar^1\text{—}Ar^2$$

In the formula, HAr represents a substituted or unsubstituted nitrogen-containing heterocycle having 3 to 40 carbon atoms;

$L^1$ represents a single bond, a substituted or unsubstituted arylene group having 6 to 40 carbon atoms, or a substituted or unsubstituted heteroarylene group having 3 to 40 carbon atoms; $Ar^1$ represents a substituted or unsubstituted divalent aromatic hydrocarbon group having 6 to 40 carbon atoms; and $Ar^2$ represents a substituted or unsubstituted aryl group having 6 to 40 carbon atoms, or a substituted or unsubstituted heteroaryl group having 3 to 40 carbon atoms.

HAr is exemplarily selected from the following group.

[Chemical Formula 166]

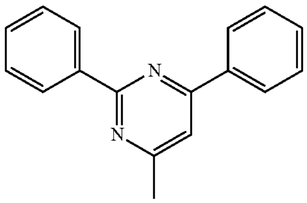

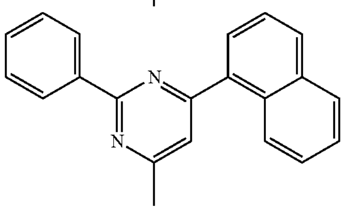

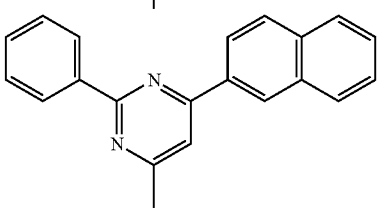

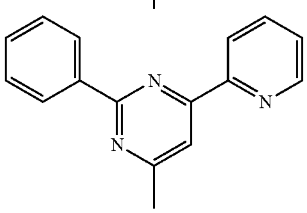

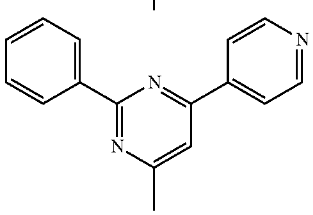

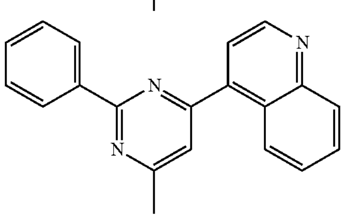

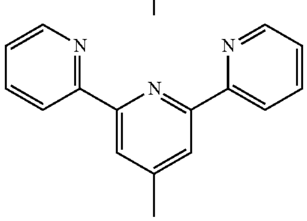

-continued

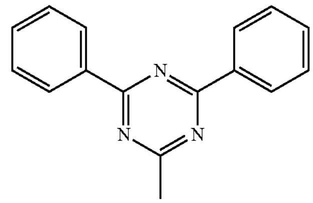

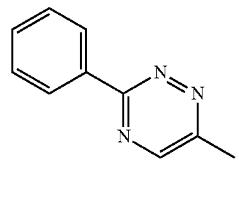

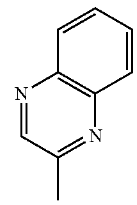

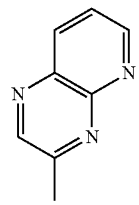

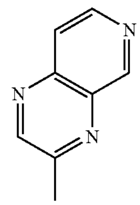

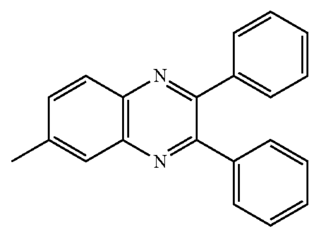

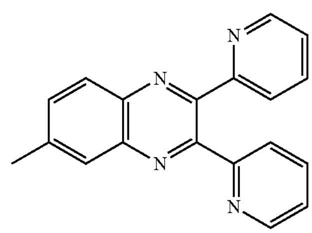

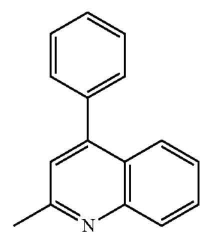

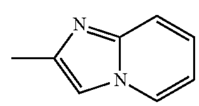

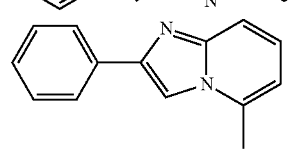

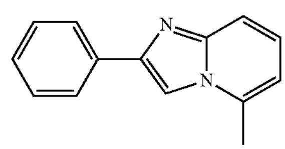

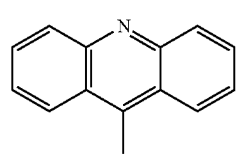

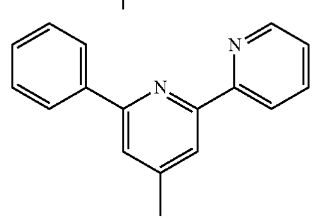

$L^1$ is exemplarily selected from the following group.

[Chemical Formula 167]

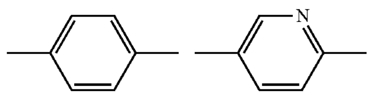

$Ar^2$ is exemplarily selected from the following group.

[Chemical Formula 168]

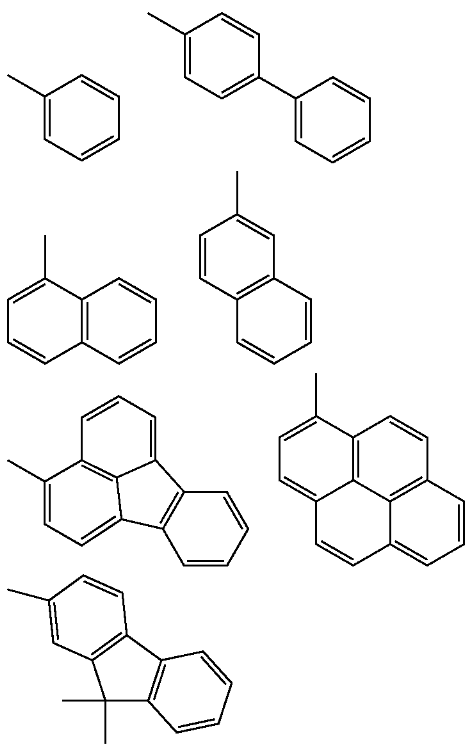

$Ar^1$ is exemplarily selected from the following arylanthranil groups.

[Chemical Formula 169]

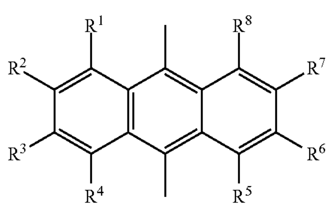

-continued

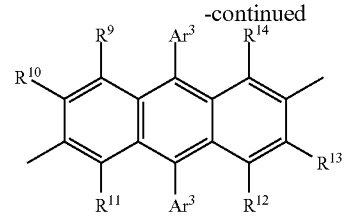

In the formula, $R^1$ to $R^{14}$ each independently represent a hydrogen atom, halogen atom, alkyl group having 1 to 20 carbon atoms, alkoxy group having 1 to 20 carbon atoms, aryloxy group having 6 to 40 carbon atoms, substituted or unsubstituted aryl group having 6 to 40 carbon atoms or heteroaryl group having 3 to 40 carbon atoms. $Ar^3$ represents a substituted or unsubstituted aryl group having 6 to 40 carbon atoms or heteroaryl group having 3 to 40 carbon atoms.

The nitrogen-containing heterocyclic derivative is also preferably a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

[Chemical Formula 170]

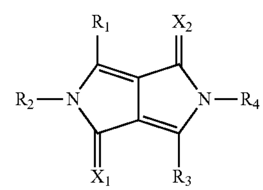

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic ring group, or substituted or unsubstituted heterocyclic group. $X_1$ and $X_2$ each independently represent an oxygen atom, a sulfur atom or a dicyanomethylene group.

Alternatively, the following compound (see JP-A-2000-173774) can also be favorably used.

[Chemical Formula 171]

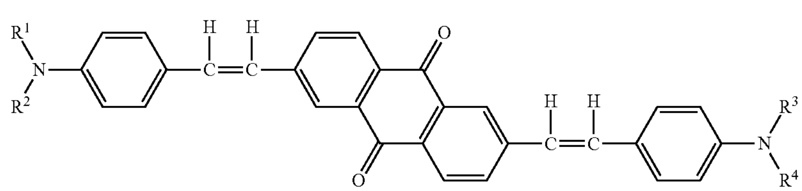

In the formula, $R^1$, $R^2$, $R^3$ and $R^4$, which may be mutually the same or different, each represent an aryl group represented by the following formula.

[Chemical Formula 172]

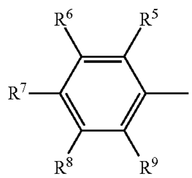

In the formula, $R^5$, $R^6$, $R^7$, $R^8$ and $R^9$, which may be mutually the same or different, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the nitrogen-containing heterocyclic group or a nitrogen-containing heterocyclic derivative may be used.

Although thickness of the electron injecting layer or the electron transporting layer is not specifically limited, the thickness is preferably 1 to 100 nm.

The anode of the organic EL device is used for injecting holes into the hole transporting layer or the emitting layer. It is effective that the anode has a work function of 4.5 eV or more. Exemplary materials for the anode for use in the aspect of the invention are indium-tin oxide (ITO), tin oxide (NESA), gold, silver, platinum and copper. The cathode is preferably formed of a material with smaller work function in order to inject electrons into the electron injecting layer or the emitting layer. Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, alloy of magnesium and silver and the like.

A method of forming each of the layers in the organic EL device according to the aspect of the invention is not particularly limited. A conventionally-known methods such as vacuum deposition or spin coating may be employed for forming the layers. The organic thin-film layer containing the compound represented by the formula (1), which is used in the organic EL device according to the aspect of the invention, may be formed by a conventional coating method such as vacuum deposition, molecular beam epitaxy (MBE method) and coating methods using a solution such as a dipping, spin coating, casting, bar coating, and roll coating.

Although the thickness of each organic layer of the organic EL device is not particularly limited, the thickness is generally preferably in a range of several nanometers to 1 μm because an excessively-thinned film likely entails defects such as a pin hole while an excessively-thickened film requires high voltage to be applied and deteriorates efficiency.

The organic EL device is formed on a light-transmissive substrate. The light-transmissive substrate, which supports the organic EL device, is preferably a smoothly-shaped substrate that transmits 50% or more of light in a visible region of 400 nm to 700 nm.

The light-transmissive substrate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

In the organic EL device according to the aspect of the invention, a reduction-causing dopant may also be preferably contained in an interfacial region between the cathode and the organic thin-film layer.

With this arrangement, the organic EL device can emit light with enhanced luminance intensity and have a longer lifetime.

The reduction-causing dopant is defined as a substance capable of reducing an electron-transporting compound. Accordingly, various materials are utilized as far as the material possesses proper reduction-causing property. For example, at least one material selected from a group of alkali metal, alkali earth metal, rare earth metal, oxide of alkali metal, halogenide of alkali metal, oxide of alkali earth metal, halogenide of alkali earth metal, oxide of rare earth metal, halogenide of rare earth metal, organic complexes of alkali metal, organic complexes of alkali earth metal, and organic complexes of rare earth metal may suitably be utilized.

Specifically, a preferable reduction-causing dopant is at least one alkali metal selected from a group consisting of Li (work function: 2.9 eV), Na (work function: 2.36 eV), K (work function: 2.28 eV), Rb (work function: 2.16 eV) and Cs (work function: 1.95 eV), or at least one alkali earth metal selected from a group consisting of Ca (work function: 2.9 eV), Sr (work function: 2.0 to 2.5 eV) and Ba (work function: 2.52 eV). A substance having work function of 2.9 eV or less is particularly preferable. Among the above, a more preferable reduction-causing dopant is at least one alkali metal selected from a group consisting of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic EL device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic EL device.

BEST MODE FOR CARRYING OUT THE INVENTION

Exemplary preferable embodiment(s) of the invention will be described below.

[Organic EL Device]

Figure 1:
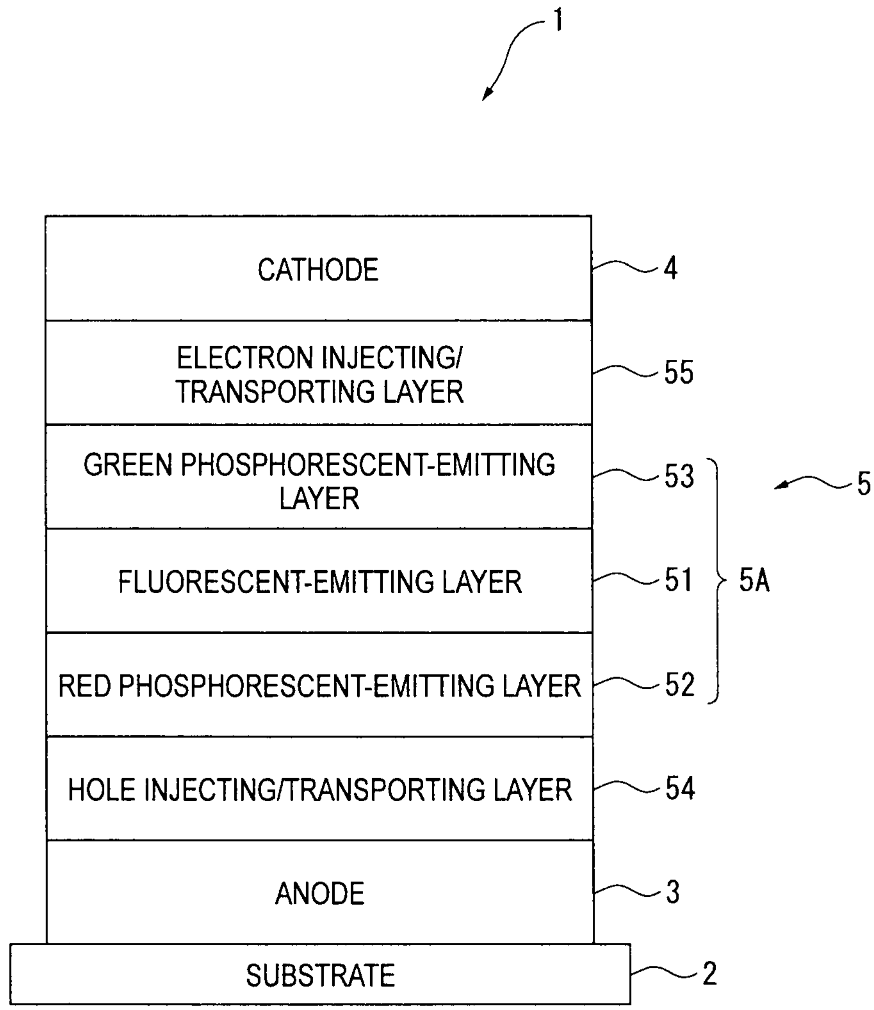
FIG. 1 shows an arrangement of an organic EL device according to an exemplary embodiment.

As shown in FIG. 1, an organic EL device 1 according to this exemplary embodiment includes an anode 3 provided on a transparent substrate 2, a cathode 4 and an organic thin-film layer 5 provided between the anode 3 and the cathode 4.

The organic thin-film layer 5 includes an emitting layer 5A that includes a fluorescent-emitting layer 51, a red phosphorescent-emitting layer 52 and a green phosphorescent-emitting layer 53.

In the emitting layer 5A, the recombination of the holes and the electrons takes place in the fluorescent host and the green phosphorescent host of the fluorescent-emitting layer 51 and the green phosphorescent-emitting layer 53. The fluorescent-emitting layer 51 emits light with the energy being transferred from the singlet level of the fluorescent host to the singlet level of the fluorescent dopant. On the other hand, the green phosphorescent-emitting layer 53 emits light with the energy being transferred from the triplet level 53B of the green phosphorescent host to the triplet level of the green phosphorescent host.

Figure 2:
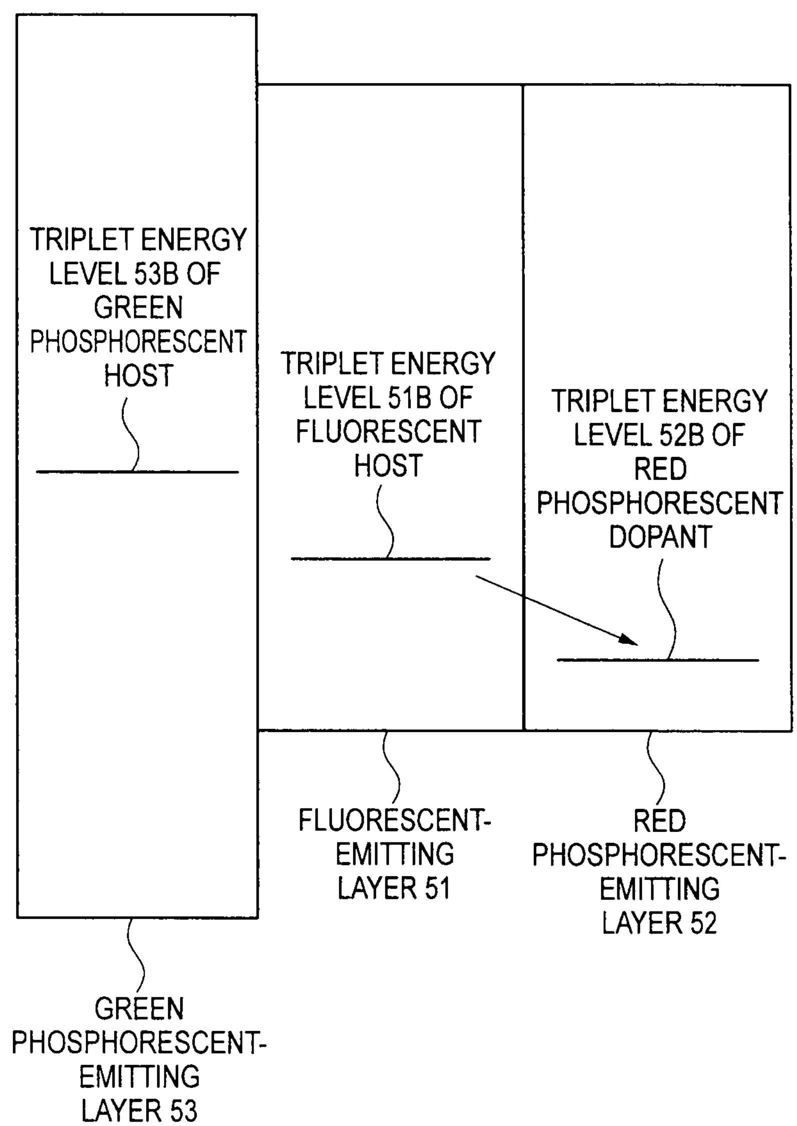
FIG. 2 shows transfer of triplet energy in the organic EL device according to the exemplary embodiment.

As shown in FIG. 2, the energy is transferred from the triplet levels 51B and 53B of the fluorescent host and the green phosphorescent host to the triplet level of the red phosphorescent host. The energy is further transferred to the triplet level 52B of the red phosphorescent dopant, from which emission is obtainable.

A hole injecting/transporting layer 54 and the like may be provided between the anode 3 and the emitting layer 5A. An electron injecting/transporting layer 55 and the like may be provided between the cathode 4 and the emitting layer 5A.

In addition, an electron blocking layer may be provided at a location closer to the anode than the fluorescent-emitting layer 51 and the green phosphorescent-emitting layer 53. A hole blocking layer may be provided at a location closer to the cathode 4 than the fluorescent-emitting layer 51 and the green phosphorescent-emitting layer 53. With this arrangement, electrons and holes can be trapped in the fluorescent-emitting layer 51 and the green phosphorescent-emitting layer 53, thereby enhancing probability of exciton generation in the fluorescent-emitting layer 51 and green phosphorescent-emitting layer 53.

By structuring the fluorescent-emitting layer 51 to contain a combination of the above-described host material and a fluorescent dopant, the blue fluorescent emission can be provided at a low voltage, and the triplet energy can be transferred to the red phosphorescent-emitting layer 52. With this arrangement, the organic EL device 1 can provide white emission by the fluorescent-emitting layer 51 and the phosphorescent-emitting layers 52 and 53. The organic EL device 1 also has high luminous efficiency and long lifetime.

FIG. 1 shows an exemplary structure of the emitting layer 5A in which the red phosphorescent-emitting layer 52, the fluorescent-emitting layer 51 and the green phosphorescent-emitting layer 53 are provided in this order from the anode 2. However, the layering order is not limited to this.

EXAMPLES

Next, the invention will be described in further detail by exemplifying Example(s) and Comparative(s). However, the invention is not limited by the description of Example(s).

Note that solid-property values of each material, which are shown in the Table 2 below, were measured in the following manner.

Triplet energy gap Eg(T) was defined based on phosphorescence spectrum.

Specifically, each material was dissolved in an EPA solvent (diethylether:isopentane:ethanol=5:5:2 in volume ratio) at a concentration of 10 μmol/L, thereby forming a sample for phosphorescence measurement.

Then, the sample for phosphorescence measurement was put into a quartz cell, cooled to 77K and irradiated with exciting light, so that a wavelength of phosphorescence radiated therefrom was measured.

A tangent line was drawn to be tangent to a rising section adjacent to short-wavelength of the obtained phosphorescence spectrum, a wavelength value at an intersection of the tangent line and a base line (absorption zero) was converted into energy value, and the converted energy value was defined as the triplet energy gap Eg(T).

For the measurement, a commercially-available measuring equipment F-4500 (manufactured by Hitachi, Ltd.) was used.

The affinity level Ea (electron affinity) means energy emitted or absorbed when an electron is fed to a molecule of a material. The affinity level is defined as "positive" when energy is emitted while being defined as "negative" when energy is absorbed.

The affinity level Ea is defined by the following equation based on the ionization potential Ip and the optical energy gap Eg(S).

$$Af=Ip-Eg(S)$$

The ionization potential Ip means energy required for removing electron(s) from a compound of each material (i.e., energy required for ionization). The ionization potential is, for instance, a value measured by an ultraviolet-ray photoelectron spectrometer (AC-3, manufactured by Riken Keiki Co., Ltd.).

The optical energy gap Eg(S) is a difference between a conduction level and a valence level. For instance, the optical energy gap was obtained by converting into energy a wavelength value at an intersection of a long-wavelength-side tangent line in an absorbing spectrum of a toluene-diluted solution of each material and a base line in the absorbing spectrum (zero absorption).

Example 1

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus. Then, 55-nm thick film of 4,4'-bis[N-(1-naphthyl)-N-phenylamino]biphenyl (hereinafter abbreviated as "NPD film") was initially formed by resistance heating deposition onto a surface of the glass substrate where the transparent electrode line was provided so that the NPD film covered the transparent electrode. The NPD film served as the hole injecting/transporting layer.

A 15-nm thick film of CBP, which was used as the red phosphorescent host, was formed on the NPD film by resistance heating deposition. At the same time, $Ir(ppy)_2(acac)$, which was used as the red phosphorescent dopant, was deposited to be contained at a content of 5% (mass ratio) of the CBP. This film served as the red phosphorescent-emitting layer.

Next, a 10-nm thick film of a compound A, which was used as the fluorescent host, was formed on the red phosphorescent-emitting layer by resistance heating deposition.

At the same time, NPD (its Eg(T) was 2.46 eV), which was used as the fluorescent dopant, was deposited to be contained at a content of 2% (mass ratio) of the compound A. This film served as the fluorescent-emitting layer.

Then, a 5-nm thick film of a compound D, which was used as the green phosphorescent host, was formed on the fluorescent-emitting layer by resistance heating deposition.

At the same time, Ir(ppy)3(fac-tris(2-phenylpyridine)iridium), which was used as the green phosphorescent dopant, was deposited to be contained at a content of 5% (mass ratio) of the compound D. This film served as the green phosphorescent-emitting layer.

A 10-nm thick film of a compound I was formed on this film. This film served as a hole blocking layer.

Further, 30-nm thick film of tris(8-quinolinol) aluminum (Alq) complex was formed on this film. This film served as an electron injecting layer.

After that, LiF was formed into 0.5-nm thick film. Metal (Al) was deposited on the LiF film to form a 150-nm thick metal cathode, thereby providing the organic EL device.

By driving the organic EL device in the later-described manner, white emission shown in Table 2 was obtained. This proves that each emitting layer in the device suitably emitted light. In other words, energy is transferred from CBP to NPD, and blue emission is obtained. In addition, energy is transferred from CBP to Ir(tpiq)2(acac), and red emission is obtained. On the other hand, Ir(ppy)3, which has a large Eg(T), hardly receives the energy transferred from CBP. In addition, the energy is not likely to be transferred from CBP to the compound D (green phosphorescent host). In conclusion, the green phosphorescent-emitting layer provides green phosphorescent emission mainly by way of recombination.

Examples 2 to 10

Devices of Examples 2 to 10 were manufactured in the same manner as Example 1.

Compounds and device structures employed in Examples 2 to 10 are shown in Table below. Eg(T) of BAlq(bis(2-methyl-8-quinolinolate)-4-(phenylphenolate)aluminium), which was used in Example 7, was 2.28 eV.

In conclusion, white emission in Examples 2 to 10 is obtained also through the process described in Example 1.

Examples 11 to 23

Devices of Examples 11 to 23 were manufactured in the same manner as Example 1.

Compounds and device structures employed in Examples 11 to 23 are shown in Table below.

In Examples 13, 14, 19 and 23, an intermediate layer (non-dope layer) was provided between the fluorescent-emitting layer and the red phosphorescent-emitting layer. A thickness of the intermediate layer was 5 nm.

In Examples 12 and 14, a buffer layer was provided between the green phosphorescent-emitting layer and the fluorescent-emitting layer. A thickness of the buffer layer was 5 nm. The buffer layer can prevents the transfer of the energy to the compound A, thereby contributing to the enhancement of the luminous efficiency and prolongation of the lifetime.

In conclusion, white emission or whitish emission in Examples 11 to 23 is obtained also through the process described in Example 1.

Comparative 1

Comparative 1 was manufactured in the following manner.

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus. Then, 55-nm thick film of 4,4'-bis[N-(1-naphthyl)-N-phenylamino]biphenyl (hereinafter abbreviated as "NPD film") was initially formed by resistance heating deposition onto a surface of the glass substrate where the transparent electrode line was provided so that the NPD film covered the transparent electrode. The NPD film served as the hole injecting/transporting layer.

A 5-nm thick film of CBP, which was used as the red phosphorescent host, was formed on the NPD film by resistance heating deposition. At the same time, $Ir(ppy)_2(acac)$, which was used as the red phosphorescent dopant, was deposited to be contained at a content of 5% (mass ratio) of the CBP. This film served as the red phosphorescent-emitting layer.

A 5-nm thick film of CBP, which was used as the green phosphorescent host, was formed on the red phosphorescent-emitting layer by resistance heating deposition. At the same time, Ir(ppy)3, which was used as the green phosphorescent dopant, was deposited to be contained at a content of 5% (mass ratio) of the CBP. This film served as the green phosphorescent-emitting layer.

Subsequently, CBP alone was formed into 5-nm thick film.

Then, a 10-nm thick film of CBP, which was used as the fluorescent host, was formed by resistance heating deposition. At the same time, NPD, which was used as the fluorescent dopant, was deposited to be contained at a content of 2% (mass ratio) of CBP. This film served as the fluorescent-emitting layer.

A 10-nm thick film of a compound I was formed on this film. This film served as a hole blocking layer.

Further, 30-nm thick film of tris(8-quinolinol) aluminum (Alq) complex was formed on this film. This film served as an electron injecting layer.

After that, LiF was formed into 0.5-nm thick film. Metal (Al) was deposited on the LiF film to form a 150-nm thick metal cathode, thereby providing the organic EL device.

[Evaluation of Organic EL Device]

The organic EL devices each manufactured as described above were driven by direct-current electricity of 1 $mA/cm^2$ to emit light, and then emission chromaticity, the luminance (L) and voltage were measured. Based on the measurement, the external quantum efficiency (EQE, %) was obtained. In addition, by conducting a direct-current continuous current test with the initial luminance intensity being set at 1000 $cd/m^2$ for each organic EL device, time elapsed until the initial luminance intensity was reduced to the half (i.e., time until half-life) was measured for each organic EL device.

The results of the evaluation are shown in Tables 2 and 3 as well as the device structures.

Table 1 below shows ionization potential (Ip), affinity level (Ea), singlet energy gap (Eg(S)) and triplet energy gap (Eg(T)) of the compounds used in Examples and Comparatives. BCzVBi in Comparative 1 was 4,4'-Bis(9-ethyl-3-carbazovinylene)-1,1'-biphenyl.

TABLE 1

| | Ip | Ea | Eg(S) | Eg(T) |
|---|---|---|---|---|
| Compound A | 5.88 | 2.64 | 3.24 | 2.38 |

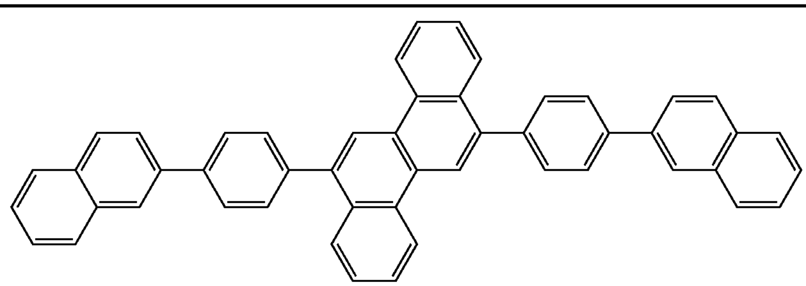

TABLE 1-continued
| | | Ip | Ea | Eg(S) | Eg(T) |
|---|---|---|---|---|---|
| Compound B | 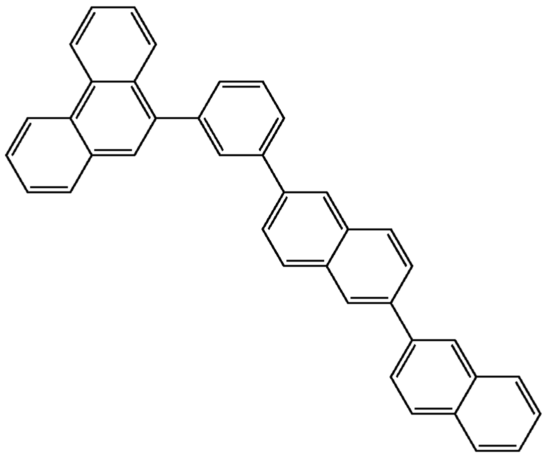 [SMILES: c1cc(-c2ccc3cc(-c4ccc5ccccc5c4)ccc3c2)cc(-c2cc3ccccc3c3ccccc23)c1] | 6.04 | 2.55 | 3.49 | 2.44 |
| Compound D | 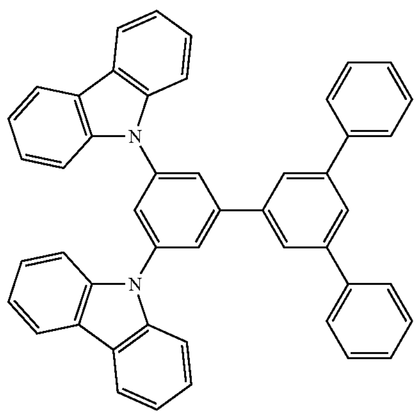 [SMILES: c1ccc(-c2cc(-c3ccccc3)cc(-c3cc(-n4c5ccccc5c5ccccc54)cc(-n4c5ccccc5c5ccccc54)c3)c2)cc1] | 5.98 | 2.41 | 3.57 | 2.89 |
| Compound E | 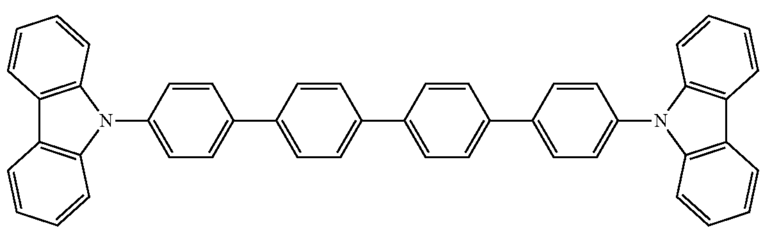 [SMILES: c1ccc2c(c1)c1ccccc1n2-c1ccc(-c2ccc(-c3ccc(-c4ccc(-n5c6ccccc6c6ccccc65)cc4)cc3)cc2)cc1] | 5.95 | 2.56 | 3.39 | 2.72 |
| CBP | 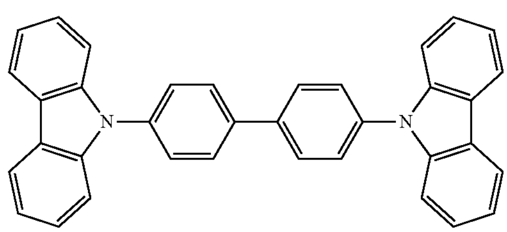 [SMILES: c1ccc2c(c1)c1ccccc1n2-c1ccc(-c2ccc(-n3c4ccccc4c4ccccc43)cc2)cc1] | 6.06 | 2.50 | 3.56 | 2.81 |
| Dopant A | 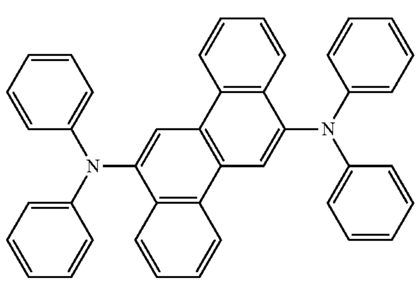 [SMILES: c1ccc(N(c2ccccc2)c2cc3c4ccccc4c(N(c4ccccc4)c4ccccc4)cc3c3ccccc23)cc1] | 5.47 | 2.67 | 2.80 | — |

TABLE 1-continued

| | | Ip | Ea | Eg(S) | Eg(T) |
|---|---|---|---|---|---|
| Compound I | 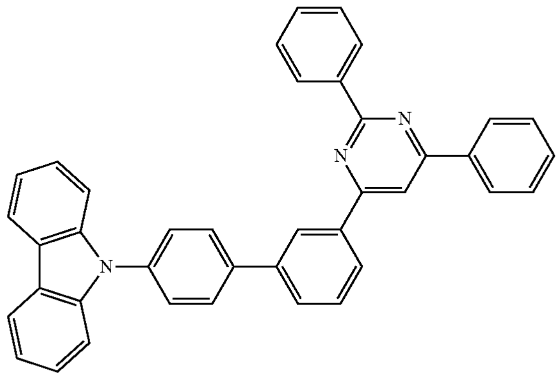 [SMILES: c1ccc(-c2cc(-c3cccc(-c4ccc(-n5c6ccccc6c6ccccc65)cc4)c3)nc(-c3ccccc3)n2)cc1] | | | | |
| Compound J | 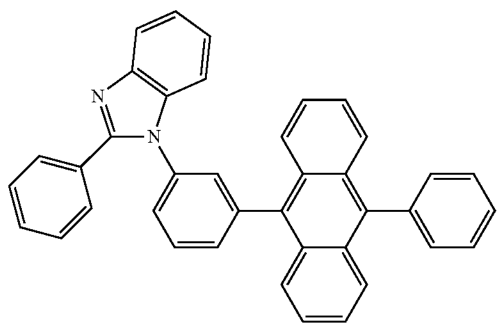 [SMILES: c1ccc(-c2c3ccccc3c(-c3cccc(-n4c(-c5ccccc5)nc5ccccc54)c3)c3ccccc23)cc1] | | | | |
| Ir(ppy)3 | | | | | 2.56 |
| Ir(tpiq)2(acac) | 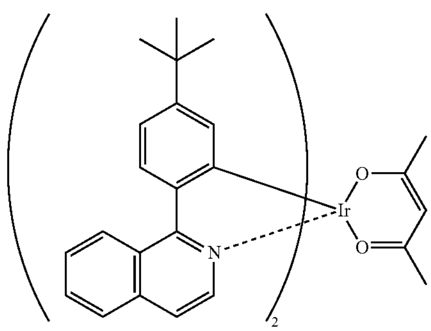 | | | | 2.03 |

TABLE 2

| | | EQE | Lifetime @1000 nit | Chromaticity | |
|---|---|---|---|---|---|
| Example 1 | NPD/CBP: Ir(tpiq)2(acac)/CBP: NPD/Compound D: Ir(ppy)3/Compound I/Alq3/LiF/Al | 13.5% | 200 hr | 0.354 | 0.388 |
| Example 2 | NPD/CBP: Ir(tpiq)2(acac)/Compound E: NPD/Compound D: Ir(ppy)3/Compound I/Alq3/LiF/Al | 14.1% | 180 hr | 0.361 | 0.397 |
| Example 3 | NPD/Compound A: Ir(tpiq)2(acac)/CB P: NPD/Compound D: Ir(ppy)3/Compound I/Alq3/LiF/Al | 13.7% | 220 hr | 0.379 | 0.393 |
| Example 4 | NPD/Compound B: Ir(tpiq)2(acac)/CB P: NPD/Compound D: Ir(ppy)3/Compound I/Alq3/LiF/Al | 13.9% | 200 hr | 0.382 | 0.383 |
| Example 5 | NPD/NPD: Ir(tpiq)2(acac)/CBP: NPD/Compound D: Ir(ppy)3/Compound I/Alq3/LiF/Al | 10.5% | 200 hr | 0.260 | 0.432 |
| Example 6 | NPD/Compound D: Ir(ppy)3/CBP: NPD/CBP: Ir(tpiq)2(acac)/Comnpound I/Alq3/LiF/Al | 12.8% | 250 hr | 0.312 | 0.465 |
| Example 7 | NPD/Compound D: Ir(ppy)3/CBP: NPD/BAlq: Ir(tpiq)2(acac)/Alq3/LiF/Al | 12.7% | 300 hr | 0.275 | 0.442 |
| Example 8 | NPD/CBP: Ir(tpiq)2(acac)/CBP: NPD/Compound D/Compound D: Ir(ppy)3/Compound I/Alq3/LiF/Al | 13.8% | 200 hr | 0.313 | 0.335 |
| Example 9 | NPD/CBP: Ir(tpiq)2(acac)/CBP: NPD/Compound D/Ir(ppy)3/Compound I/Compound J/LiF/Al | 12.6% | 200 hr | 0.302 | 0.315 |
| Example 10 | NPD/CBP: Ir(tpiq)2(acac)/CBP: DopantA/Compound D: Ir(ppy)3/Compound I/Alq3/LiF/Al | 13.7% | 250 hr | 0.366 | 0.394 |

TABLE 3

| | | EQE | Lifetime @1000 nit | Chromaticity | |
|---|---|---|---|---|---|
| Example 11 | NPD/CBP: Ir(ppy)3/Compound A: NPD/Compound A: Ir(tpiq)2(acac)Compound I/Alq3/LiF/Al | 14.7% | 700 hr | 0.527 | 0.402 |
| Example 12 | NPD/CBP: Ir(ppy)3/CBP/Compound A: NPD/Compound A: Ir(tpiq)2(acac)/Compound I/Alq3/LiF/Al | 15.2% | 750 hr | 0.503 | 0.440 |
| Example 13 | NPD/CBP: Ir(ppy)3/Compound A: NPD/Compound A/Compound A: Ir(tpiq)2(acac)/Compound I/Alq3/LiF/Al | 14.2% | 700 hr | 0.498 | 0.405 |
| Example 14 | NPD/CBP: Ir(ppy)3/CBP/Compound A: NPD/Compound A/Compound A: Ir(tpiq)2(acac)/Compound I/Alq3/LiF/Al | 15.0% | 720 hr | 0.515 | 0.414 |
| Example 15 | NPD/CBP: Ir(ppy)3/Compound B: NPD/Compound A: Ir(tpiq)2(acac)/Compound I/Alq3/LiF/Al | 15.8% | 700 hr | 0.522 | 0.407 |
| Example 16 | NPD/CBP: Ir(ppy)3/Compound A: NPD/BAlq: Ir(tpiq)2(acac)Compound I/Alq3/LiF/Al | 14.3% | 650 hr | 0.298 | 0.485 |
| Example 17 | NPD/Compound A: Ir(tpiq)2(acac)/Compound A: NPD/CBP: Ir(ppy)3/Compound I/Alq3/LiF/Al | 13.8% | 700 hr | 0.404 | 0.424 |
| Example 18 | NPD/Compound A: Ir(tpiq)2(acac)Compound B: NPD/CBP: Ir(ppy)3/Compound I/Alq3/LiF/Al | 14.2% | 750 hr | 0.382 | 0.385 |
| Example 19 | NPD/Compound A: Ir(tpiq)2(acac)/NPD/Compound B: NPD/CBP: Ir(ppy)3/Compound I/Alq3/LiF/Al | 15.1% | 750 hr | 0.352 | 0.400 |
| Example 20 | NPD/CBP: Ir(ppy)3/Compound A: Dopant A/Compound A: Ir(tpiq)2(acac)/Compound I/Alq3/LiF/Al | 15.0% | 800 hr | 0.525 | 0.411 |
| Example 21 | NPD/Compound A: Ir(tpiq)2(acac)/Compound A: NPD/Compound D: Ir(ppy)3/Compound I/Alq3/LiF/Al | 14.6% | 750 hr | 0.376 | 0.406 |
| Example 22 | NPD/CBP: Ir(ppy)3/Compound A: NPD/Compound A: Ir(tpiq)2(acac)/Compound I/Compound J/LiF/Al | 15.5% | 1000 hr | 0.363 | 0.409 |
| Example 23 | NPD/Compound A: Ir(tpiq)2(acac)/NPD/Compound E: NPD/CBP: Ir(ppy)3/Compound I/Alq3/LiF/Al | 14.5% | 400 hr | 0.395 | 0.422 |
| Comparative 1 | NPD/CBP: Ir(tpiq)2(acac)/CBP: Ir(ppy)3/CBP/CBP: BCzVBi/Compound I/Alq3/LiF/Al | 11.6% | 150 hr | 0.370 | 0.391 |

As appreciated from Tables above, the organic EL devices of Examples 1 to 23, in which the device structure according to the aspect of the invention was employed, exhibited long lifetime and high efficiency.

In contrast, the organic EL device according to Comparative 1, in which the red phosphorescent emission and the green phosphorescent emission were obtained by the transfer of the excited energy from the fluorescent-emitting layer, exhibited short lifetime and low efficiency.

It should be noted that a "fluorescent host" and a "phosphorescent host" herein respectively mean a host combined with a fluorescent dopant and a host combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material.

Likewise, the phosphorescent host herein means a material for forming a phosphorescent-emitting layer containing a phosphorescent dopant, and does not mean a host that is only usable as a host of a phosphorescent material.

The invention claimed is:

1. An organic EL device, comprising:

an anode;

a cathode; and an organic thin-film layer provided between the anode and the cathode, said organic thin-film layer comprising:

a fluorescent-emitting layer containing a fluorescent host and a fluorescent dopant;

a red phosphorescent-emitting layer containing a red phosphorescent host and a red phosphorescent dopant; and a green phosphorescent-emitting layer containing a green phosphorescent host and a green phosphorescent dopant, wherein the red phosphorescent dopant emits light mainly by receiving transfer of triplet energy from the fluorescent host, and the green phosphorescent dopant emits light mainly by recombination of charges within the green phosphorescent-emitting layer, wherein the triplet energy gap $Eg_{FH}$ of the fluorescent host and the triplet energy gap $Eg_{PH-G}$ of the green phosphorescent host satisfy a relationship of $Eg_{FH}<Eg_{PH-G}$, the triplet energy gap $Eg_{PH-G}$ of the green phosphorescent host is 2.4 eV or more, and wherein the triplet energy gap $Eg_{FH}$ of the fluorescent host, triplet energy gap $Eg_{PD-R}$ of the red phosphorescent dopant and the triplet energy gap $Eg_{PD-G}$ of the green phosphorescent dopant satisfy a relationship of $Eg_{PD-R}<Eg_{FH}<Eg_{PD-G}+0.2$ eV.

2. The organic EL device according to claim 1, wherein the triplet energy gap $Eg_{FH}$ of the fluorescent host, the triplet energy gap $Eg_{PD-R}$ of the red phosphorescent dopant and the triplet energy gap $Eg_{PD-G}$ of the green phosphorescent dopant satisfy a relationship of $Eg_{PD-R}+0.2$ eV$<Eg_{FH}<Eg_{FD-G}+0.2$ eV.

3. The organic EL device according to claim 1, wherein the organic thin-film layer comprises an electron injecting/transporting layer provided between the cathode and the fluorescent-emitting layer, and the electron injecting/transporting layer contains a nitrogen-containing heterocyclic derivative.

4. The organic EL device according to claim 1, wherein the green phosphorescent host is different form the fluorescent host.

5. The organic EL device according to claim 1, wherein a thickness of the red phosphorescent-emitting layer is greater than a thickness of the fluorescent-emitting layer.

6. The organic EL device according to claim 1, wherein a content of the red phosphorescent dopant is 10% or less of the red phosphorescent host by mass ratio.

7. The organic EL device according to claim 1, wherein energy is not transferable from the fluorescent host to the green phosphorescent host and to the green phosphorescent dopant.

* * * * *